US012136640B2

(12) United States Patent
Nakazawa et al.

(10) Patent No.: US 12,136,640 B2
(45) Date of Patent: Nov. 5, 2024

(54) SOLID-STATE IMAGING DEVICE

(71) Applicant: SONY SEMICONDUCTOR SOLUTIONS CORPORATION, Kanagawa (JP)

(72) Inventors: Keiichi Nakazawa, Kanagawa (JP); Koichiro Zaitsu, Kanagawa (JP); Nobutoshi Fujii, Kanagawa (JP); Yohei Hiura, Kanagawa (JP); Shigetaka Mori, Kanagawa (JP); Shintaro Okamoto, Kanagawa (JP); Keiji Ohshima, Kanagawa (JP); Shuji Manda, Kanagawa (JP); Junpei Yamamoto, Kanagawa (JP); Yui Yuga, Kanagawa (JP); Shinichi Miyake, Kanagawa (JP); Tomoki Kambe, Kanagawa (JP); Ryo Ogata, Kumamoto (JP); Tatsuki Miyaji, Kanagawa (JP); Shinji Nakagawa, Kanagawa (JP); Hirofumi Yamashita, Kanagawa (JP); Yasushi Hamamoto, Kanagawa (JP); Naohiko Kimizuka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 282 days.

(21) Appl. No.: 17/620,228

(22) PCT Filed: Jun. 26, 2020

(86) PCT No.: PCT/JP2020/025329

§ 371 (c)(1), (2) Date: Dec. 17, 2021

(87) PCT Pub. No.: WO2020/262643

PCT Pub. Date: Dec. 30, 2020

(65) Prior Publication Data

US 2022/0271070 A1 Aug. 25, 2022

(30) Foreign Application Priority Data

Jun. 26, 2019 (JP) ................................ 2019-118222

(51) Int. Cl.
*H01L 27/146* (2006.01)
*H04N 25/77* (2023.01)

(52) U.S. Cl.
CPC .... *H01L 27/1463* (2013.01); *H01L 27/14603* (2013.01); *H01L 27/14612* (2013.01);
(Continued)

(58) Field of Classification Search
CPC ................................................ H01L 27/14603
See application file for complete search history.

(56) References Cited

U.S. PATENT DOCUMENTS

2003/0228736 A1 12/2003 Kimura
2006/0157758 A1* 7/2006 Rhodes ............ H01L 27/14609 257/292

(Continued)

FOREIGN PATENT DOCUMENTS

JP H11-233789 8/1999
JP 2004-014911 1/2004

(Continued)

OTHER PUBLICATIONS

International Search Report prepared by the Japan Patent Office on Sep. 10, 2020, for International Application No. PCT/JP2020/025329, 5 pgs.

*Primary Examiner* — Thanh Luu
(74) *Attorney, Agent, or Firm* — Sheridan Ross PC

(57) ABSTRACT

There is provided a solid-state imaging device including: a first semiconductor layer including a photoelectric converter and an electric charge accumulation section for each pixel, the electric charge accumulation section in which a signal electric charge generated in the photoelectric converter is (Continued)

accumulated; a pixel separation section that is provided in the first semiconductor layer, and partitions a plurality of the pixels from each other; a second semiconductor layer that is provided with a pixel transistor and is stacked on the first semiconductor layer, the pixel transistor that reads the signal electric charge of the electric charge accumulation section; and a first shared coupling section that is provided between the second semiconductor layer and the first semiconductor layer, and is provided to straddle the pixel separation section and is electrically coupled to a plurality of the electric charge accumulation sections.

32 Claims, 141 Drawing Sheets

(52) U.S. Cl.
CPC .. *H01L 27/14636* (2013.01); *H01L 27/14643* (2013.01); *H04N 25/77* (2023.01)

(56) References Cited

U.S. PATENT DOCUMENTS

| | | | |
|---|---|---|---|
| 2007/0018075 | A1 | 1/2007 | Cazaux et al. |
| 2007/0069248 | A1 | 3/2007 | Ohta |
| 2011/0156055 | A1 | 6/2011 | Mazellier |
| 2011/0156197 | A1 | 6/2011 | Tivarus |
| 2011/0285892 | A1 | 11/2011 | Itahashi |
| 2012/0223436 | A1 | 9/2012 | Sekar et al. |
| 2014/0138752 | A1 | 5/2014 | Kao et al. |
| 2014/0327059 | A1 | 11/2014 | Ammo |
| 2015/0228684 | A1 | 8/2015 | Yamashita |
| 2015/0263053 | A1 | 9/2015 | Yamazaki et al. |
| 2016/0126285 | A1 | 5/2016 | Kobayashi |
| 2016/0343762 | A1 | 11/2016 | Kagawa |
| 2017/0018591 | A1 | 1/2017 | Yamaguchi |
| 2017/0062499 | A1 | 3/2017 | Yanagita |
| 2017/0330906 | A1* | 11/2017 | Korobov ........... H01L 27/14689 |
| 2018/0090435 | A1 | 3/2018 | Roy |
| 2018/0158860 | A1 | 6/2018 | Roy |
| 2018/0213173 | A1* | 7/2018 | Oh ....................... H04N 25/622 |
| 2019/0289239 | A1* | 9/2019 | Gomi ..................... H04N 25/77 |
| 2019/0363130 | A1 | 11/2019 | Yokoyama et al. |
| 2020/0066773 | A1 | 2/2020 | Tashiro et al. |

FOREIGN PATENT DOCUMENTS

| | | |
|---|---|---|
| JP | 2007-095917 | 4/2007 |
| JP | 2010-245506 | 10/2010 |
| JP | 2010-278080 | 12/2010 |
| JP | 2011-139069 | 7/2011 |
| JP | 2011-243747 | 12/2011 |
| JP | 2012-028665 | 2/2012 |
| JP | 2014022561 A | 2/2014 |
| JP | 2014-123771 | 7/2014 |
| JP | 2015-153772 | 8/2015 |
| JP | 2015-154188 | 8/2015 |
| JP | 2015-188083 | 10/2015 |
| JP | 2017-027982 | 2/2017 |
| JP | 2018-129374 | 8/2018 |
| JP | 2018-148116 | 9/2018 |
| KR | 20140113633 A | 9/2014 |
| TW | 201909383 A | 3/2019 |
| WO | WO 2018/110303 | 6/2008 |
| WO | WO 2013/094430 | 6/2013 |
| WO | WO 2014/185085 | 11/2014 |
| WO | WO 2015/016140 | 6/2015 |

* cited by examiner

SOLID-STATE IMAGING DEVICE

CROSS REFERENCE TO RELATED APPLICATIONS

This application is a national stage application under 35 U.S.C. 371 and claims the benefit of PCT Application No. PCT/JP2020/025329 having an international filing date of 26 Jun. 2020, which designated the United States, which PCT application claimed the benefit of Japanese Patent Application No. 2019-118222 filed 26 Jun. 2019, the entire disclosures of each of which are incorporated herein by reference.

TECHNICAL FIELD

The present disclosure relates to a solid-state imaging device including a plurality of semiconductor layers that are stacked on each other.

BACKGROUND ART

Recently, for a solid-state imaging device, development of a CMOS (Complementary Metal Oxide Semiconductor) image sensor has advanced. For example, PTL 1 discloses a solid-state imaging device in which a semiconductor wafer including a pixel array section and a semiconductor wafer including a logic circuit are stacked.

CITATION LIST

Patent Literature

PTL 1: Japanese Unexamined Patent Application Publication No. 2010-245506

SUMMARY OF THE INVENTION

In such a solid-state imaging device, further enhancement of flexibility in design is desired.

It is therefore desirable to provide a solid-state imaging device that makes it possible to further enhance flexibility in design.

A solid-state imaging device (1) according to an embodiment of the present disclosure includes: a first semiconductor layer including a photoelectric converter and an electric charge accumulation section for each pixel, the electric charge accumulation section in which a signal electric charge generated in the photoelectric converter is accumulated; a pixel separation section that is provided in the first semiconductor layer, and partitions a plurality of the pixels from each other; a second semiconductor layer that is provided with a pixel transistor and is stacked on the first semiconductor layer, the pixel transistor that reads the signal electric charge of the electric charge accumulation section; and a first shared coupling section that is provided between the second semiconductor layer and the first semiconductor layer, and is provided to straddle the pixel separation section and is electrically coupled to a plurality of the electric charge accumulation sections.

A solid-state imaging device (2) according to an embodiment of the present disclosure includes: a first semiconductor layer including a photoelectric converter and an electric charge accumulation section for each pixel, the electric charge accumulation section in which a signal electric charge generated in the photoelectric converter is accumulated; a second semiconductor layer that is provided with a pixel transistor and is stacked on the first semiconductor layer, the pixel transistor that reads the signal electric charge of the electric charge accumulation section; an insulating region that divides the second semiconductor layer; and a through electrode that penetrates through the insulating region in a thickness direction and is electrically coupled to the first semiconductor layer, and includes a first portion and a second portion from side of the first semiconductor layer in the thickness direction, the second portion being bonded to the first portion.

A solid-state imaging device (3) according to an embodiment of the present disclosure includes: a first semiconductor layer including a photoelectric converter and an electric charge accumulation section for each pixel, the electric charge accumulation section in which a signal electric charge generated in the photoelectric converter is accumulated; a second semiconductor layer that is provided with a pixel transistor and is stacked on the first semiconductor layer, the pixel transistor that reads the signal electric charge of the electric charge accumulation section; an insulating region that divides the second semiconductor layer; and an element separation region provided in a portion in a thickness direction from a front surface of the semiconductor layer.

A solid-state imaging device (4) according to an embodiment of the present disclosure includes: a first substrate including a photoelectric converter and an electric charge accumulation section for each pixel, the electric charge accumulation section in which a signal electric charge generated in the photoelectric converter is accumulated; a second substrate that is provided with a pixel transistor and includes a second semiconductor layer and an insulating region, the pixel transistor that reads the signal electric charge of the electric charge accumulation section, the second semiconductor layer being stacked on the first substrate, and the insulating region that divides the second semiconductor layer; a through electrode that penetrates through the insulating region in the thickness direction to reach the first substrate; and a coupling section that is provided in the second substrate and disposed at a position opposed to the second semiconductor layer, and has a hole diameter different from a hole diameter of the through electrode.

A solid-state imaging device (5) according to an embodiment of the present disclosure includes: a first substrate including a photoelectric converter and an electric charge accumulation section for each pixel, the electric charge accumulation section in which a signal electric charge generated in the photoelectric converter is accumulated; a second substrate that is provided with a pixel transistor and is stacked on the first substrate, the pixel transistor that reads the signal electric charge of the electric charge accumulation section; a bonding film that is provided at a bonding surface between the second substrate and the first substrate, and is provided in a selective region between the second substrate and the first substrate; and a through electrode that is disposed in a gap of the bonding film, and electrically couples the second substrate and the first substrate to each other.

A solid-state imaging device (6) according to an embodiment of the present disclosure includes: a first semiconductor layer including a photoelectric converter and an electric charge accumulation section for each pixel, the electric charge accumulation section in which a signal electric charge generated in the photoelectric converter is accumulated; and a second semiconductor layer that is provided with a pixel transistor and is stacked on the first semiconductor layer, the pixel transistor that has a three-dimensional structure and reads the signal electric charge of the electric charge accumulation section.

A solid-state imaging device (7) according to an embodiment of the present disclosure includes: a first semiconductor layer including a photoelectric converter and an electric charge accumulation section for each pixel, the electric charge accumulation section in which a signal electric charge generated in the photoelectric converter is accumulated; a transfer transistor that includes a gate electrode opposed to the first semiconductor layer, and transfers the signal electric charge of the photoelectric converter to the electric charge accumulation section; a second semiconductor layer that is provided with a pixel transistor and is stacked on the first semiconductor layer, the pixel transistor that reads the signal electric charge of the electric charge accumulation section; a third semiconductor layer including a third region electrically coupled to a first region of the first semiconductor layer or a second region of the second semiconductor layer; a protection element having a pn junction in the third semiconductor layer; and an antenna wiring line that is opposed to the first semiconductor layer with the second semiconductor layer interposed therebetween, and is electrically coupled to the protection element, and the pixel transistor or the transfer transistor.

In the solid-state imaging device according to any of the embodiments of the present disclosure, the second semiconductor layer (or the second substrate) provided with the pixel transistor is stacked on the first semiconductor layer (or the first substrate) provided with the photoelectric converter and the electric charge accumulation section for each pixel. Thus, each of the photoelectric converter and the pixel transistor is designed more freely, as compared with a case where the photoelectric converter and the pixel transistor are provided in the same semiconductor layer (or substrate).

BRIEF DESCRIPTION OF DRAWINGS

FIG. 18A is a schematic cross-sectional view of one process of a method of manufacturing an imaging device 1 illustrated in FIG. 6 and the like.

FIG. 73 is a schematic plan view of another example of a pixel separation section illustrated in FIG. 7A and the like.

FIG. 94 is a schematic plan view of the first substrate illustrated in FIG. 93.

FIG. 95A is a schematic cross-sectional view that describes a process of manufacturing a contact section illustrated in FIG. 93.

FIG. 95B is a schematic cross-sectional view of a process following FIG. 95A.

FIG. 95C is a schematic cross-sectional view of a process following FIG. 95B.

FIG. 95D is a schematic cross-sectional view of a process following FIG. 95C.

FIG. 95E is a schematic cross-sectional view of a process following FIG. 95D.

FIG. 95F is a schematic cross-sectional view of a process following FIG. 95E.

FIG. 95G is a schematic cross-sectional view of a process following FIG. 95F.

FIG. 95H is a schematic cross-sectional view of a process following FIG. 95G.

FIG. 96 is a schematic view of another example of the cross-sectional configuration of the main parts of the first substrate and the second substrate according to the modification example 16 of the present disclosure.

FIG. 97 is a schematic plan view of the first substrate illustrated in FIG. 96.

FIG. 98 is a schematic view of another example of a planar configuration of the main part of the first substrate according to the modification example 16 of the present disclosure.

Figure 96:
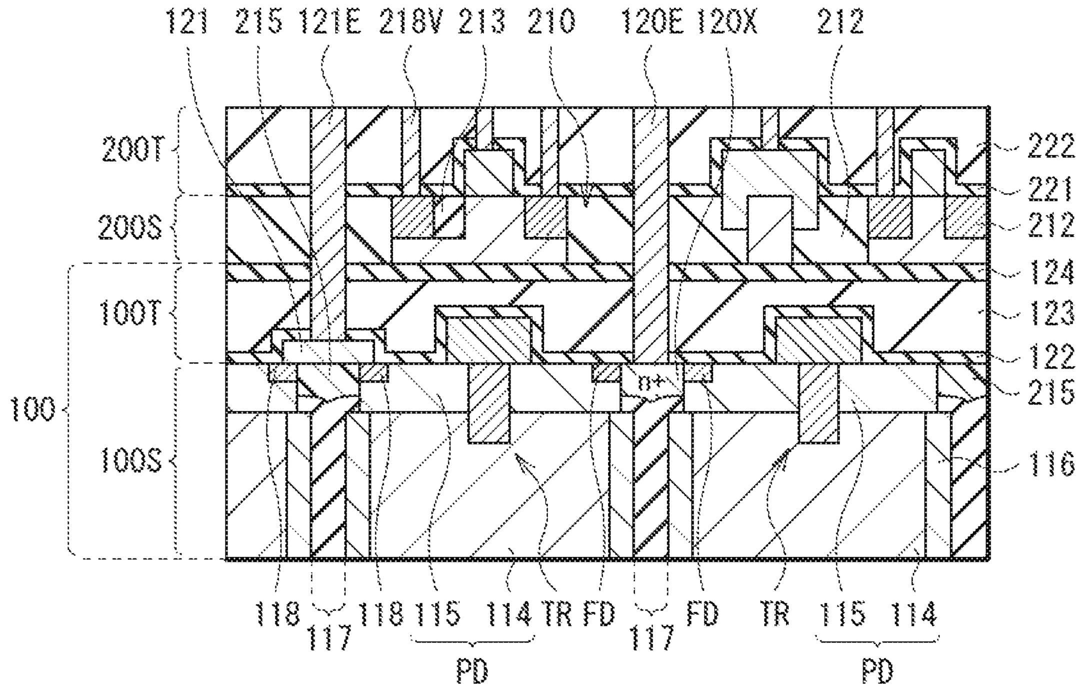
Figure 99A:
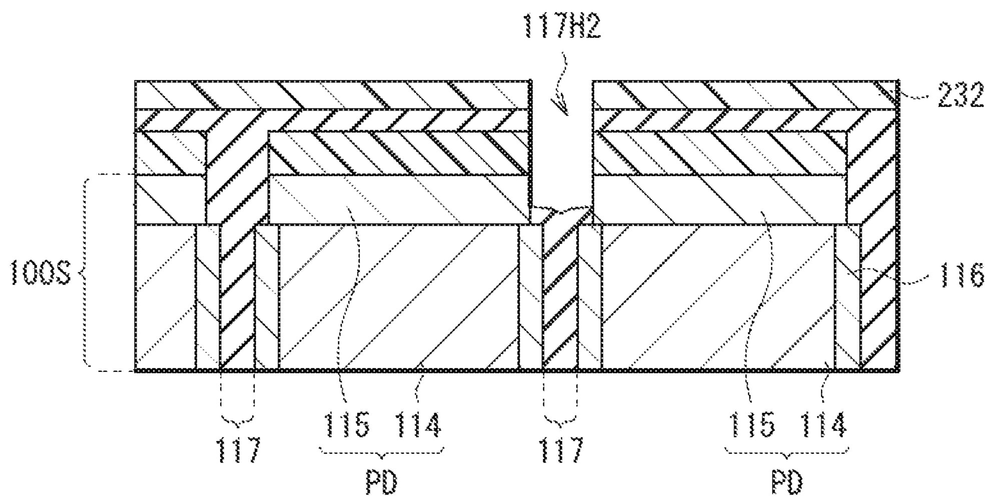

FIG. 99A is a schematic cross-sectional view that describes a process of manufacturing the contact section illustrated in FIG. 96.

Figure 99B:
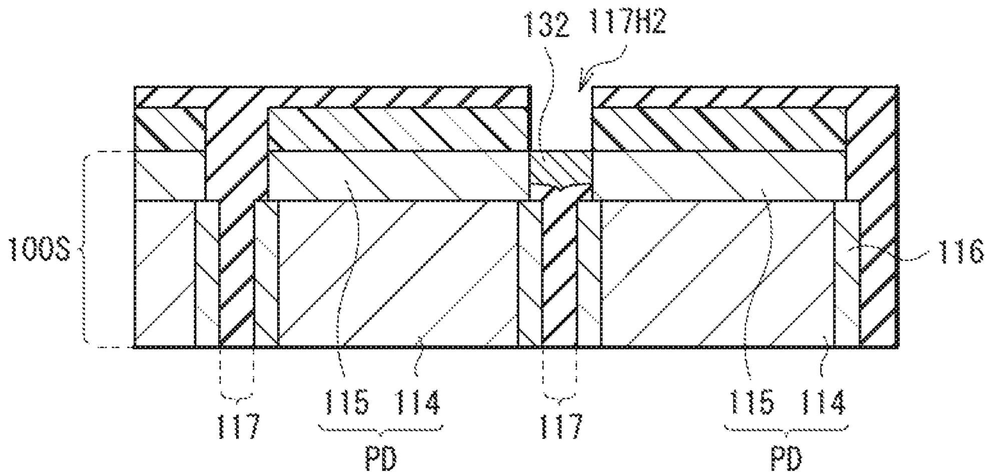

FIG. 99B is a schematic cross-sectional view of a process following FIG. 99A.

Figure 99C:
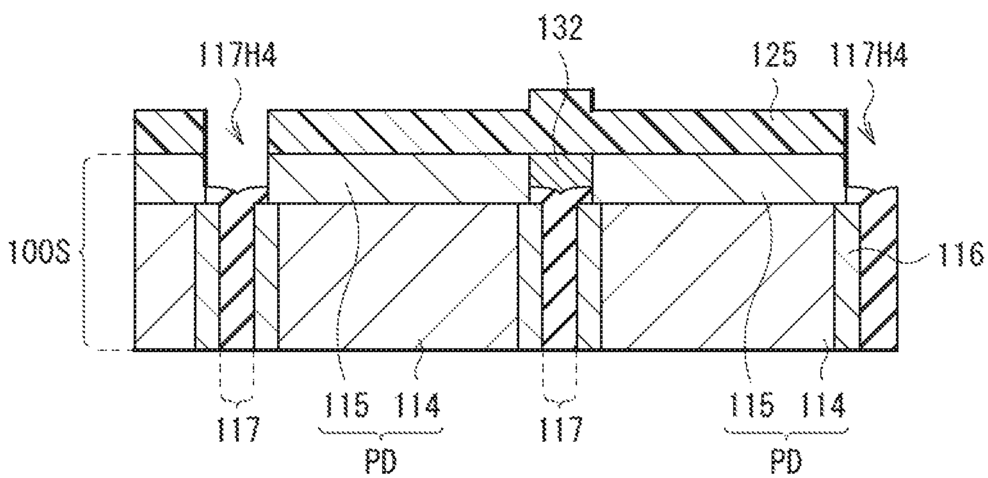

FIG. 99C is a schematic cross-sectional view of a process following FIG. 99B.

Figure 99D:
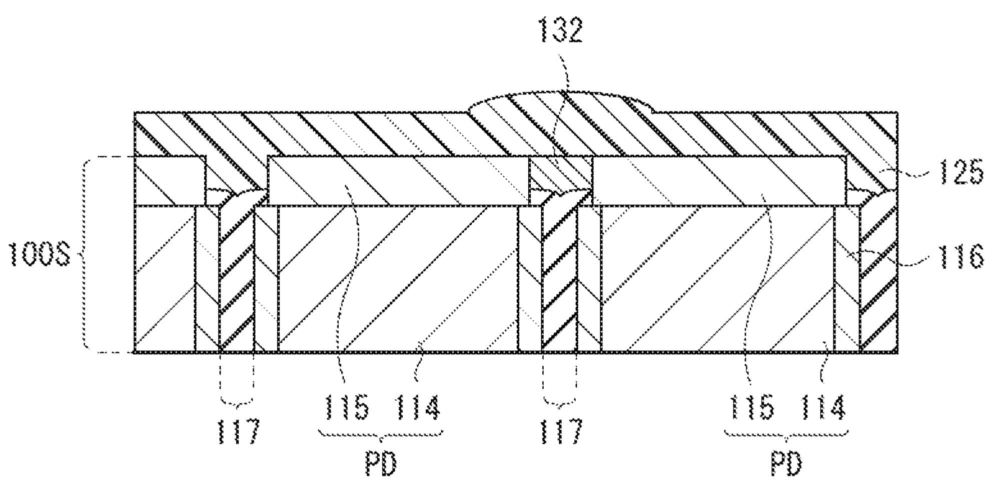

FIG. 99D is a schematic cross-sectional view of a process following FIG. 99C.

Figure 100:
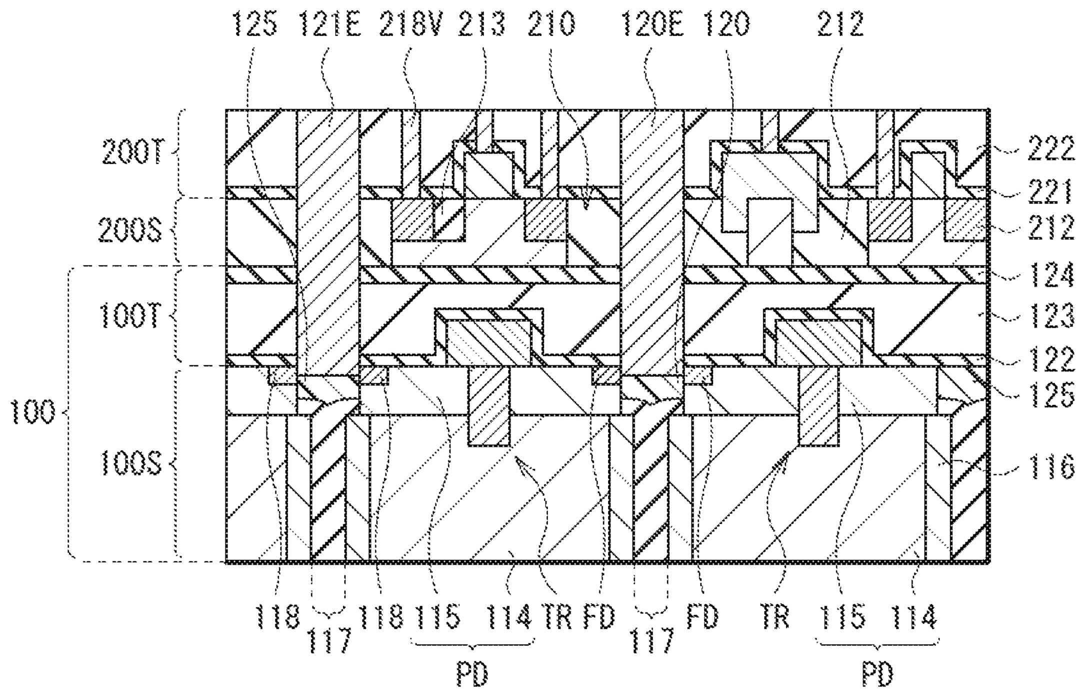

FIG. 100 is a schematic view of another example of the cross-sectional configuration of the main parts of the first substrate and the second substrate according to the modification example 16 of the present disclosure.

Figure 101:
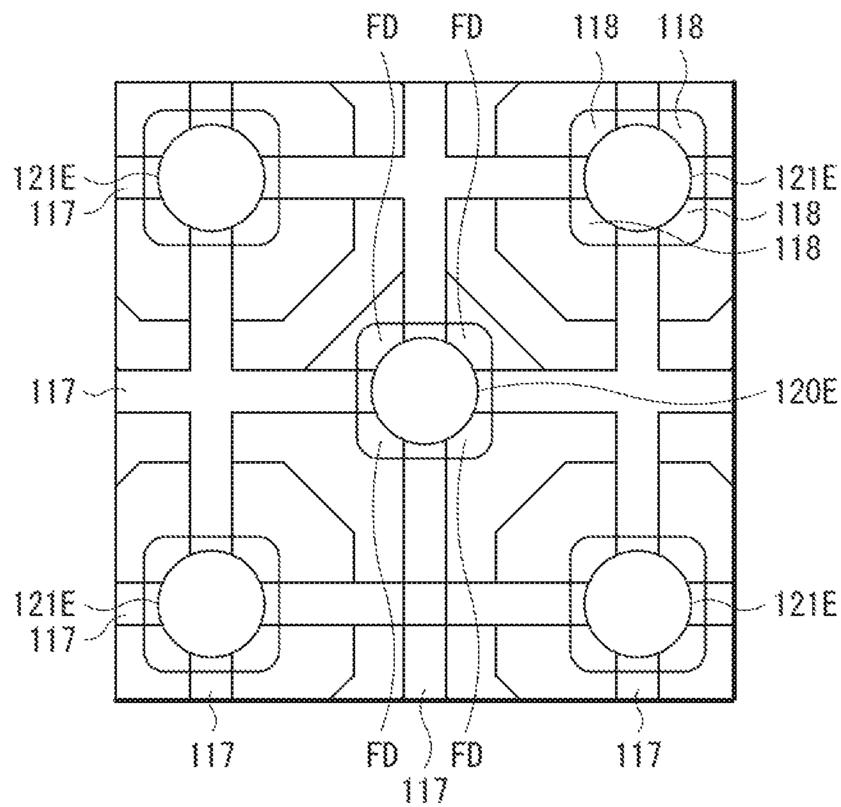

FIG. 101 is a schematic plan view of the first substrate illustrated in FIG. 100.

Figure 102A:
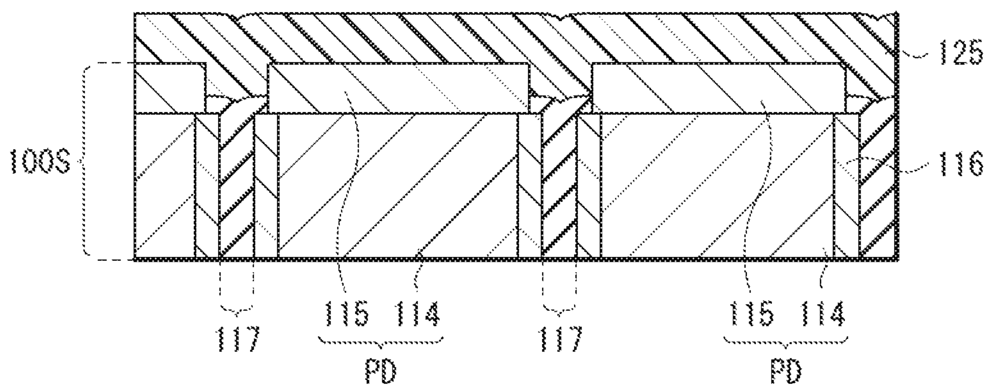

FIG. 102A is a schematic cross-sectional view that describes a process of manufacturing the contact section illustrated in FIG. 100.

Figure 102B:
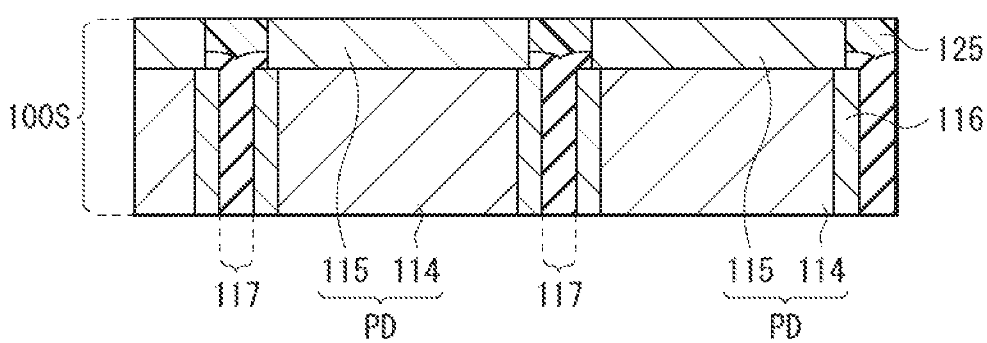

FIG. 102B is a schematic cross-sectional view of a process following FIG. 102A.

Figure 102C:
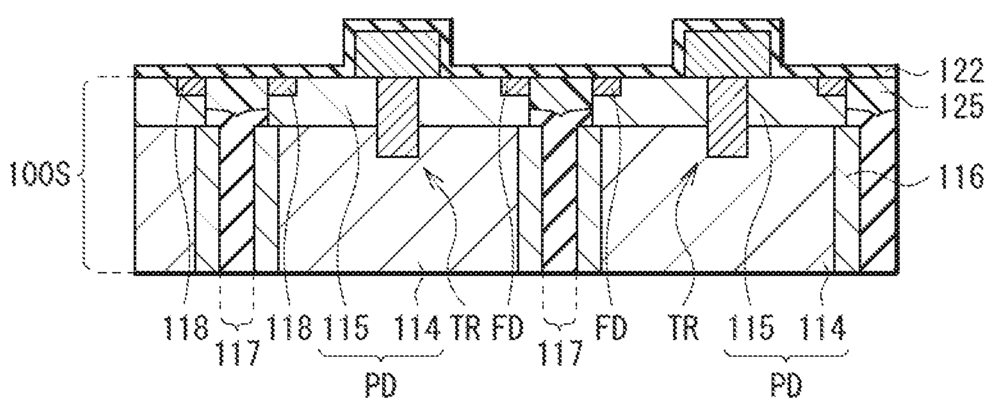

FIG. 102C is a schematic cross-sectional view of a process following FIG. 102B.

Figure 102D:
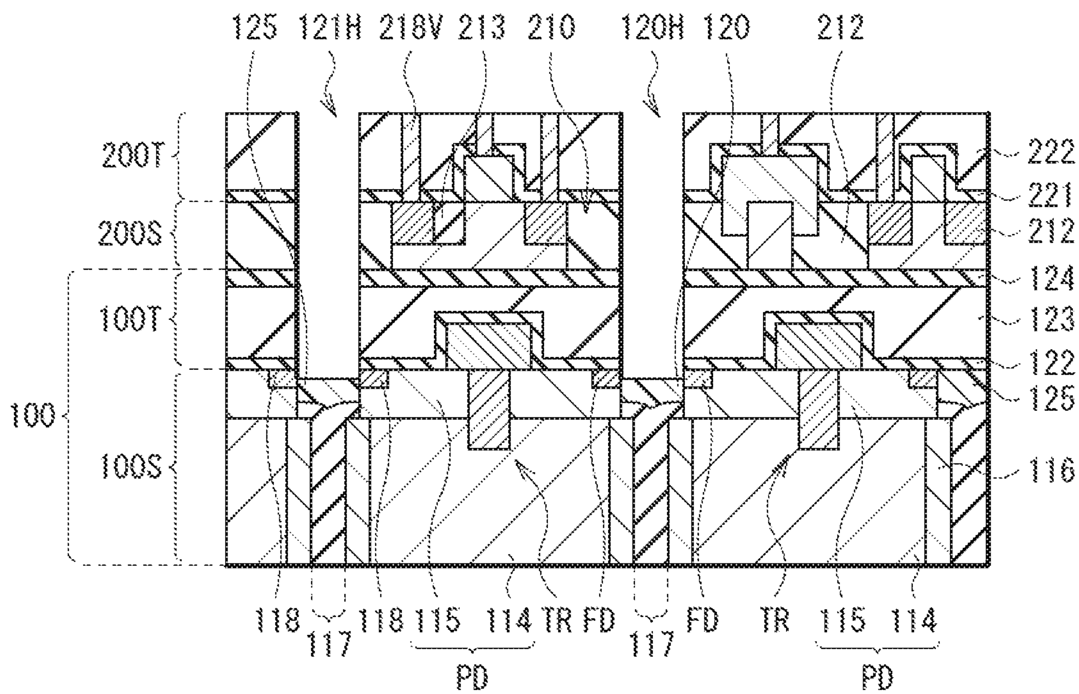

FIG. 102D is a schematic cross-sectional view of a process following FIG. 102C.

Figure 103:
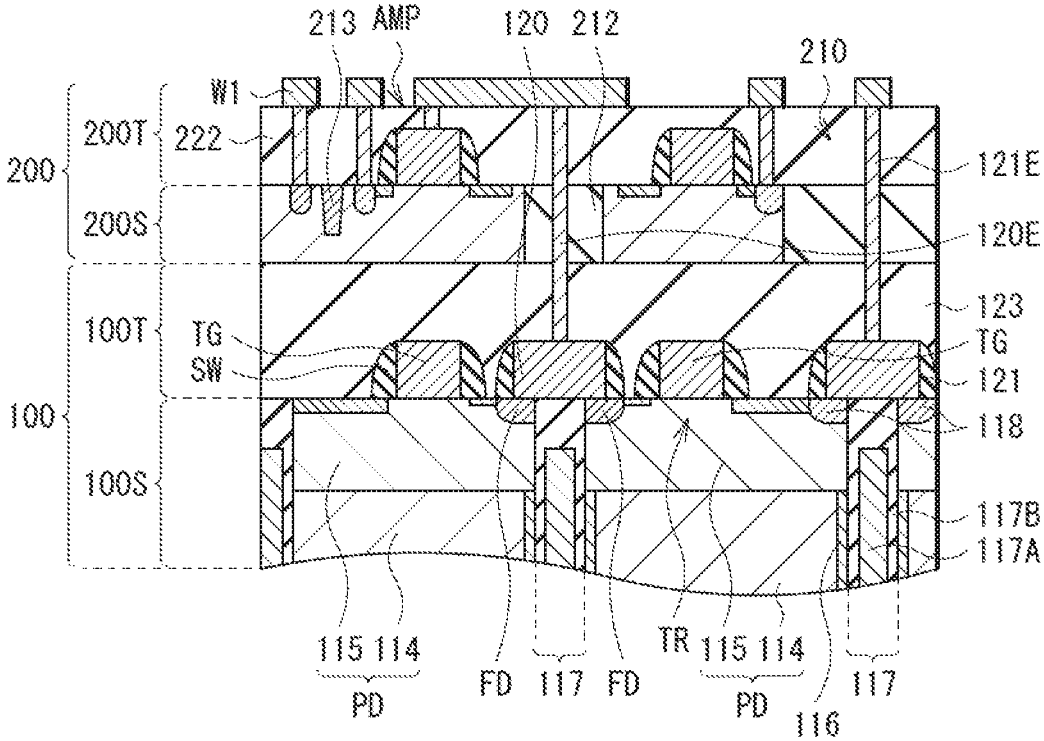

FIG. 103 is a schematic view of an example of a cross-sectional configuration of main parts of a first substrate and a second substrate according to a modification example 17 of the present disclosure.

Figure 104:
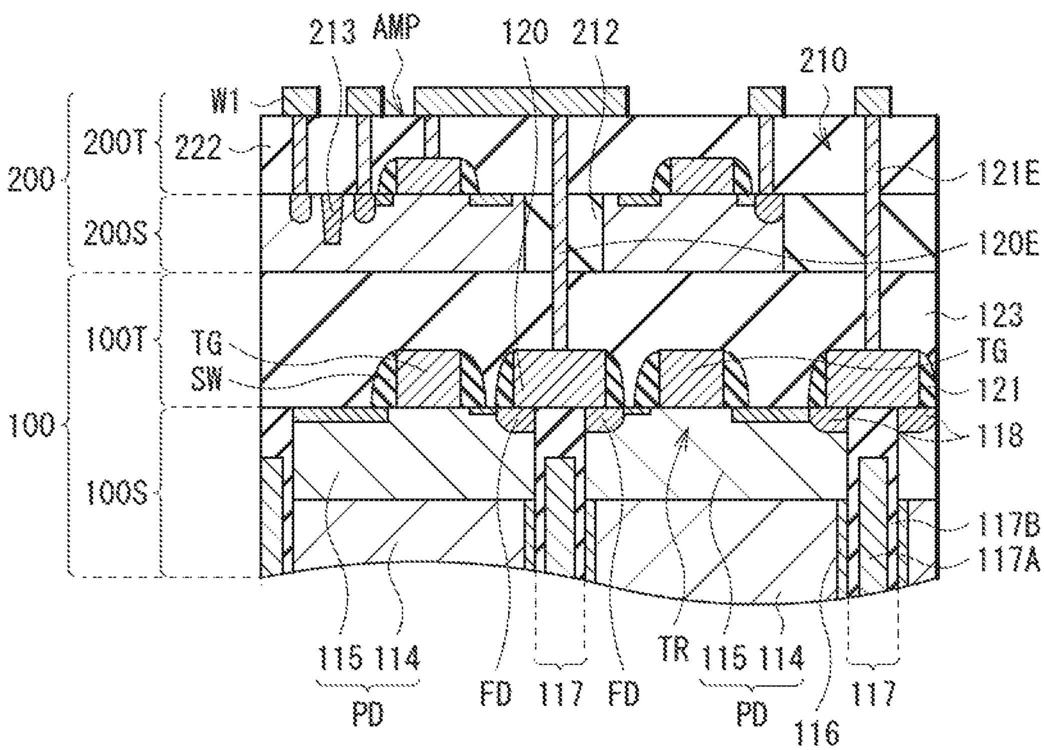

FIG. 104 is a schematic view of another example of the cross-sectional configuration of the main parts of the first substrate and the second substrate according to the modification example 17 of the present disclosure.

Figure 105:
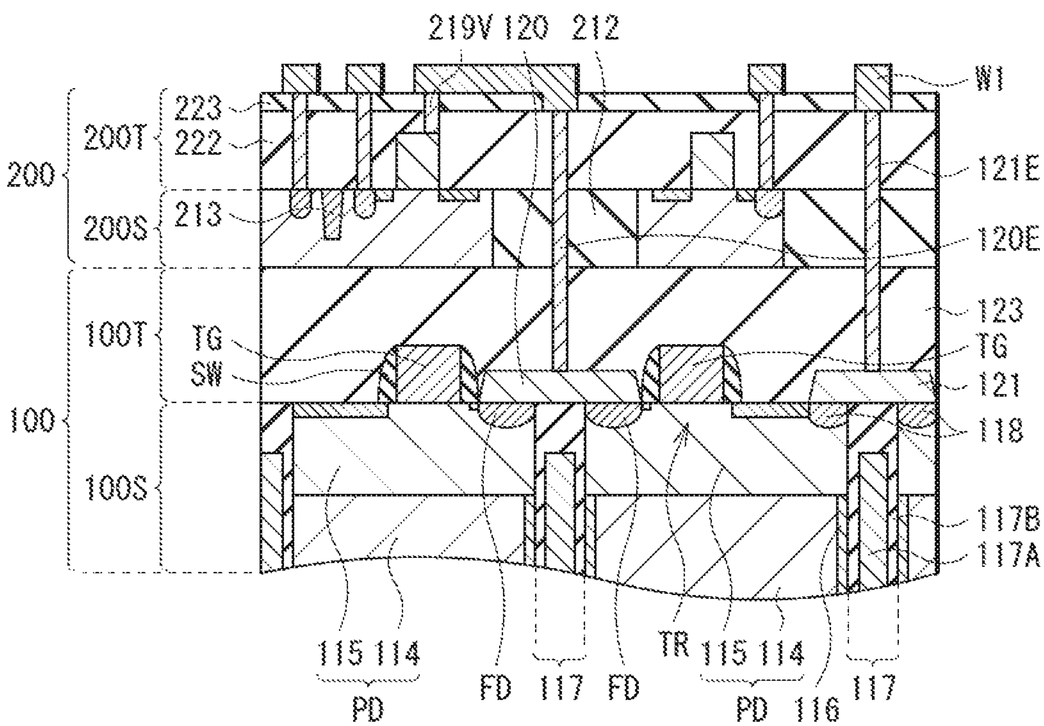

FIG. 105 is a schematic view of an example of a cross-sectional configuration of main parts of a first substrate and a second substrate according to a modification example 18 of the present disclosure.

Figure 106A:
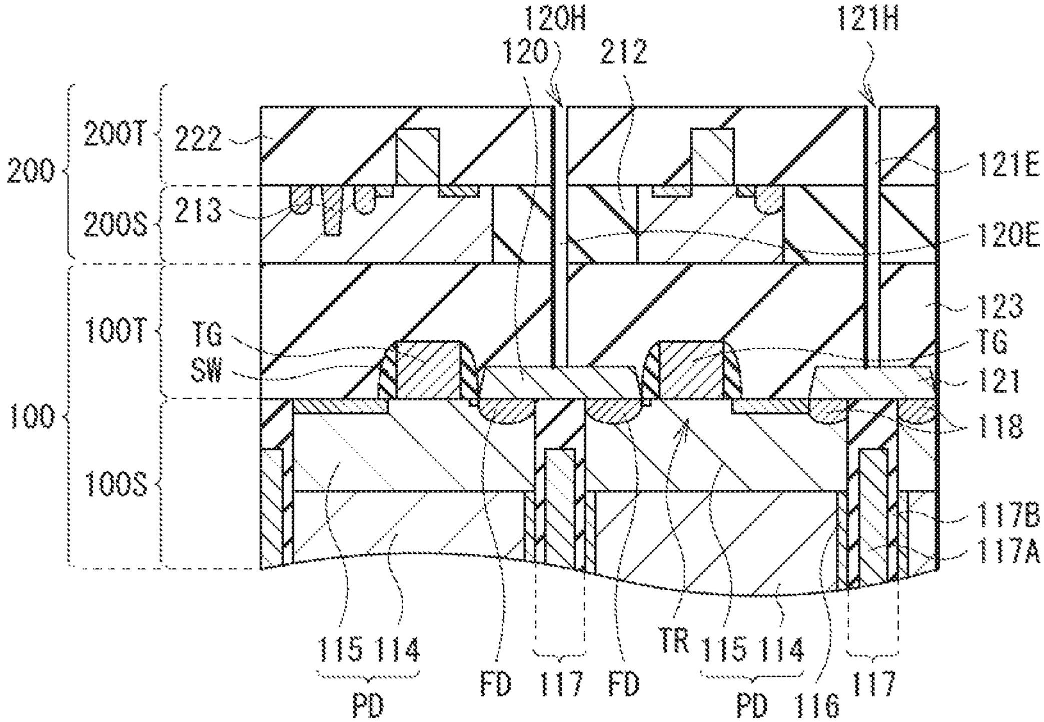

FIG. 106A is a schematic cross-sectional view that describes a process of manufacturing a through electrode and a coupling section illustrated in FIG. 105.

Figure 106B:
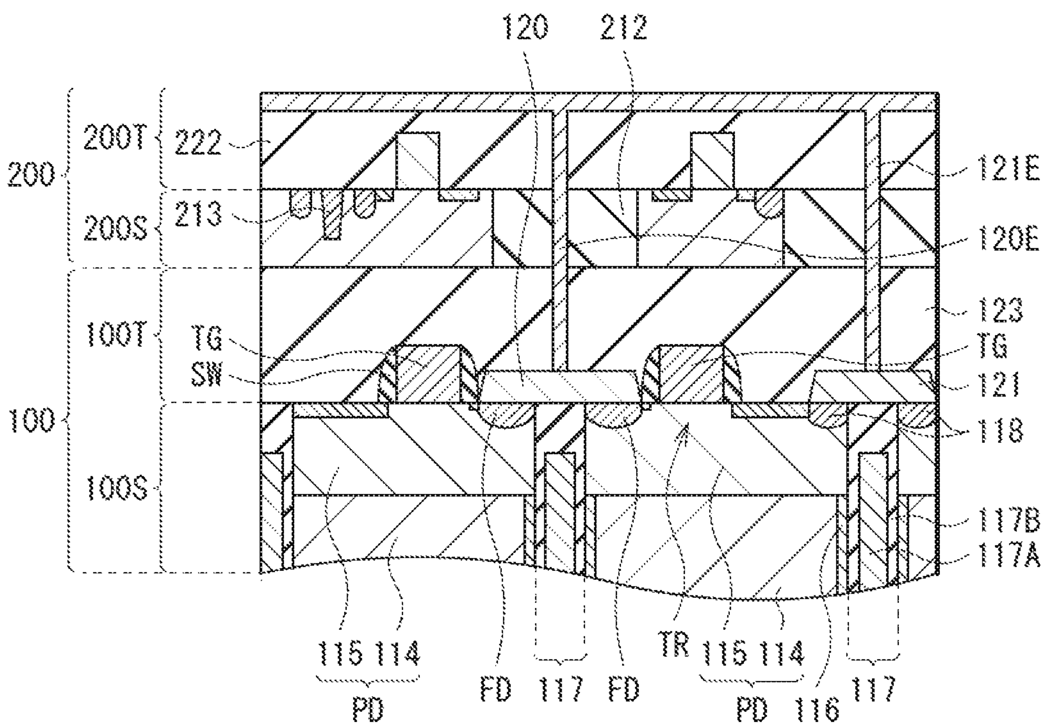

FIG. 106B is a schematic cross-sectional view of a process following FIG. 106A.

Figure 106C:
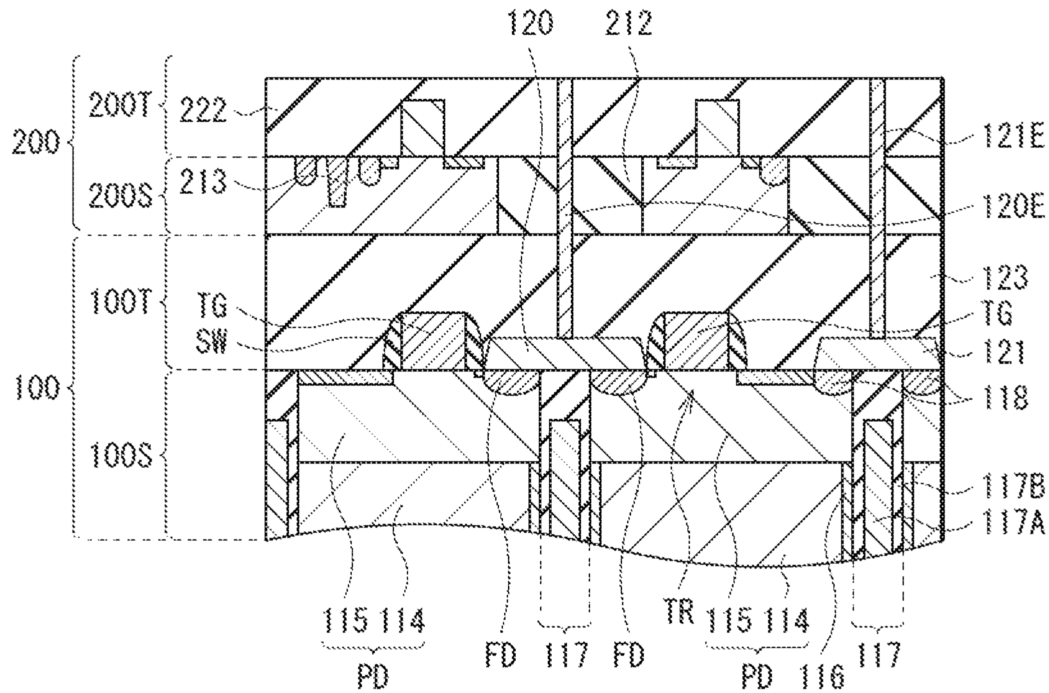

FIG. 106C is a schematic cross-sectional view of a process following FIG. 106B.

Figure 106D:
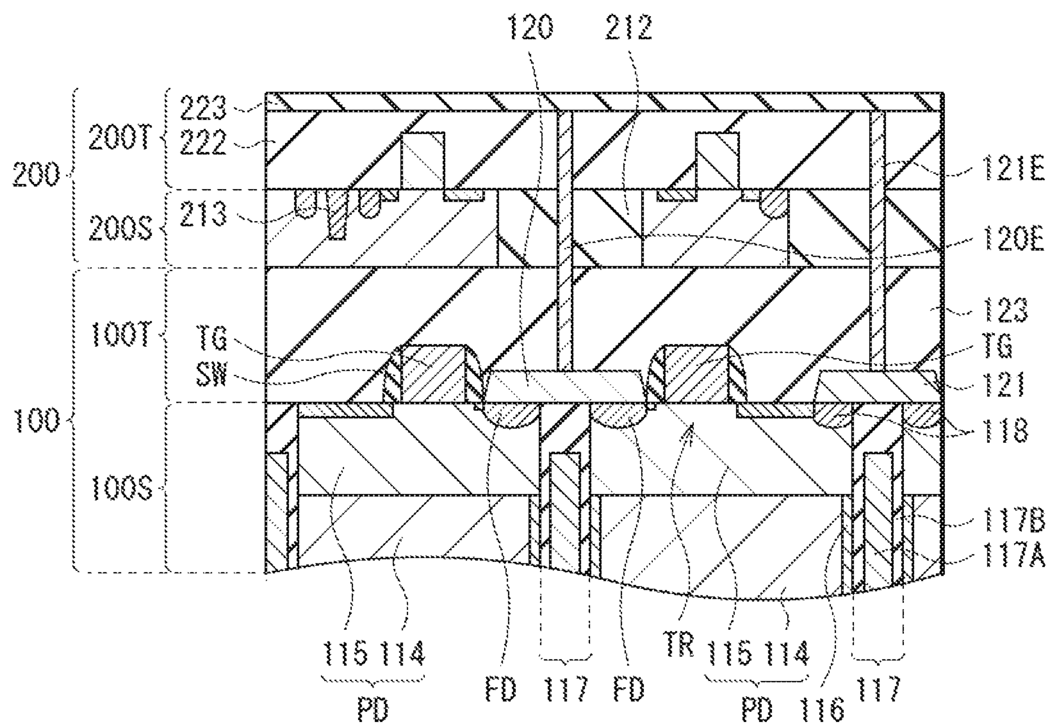

FIG. 106D is a schematic cross-sectional view of a process following FIG. 106C.

Figure 106E:
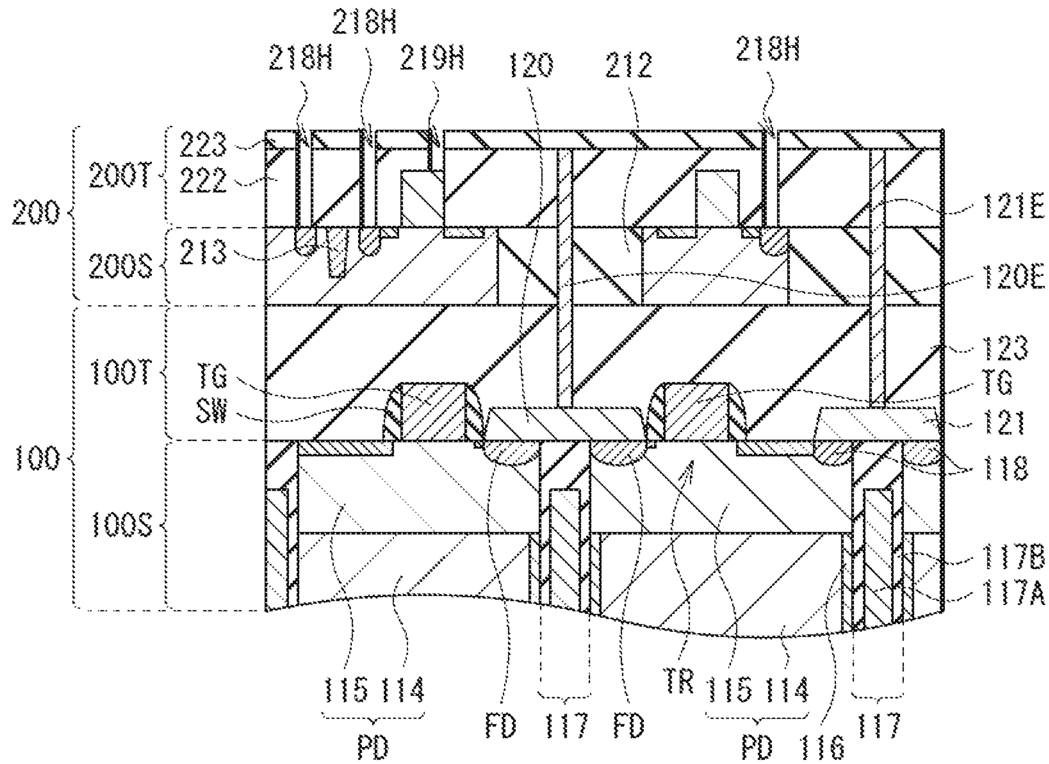

FIG. 106E is a schematic cross-sectional view of a process following FIG. 106D.

Figure 106F:
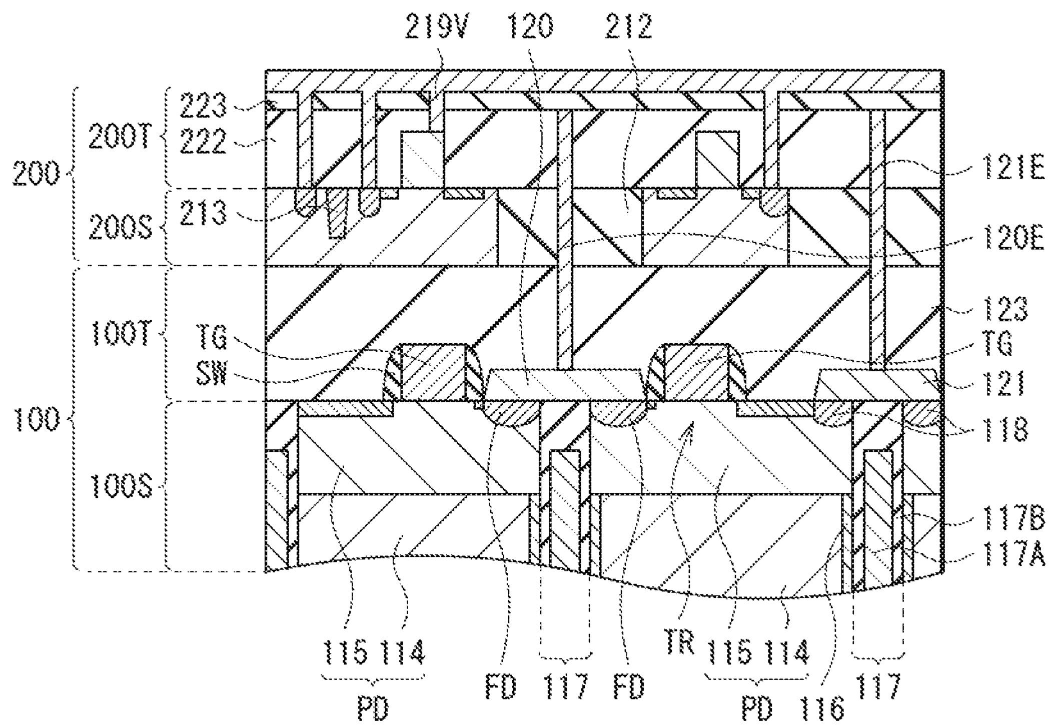

FIG. 106F is a schematic cross-sectional view of a process following FIG. 106E.

Figure 106G:
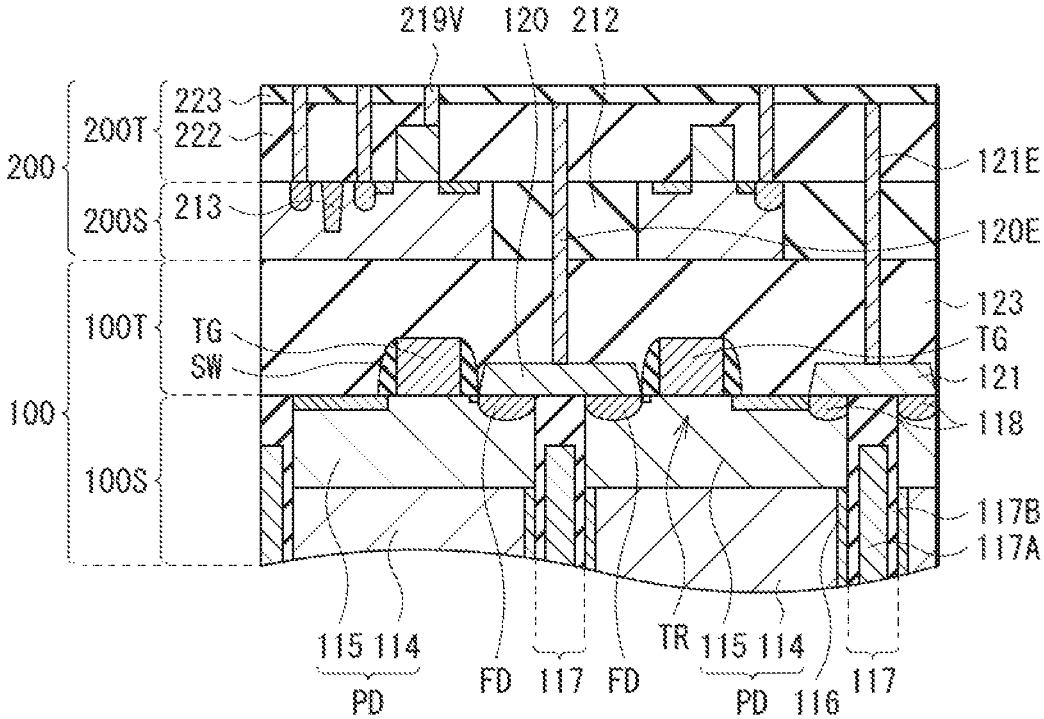

FIG. 106G is a schematic cross-sectional view of a process following FIG. 106F.

Figure 106H:
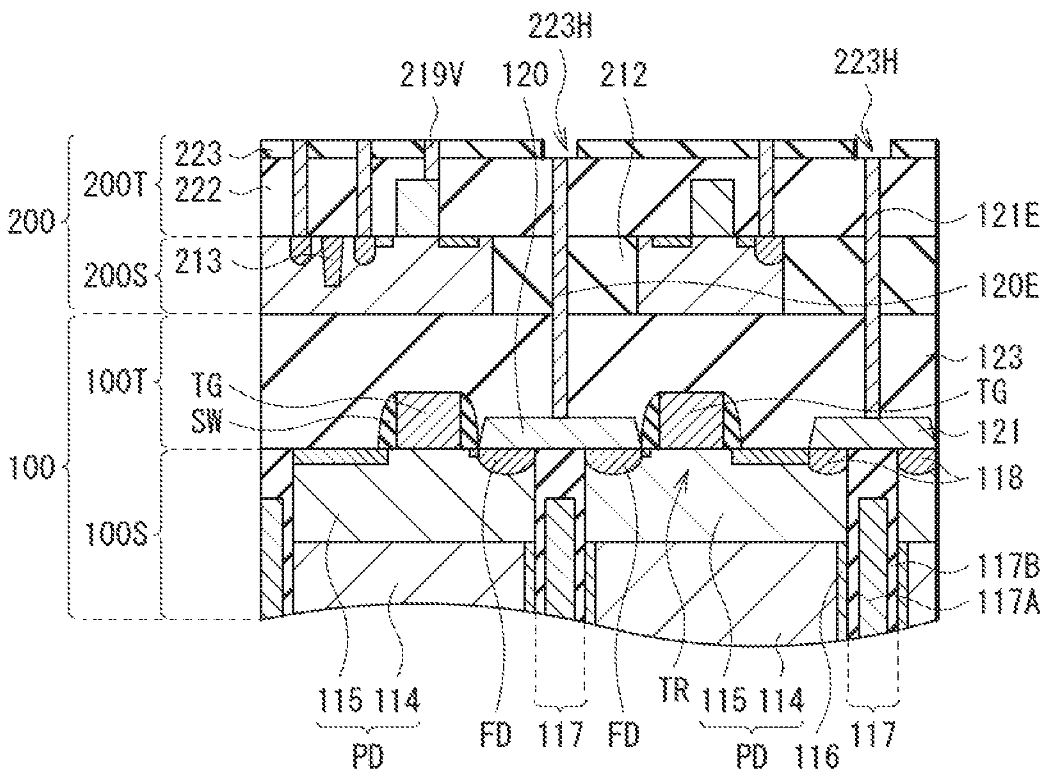

FIG. 106H is a schematic cross-sectional view of a process following FIG. 106G.

Figure 107:
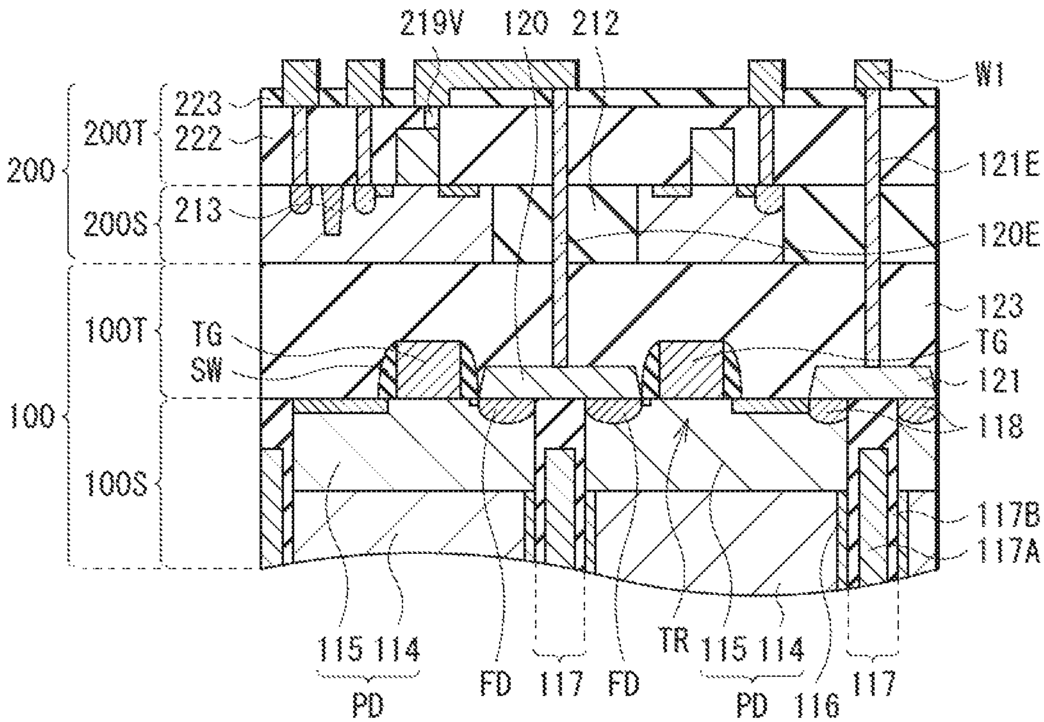

FIG. 107 is a schematic view of another example of the cross-sectional configuration of the main parts of the first substrate and the second substrate according to the modification example 18 of the present disclosure.

Figure 108A:
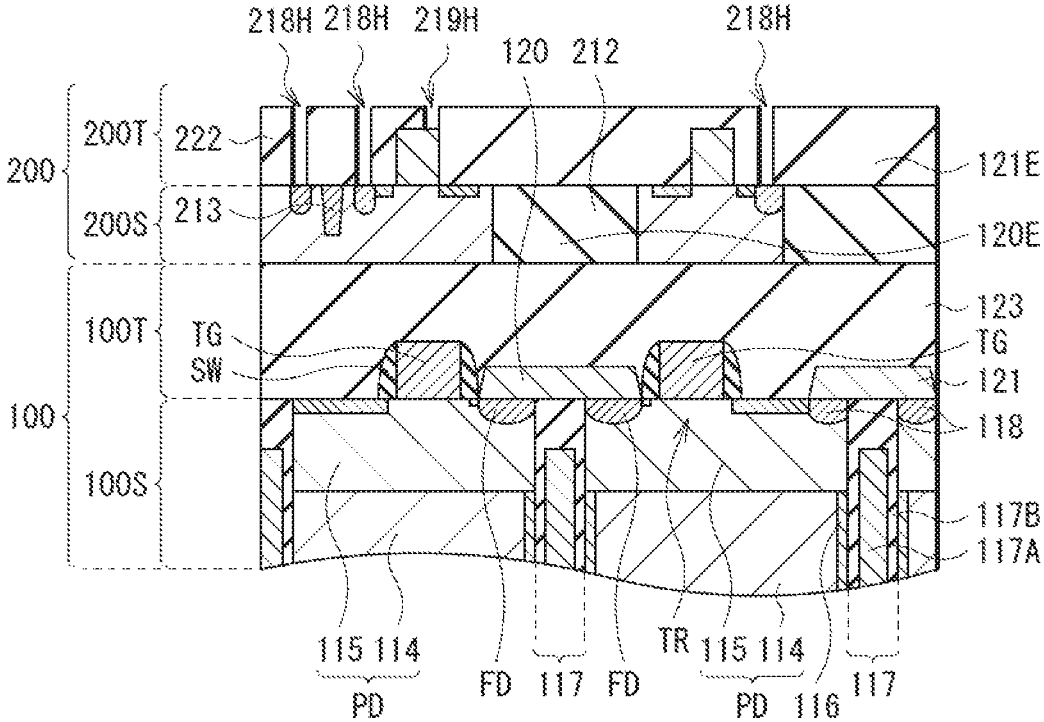

FIG. 108A is a schematic cross-sectional view that describes a process of manufacturing the through electrode and the coupling section illustrated in FIG. 107.

Figure 108B:
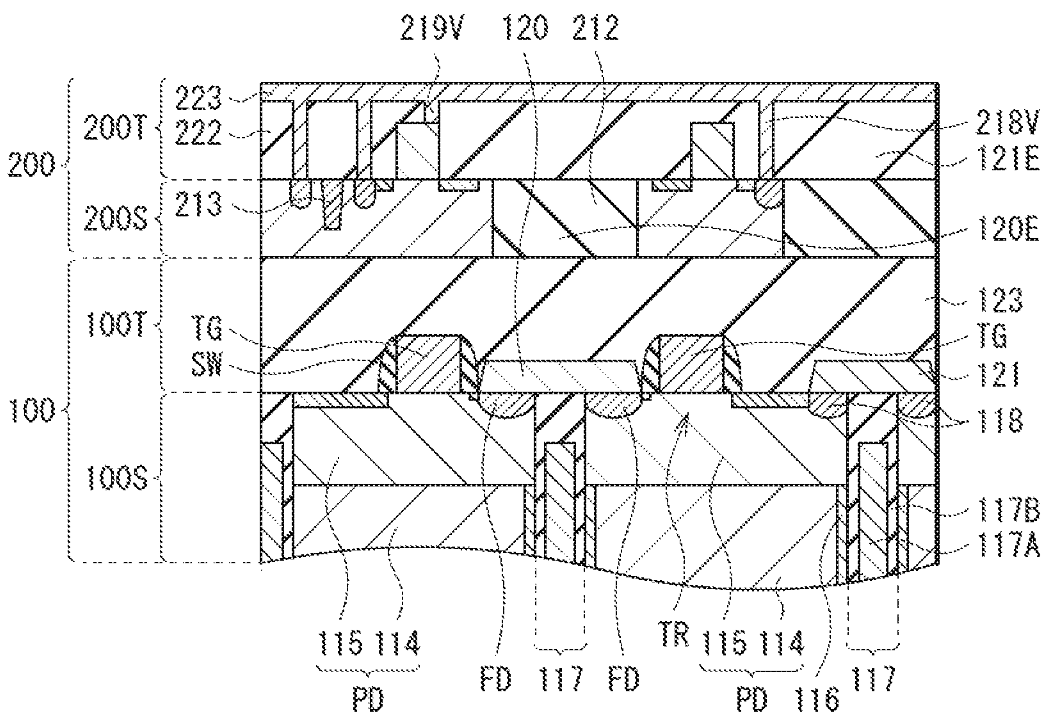

FIG. 108B is a schematic cross-sectional view of a process following FIG. 108A.

Figure 108C:
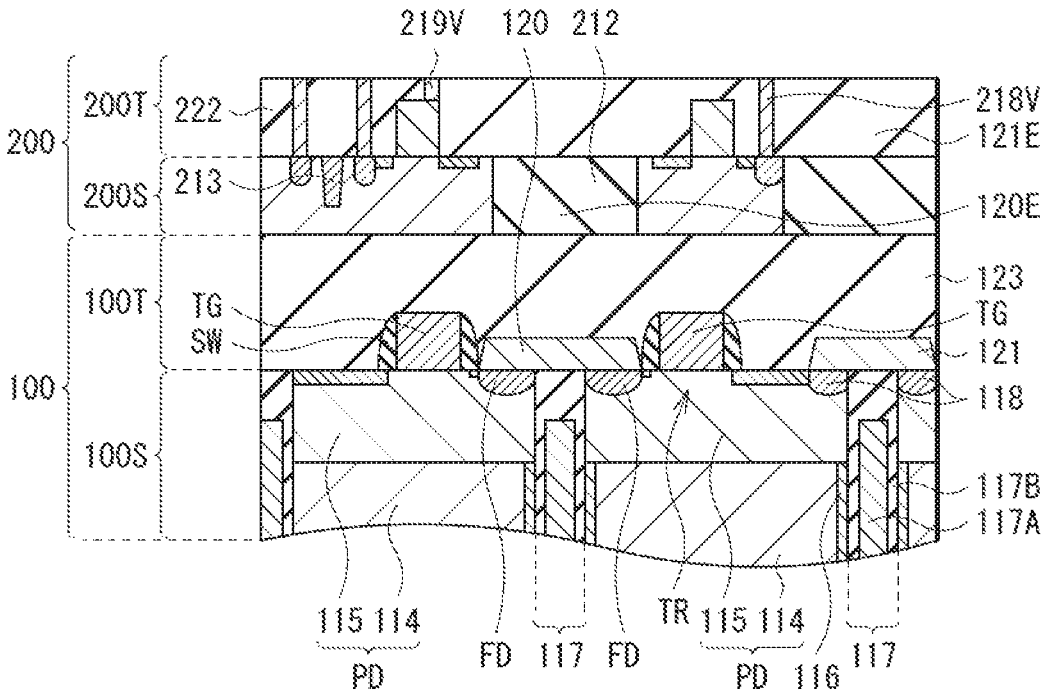

FIG. 108C is a schematic cross-sectional view of a process following FIG. 108B.

Figure 108D:
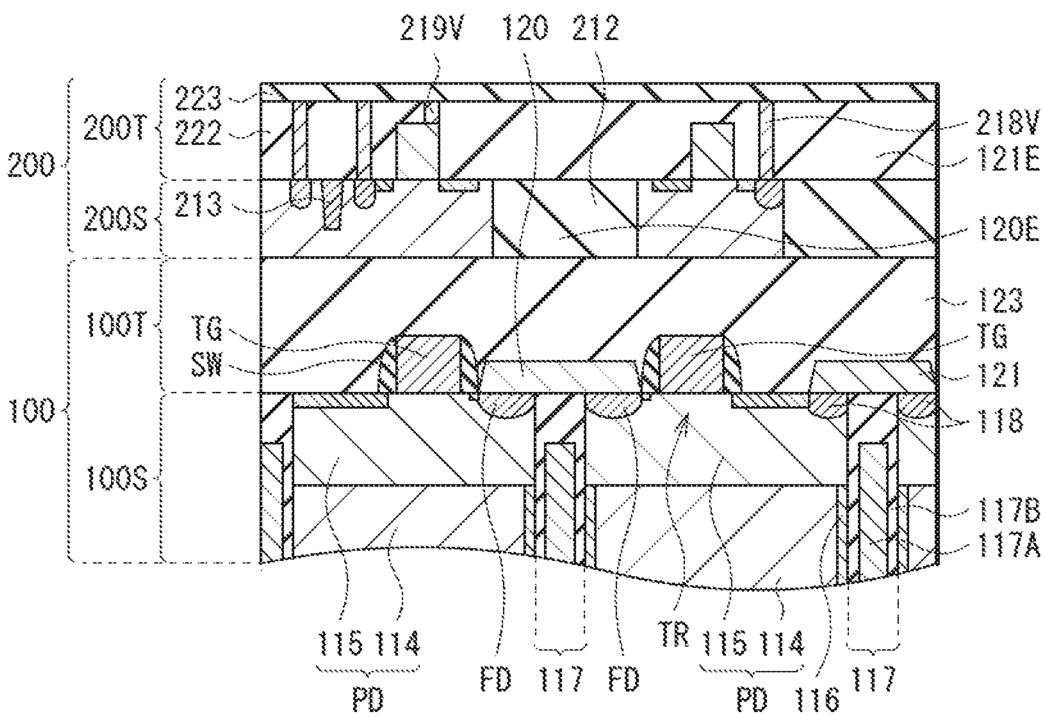

FIG. 108D is a schematic cross-sectional view of a process following FIG. 108C.

Figure 108E:
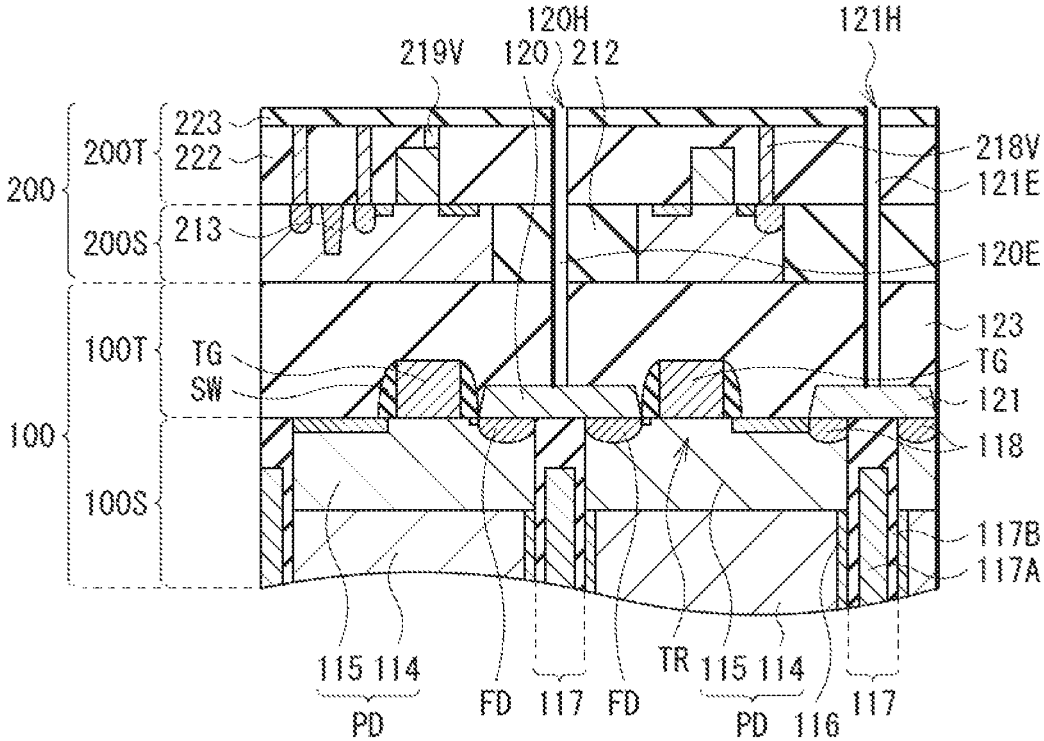

FIG. 108E is a schematic cross-sectional view of a process following FIG. 108D.

Figure 108F:
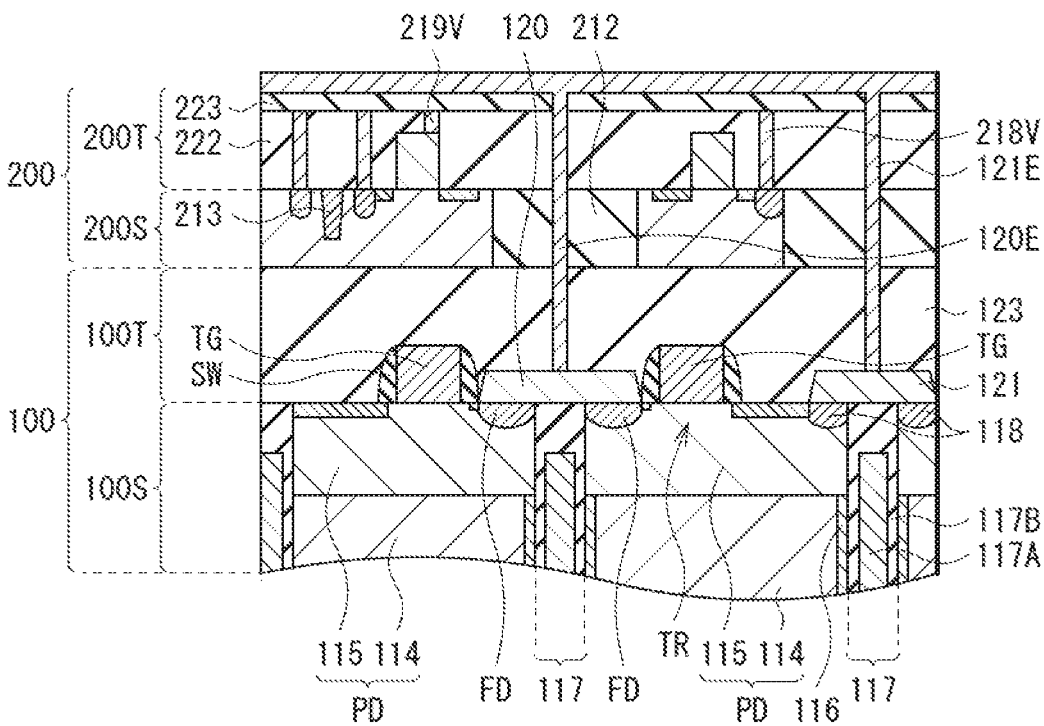

FIG. 108F is a schematic cross-sectional view of a process following FIG. 108E.

Figure 108G:
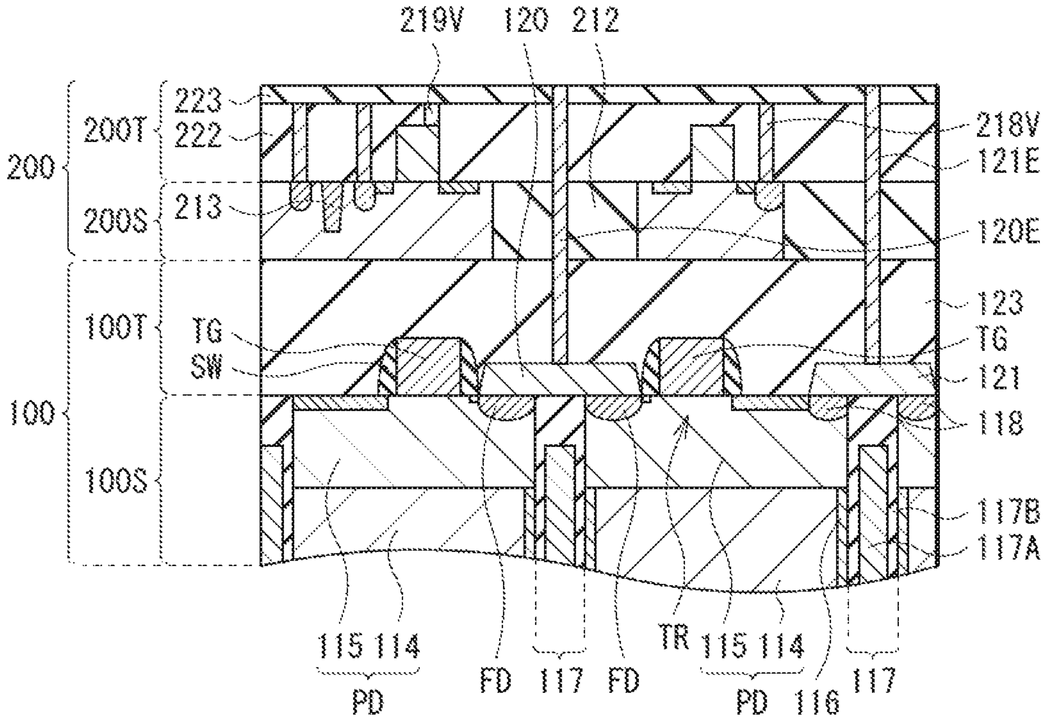

FIG. 108G is a schematic cross-sectional view of a process following FIG. 108F.

Figure 108H:
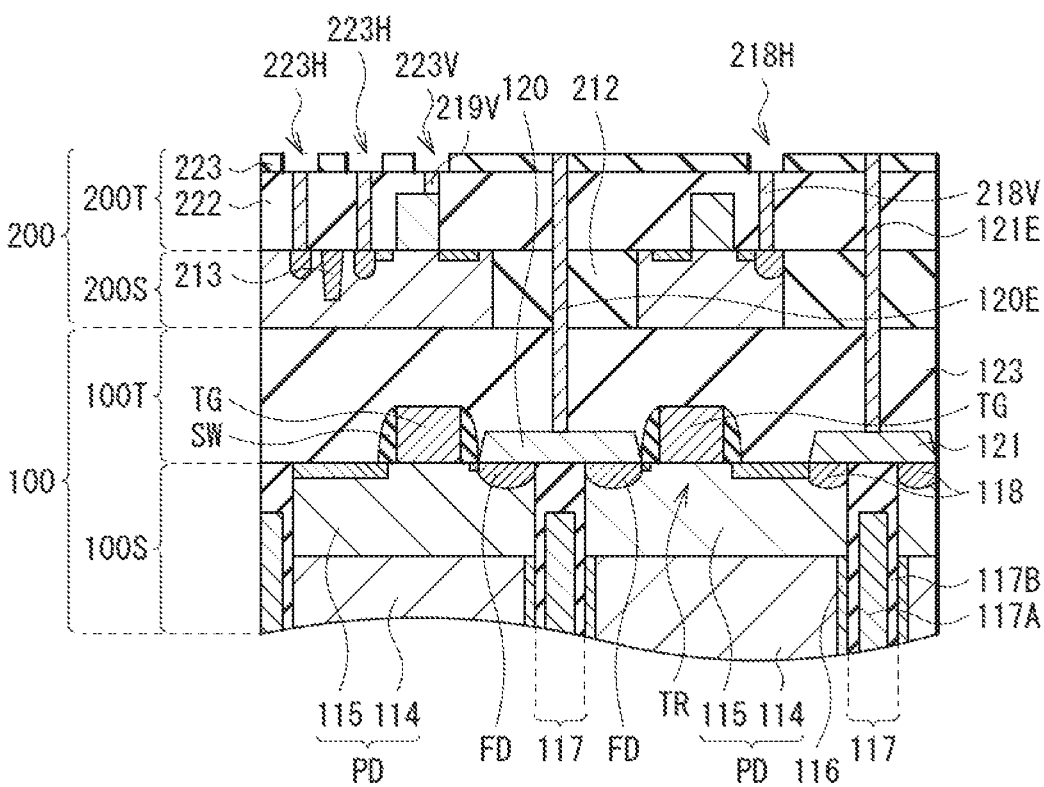

FIG. 108H is a schematic cross-sectional view of a process following FIG. 108G.

Figure 109A:
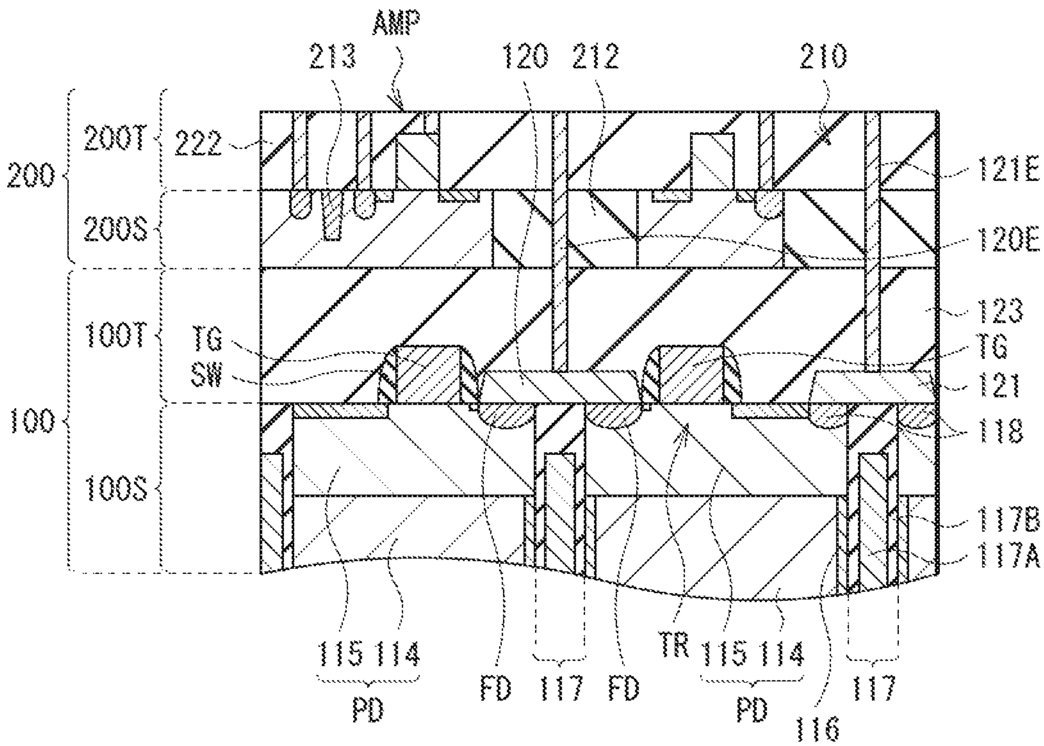

FIG. 109A is a schematic cross-sectional view of another example of the process of manufacturing the through electrode and the coupling section according to the modification example 18 of the present disclosure.

Figure 109B:
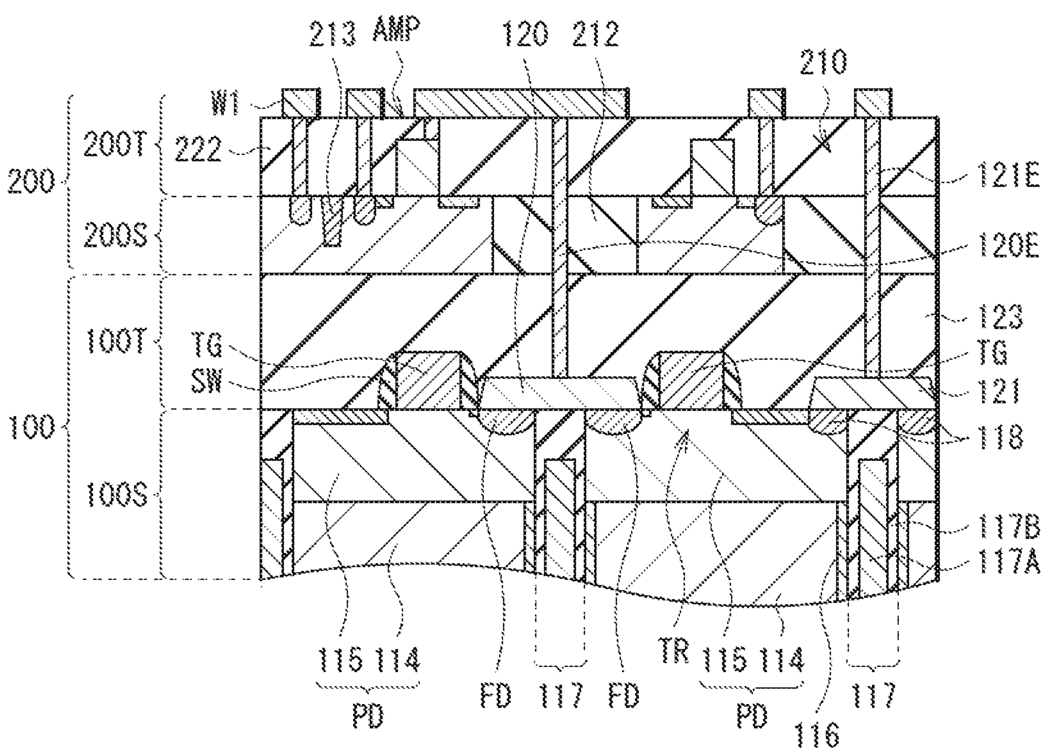

FIG. 109B is a schematic view of an example of a cross-sectional configuration of main parts of the first substrate and the second substrate of an imaging device obtained by a process following FIG. 109A.

Figure 110:
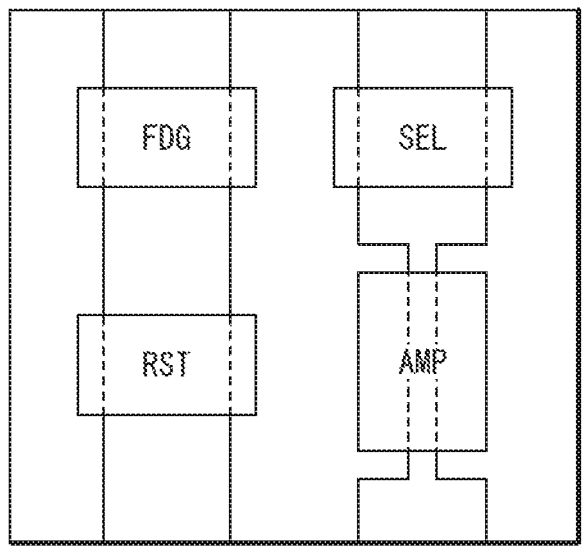

FIG. 110 is a schematic view of an example of a layout of pixel transistors in a modification example 19 of the present disclosure.

Figure 111:
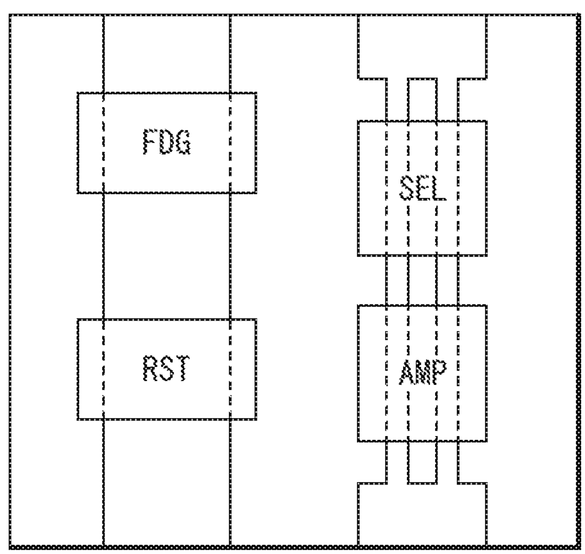

FIG. 111 is a schematic view of another example of the layout of the pixel transistors in the modification example 19 of the present disclosure.

Figure 112:
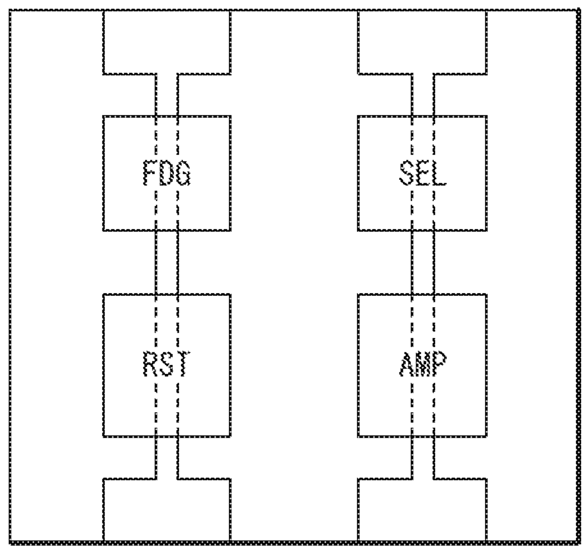

FIG. 112 is a schematic view of another example of the layout of the pixel transistors in the modification example 19 of the present disclosure.

Figure 113:
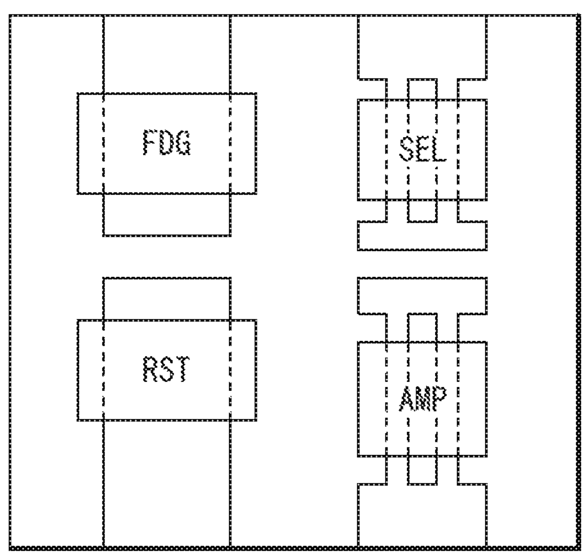

FIG. 113 is a schematic view of another example of the layout of the pixel transistors in the modification example 19 of the present disclosure.

Figure 114:
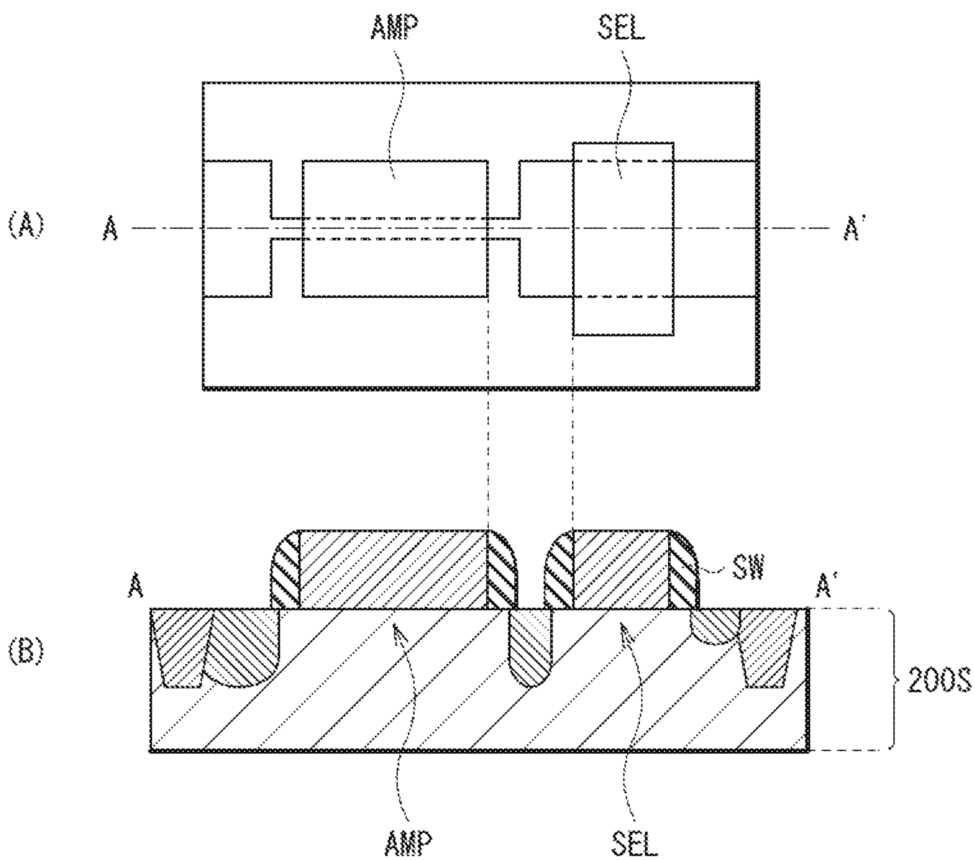

FIG. 114 is a schematic view of a planar configuration (A) and a cross-sectional configuration (B) of an amplification transistor and a selection transistor illustrated in FIG. 110.

Figure 115:
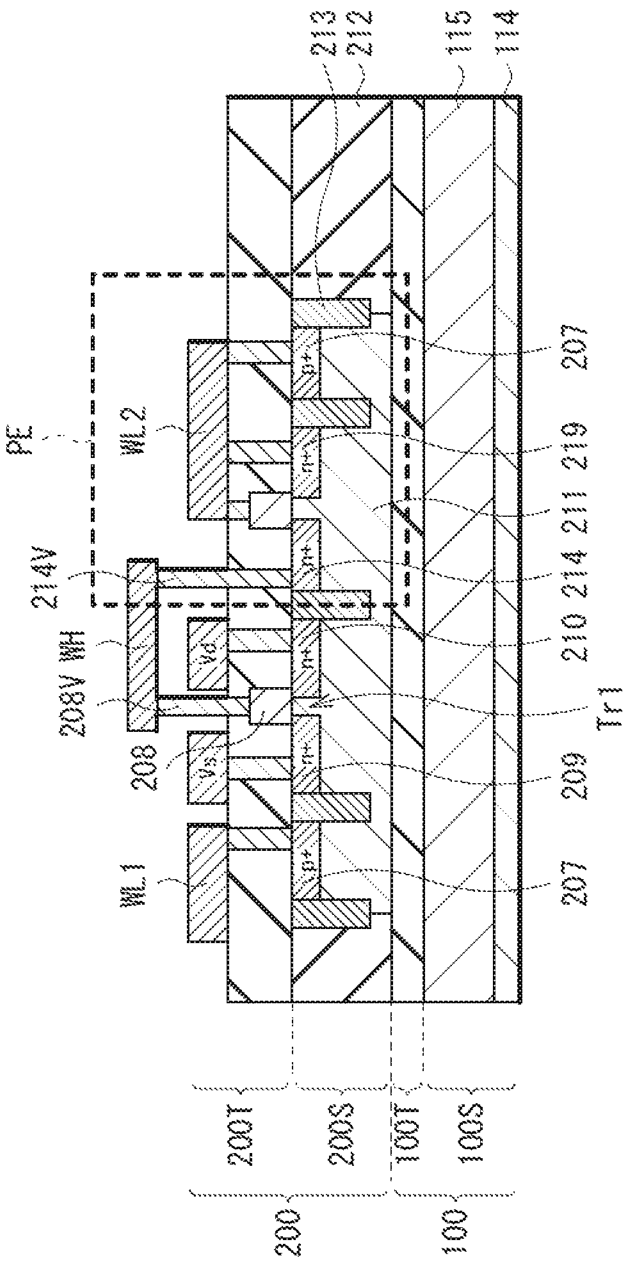

FIG. 115 is a schematic view of an example of a cross-sectional configuration of a main part of an imaging device according to a modification example 20 of the present disclosure.

Figure 116:
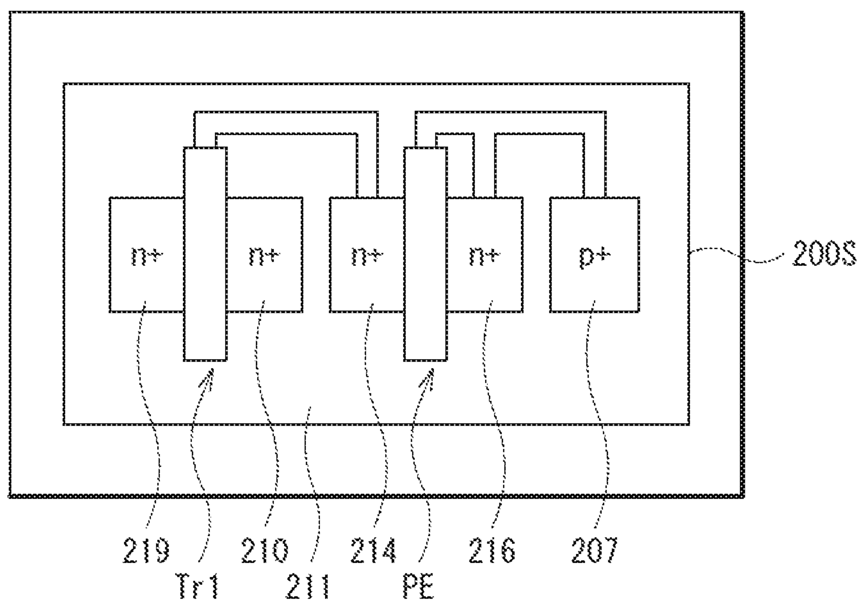

FIG. 116 is a schematic plan view of a relationship between a transistor and a protection element illustrated in FIG. 115.

Figure 117:
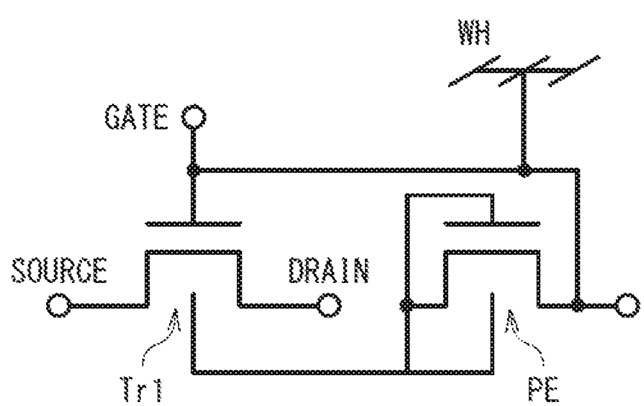

FIG. 117 is a circuit diagram illustrating a relationship between the transistor and the protection element illustrated in FIG. 115.

Figure 118:
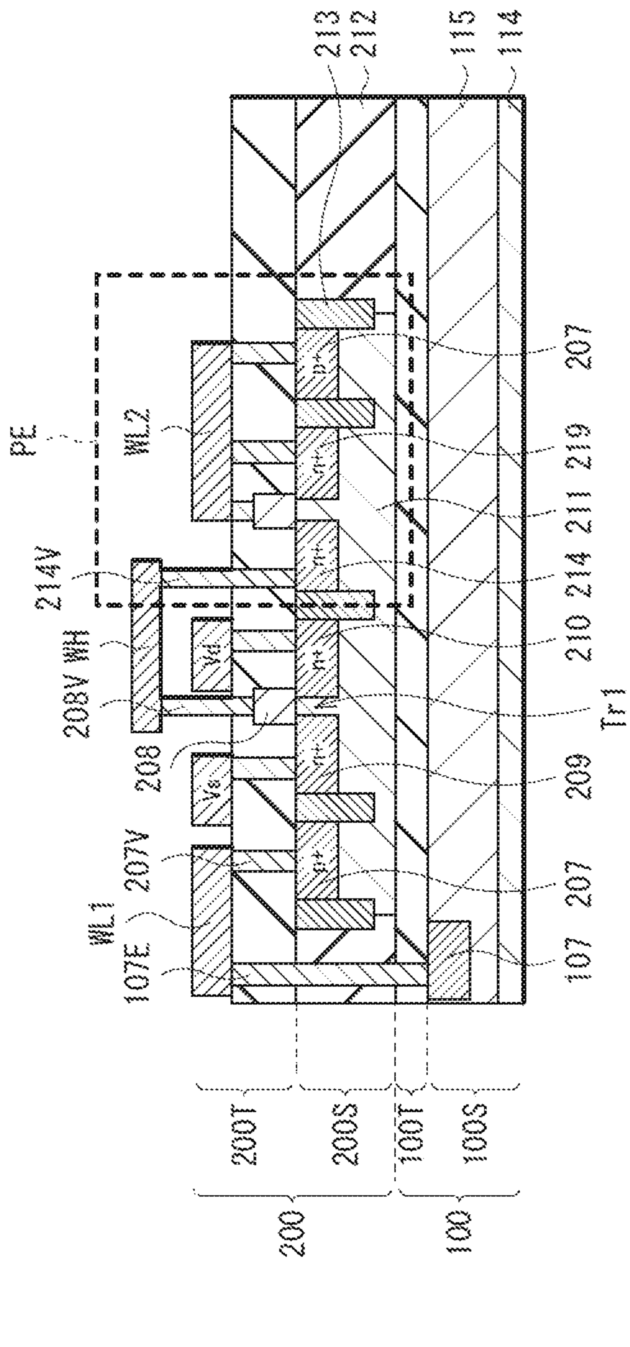

FIG. 118 is a schematic cross-sectional view of another example of the imaging device illustrated in FIG. 115.

Figure 119:
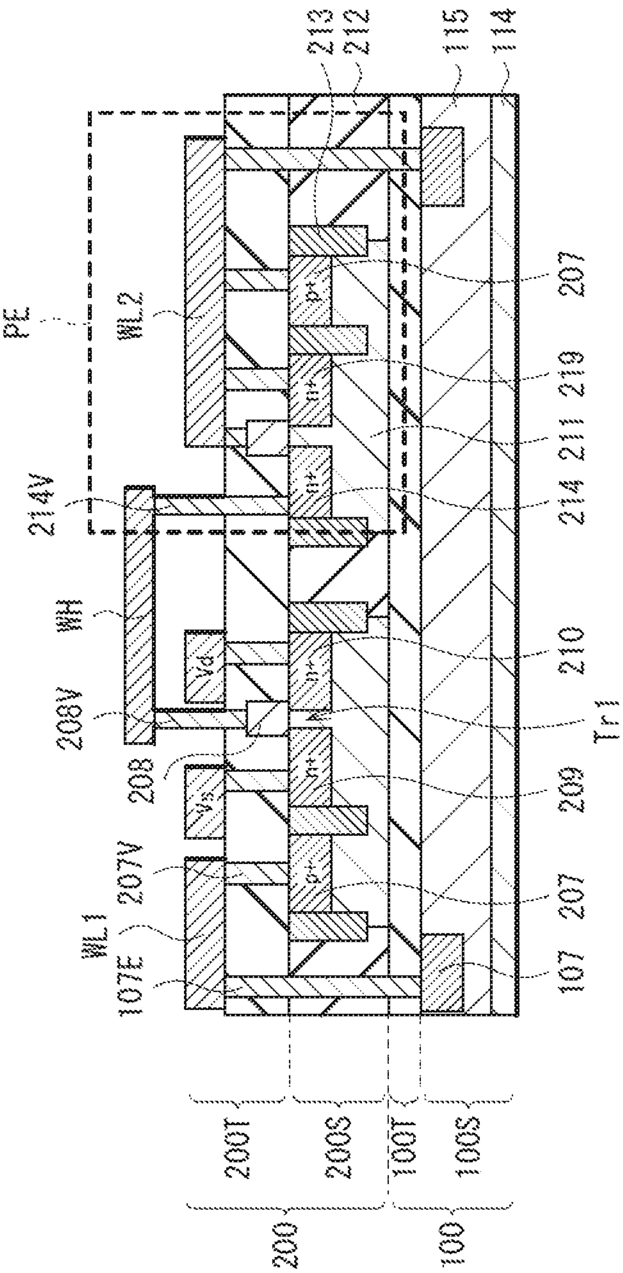

FIG. 119 is a schematic cross-sectional view of another example of the imaging device illustrated in FIG. 115.

Figure 120:
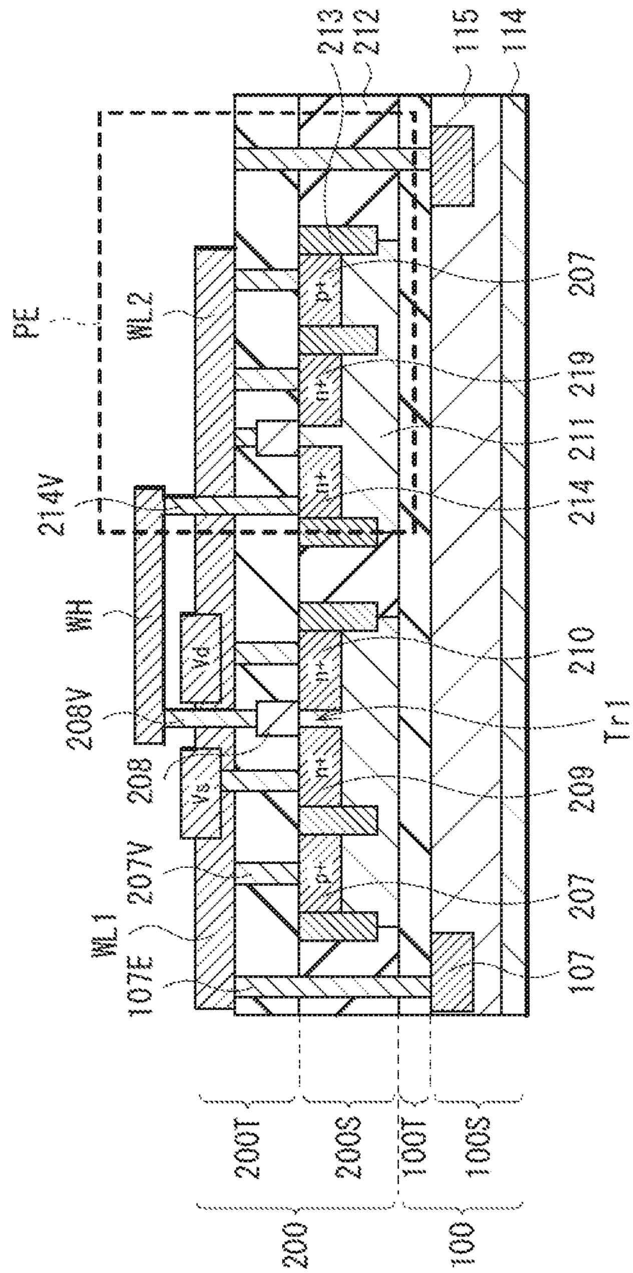

FIG. 120 is a schematic cross-sectional view of another example of the imaging device illustrated in FIG. 115.

Figure 121:
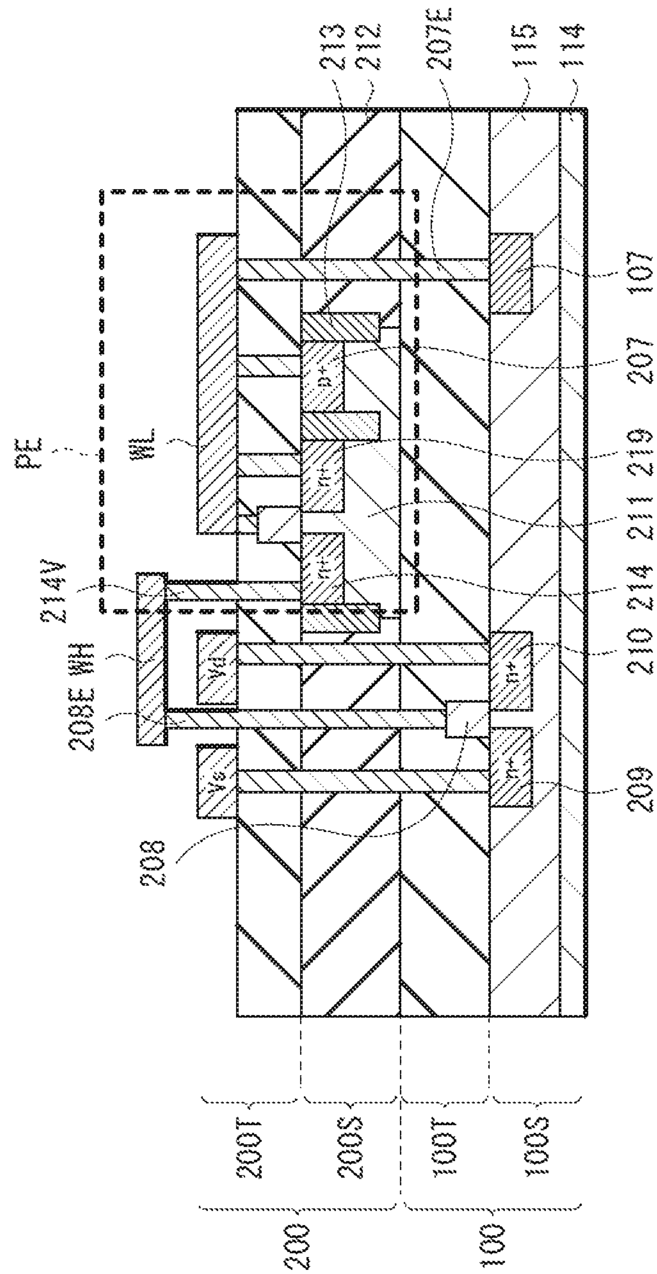

FIG. 121 is a schematic cross-sectional view of another example of the imaging device illustrated in FIG. 115.

Figure 122:
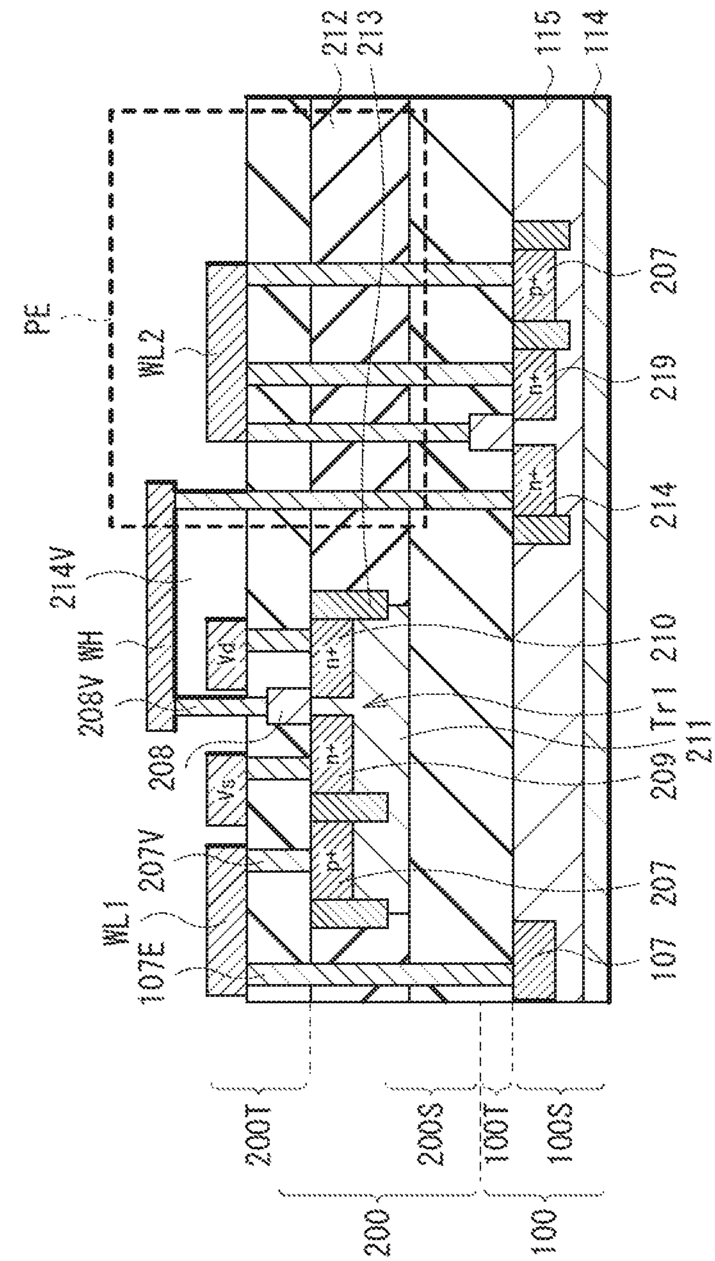

FIG. 122 is a schematic cross-sectional view of another example of the imaging device illustrated in FIG. 115.

Figure 123:
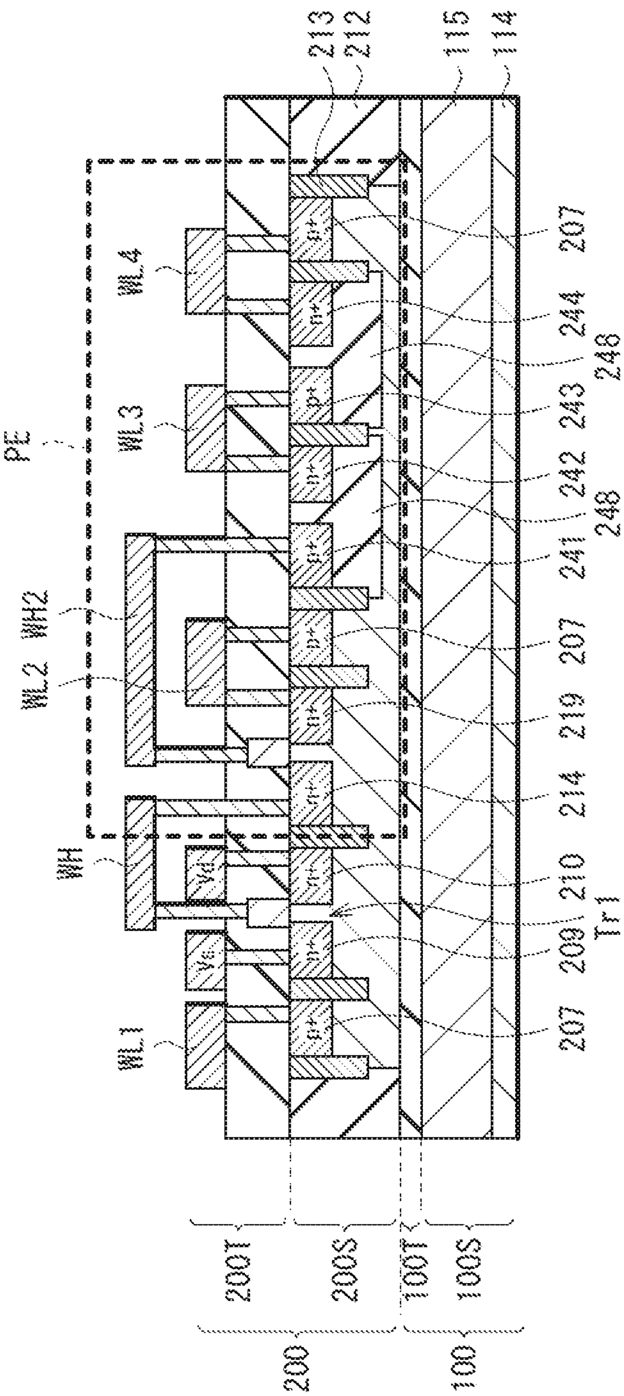

FIG. 123 is a schematic view of another example of the cross-sectional configuration of the main part of the imaging device according to the modification example 20 of the present disclosure.

Figure 124:
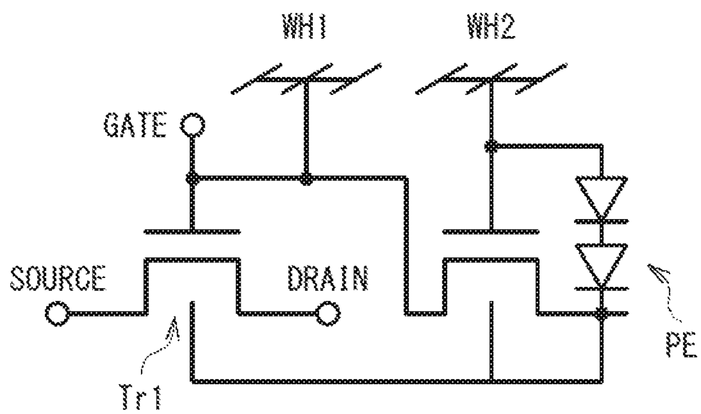

FIG. 124 is a circuit diagram illustrating a relationship between the transistor and the protection element illustrated in FIG. 123.

Figure 125:
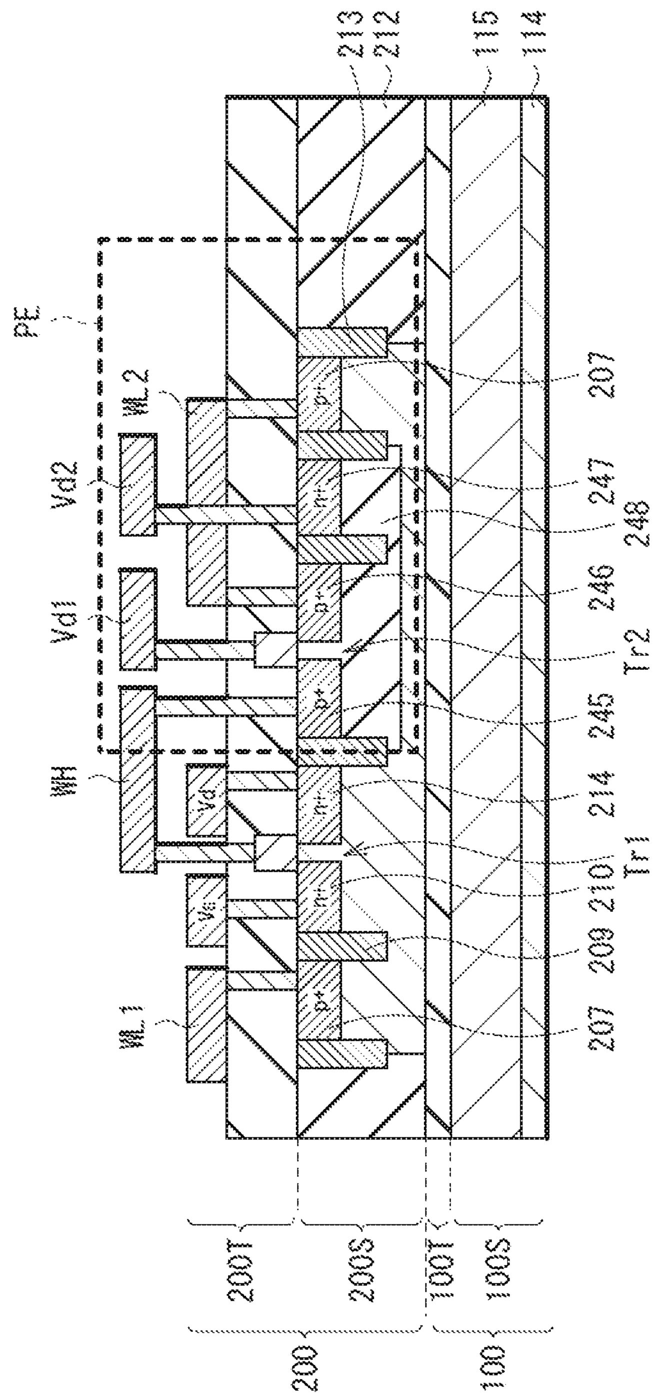

FIG. 125 is a schematic view of another example of the cross-sectional configuration of the main part of the imaging device according to the modification example 20 of the present disclosure.

Figure 126:
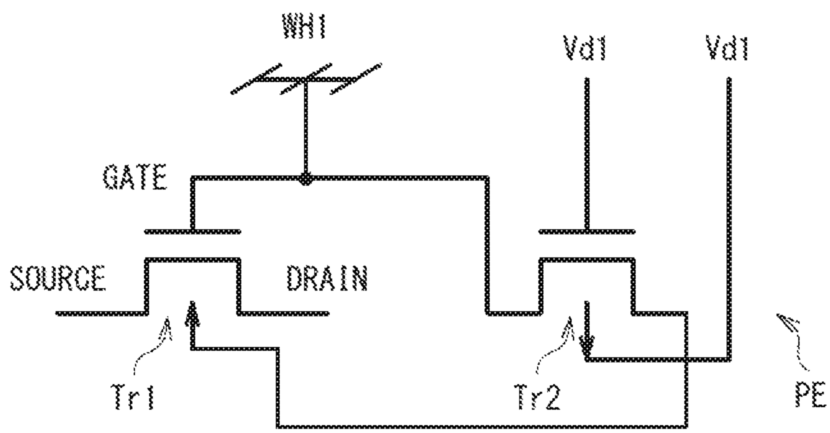

FIG. 126 is a circuit diagram illustrating a relationship between the transistor and the protection element illustrated in FIG. 125.

Figure 127:
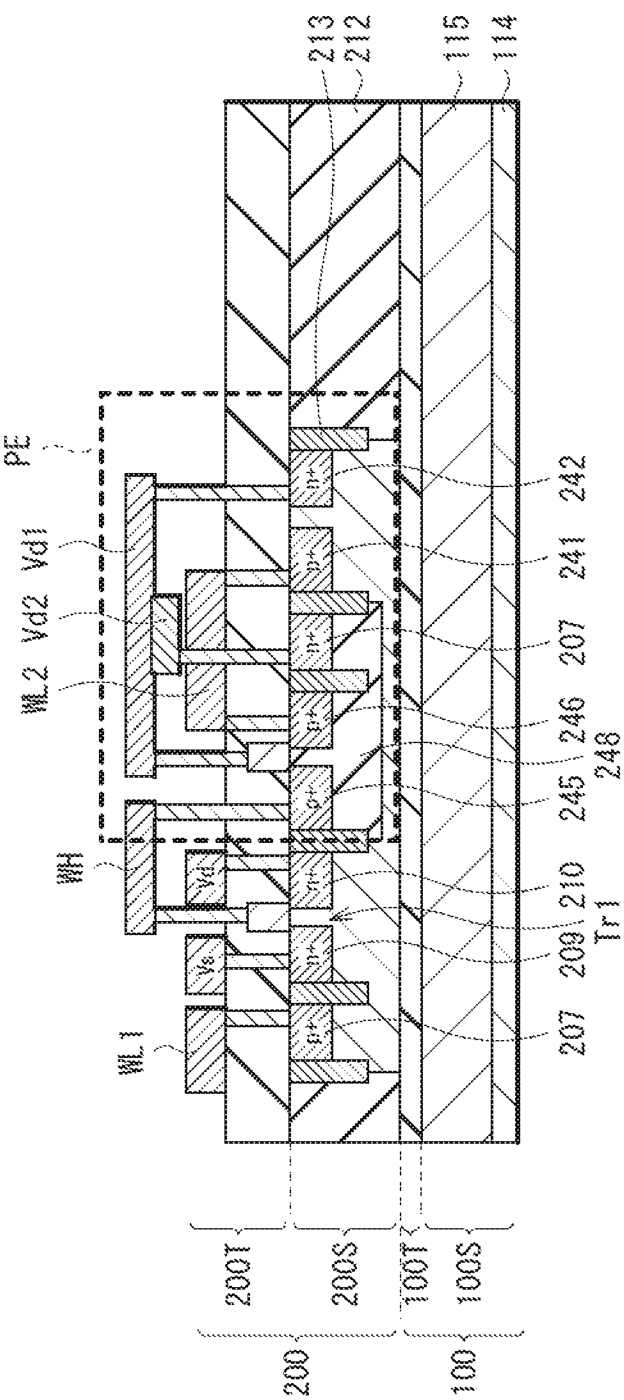

FIG. 127 is a schematic view of another example of the cross-sectional configuration of the main part of the imaging device according to the modification example 20 of the present disclosure.

Figure 128:
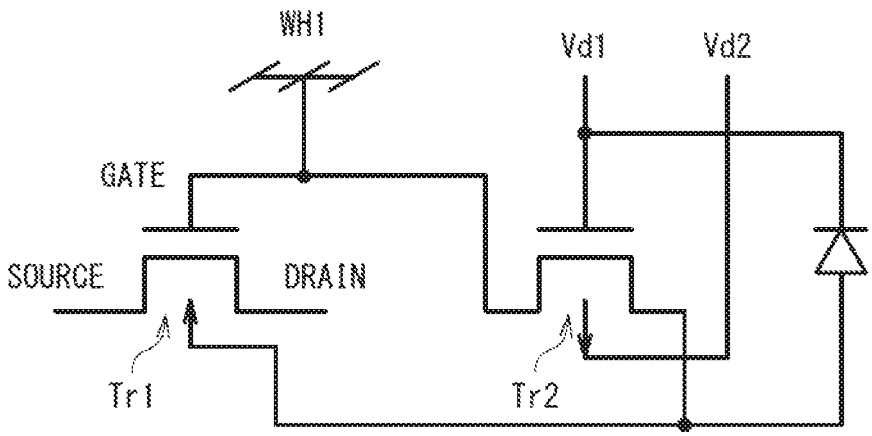

FIG. 128 is a circuit diagram illustrating a relationship between the transistor and the protection element illustrated in FIG. 127.

Figure 129:
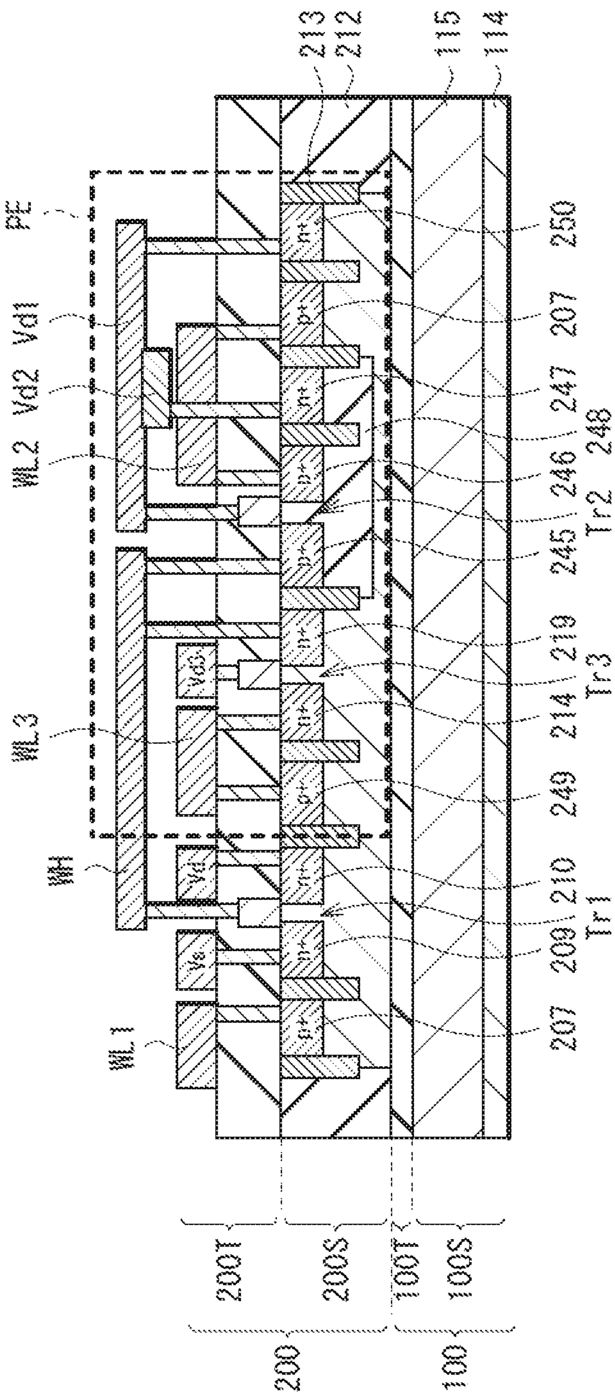

FIG. 129 is a schematic view of another example of the cross-sectional configuration of the main part of the imaging device according to the modification example 20 of the present disclosure.

Figure 130:
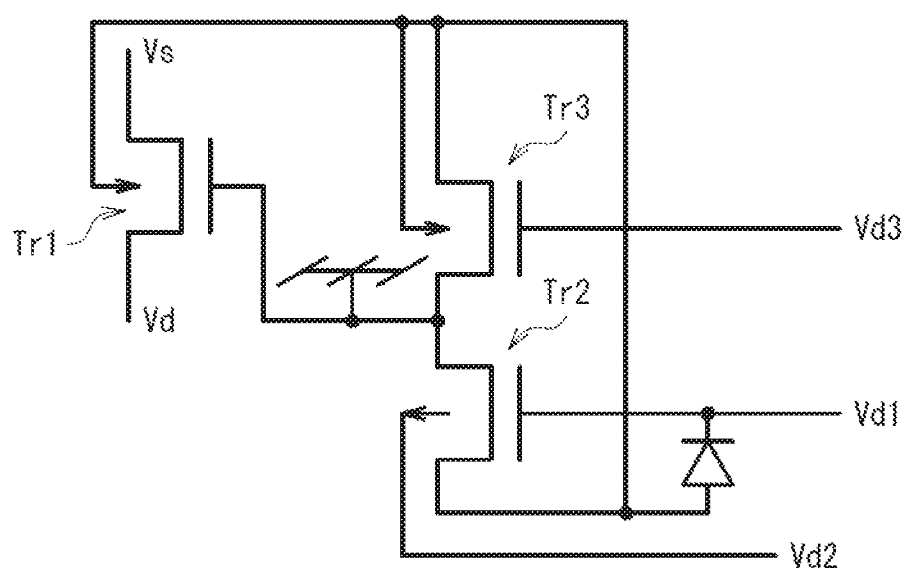

FIG. 130 is a circuit diagram illustrating a relationship between the transistor and the protection element illustrated in FIG. 129.

Figure 131:
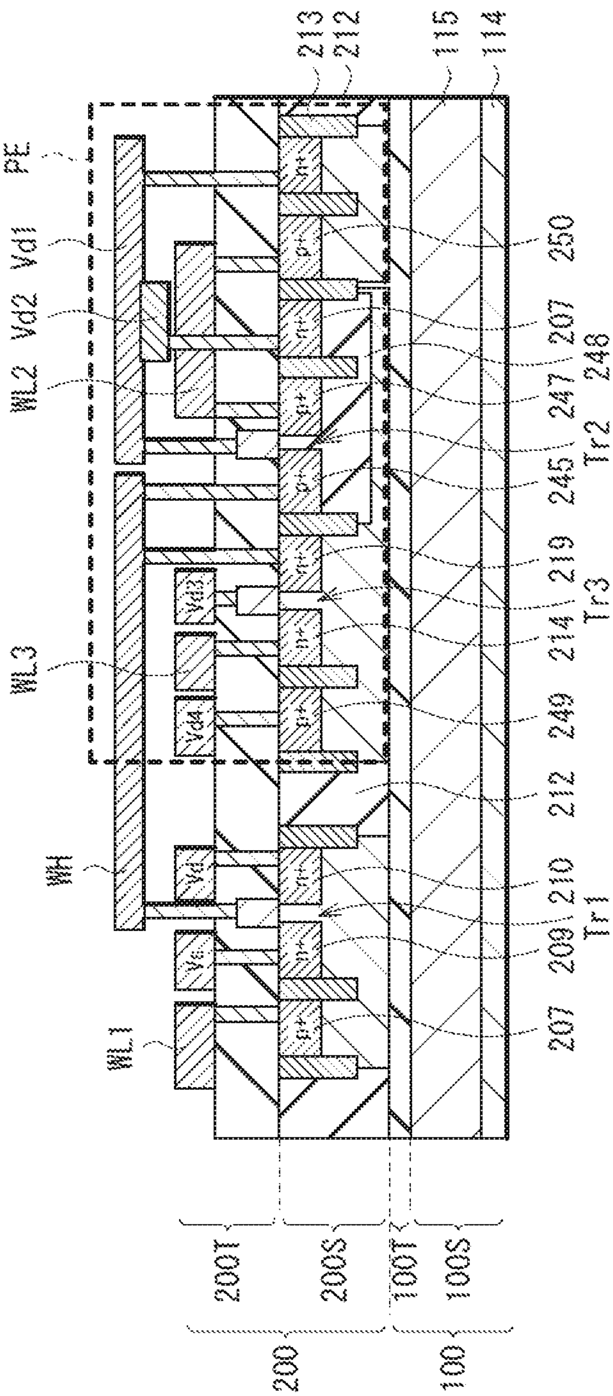

FIG. 131 is a schematic view of another example of the cross-sectional configuration of the main part of the imaging device according to the modification example 20 of the present disclosure.

Figure 132:
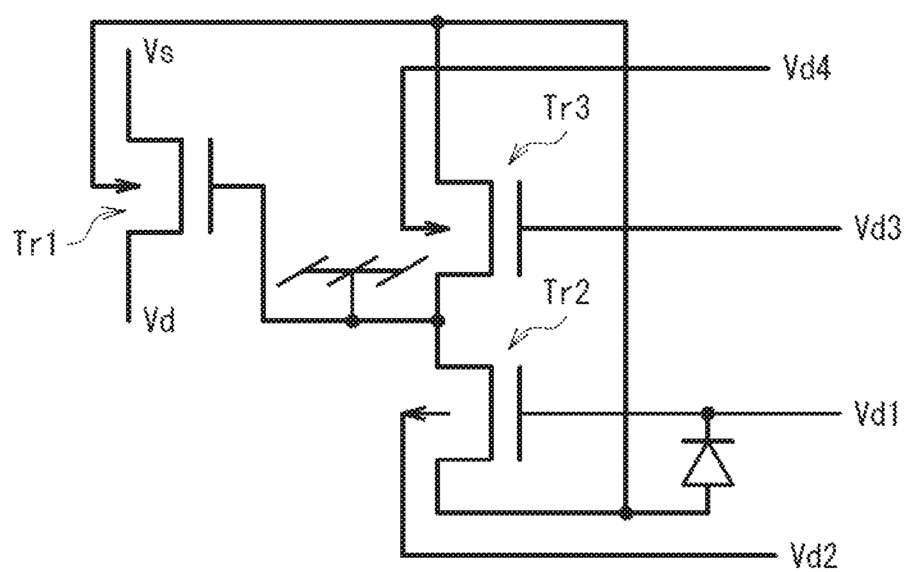

FIG. 132 is a circuit diagram illustrating a relationship between the transistor and the protection element illustrated in FIG. 130.

Figure 133:
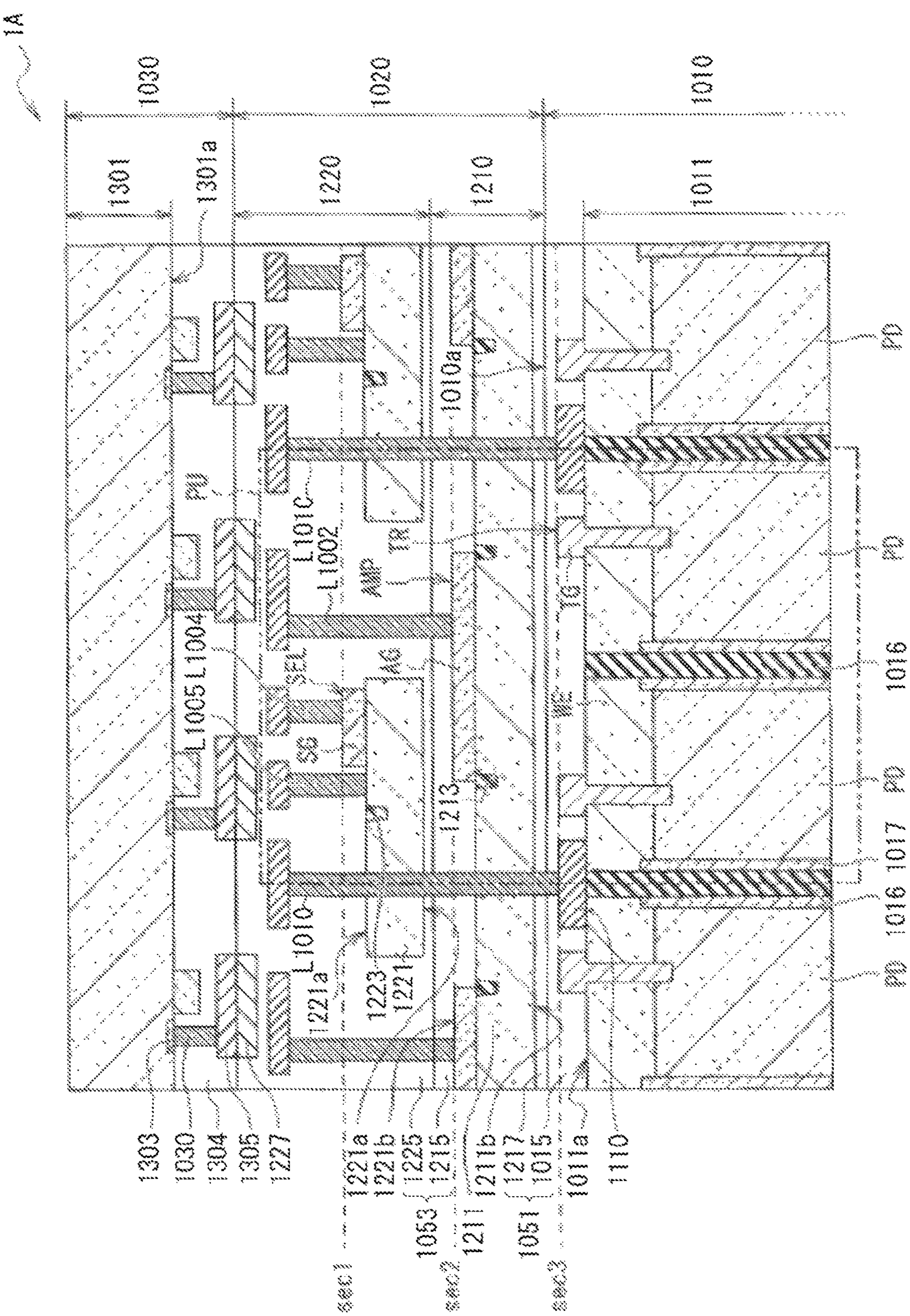

FIG. 133 is a cross-sectional view in a thickness direction of a configuration example of an imaging device according to a modification example 21 of the present disclosure.

Figure 134:
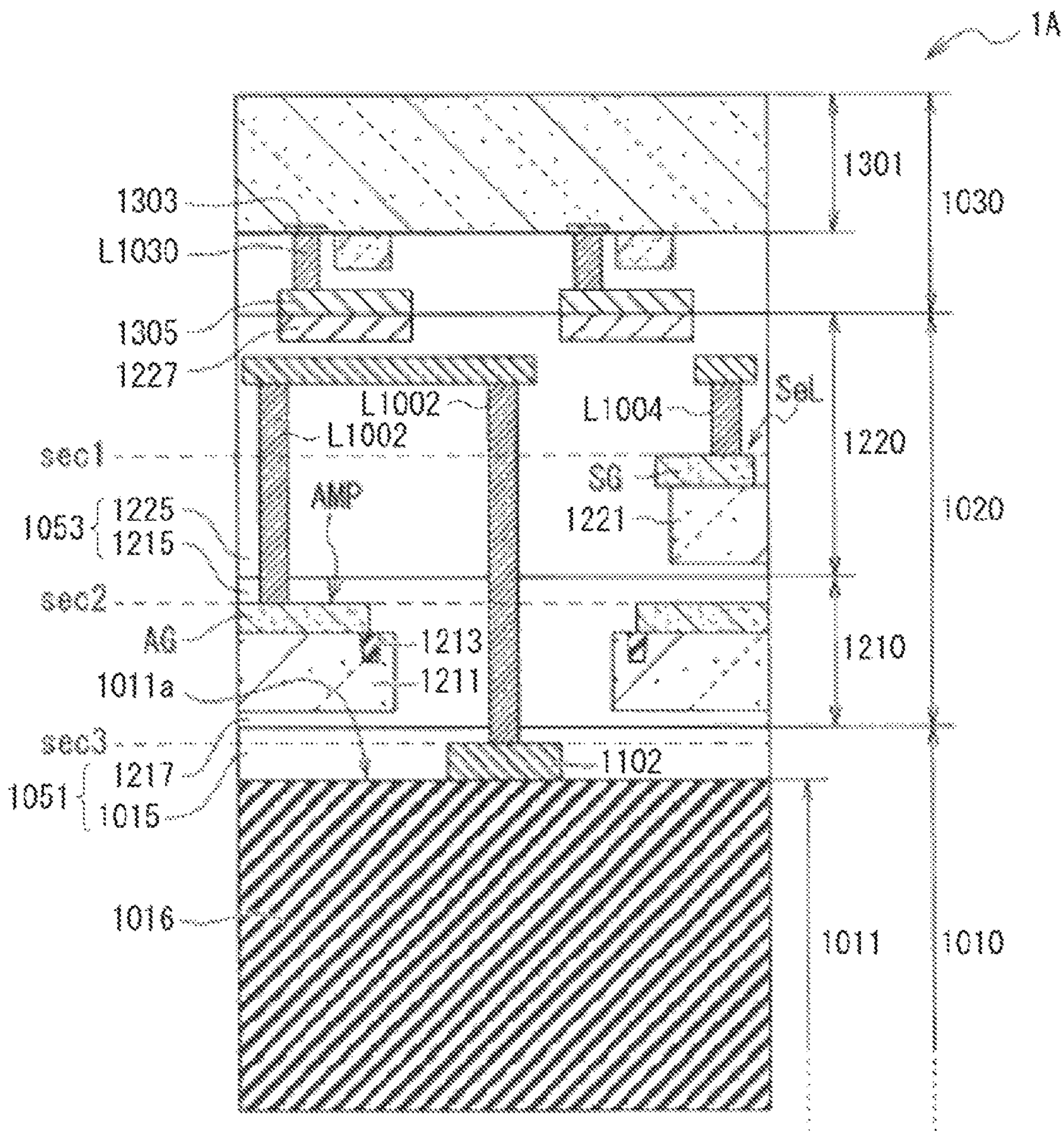

FIG. 134 is a cross-sectional view in the thickness direction of a configuration example of the imaging device according to the modification example 21 of the present disclosure.

Figure 135:
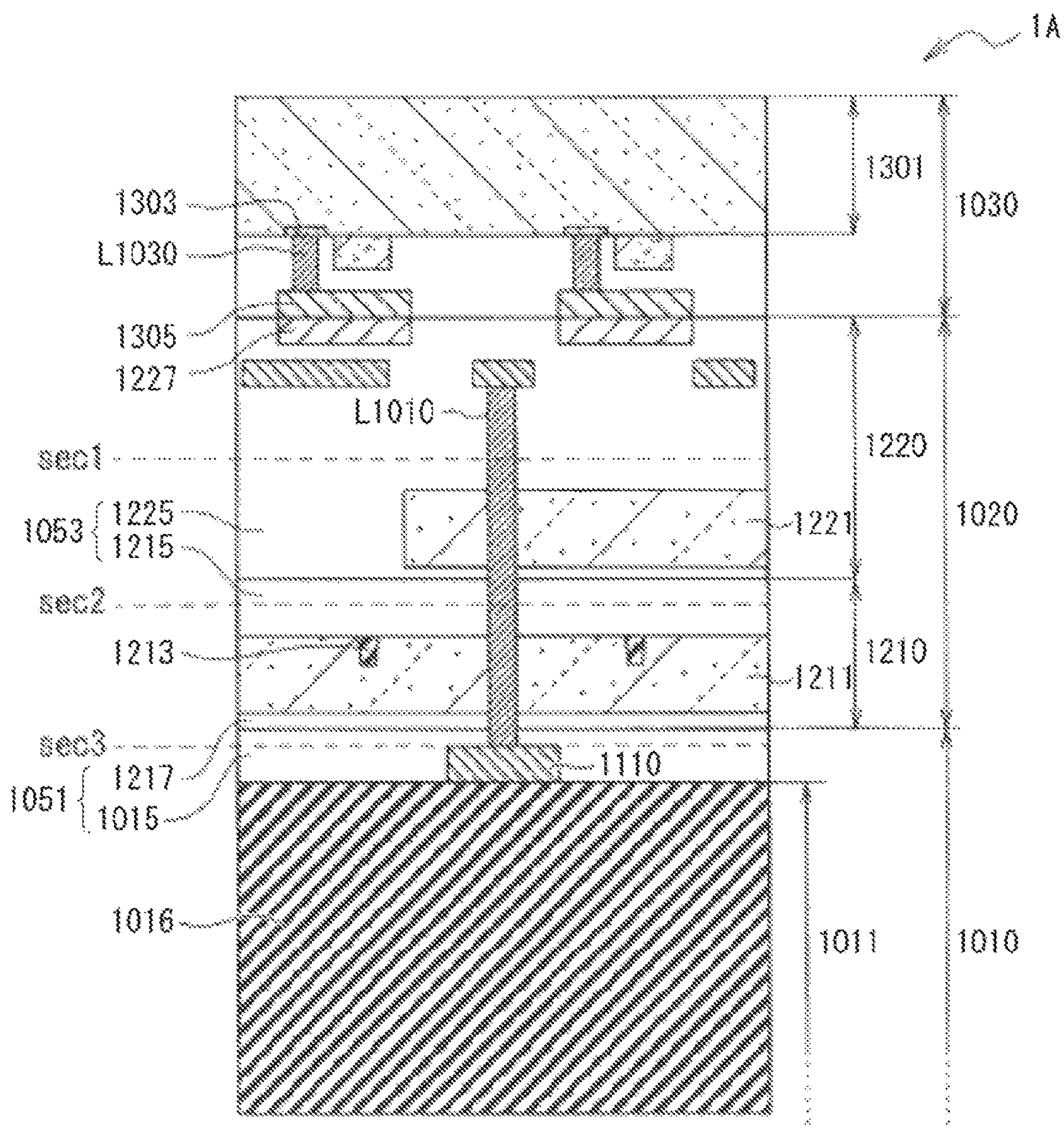

FIG. 135 is a cross-sectional view in the thickness direction of a configuration example of the imaging device according to the modification example 21 of the present disclosure.

Figure 136:
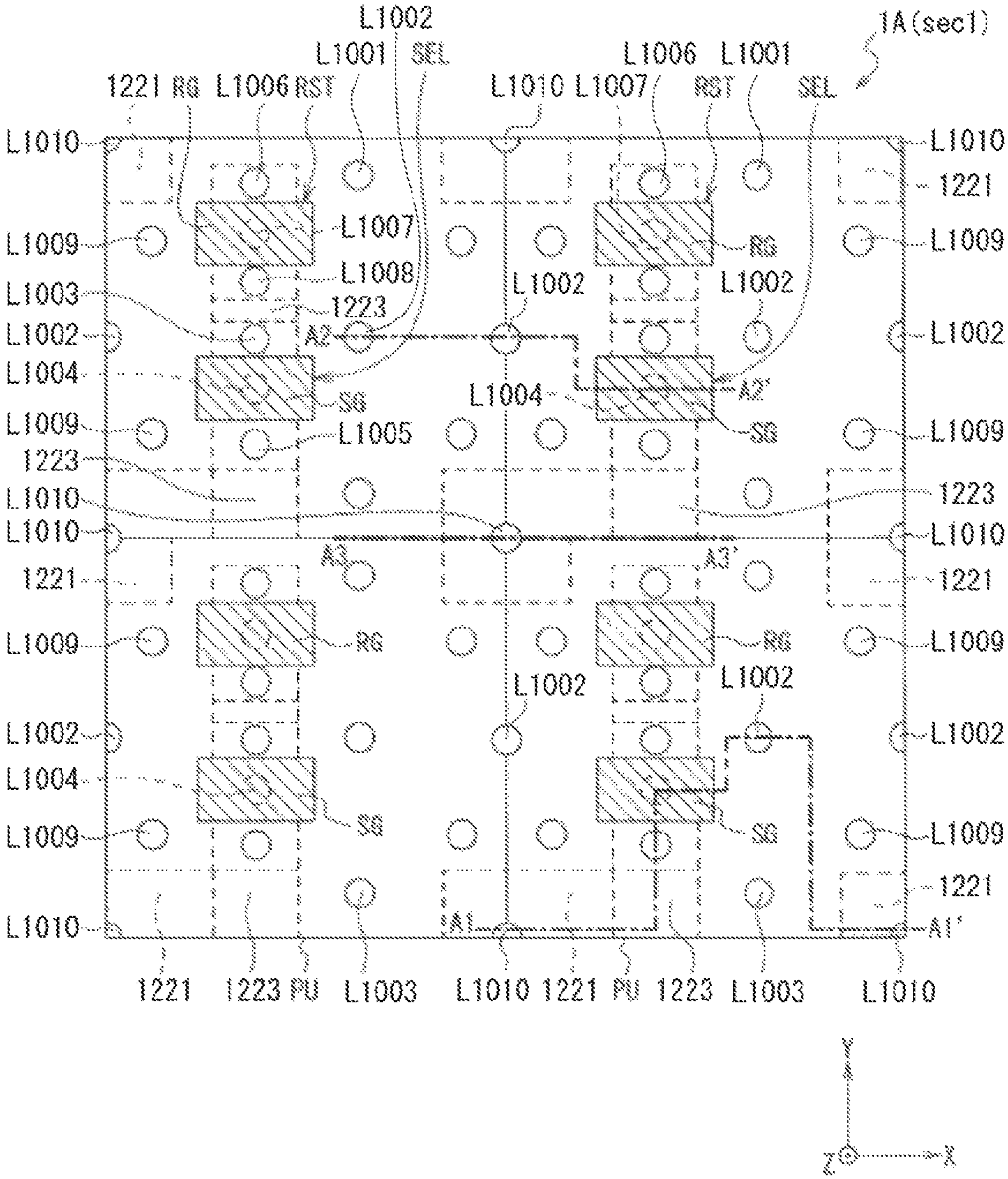

FIG. 136 is a cross-sectional view in a horizontal direction of a layout example of a plurality of pixel units according to the modification example 21 of the present disclosure.

Figure 137:
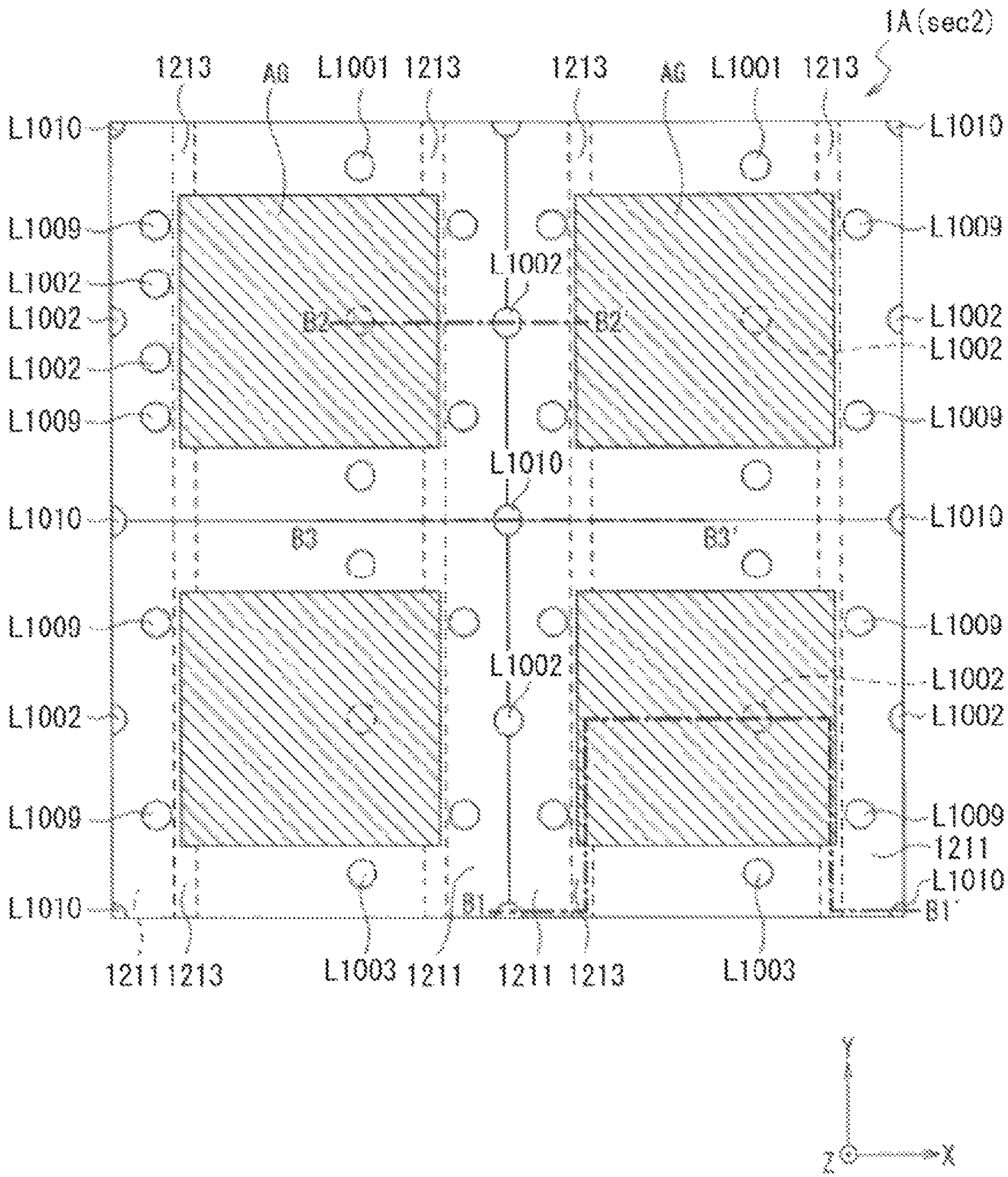

FIG. 137 is a cross-sectional view in the horizontal direction of a layout example of the plurality of pixel units according to the modification example 21 of the present disclosure.

Figure 138:
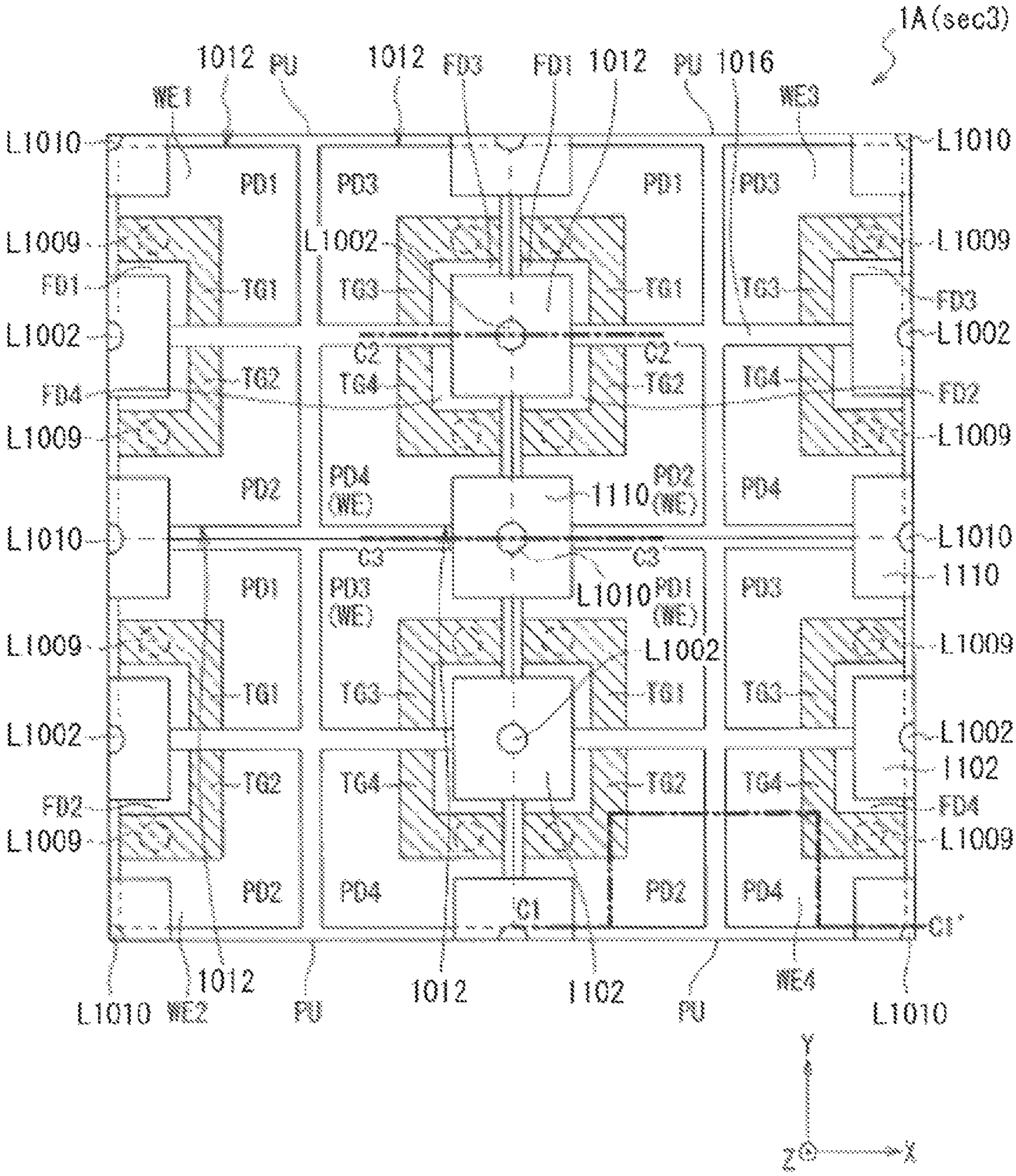

FIG. 138 is a cross-sectional view in the horizontal direction of a layout example of the plurality of pixel units according to the modification example 21 of the present disclosure.

Figure 139:
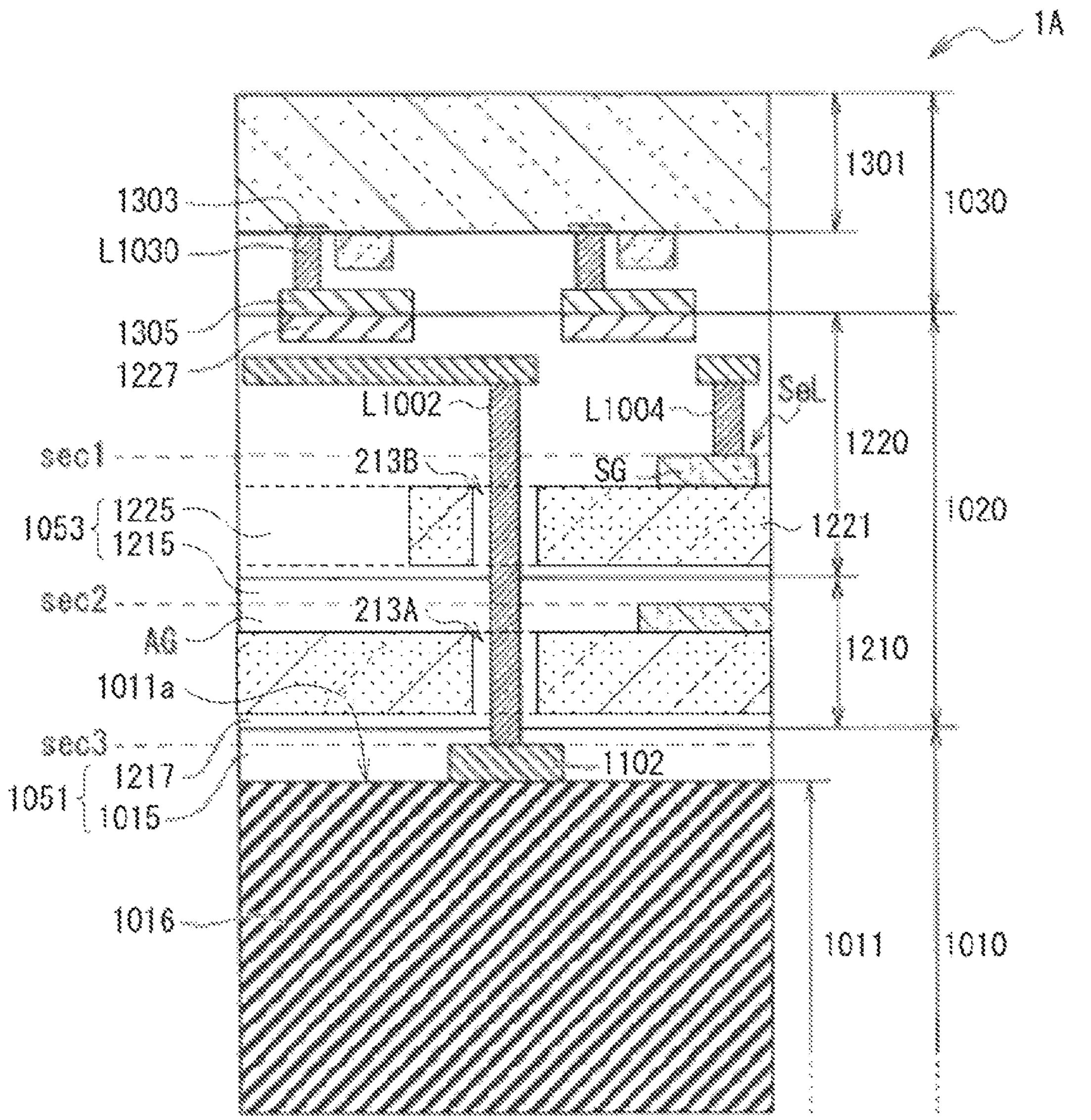

FIG. 139 is a cross-sectional view in the thickness direction of a configuration example of the imaging device according to the modification example 21 of the present disclosure.

Figure 140:
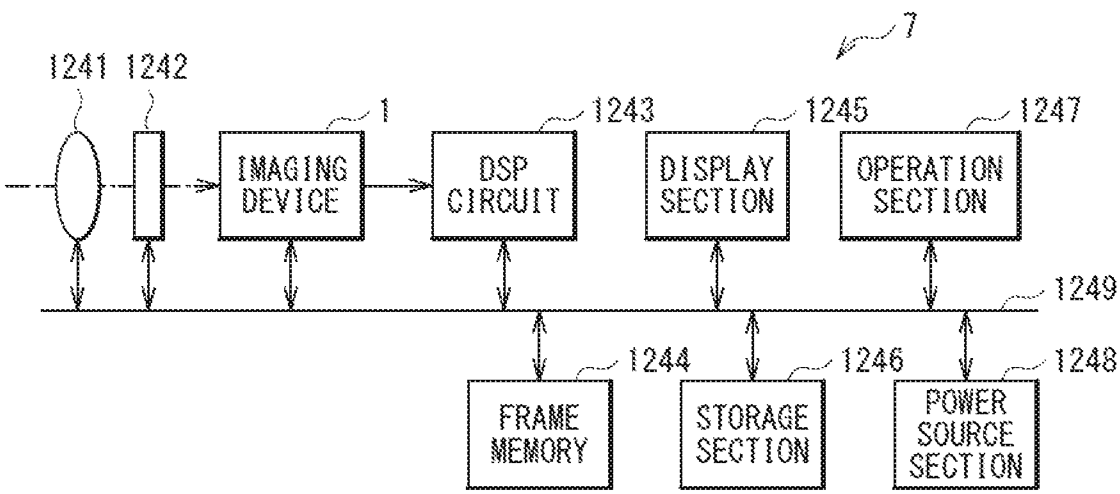

FIG. 140 is a diagram illustrating an example of a schematic configuration of an imaging system including the imaging device according to any of the embodiment described above and the modification examples thereof.

Figure 141:
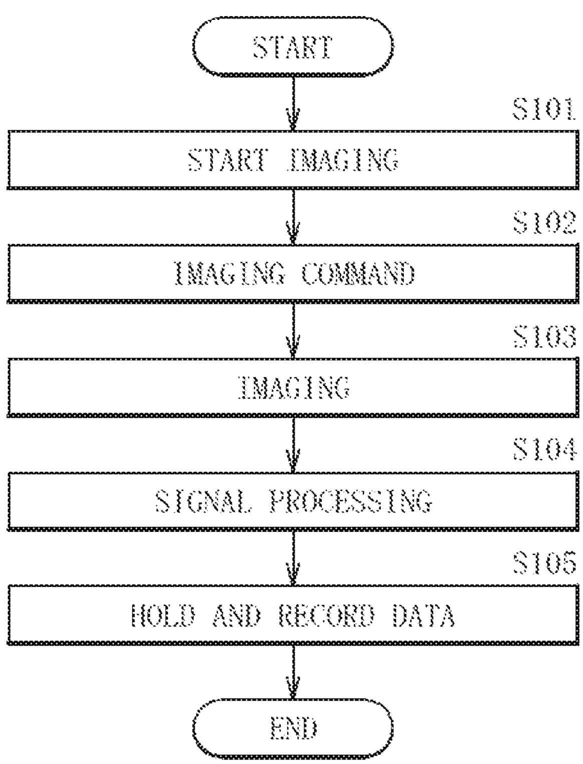

FIG. 141 is a diagram illustrating an example of an imaging procedure in the imaging system illustrated in FIG. 140.

Figure 142:
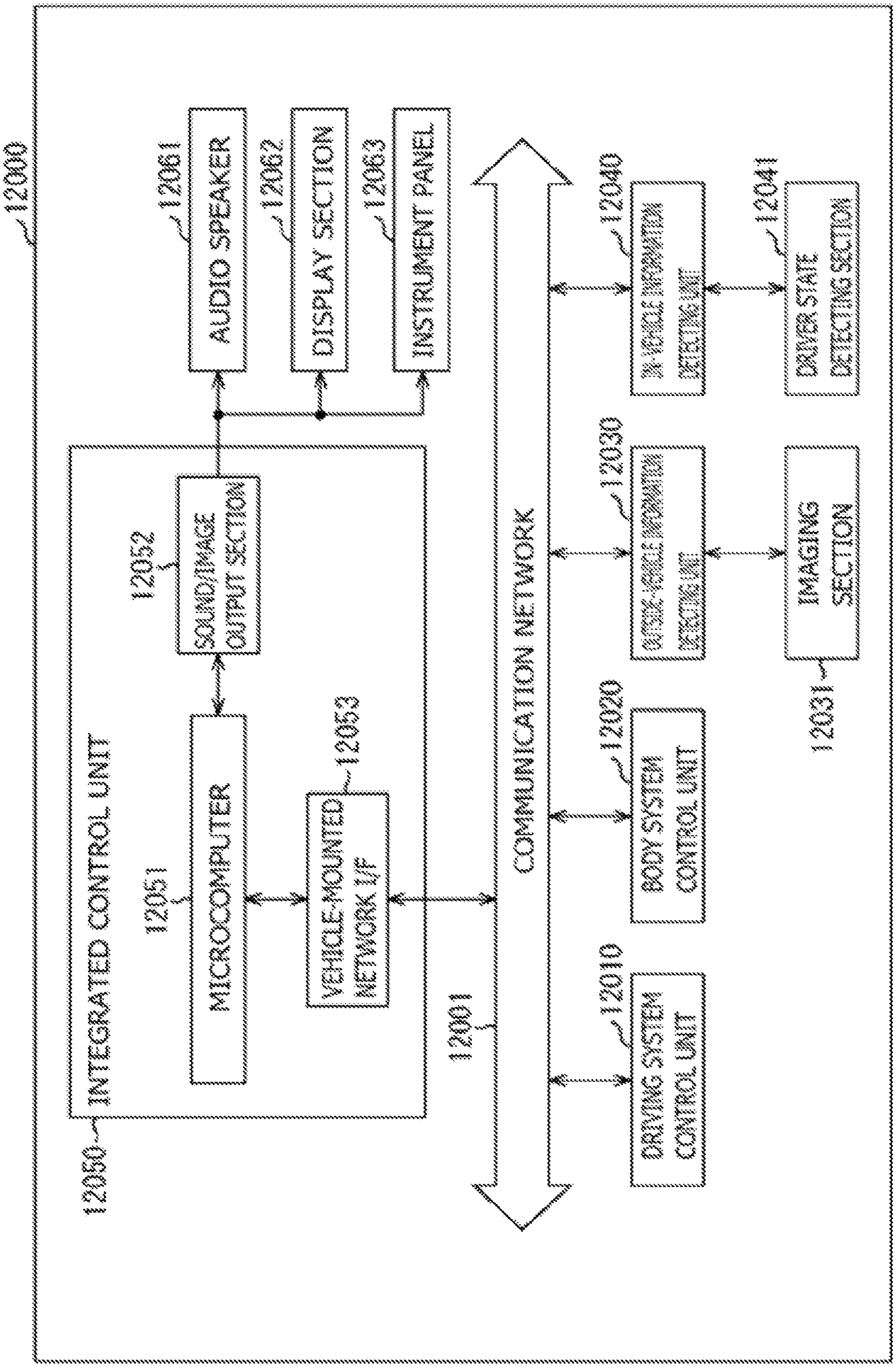

FIG. 142 is a block diagram depicting an example of schematic configuration of a vehicle control system.

Figure 143:
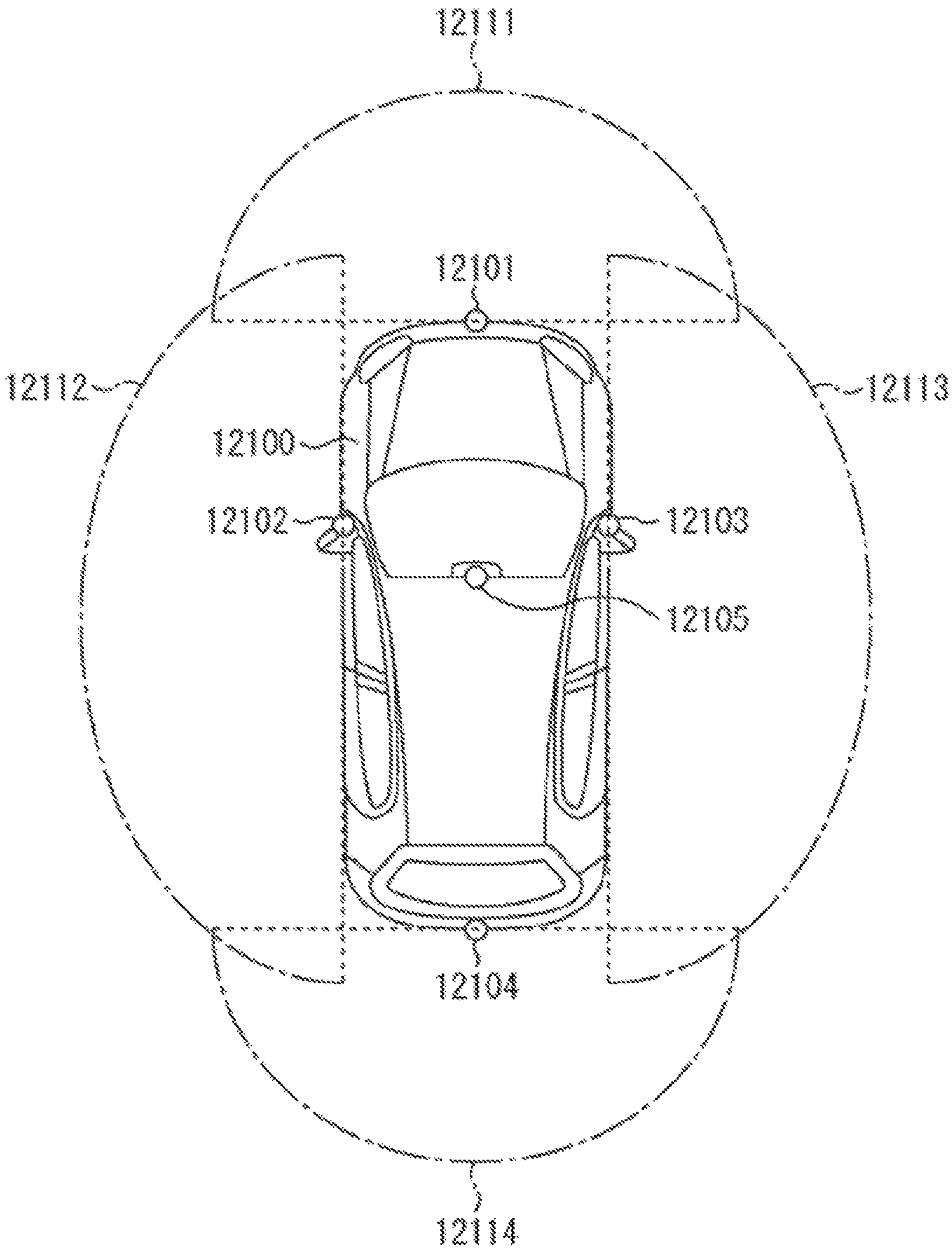

FIG. 143 is a diagram of assistance in explaining an example of installation positions of an outside-vehicle information detecting section and an imaging section.

Figure 144:
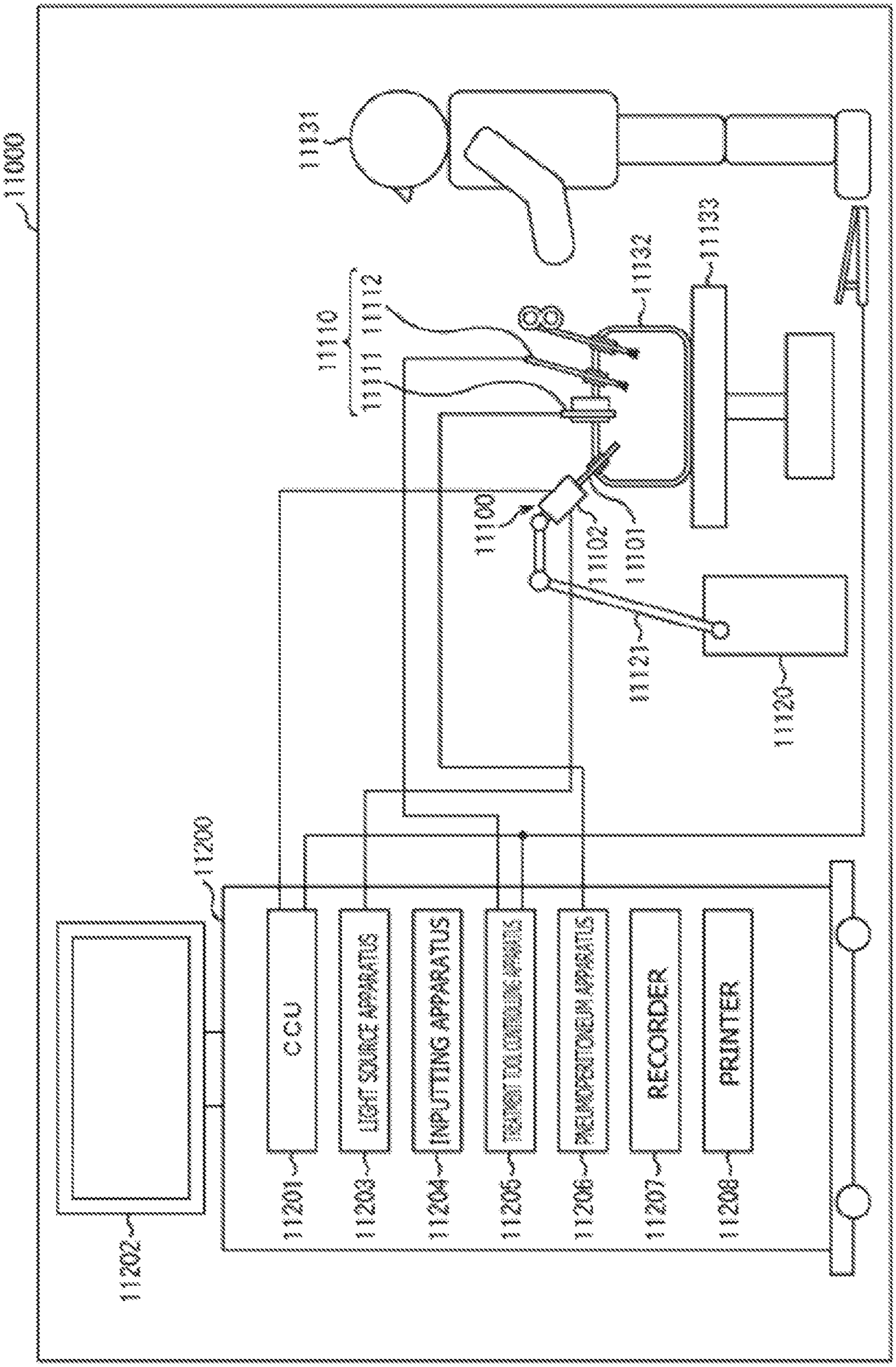

FIG. 144 is a view depicting an example of a schematic configuration of an endoscopic surgery system.

Figure 145:
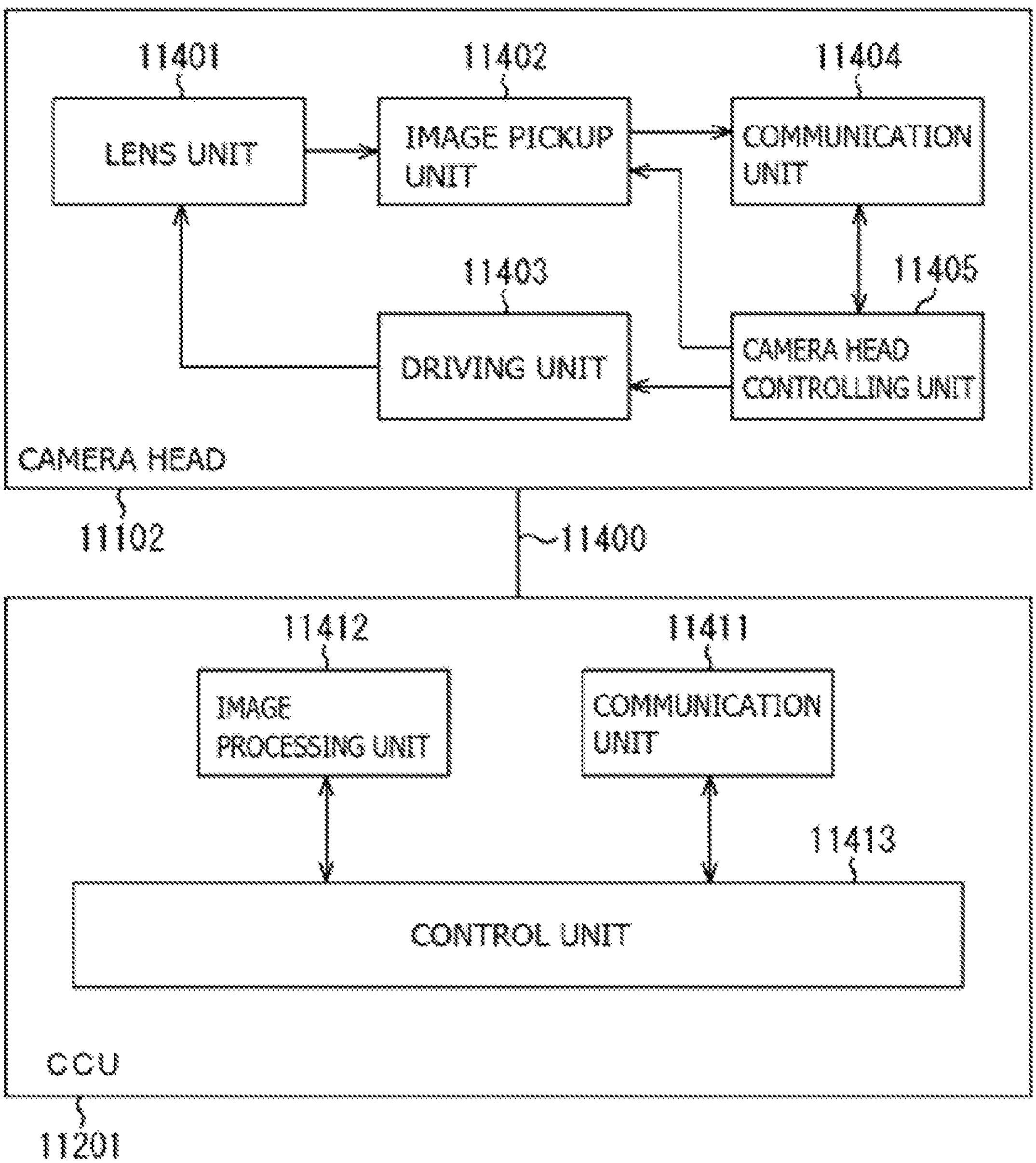

FIG. 145 is a block diagram depicting an example of a functional configuration of a camera head and a camera control unit (CCU).

MODES FOR CARRYING OUT THE INVENTION

Some embodiments of the present disclosure are described below in detail with reference to the drawings. It is to be noted that description is given in the following order.

1. Embodiment (An imaging device having a stacked structure of three substrates)
2. Modification Example 1 (An example in which arsenic (As) is diffused in a floating diffusion)
3. Modification Example 2 (An example in which a through electrode incudes a first portion and a second portion)
4. Modification Example 3 (An example in which a gap is provided in a bonding film)
5. Modification Example 4 (An example in which a bonding film includes an oxide film)
6. Modification Example 5 (An example including a protection element)
7. Modification Example 6 (An example 1 of a planar configuration)
8. Modification Example 7 (An example 2 of the planar configuration)
9. Modification Example 8 (An example 3 of the planar configuration)
10. Modification Example 9 (An example including contact sections between substrates in a middle portion of a pixel array section)
11. Modification Example 10 (An example including a planar transfer transistor)
12. Modification Example 11 (An example in which one pixel is coupled to one readout circuit)
13. Modification Example 12 (A configuration example of a pixel separation section)
14. Modification Example 13 (An example 4 of the planar configuration)
15. Modification Example 14 (An example 5 of the planar configuration)
16. Modification Example 15 (An example 1 of a configuration of a contact section)
17. Modification Example 16 (An example 2 of the configuration of the contact section)
18. Modification Example 17 (A configuration example of transistors provided in a first substrate and a second substrate)
19. Modification Example 18 (An example in which a through electrode and a coupling section are formed in different processes)
20. Modification Example 19 (A structure example of pixel transistors)
21. Modification Example 20 (An example 2 including the protection element)
22. Modification Example 21 (An example in which one well contact is provided for every plurality of sensor pixels)
23. Application Example (An imaging system)
24. Practical Application Examples

1. Embodiment

[Functional Configuration of Imaging Device 1]

Figure 1:
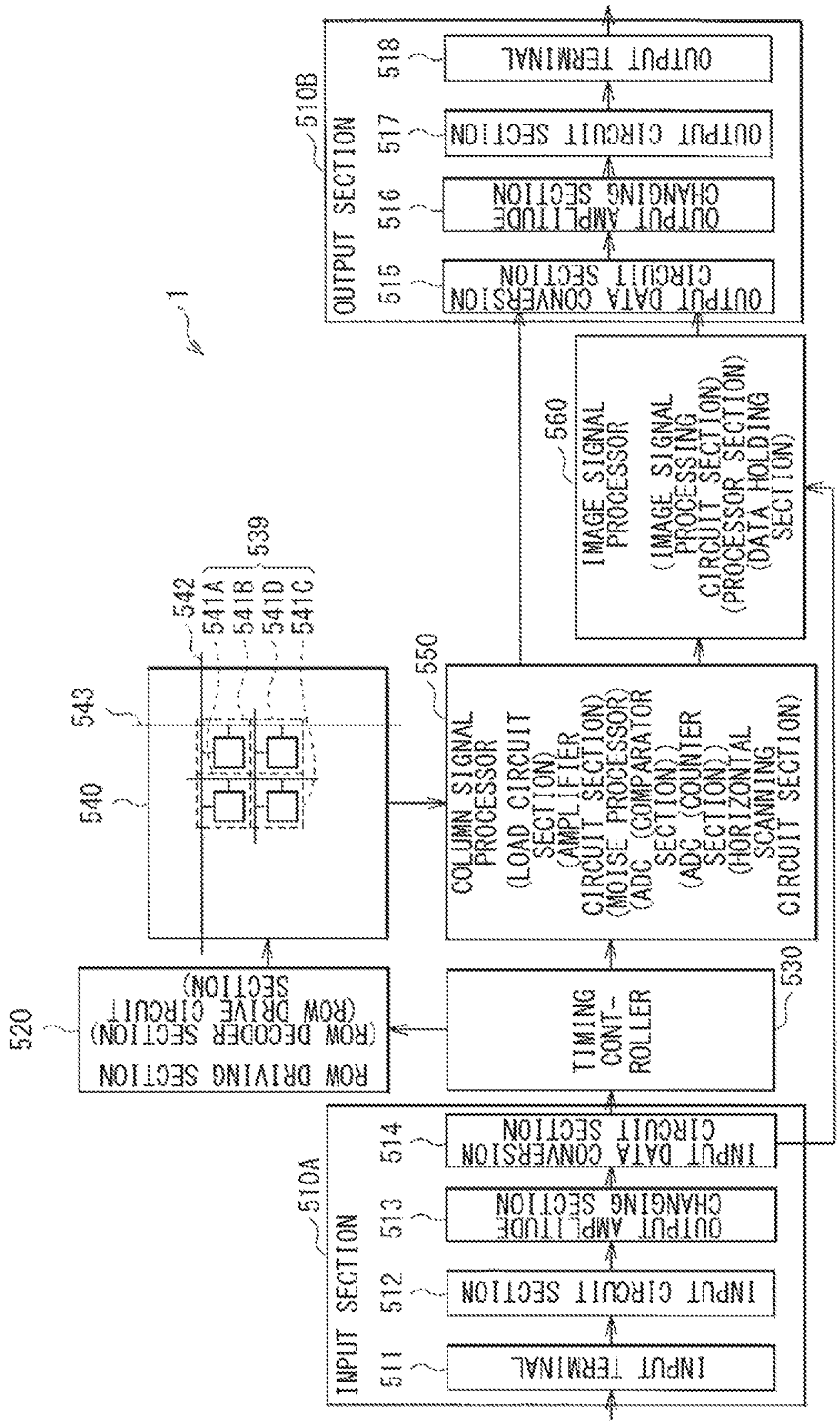
FIG. 1 is a block diagram illustrating an example of a functional configuration of an imaging device according to an embodiment of the present disclosure.

FIG. 1 is a block diagram illustrating an example of a functional configuration of a solid-state imaging device (an imaging device 1) according to an embodiment of the present disclosure.

The imaging device 1 in FIG. 1 includes, for example, an input section 510A, a row driving section 520, a timing controller 530, a pixel array section 540, a column signal processor 550, an image signal processor 560, and an output section 510B.

In the pixel array section 540, pixels 541 are repeatedly arranged in an array. More specifically, pixel sharing units 539 each including a plurality of pixels are repeating units, and are repeatedly arranged in an array in a row direction and a column direction. It is to be noted that in the present specification, for the sake of convenience, the row direction and the column direction orthogonal to the row direction are sometimes referred to as an "H direction" and a "V direction", respectively. In an example in FIG. 1, one pixel sharing unit 539 includes four pixels (pixels 541A, 541B, 541C, and 541D). The pixels 541A, 541B, 541C, and 541D each include a photodiode PD (illustrated in FIG. 6 and the like to be described later). The pixel sharing unit 539 is a unit sharing one pixel circuit (a pixel circuit 200X in FIG. 4 to be described later). In other words, one pixel circuit (the pixel circuit 200X to be described later) is included for every four pixels (the pixels 541A, 541B, 541C, and 541D). The pixel circuit is driven in a time division manner to sequentially read pixel signals of the respective pixels 541A, 541B, 541C, and 541D. The pixels 541A, 541B, 541C, and 541D are arranged in two rows by two columns, for example. The pixel array section 540 includes a plurality of row drive signal lines 542 and a plurality of vertical signal lines (column readout lines) 543 together with the pixels 541A, 541B, 541C, and 541D. The row drive signal lines 542 drive the pixels 541 that are arranged side by side in the row direction in the pixel array section 540 and included in the plurality of pixel sharing units 539. The row drive signal lines 542 drive each of pixels arranged side by side in the row direction in the pixel sharing units 539. As described in detail later with reference to FIG. 4, the pixel sharing unit 539 includes a plurality of transistors. In order to drive each of the plurality of transistors, a plurality of row drive signal lines 542 is coupled to one pixel sharing unit 539. The pixel sharing units 539 are coupled to the vertical signal lines (column readout lines) 543. The pixel signals are read from the respective pixels 541A, 541B, 541C, and 541D included in the pixel sharing units 539 through the vertical signal lines (column readout lines) 543.

The row driving section 520 includes, for example, a row address controller that determines the position of a row for driving pixels, that is, a row decoder section, and a row drive circuit section that generates a signal for driving the pixels 541A, 541B, 541C, and 541D.

The column signal processor 550 is coupled to, for example, the vertical signal lines 543, and includes a load circuit section that forms a source follower circuit with the pixels 541A, 541B, 541C, and 541D (the pixel sharing unit 539). The column signal processor 550 may include an amplifier circuit section that amplifies a signal read from the pixel sharing unit 539 through the vertical signal line 543. The column signal processor 550 may include a noise processor. The noise processor removes, for example, a noise level of a system from a signal read as a result of photoelectric conversion from the pixel sharing unit 539.

The column signal processor 550 includes, for example, an analog-digital converter (ADC). The analog-digital converter converts a signal read from the pixel sharing unit 539 or an analog signal having been subjected to noise processing described above into a digital signal. The ADC includes, for example, a comparator section and a counter section. The comparator section compares an analog signal as a conversion target with a reference signal as a comparison target. The counter section measures time until a comparison result in the comparator section is inverted. The column signal processor 550 may include a horizontal scanning circuit section that controls scanning of readout columns.

The timing controller 530 supplies a signal that controls a timing to the row driving section 520 and the column signal processor 550 on the basis of a reference clock signal and a timing control signal inputted to the device.

The image signal processor 560 is a circuit that performs various types of signal processing on data obtained as a result of photoelectric conversion, that is, data obtained as a result of an imaging operation in the imaging device 1. The image signal processor 560 includes, for example, an image signal processing circuit section and a data holding section. The image signal processor 560 may include a processor section.

One example of the signal processing to be executed in the image signal processor 560 is tone curve correction processing in which gray scales are increased in a case where AD-converted imaging data is data obtained by shooting a dark subject, and gray scales are decreased in a case where the AD-converted imaging data is data obtained by shooting a bright subject. In this case, it is desirable that characteristic data of tone curves about which tone curve is to be used to correct gray scales of imaging data be stored in advance in the data holding section of the image signal processor 560.

The input section 510A inputs, for example, the reference clock signal, the timing control signal, the characteristic data, and the like described above from outside the device to the imaging device 1. Examples of the timing control signal include a vertical synchronization signal, a horizontal synchronization signal, and the like. The characteristic data is to be stored in the data holding section of the image signal processor 560, for example. The input section 510A includes, for example, an input terminal 511, an input circuit section 512, an input amplitude changing section 513, an input data conversion circuit section 514, and a power source section (not illustrated).

The input terminal 511 is an external terminal for inputting data. The input circuit section 512 takes a signal inputted to the input terminal 511 into the imaging device 1. The input amplitude changing section 513 changes amplitude of the signal taken by the input circuit section 512 into amplitude easy to be used inside the imaging device 1. The input data conversion circuit section 514 changes the order of data columns of input data. The input data conversion circuit section 514 includes, for example, a serial-parallel conversion circuit. The serial-parallel conversion circuit converts a serial signal received as input data into a parallel signal. It is to be noted that in the input section 510A, the input amplitude changing section 513 and the input data conversion circuit section 514 may be omitted. The power source section supplies power that is set to various types of voltages necessary inside the imaging device 1 with use of power supplied from outside to the imaging device 1.

In a case where the imaging device 1 is coupled to an external memory device, the input section 510A may include a memory interface circuit that receives data from the external memory device. Examples of the external memory device include a flash memory, an SRAM, a DRAM, and the like.

The output section 510B outputs image data to outside of the device. Examples of the image data include image data captured by the imaging device 1, image data having been subjected to signal processing by the image signal processor 560, and the like The output section 510B includes, for example, an output data conversion circuit section 515, an output amplitude changing section 516, an output circuit section 517, and an output terminal 518.

The output data conversion circuit section 515 includes, for example, a parallel-serial conversion circuit. The output data conversion circuit section 515 converts a parallel signal used inside the imaging device 1 into a serial signal. The output amplitude changing section 516 changes amplitude of a signal used inside the imaging device 1. The signal having changed amplitude is easily used in an external device coupled to the outside of the imaging device 1. The output circuit section 517 is a circuit that outputs data from inside the imaging device 1 to the outside of the device, and the output circuit section 517 drives a wiring line outside the imaging device 1 coupled to the output terminal 518. At the output terminal 518, data is outputted from the imaging device 1 to the outside of the device. In the output section 510B, the output data conversion circuit section 515 and the output amplitude changing section 516 may be omitted.

In a case where the imaging device 1 is coupled to an external memory device, the output section 510B may include a memory interface circuit that outputs data to the external memory device. Examples of the external memory device include a flash memory, an SRAM, a DRAM, and the like.

[Schematic Configuration of Imaging Device 1]

Figure 2:
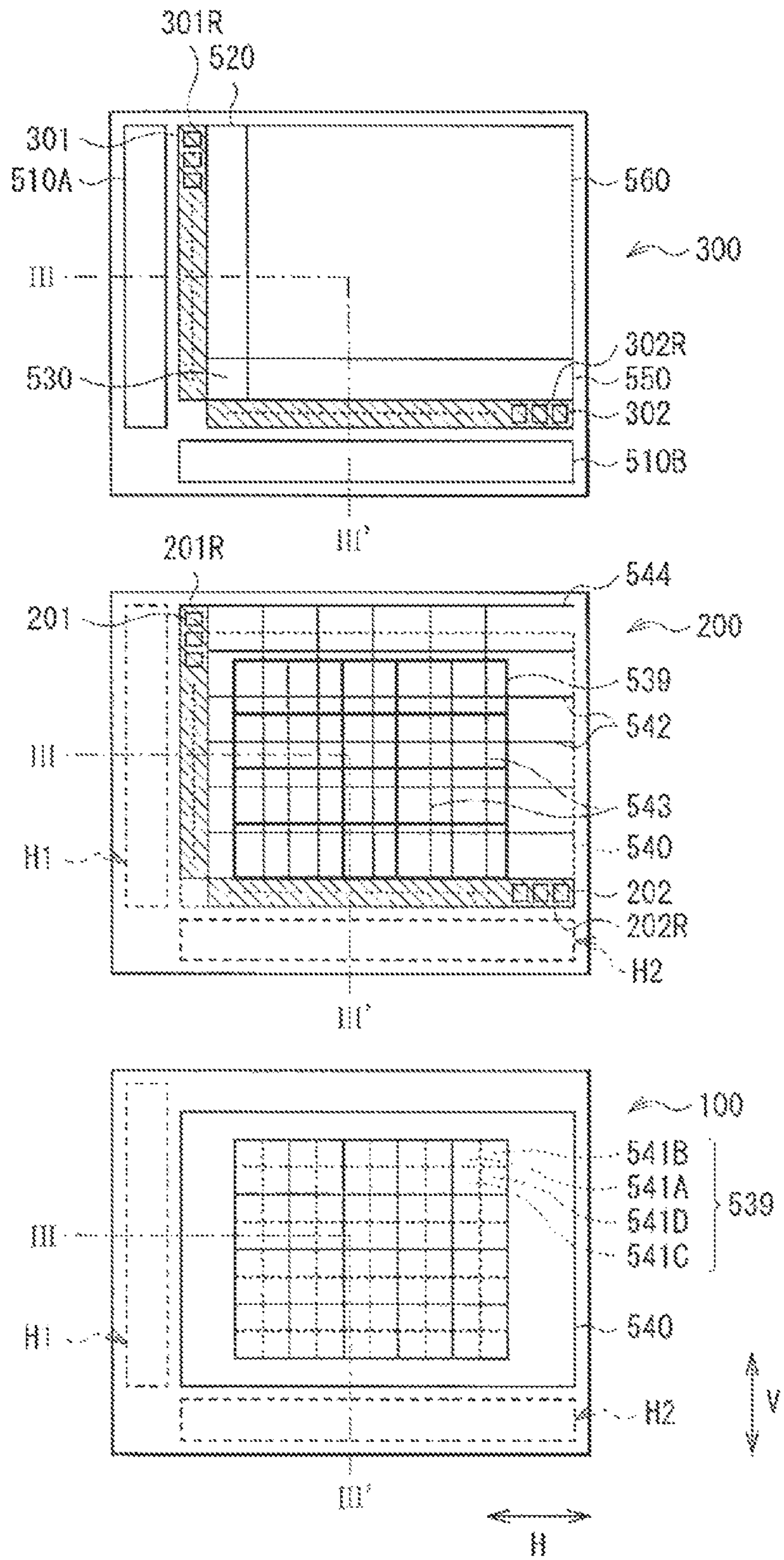
FIG. 2 is a schematic plan view of a schematic configuration of the imaging device illustrated in FIG. 1.
Figure 3:
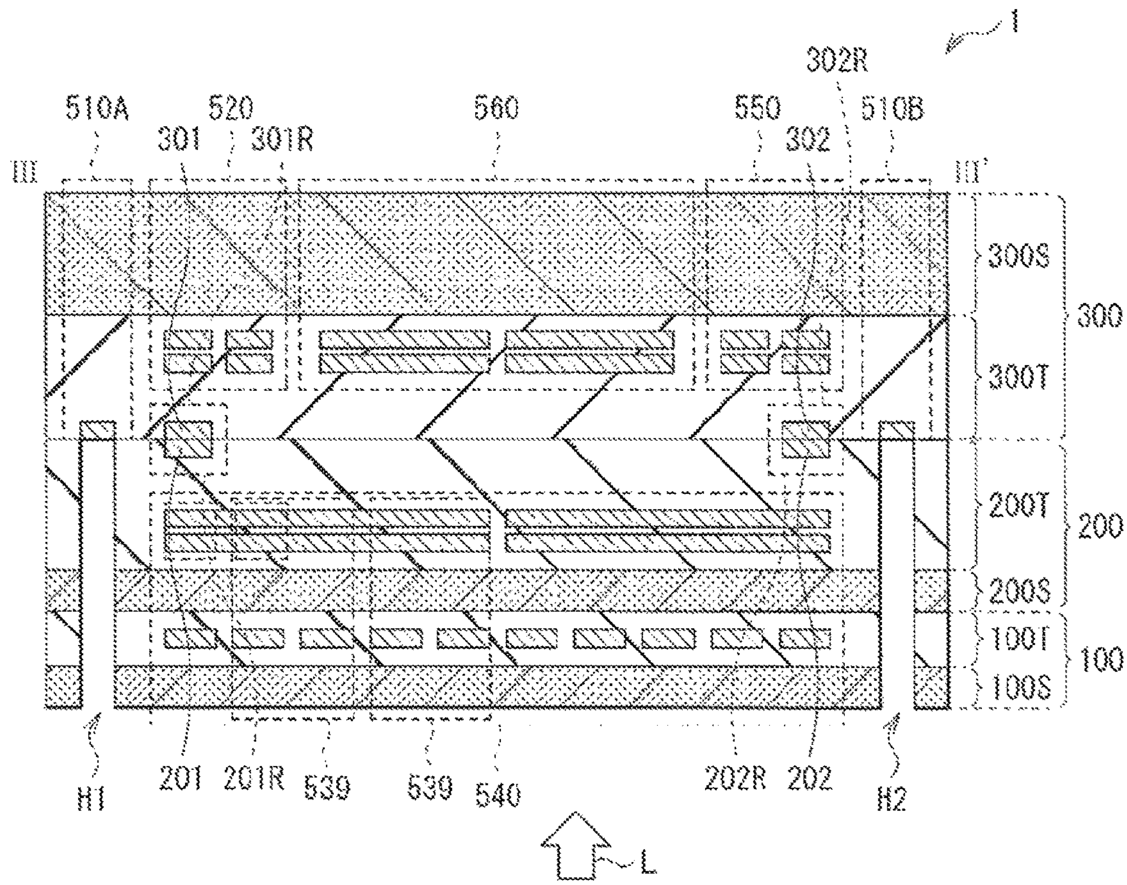
FIG. 3 is a schematic view of a cross-sectional configuration taken along a line III-III' illustrated in FIG. 2.

FIGS. 2 and 3 each illustrate an example of a schematic configuration of the imaging device 1. The imaging device 1 includes three substrates (a first substrate 100, a second substrate 200, and a third substrate 300). FIG. 2 schematically illustrates a planar configuration of each of the first substrate 100, the second substrate 200, and the third substrate 300, and FIG. 3 schematically illustrates a cross-sectional configuration of the first substrate 100, the second substrate 200, and the third substrate 300 that are stacked on each other. FIG. 3 corresponds to a cross-sectional configuration taken along a line illustrated in FIG. 2. The imaging device 1 is an imaging device having a three-dimensional structure in which three substrates (the first substrate 100, the second substrate 200, and the third substrate 300) are bonded together. The first substrate 100 includes a semiconductor layer 100S and a wiring layer 100T. The second substrate 200 includes a semiconductor layer 200S and a wiring layer 200T. The third substrate 300 includes a semiconductor layer 300S and a wiring layer 300T. Herein, for the sake of convenience, a combination of a wiring line included in each substrate of the first substrate 100, the second substrate 200, and the third substrate 300 and its surrounding interlayer insulating film is referred to as a wiring layer (100T, 200T, or 300T) provided in each of substrates (the first substrate 100, the second substrate 200, and the third substrate 300). The first substrate 100, the second substrate 200, and the third substrate 300 are stacked in this order, and the semiconductor layer 100S, the wiring layer 100T, the semiconductor layer 200S, the wiring layer 200T, the wiring layer 300T, and the semiconductor layer 300S are disposed in this order in a stacking direction. Specific configurations of the first substrate 100, the second substrate 200, and the third substrate 300 are described later. An arrow illustrated in FIG. 3 indicates an incident direction of light L onto the imaging device 1. In the present specification, for the sake of convenience, in subsequent cross-sectional views, light incident side in the imaging device 1 is sometimes referred to as "bottom", "lower side", or "below", and side opposite to the light incident side is sometimes referred to as "top", "upper side", or "above". In addition, in the present specification, for the sake of convenience, in a substrate including a semiconductor layer and a wiring layer, side of the wiring layer is sometimes referred to as a front surface, and side of the semiconductor layer is sometimes referred to as a back surface. It is to be noted that references in the specification are not limited to those described above. The imaging device 1 is, for example, a back-illuminated imaging device in which light enters from back surface side of the first substrate 100 including a photodiode.

The pixel array section 540 and the pixel sharing units 539 included in the pixel array section 540 are both configured with use of both the first substrate 100 and the second substrate 200. The first substrate 100 includes a plurality of pixels 541A, 541B, 541C, and 541D included in the pixel sharing units 539. Each of the pixels 541 includes a photodiode (a photodiode PD to be described later) and a transfer transistor (a transfer transistor TR to be described later). The second substrate 200 includes pixel circuits (pixel circuits 200X to be described later) included in the pixel sharing units 539. The pixel circuits each read a pixel signal transferred from the photodiode of each of the pixels 541A, 541B, 541C, and 541D through the transfer transistor, or reset the photodiode. The second substrate 200 includes, in addition to such pixel circuits, a plurality of row drive signal lines 542 extending in the row direction and a plurality of vertical signal lines 543 extending in the column direction. The second substrate 200 further includes a power source line 544 (a power source line VDD to be described later or the like) extending in the row direction. The third substrate 300 includes, for example, the input section 510A, the row driving section 520, the timing controller 530, the column signal processor 550, the image signal processor 560, and the output section 510B. The row driving section 520 is provided in, for example, a region partially overlapping the pixel array section 540 in a stacking direction of the first substrate 100, the second substrate 200, and the third substrate 300 (hereinafter simply referred to as a stacking direction). More specifically, the row driving section 520 is provided in a region overlapping a portion in proximity to an end in the H direction of the pixel array section 540 in the stacking direction (FIG. 2). The column signal processor 550 is provided in, for example, a region partially overlapping the pixel array section 540 in the stacking direction. More specifically, the column signal processor 550 is provided in a region overlapping a portion in proximity to an end in the V direction of the pixel array section 540 in the stacking direction (FIG. 2). Although not illustrated, the input section 510A and the output section 510B may be disposed in a portion other than the third substrate 300, and may be disposed in the second substrate 200, for example. Alternatively, the input section 510A and the output section 510B may be provided on the back surface (light incident surface) side of the first substrate 100. It is to be noted that the pixel circuit provided in the second substrate 200 described above is also referred to as a pixel transistor circuit, a pixel transistor group, a pixel transistor, a pixel readout circuit, or a readout circuit. In the present specification, the term "pixel circuit" is used.

The first substrate 100 and the second substrate 200 are electrically coupled to each other by, for example, a through electrode (through electrodes 120E and 121E in FIG. 6 to be described later). The second substrate 200 and the third substrate 300 are electrically coupled to each other through, for example, contact sections 201, 202, 301, and 302. The second substrate 200 is provided with the contact sections 201 and 202, and the third substrate 300 is provided with the contact sections 301 and 302. The contact section 201 of the second substrate 200 is in contact with the contact section 301 of the third substrate 300, and the contact section 202 of the second substrate 200 is in contact with the contact section 302 of the third substrate 300. The second substrate 200 includes a contact region 201R provided with a plurality of contact sections 201 and a contact region 202R provided with a plurality of contact sections 202. The third substrate 300 includes a contact region 301R provided with a plurality of contact sections 301 and a contact region 302R provided with a plurality of contact sections 302. The contact regions 201R and 301R are provided in the stacking direction between the pixel array section 540 and the row driving section 520 (FIG. 3). In other words, the contact regions 201R and 301R are provided in, for example, a region where the row driving section 520 (the third substrate 300) and the pixel array section 540 (the second substrate 200) overlap each other in the stacking direction, or a region in proximity to the region. The contact regions 201R and 301R are disposed at an end in the H direction of such a region, for example (FIG. 2). In the third substrate 300, the contact region 301R is provided, for example, at a position overlapping a portion of the row driving section 520, specifically an end in the H direction of the row driving section 520 (FIGS. 2 and 3). The contact sections 201 and 301 couple, for example, the row driving section 520 provided in the third substrate 300 and the row drive signal lines 542 provided in the second substrate 200 to each other. The contact sections 201 and 301 may couple, for example, the input section 510A provided in the third substrate 300 to the power source line 544 and a reference potential line (a reference potential line VSS to be described later). The contact regions 202R and 302R are provided in the stacking direction between the pixel array section 540 and the column signal processor 550 (FIG. 3). In other words, the contact regions 202R and 302R are provided in, for example, a region where the column signal processor 550 (the third substrate 300) and the pixel array section 540 (the second substrate 200) overlap each other in the stacking direction, or a region in proximity to the region. The contact regions 202R and 302R are disposed at an end in the V direction of such a region (FIG. 2). In the third substrate 300, the contact region 301R is provided, for example, at a position overlapping a portion of the column signal processor 550, specifically an end in the V direction of the column signal processor 550 (FIGS. 2 and 3). The contact sections 202 and 302 couple, for example, a pixel signal outputted from each of the plurality of pixel sharing units 539 included in the pixel array section 540 (a signal corresponding to the amount of electric charges generated as a result of photoelectric conversion by the photodiode) to the column signal processor 550 provided in the third substrate 300. The pixel signal is transmitted from the second substrate 200 to the third substrate 300.

FIG. 3 is an example of a cross-sectional view of the imaging device 1 as described above. The first substrate 100, the second substrate 200, and the third substrate 300 are electrically coupled to each other through the wiring layers 100T, 200T, and 300T. For example, the imaging device 1 includes an electrical coupling section that electrically couples the second substrate 200 and the third substrate 300 to each other. Specifically, the contact sections 201, 202, 301, and 302 are each formed using an electrode that is formed using an electrically conductive material. The electrically conductive material is formed using, for example, a metal material such as copper (Cu), aluminum (Al), and gold (Au). The contact regions 201R, 202R, 301R, and 302R electrically couple the second substrate and the third substrate to each other, for example, by directly bonding wiring lines formed as electrodes, which makes it possible to input and/or output signals to and from the second substrate 200 and the third substrate 300.

It is possible to provide, at a desired position, the electrical coupling section that electrically couples the second substrate 200 and the third substrate 300 to each other. For example, as described in FIG. 3 as the contact regions 201R. 202R, 301R, and 302R, the electrical coupling section may be provided in a region overlapping the pixel array section 540 in the stacking direction. In addition, the electrical coupling section may be provided in a region not overlapping the pixel array section 540 in the stacking direction. Specifically, the electrical coupling section may be provided in a region overlapping, in the stacking direction, a peripheral section disposed outside the pixel array section 540.

The first substrate 100 and the second substrate 200 include, for example, coupling hole sections H1 and H2. The coupling hole sections H1 and H2 penetrate through the first substrate 100 and the second substrate 200 (FIG. 3). The coupling hole sections H1 and H2 are provided outside the pixel array section 540 (or a portion overlapping the pixel array section 540) (FIG. 2). For example, the coupling hole section H1 is disposed outside the pixel array section 540 in the H direction, and the coupling hole section H2 is disposed outside the pixel array section 540 in the V direction. For example, the coupling hole section H1 reaches the input section 510A provided in the third substrate 300, and the coupling hole section H2 reaches the output section 510B provided in the third substrate 300. The coupling hole sections H1 and H2 may be hollows, or may at least partially include an electrically conductive material. For example, there is a configuration in which a bonding wire is coupled to an electrode formed as the input section 510A and/or the output section 510B. Alternatively, there is a configuration in which the electrode formed as the input section 510A and/or the output section 510B and the electrically conductive material provided in the coupling hole sections H1 and H2 are coupled to each other. The electrically conductive material provided in the coupling hole sections H1 and H2 may be embedded in a portion or the entirety of each of the coupling hole sections H1 and H2, or the electrically conductive material may be formed on a sidewall of each of the coupling hole sections H1 and H2.

It is to be noted that FIG. 3 illustrates a configuration in which the input section 510A and the output section 510B are provided in the third substrate 300, but this is not limitative. For example, transmitting a signal of the third substrate 300 to the second substrate 200 through the wiring layers 200T and 300T makes it possible to provide the input section 510A and/or the output section 510B in the second substrate 200. Likewise, transmitting a signal of the second substrate 200 to the first substrate 100 through the wiring layers 100T and 200T makes it possible to provide the input section 510A and/or the output section 510B in the first substrate 100.

Figure 4:
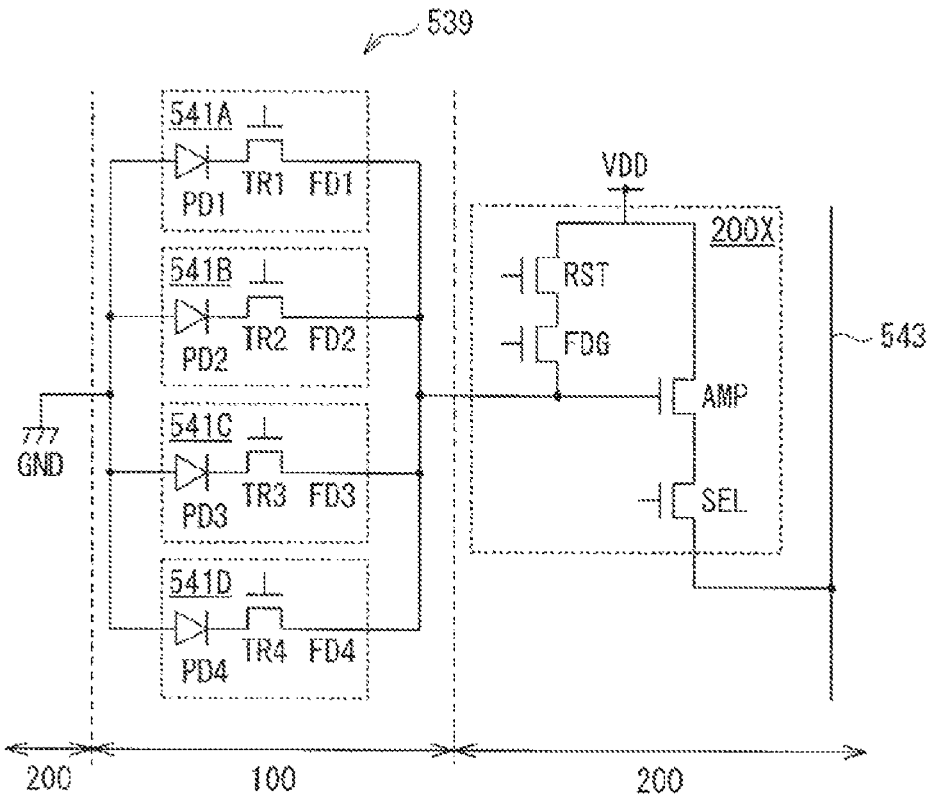
FIG. 4 is an equivalent circuit diagram of a pixel sharing unit illustrated in FIG. 1.

FIG. 4 is an equivalent circuit diagram illustrating an example of a configuration of the pixel sharing unit 539. The pixel sharing unit 539 includes a plurality of pixels 541 (FIG. 4 illustrates four pixels 541, that is, the pixels 541A, 541B, 541C, and 541D), one pixel circuit 200X coupled to the plurality of pixels 541, and the vertical signal line 543 coupled to the pixel circuit 200X. The pixel circuit 200X includes, for example, four transistors, specifically, an amplification transistor AMP, a selection transistor SEL, a reset transistor RST, and an FD conversion gain switching transistor FDG. As described above, the pixel sharing unit 539 operates one pixel circuit 200X in a time division manner to sequentially output pixel signals of the four pixels 541 (the pixels 541A, 541B, 541C, and 541D) included in the pixel sharing unit 539 to the vertical signal line 543. One pixel circuit 200X is coupled to the plurality of pixels 541, and a mode in which the pixel signals of the plurality of pixels 541 are outputted by the one pixel circuit 200X in a time division manner means “sharing one pixel circuit 200X by the plurality of pixels 541”.

The pixels 541A, 541B, 541C, and 541D include components common to each other. Hereinafter, in order to distinguish components of the pixels 541A, 541B, 541C, and 541D from one another, an identification number “1” is assigned at the end of a reference sign of the component of the pixel 541A, an identification number “2” is assigned at the end of a reference sign of the component of the pixel 541B, an identification number “3” is assigned at the end of a reference sign of the component of the pixel 541C, and an identification number “4” is assigned at the end of a reference sign of the component of the pixel 541D. In a case where the components of the pixels 541A, 541B, 541C, and 541D do not need to be distinguished from one another, the identification number at the end of the reference sign of the component of each of the pixels 541A, 541B, 541C, and 541D is omitted.

The pixels 541A, 541B, 541C, and 541D each include, for example, the photodiode PD, the transfer transistor TR electrically coupled to the photodiode PD, and a floating diffusion FD electrically coupled to the transfer transistor TR. In the photodiode PD (PD1, PD2, PD3, and PD4), a cathode is electrically coupled to a source of the transfer transistor TR, and an anode is electrically coupled to the reference potential line (e.g., a ground). The photodiode PD photoelectrically converts incident light to generate electric charges corresponding to the amount of received light. The transfer transistor TR (transfer transistors TR1, TR2, TR3, and TR4) is, for example, an n-type CMOS (Complementary Metal Oxide Semiconductor) transistor. In the transfer transistor TR, a drain is electrically coupled to the floating diffusion FD, and a gate is electrically coupled to a drive signal line. The drive signal line is a portion of the plurality of row drive signal lines 542 (see FIG. 1) coupled to one pixel sharing unit 539. The transfer transistor TR transfers the electric charges generated by the photodiode PD to the floating diffusion FD. The floating diffusion FD (floating diffusions FD1, FD2, FD3, and FD4) is an n-type diffusion layer region formed in a p-type semiconductor layer. The floating diffusion FD is an electric charge holding means that temporarily holds the electric charges transferred from the photodiode PD, as well as an electric charge-voltage conversion means that generates a voltage corresponding to the amount of the electric charges. Herein, the photodiode PD corresponds to a specific example of a “photoelectric converter” of the present disclosure, and the floating diffusion FD corresponds to a specific example of an “electric charge accumulation section” of the present disclosure.

The four floating diffusions FD (the floating diffusions FD1, FD2, FD3, and FD4) included in one pixel sharing unit 539 are electrically coupled to each other, and are electrically coupled to a gate of the amplification transistor AMP and a source of the FD conversion gain switching transistor FDG. A drain of the FD conversion gain switching transistor FDG is coupled to a source of the reset transistor RST, and a gate of the FD conversion gain switching transistor FDG is coupled to a drive signal line. The drive signal line is a portion of the plurality of row drive signal lines 542 coupled to the one pixel sharing unit 539. A drain of the reset transistor RST is coupled to the power source line VDD, and a gate of the reset transistor RST is coupled to a drive signal line. The drive signal line is a portion of the plurality of row drive signal lines 542 coupled to the one pixel sharing unit 539. A gate of the amplification transistor AMP is coupled to the floating diffusion FD, a drain of the amplification transistor AMP is coupled to the power source line VDD, and a source of the amplification transistor AMP is coupled to a drain of the selection transistor SEL. A source of the selection transistor SEL is coupled to the vertical signal line 543, and a gate of the selection transistor SEL is coupled to a drive signal line. The drive signal line is a portion of the plurality of row drive signal lines 542 coupled to the one pixel sharing unit 539.

In a case where the transfer transistor TR is turned on, the transfer transistor TR transfers electric charges of the photodiode PD to the floating diffusion FD. The gate (a transfer gate TG) of the transfer transistor TR includes, for example, a so-called vertical electrode, and is provided to extend from a front surface of a semiconductor layer (the semiconductor layer 100S in FIG. 6 to be described later) to a depth reaching the PD, as illustrated in FIG. 6 to be described later. The reset transistor RST resets the potential of the floating diffusion FD to a predetermined potential. In a case where the reset transistor RST is turned on, the potential of the floating diffusion FD is reset to the potential of the power source line VDD. The selection transistor SEL controls an output timing of the pixel signal from the pixel circuit 200X. The amplification transistor AMP generates, as the pixel signal, a signal of a voltage corresponding to the level of electric charges held by the floating diffusion FD. The amplification transistor AMP is coupled to the vertical signal line 543 through the selection transistor SEL. The amplification transistor AMP configures a source follower together with the load circuit section (see FIG. 1) coupled to the vertical signal line 543 in the column signal processor 550. In a case where the selection transistor SEL is turned on, the amplification transistor AMP outputs the voltage of the floating diffusion FD to the column signal processor 550 through the vertical signal line 543. The reset transistor RST, the amplification transistor AMP, and the selection transistor SEL are, for example, N-type CMOS type transistors.

The FD conversion gain switching transistor FDG is used to change a gain of electric charge-voltage conversion in the floating diffusion FD. In general, a pixel signal is small when shooting in a dark place. In performing electric charge-voltage conversion on the basis of Q=CV, larger capacity of the floating diffusion FD (FD capacity C) causes the value V to be smaller upon conversion to a voltage at the amplification transistor AMP. Meanwhile, the pixel signal becomes large in a bright place; it is therefore not possible, for the floating diffusion FD, to receive the electric charges of the photodiode PD unless the FD capacity C is large. Further, the FD capacity C needs to be large to allow the value V not to be too large (in other words, to be small) upon the conversion to a voltage at the amplification transistor AMP. Taking these into account, when the FD conversion gain switching transistor FDG is turned on, a gate capacity for the FD conversion gain switching transistor FDG is increased, thus causing the entire FD capacity C to be large. Meanwhile, when the FD conversion gain switching transistor FDG is turned off, the entire FD capacity C becomes small. In this manner, performing ON/OFF switching of the FD conversion gain switching transistor FDG enables the FD capacity C to be variable, thus making it possible to switch conversion efficiency. The FD conversion gain switching transistor FDG is, for example, an N-type CMOS type transistor.

It is to be noted that a configuration is possible in which the FD conversion gain switching transistor FDG is not provided. On this occasion, the pixel circuit 200X includes, for example, three transistors, that is, the amplification transistor AMP, the selection transistor SEL, and the reset transistor RST. The pixel circuit 200X includes, for example, at least one of the pixel transistors such as the amplification transistor AMP, the selection transistor SEL, the reset transistor RST, and the FD conversion gain switching transistor FDG.

The selection transistor SEL may be provided between the power source line VDD and the amplification transistor AMP. In this case, the drain of the reset transistor RST is electrically coupled to the power source line VDD and the drain of the selection transistor SEL. The source of the selection transistor SEL is electrically coupled to the drain of the amplification transistor AMP, and the gate of the selection transistor SEL is electrically coupled to the row drive signal line 542 (see FIG. 1). The source (an output end of the pixel circuit 200X) of the amplification transistor AMP is electrically coupled to the vertical signal line 543, and the gate of the amplification transistor AMP is electrically coupled to the source of the reset transistor RST. It is to be noted that although not illustrated, the number of pixels 541 that share one pixel circuit 200X may be other than four. For example, two or eight pixels 541 may share one pixel circuit 200X.

Figure 5:
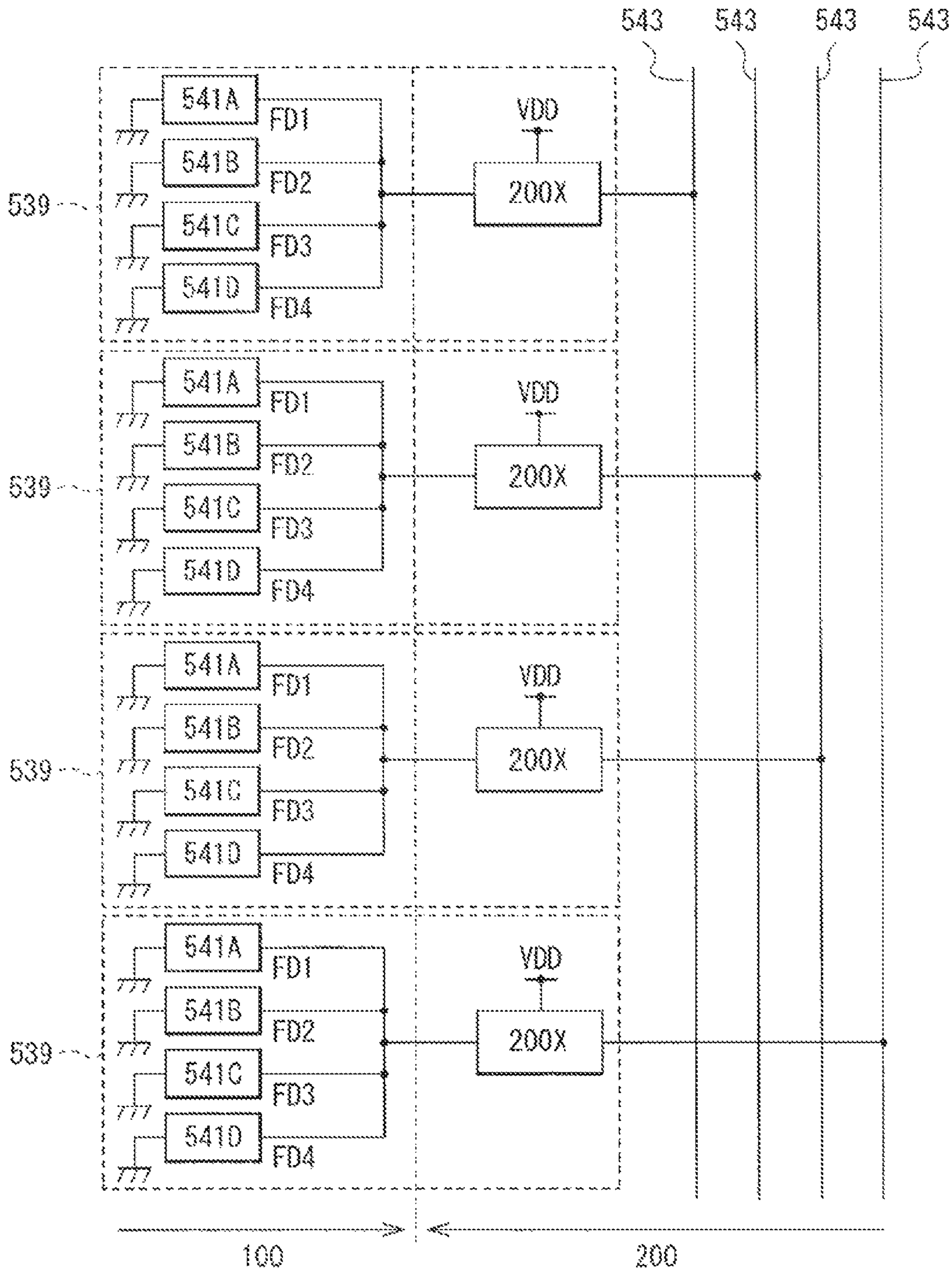
FIG. 5 is a diagram illustrating an example of a coupling mode between a plurality of pixel sharing units and a plurality of vertical signal lines.

FIG. 5 illustrates an example of a coupling mode between a plurality of pixel sharing units 539 and the vertical signal lines 543. For example, four pixel sharing units 539 arranged side by side in the column direction are divided into four groups, and the vertical signal line 543 is coupled to each of the four groups. For ease of explanation, FIG. 5 illustrates an example in which each of the four groups includes one pixel sharing unit 539; however, each of the four groups may include a plurality of pixel sharing units 539. As described above, in the imaging device 1, the plurality of pixel sharing units 539 arranged side by side in the column direction may be divided into groups including one or a plurality of pixel sharing units 539. For example, the vertical signal line 543 and the column signal processor 550 are coupled to each of the groups, which makes it possible to simultaneously read the pixel signals from the respective groups. Alternatively, in the imaging device 1, one vertical signal line 543 may be coupled to a plurality of pixel sharing units 539 arranged side by side in the column direction. On this occasion, the pixel signals are sequentially read from the plurality of pixel sharing units 539 coupled to the one vertical signal line 543 in a time division manner.

[Specific Configuration of Imaging Device 1]

Figure 6:
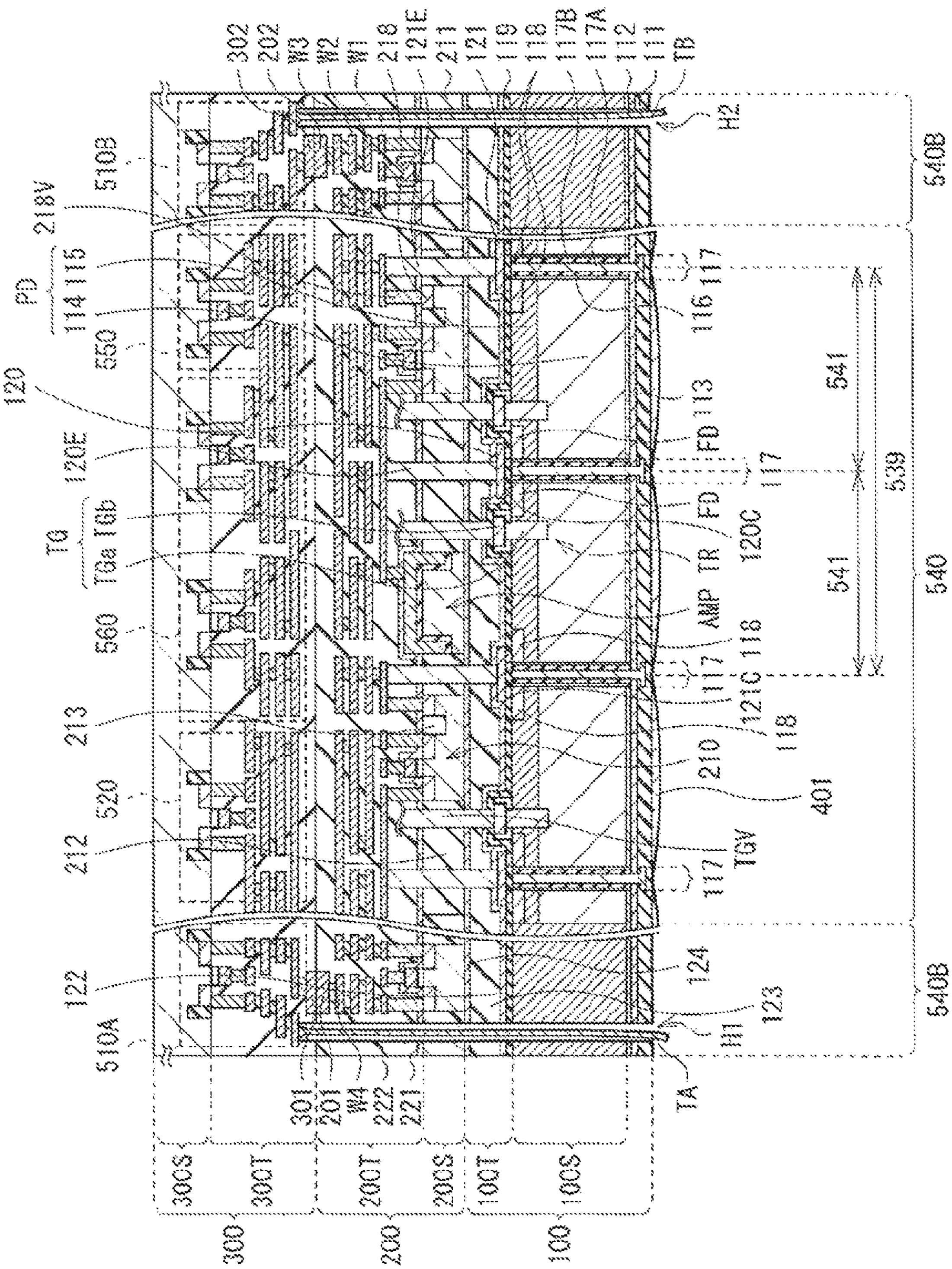
FIG. 6 is a schematic cross-sectional view of an example of a specific configuration of the imaging device illustrated in FIG. 3.

FIG. 6 illustrates an example of a cross-sectional configuration in a vertical direction with respect to main surfaces of the first substrate 100, the second substrate 200, and the third substrate 300 of the imaging device 1. FIG. 6 schematically illustrates a positional relationship of components for ease of understanding, and may be different from an actual cross section. In the imaging device 1, the first substrate 100, the second substrate 200, and the third substrate 300 are stacked in this order. The imaging device 1 further includes a light-receiving lens 401 on the back surface side (light incident surface side) of the first substrate 100. A color filter layer (not illustrated) may be provided between the light-receiving lens 401 and the first substrate 100. The light-receiving lens 401 is provided for each of the pixels 541A, 541B, 541C, and 541D, for example. The imaging device 1 is, for example, a back-illuminated imaging device. The imaging device 1 includes the pixel array section 540 disposed in a middle portion and a peripheral section 540B disposed outside the pixel array section 540.

The first substrate 100 includes an insulating film 111, a fixed electric charge film 112, the semiconductor layer 100S, and the wiring layer 100T in order from side of the light-receiving lens 401. The semiconductor layer 100S includes, for example, a silicon substrate. The semiconductor layer 100S includes, for example, a p-well layer 115 in a portion of the front surface (a surface on side of the wiring layer 100T) and in proximity to the portion, and includes an n-type semiconductor region 114 in a region (a region deeper than the p-well layer 115) other than the p-well layer 115. For example, the pn-junction photodiode PD includes the n-type semiconductor region 114 and the p-well layer 115. The p-well layer 115 is a p-type semiconductor region.

Figure 7A:
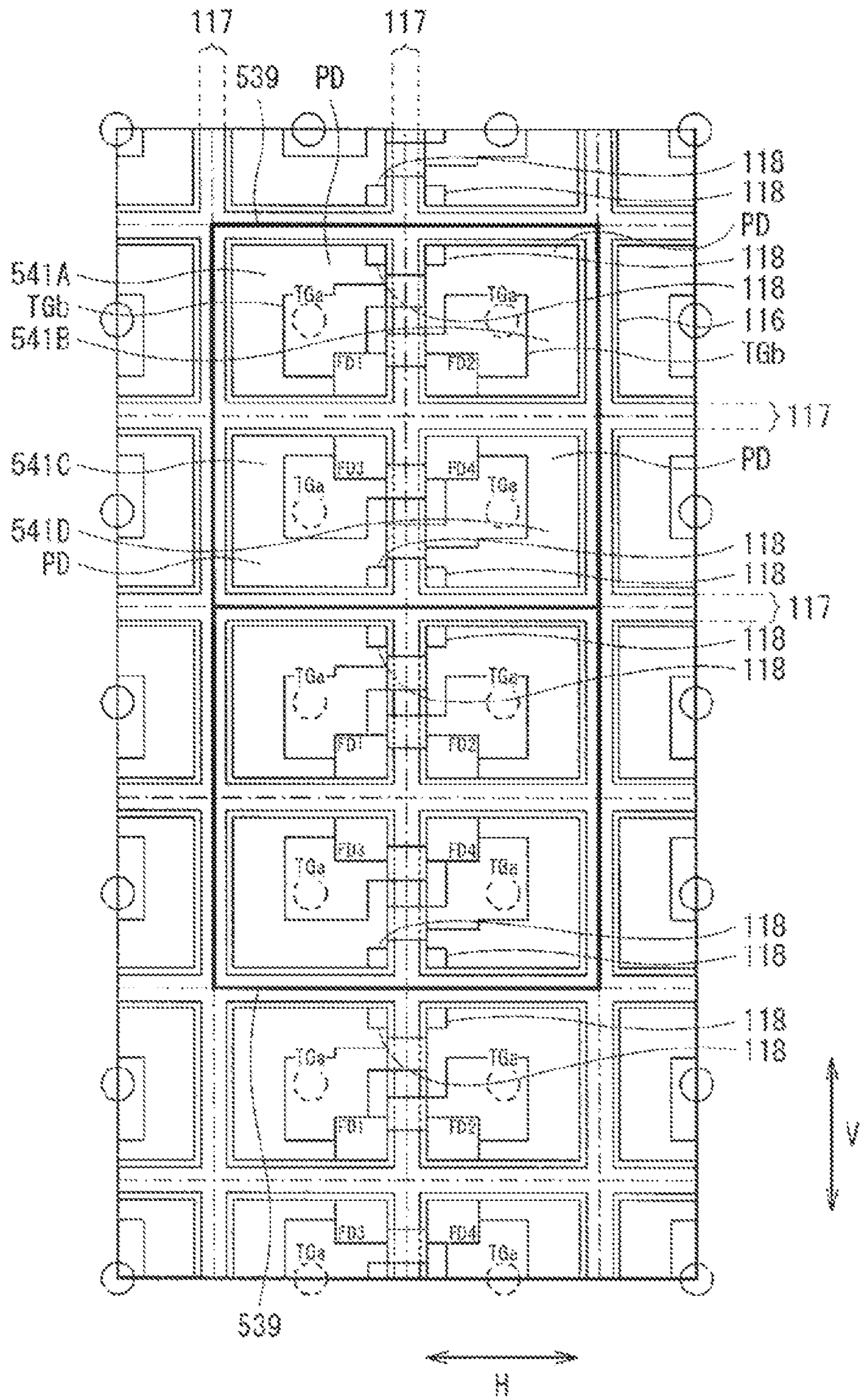
FIG. 7A is a schematic view of an example of a planar configuration of a main part of a first substrate illustrated in FIG. 6.

FIG. 7A illustrates an example of a planar configuration of the first substrate 100. FIG. 7A mainly illustrates a planar configuration of a pixel separation section 117, the photodiode PD, the floating diffusion FD, a VSS contact region 118, and the transfer transistor TR of the first substrate 100. The configuration of the first substrate 100 is described with use of FIG. 7A together with FIG. 6.

The floating diffusion FD and the VSS contact region 118 are provided in proximity to the front surface of the semiconductor layer 100S. The floating diffusion FD includes an n-type semiconductor region provided in the p-well layer 115. The floating diffusions FD (the floating diffusions FD1, FD2, FD3, and FD4) of the pixels 541A, 541B, 541C, and 541D are provided close to each other in a middle portion of the pixel sharing unit 539, for example (FIG. 7A). As described in detail later, the four floating diffusions (the floating diffusions FD1, FD2, FD3, and FD4) included in the pixel sharing unit 539 are electrically coupled to each other in the first substrate (more specifically in the wiring layer 100T) through an electrical coupling means (a pad section 120 to be described later). Furthermore, the floating diffusions FD are coupled from the first substrate 100 to the second substrate 200 (more specifically, from the wiring layer 100T to the wiring layer 200T) through an electrical means (the through electrode 120E to be described later). In the second substrate 200 (more specifically inside the wiring layer 200T), the floating diffusions FD are electrically coupled to the gate of the amplification transistor AMP and the source of the FD conversion gain switching transistor FDG by the electrical means. Herein, the VSS contact region 118 corresponds to a specific example of an "impurity diffusion region" of the present disclosure.

The VSS contact region 118 is a region electrically coupled to the reference potential line VSS, and is disposed apart from the floating diffusion FD. For example, in the pixels 541A, 541B, 541C, and 541D, the floating diffusion FD is disposed at one end in the V direction of each pixel, and the VSS contact region 118 is disposed at another end (FIG. 7A). The VSS contact region 118 includes, for example, a p-type semiconductor region. The VSS contact region 118 is coupled to a ground potential or a fixed potential, for example. Thus, a reference potential is supplied to the semiconductor layer 100S.

The first substrate 100 includes the transfer transistor TR together with the photodiode PD, the floating diffusion FD, and the VSS contact region 118. The photodiode PD, the floating diffusion FD, the VSS contact region 118, and the transfer transistor TR are provided in each of the pixels 541A, 541B, 541C, and 541D. The transfer transistor TR is provided on front surface side (side opposite to the light incident surface side, side of the second substrate 200) of the semiconductor layer 100S. The transfer transistor TR includes the transfer gate TG. The transfer gate TG includes, for example, a horizontal portion TGb opposed to the front surface of the semiconductor layer 100S, and a vertical portion TGa provided inside the semiconductor layer 100S. The vertical portion TGa extends in a thickness direction of the semiconductor layer 100S. The vertical portion TGa has one end in contact with the horizontal portion TGb, and another end provided inside the n-type semiconductor region 114. The transfer transistor TR includes such a vertical transistor, which hinders occurrence of a failure in transferring the pixel signal, thus making it possible to improve readout efficiency of the pixel signal.

The horizontal portion TGb of the transfer gate TG extends from a position opposed to the vertical portion TGa toward, for example, the middle portion of the pixel sharing unit 539 in the H direction (FIG. 7A). This makes it possible to bring the position in the H direction of a through electrode (the through electrode TGV to be described later) that reaches the transfer gate TG close to positions in the H direction of through electrodes (the through electrodes 120E and 121E to be described later) coupled to the floating diffusion FD and the VSS contact region 118. For example, the plurality of pixel sharing units 539 provided in the first substrate 100 have the same configuration as each other (FIG. 7A).

Figure 8A:
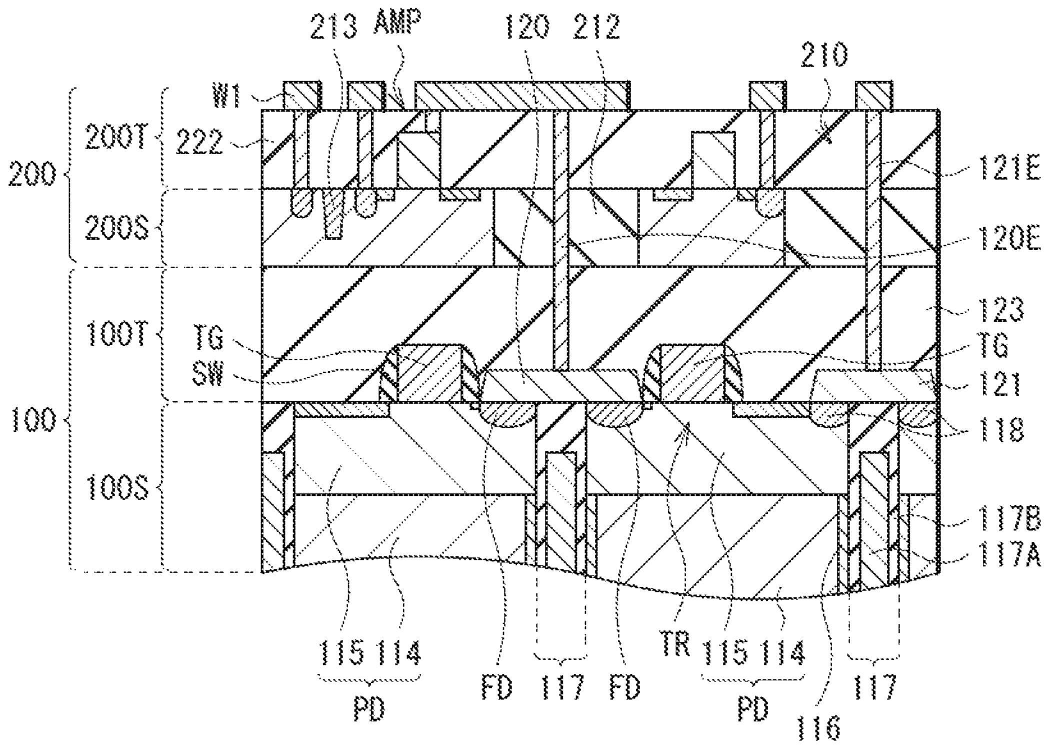
FIG. 8A is a schematic view of another example (1) of a cross-sectional configuration of main parts of the first substrate and a second substrate illustrated in FIG. 6.
Figure 8B:
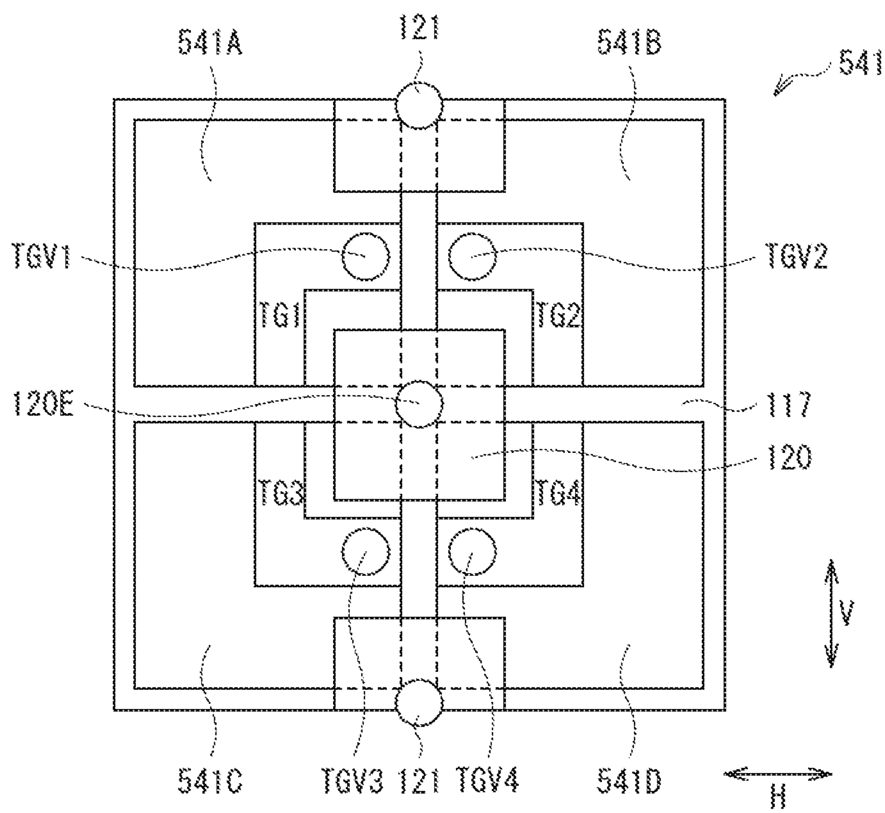
FIG. 8B is a schematic view of a planar configuration of the main parts of the first substrate and the second substrate illustrated in FIG. 8A.

FIGS. 8A and 8B schematically illustrate another example of the configuration of main parts of the first substrate 100 and the second substrate 200. FIG. 8A illustrates a cross-sectional configuration of the main parts of the first substrate 100 and the second substrate 200, and FIG. 8B illustrates an example of a planar configuration of the pixel sharing unit 539.

The transfer transistor TR may include a planar type transistor (FIG. 8A). On this occasion, for example, the transfer gate TG is provided on the front surface of the semiconductor layer 100S. For example, a side surface of the transfer gate TG is covered with a sidewall SW. The sidewall SW includes, for example, silicon nitride (SiN). A gate insulating film (not illustrated in FIG. 8A, a gate insulating film TR-I in FIG. 19B to be described later) is provided between the semiconductor layer 100S and the transfer gate TG. The transfer gates TG (transfer gates TG1, TG2, TG3, and TG4) of the pixels 541A, 541B, 541C, and 541D are provided to surround the floating diffusions FD in plan view, for example (FIG. 8B).

Figure 7B:
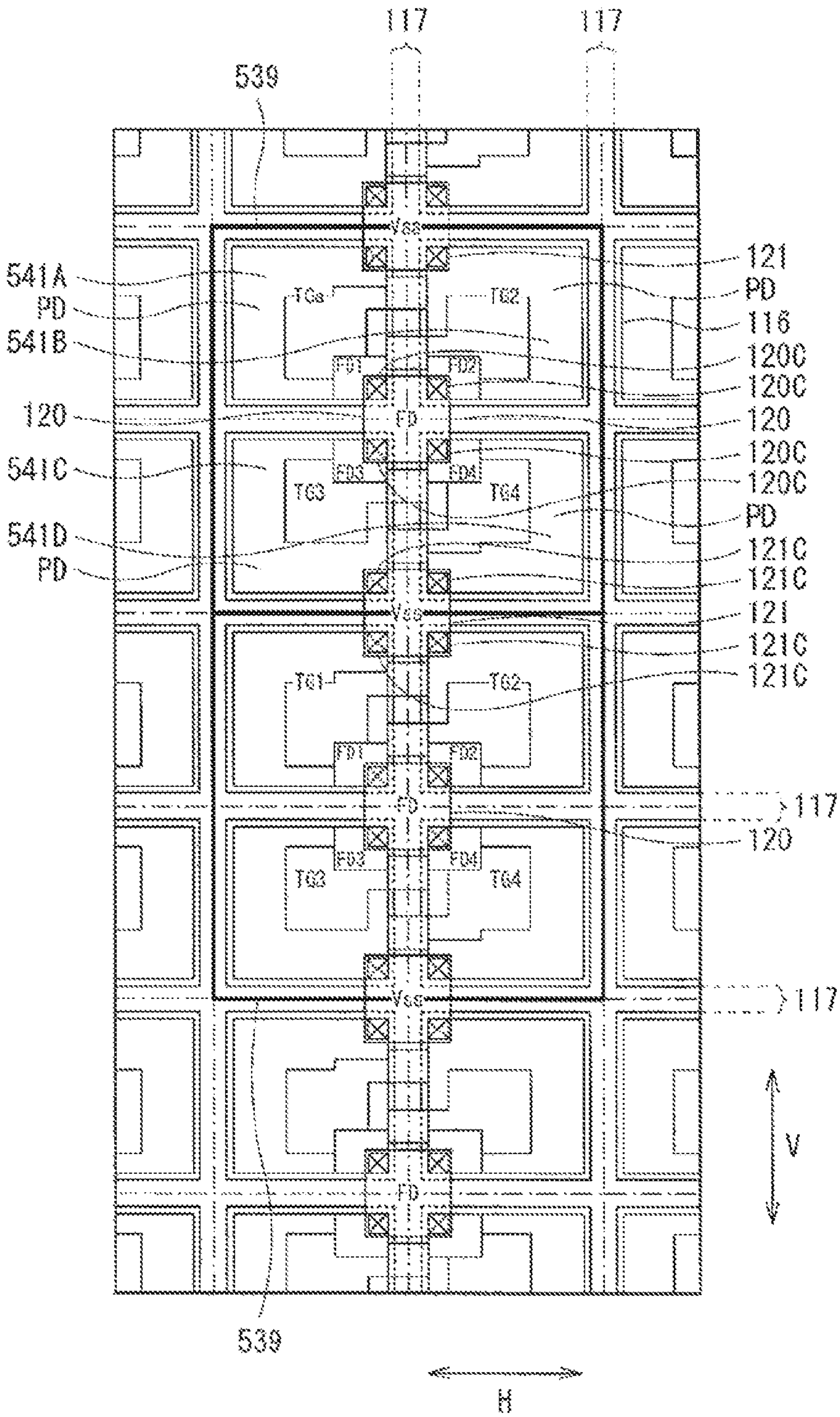
FIG. 7B is a schematic view of a planar configuration of pad sections together with the main part of the first substrate illustrated in FIG. 7A.

The semiconductor layer 100S includes the pixel separation section 117 that separates the pixels 541A, 541B, 541C, and 541D from each other. The pixel separation section 117 is formed to extend in a direction normal to the semiconductor layer 100S (a direction perpendicular to the front surface of the semiconductor layer 100S). The pixel separation section 117 is provided to partition the pixels 541A, 541B, 541C, and 541D from each other, and has a planar grid shape (FIGS. 7A and 7B). For example, the pixel separation section 117 electrically and optically separates the pixels 541A, 541B, 541C, and 541D from each other. The pixel separation section 117 includes, for example, a light-shielding film 117A and an insulating film 117B. For example, tungsten (W) or the like is used for the light-shielding film 117A. The insulating film 117B is provided between the light-shielding film 117A and the p-well layer 115 or the n-type semiconductor region 114. The insulating film 117B includes, for example, silicon oxide (SiO). The pixel separation section 117 has, for example, an FTI (Full Trench Isolation) structure, and penetrates through the semiconductor layer 100S. Although not illustrated, the pixel separation section 117 is not limited to the FTI structure that penetrates through the semiconductor layer 100S. For example, the pixel separation section 117 may have a DTI (Deep Trench Isolation) structure that does not penetrate through the semiconductor layer 100S. The pixel separation section 117 extends in the direction normal to the semiconductor layer 100S, and is formed in a partial region of the semiconductor layer 100S.

The semiconductor layer 100S includes, for example, a first pinning region 113 and a second pinning region 116. The first pinning region 113 is provided in proximity to the back surface of the semiconductor layer 100S, and is disposed between the n-type semiconductor region 114 and the fixed electric charge film 112. The second pinning region 116 is provided on a side surface of the pixel separation section 117, specifically, between the pixel separation section 117 and the p-well layer 115 or the n-type semiconductor region 114. The first pinning region 113 and the second pinning region 116 each include, for example, a p-type semiconductor region.

The fixed electric charge film 112 having a negative fixed electric charge is provided between the semiconductor layer 100S and the insulating film 111. The first pinning region 113 of a hole accumulation layer is formed at an interface on side of a light-receiving surface (the back surface) of the semiconductor layer 100S by an electric field induced by the fixed electric charge film 112. This suppresses generation of a dark current caused by an interface state on the side of the light-receiving surface of the semiconductor layer 100S. The fixed electric charge film 112 is formed using, for example, an insulating film having a negative fixed electric charge. Examples of a material of the insulating film having a negative fixed electric charge include hafnium oxide, zirconium oxide, aluminum oxide, titanium oxide, and tantalum oxide.

The light-shielding film 117A is provided between the fixed electric charge film 112 and the insulating film 111. The light-shielding film 117A may be provided continuously to the light-shielding film 117A included in the pixel separation section 117. The light-shielding film 117A between the fixed electric charge film 112 and the insulating film 111 is selectively provided at a position opposed to the pixel separation section 117 inside the semiconductor layer 100S, for example. The insulating film 111 is provided to cover the light-shielding film 117A. The insulating film 111 includes, for example, silicon oxide.

The wiring layer 100T provided between the semiconductor layer 100S and the second substrate 200 includes an interlayer insulating film 119, pad sections 120 and 121, a passivation film 122, an interlayer insulating film 123, and a bonding film 124 in this order from side of the semiconductor layer 100S. The horizontal portion TGb of the transfer gate TG is provided in the wiring layer 100T, for example. The interlayer insulating film 119 is provided throughout the front surface of the semiconductor layer 100S, and is in contact with the semiconductor layer 100S. The interlayer insulating film 119 includes, for example, a silicon oxide film. It is to be noted that the configuration of the wiring layer 100T is not limited to the configuration described above, and it is sufficient if the wiring layer 100T has a configuration including a wiring line and an insulating film. Herein, the pad section 120 corresponds to a specific example of a “first shared coupling section” of the present disclosure, and the pad section 121 corresponds to a specific example of a “second shared coupling section” of the present disclosure.

FIG. 7B illustrates configurations of the pad sections 120 and 121 together with the planar configuration illustrated in FIG. 7A. The pad sections 120 and 121 are provided in a selective region on the interlayer insulating film 119. The pad section 120 couples the floating diffusions FD (the floating diffusions FD1, FD2, FD3, and FD4) of the pixels 541A, 541B, 541C, and 541D to each other. The pad section 120 is disposed, for example, for each pixel sharing unit 539 in the middle portion of the pixel sharing unit 539 in plan view (FIG. 7B). The pad section 120 is provided to straddle the pixel separation section 117, and is disposed to be superimposed on at least a portion of each of the floating diffusions FD1, FD2, FD3, and FD4 (FIGS. 6 and 7B). Specifically, the pad section 120 is formed in a region overlapping, in the direction perpendicular to the front surface of the semiconductor layer 100S, at least a portion of each of the plurality of floating diffusions FD (the floating diffusions FD1, FD2, FD3, and FD4) that shares the pixel circuit 200X and at least a portion of the pixel separation section 117 formed between the plurality of photodiodes PD (the photodiodes PD1, PD2, PD3, and PD4) that shares the pixel circuit 200X. The interlayer insulating film 119 includes a coupling via 120C for electrically coupling the pad section 120 and each of the floating diffusions FD1, FD2, FD3, and FD4 to each other. The coupling via 120C is provided for each of the pixels 541A, 541B, 541C, and 541D. For example, a portion of the pad section 120 is embedded in the coupling via 120C to electrically couple the pad section 120 and each of the floating diffusions FD1, FD2, FD3, and FD4 to each other.

Figure 9:
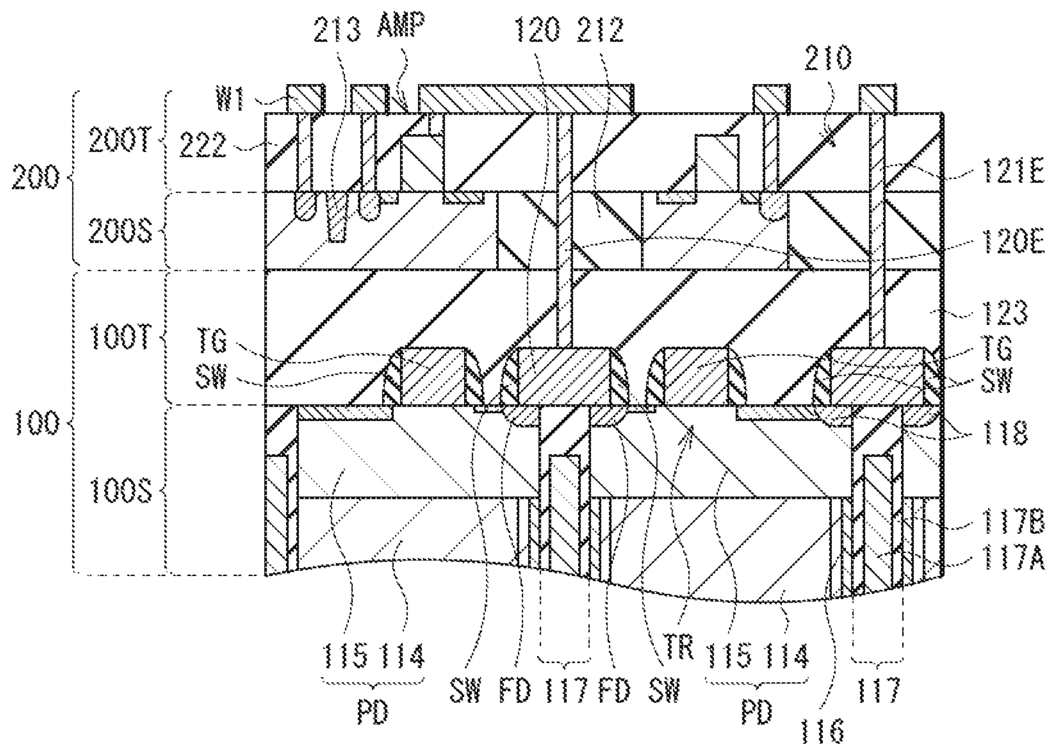
FIG. 9 is a schematic view of another example (2) of a cross-sectional configuration of the main parts of the first substrate and the second substrate illustrated in FIG. 6.

The pad section 121 couples a plurality of VSS contact regions 118 to each other. For example, the VSS contact regions 118 provided in the pixels 541C and 541D of one of the pixel sharing units 539 adjacent to each other in the V direction, and the VSS contact regions provided in the pixels 541A and 541B of the other of the pixel sharing units 539 are electrically coupled to each other by the pad section 121. The pad section 121 is provided to straddle the pixel separation section 117, for example, and is disposed to be superimposed on at least a portion of each of the four VSS contact regions 118. Specifically, the pad section 121 is formed in a region overlapping, in the direction perpendicular to the front surface of the semiconductor layer 100S, at least a portion of each of the plurality of VSS contact regions 118 and at least a portion of the pixel separation section 117 formed between the plurality of VSS contact regions 118. The interlayer insulating film 119 includes a coupling via 121C for electrically coupling the pad section 121 and each of the VSS contact regions 118 to each other. The coupling via 121C is provided for each of the pixels 541A, 541B, 541C, and 541D. For example, a portion of the pad section 121 is embedded in the coupling via 121C to electrically couple the pad section 121 and each of the VSS contact regions 118 to each other. For example, the pad section 120 and the pad section 121 of each of a plurality of pixel sharing units 539 arranged side by side in the V direction are disposed at substantially the same position in the H direction (FIG. 7B). FIG. 9 illustrates another example of the configurations of the pad sections 120 and 121. The sidewall SW may be also provided on side surfaces of the pad sections 120 and 121 together with the side surface of the transfer gate TG in this manner.

Providing the pad section 120 makes it possible to reduce wiring lines for coupling from the floating diffusions FD to the pixel circuit 200X (e.g., a gate electrode of the amplification transistor AMP) in an entire chip. Likewise, providing the pad section 121 makes it possible to reduce wiring lines that supply a potential to each of the VSS contact regions 118 in the entire chip. This makes it possible to achieve a decrease in area of the entire chip, suppression of electrical interference between wiring lines in miniaturized pixels, cost reduction by reduction in the number of components, and/or the like.

It is possible to provide the pad sections 120 and 121 at desired positions of the first substrate 100 and the second substrate 200. Specifically, it is possible to provide the pad sections 120 and 121 in one of the wiring layer 100T and an insulating region 212 of the semiconductor layer 200S. In a case where the pad sections 120 and 121 are provided in the wiring layer 100T, the pad sections 120 and 121 may be in direct contact with the semiconductor layer 100S. Specifically, the pad sections 120 and 121 may be configured to be directly coupled to at least a portion of each of the floating diffusions FD and/or the VSS contact regions 118. In addition, a configuration may be adopted in which the coupling vias 120C and 121C are provided from each of the floating diffusions FD and/or the VSS contact regions 118 coupled to the pad sections 120 and 121, and the pad sections 120 and 121 are provided at desired positions of the wiring layer 100T and the insulating region 212 of the semiconductor layer 200S.

In particular, in a case where the pad sections 120 and 121 are provided in the wiring layer 100T, it is possible to reduce wiring lines coupled to the floating diffusions FD and/or the VSS contact regions 118 in the insulating region 212 of the semiconductor layer 200S. This makes it possible to reduce the area of the insulating region 212, for forming through wiring lines for coupling the floating diffusions FD to the pixel circuit 200X, of the second substrate 200 where the pixel circuits 200X are formed. Accordingly, it is possible to secure a large area of the second substrate 200 where the pixel circuits 200X are formed. Securing the area of the pixel circuit 200X makes it possible to form a large pixel transistor and contribute to an improvement in image quality resulting from noise reduction and the like.

In particular, in a case where the pixel separation section 117 uses an FTI structure, the floating diffusions FD and/or the VSS contact regions 118 are preferably provided in the respective pixels 541; therefore, using the configurations of the pad sections 120 and 121 makes it possible to significantly reduce wiring lines that couples the first substrate 100 and the second substrate 200 to each other.

In addition, as illustrated in FIG. 7B, for example, the pad sections 120 to which a plurality of floating diffusions FD is coupled and the pad sections 121 to which a plurality of VSS contact regions 118 is coupled are alternately linearly arranged in the V direction. In addition, the pad sections 120 and 121 are formed at positions surrounded by a plurality of photodiodes PD, a plurality of transfer gates TG, and a plurality of floating diffusions FD. This makes it possible to freely dispose an element other than the floating diffusions FD and the VSS contact regions 118 in the first substrate 100 where a plurality of elements are formed, and enhance efficiency of a layout of the entire chip. In addition, symmetry in a layout of elements formed in each of the pixel sharing units 539 is secured, which makes it possible to suppress variations in characteristics of the pixels 541.

The pad sections 120 and 121 include, for example, polysilicon (Poly Si), more specifically, a doped polysilicon doped with an impurity. The pad sections 120 and 121 preferably include an electrically conductive material having high heat resistance such as polysilicon, tungsten (W), titanium (Ti), and titanium nitride (TiN). This makes it possible to form the pixel circuit 200X after bonding the semiconductor layer 200S of the second substrate 200 to the first substrate 100. A reason for this is described below. It is to be noted that in the following description, a method of forming the pixel circuit 200X after bonding the first substrate 100 and the semiconductor layer 200S of the second substrate 200 together is referred to as a first manufacturing method.

Herein, it is conceivable to form the pixel circuit 200X in the second substrate 200 and thereafter bond the pixel circuit 200X to the first substrate 100 (hereinafter referred to as a second manufacturing method). In the second manufacturing method, electrodes for electrical coupling are formed in advance on both the front surface of the first substrate 100 (the front surface of the wiring layer 100T) and the front surface of the second substrate 200 (the front surface of the wiring layer 200T). In a case where the first substrate 100 and the second substrate 200 are bonded together, the electrodes for electrical coupling formed on the front surface of the first substrate 100 and the front surface of the second substrate 200 are brought into contact with each other at the same time. Thus, electrical coupling is formed between wiring lines included in the first substrate 100 and wiring lines included in the second substrate 200. Accordingly, configuring the imaging device 1 with use of the second manufacturing method makes it possible to perform manufacturing with use of appropriate processes corresponding to the configurations of the first substrate 100 and the second substrate 200 and manufacture an imaging device having high quality and high performance.

In such a second manufacturing method, upon bonding the first substrate 100 and the second substrate 200 together, an error in alignment may be caused by a manufacturing apparatus for bonding. In addition, the first substrate 100 and the second substrate 200 each have, for example, a diameter of about several tens cm, and upon bonding the first substrate 100 and the second substrate 200 together, expansion and contraction of substrates may occur in a microscopic region of each part of the first substrate 100 and the second substrate 200. The expansion and contraction of the substrates result from slight deviation of a timing at which the substrates come into contact with each other. An error may occur at the positions of the electrodes for electrical coupling formed on the front surface of the first substrate 100 and the front surface of the second substrate 200 due to such expansion and contraction of the first substrate 100 and the second substrate 200. In the second manufacturing method, even if such an error occurs, it is preferable to cause the electrodes of the first substrate 100 and the second substrate 200 to come into contact with each other. Specifically, at least one, preferably both of electrodes of the first substrate 100 and the second substrate 200 are made large in consideration of the error described above. Accordingly, in a case where the second manufacturing method is used, for example, the size (the size in a substrate plane direction) of the electrode formed on the front surface of the first substrate 100 or the second substrate 200 becomes larger than the size of an internal electrode extending in the thickness direction from inside of the first substrate 100 or the second substrate 200 to the front surface.

Meanwhile, the pad sections 120 and 121 include an electrically conductive material having heat resistance, which makes it possible to use the first manufacturing method described above. In the first manufacturing method, after the first substrate 100 including the photodiodes PD, the transfer transistors TR, and the like is formed, the first substrate 100 and the second substrate 200 (the semiconductor layer 2000S) are bonded together. On this occasion, the second substrate 200 is in a state in which a pattern such as an active element and a wiring layer included in the pixel circuit 200X is not yet formed. The second substrate 200 is in a state before forming the pattern; therefore, even if an error in a bonding position occurs upon bonding the first substrate 100 and the second substrate 200 together, an error in alignment between a pattern of the first substrate 100 and the pattern of the second substrate 200 is not caused by such a bonding error. A reason for this is that the pattern of the second substrate 200 is formed after bonding the first substrate 100 and the second substrate 200 together. It is to be noted that upon forming the pattern of the second substrate, for example, in an exposure apparatus for pattern formation, the pattern is formed to be aligned with the pattern formed on the first substrate. For the reason described above, in the first manufacturing method, an error in a bonding position between the first substrate 100 and the second substrate 200 is not an issue in manufacturing of the imaging device 1. For a similar reason, in the first manufacturing method, an error resulting from expansion and contraction of the substrate caused in the second manufacturing method is also not an issue in manufacturing of the imaging device 1.

In the first manufacturing method, after the first substrate 100 and the second substrate 200 (the semiconductor layer 200S) are bonded together in this manner, an active element is formed on the second substrate 200. Thereafter, the through electrodes 120E and 121E and the through electrodes TGV (FIG. 6) are formed. In formation of the through electrodes 120E, 121E, and TGV, for example, a pattern of through electrodes is formed from above the second substrate 200 with use of reduction-projection exposure by an exposure apparatus. The reduction-projection exposure is used; therefore, even if an error occurs in alignment between the second substrate 200 and the exposure apparatus, magnitude of the error in the second substrate 200 is only a fraction (the inverse number of reduction-projection exposure magnification) of the error in the second manufacturing method described above. Accordingly, alignment between elements formed in the first substrate 100 and the second substrate 200 is facilitated by configuring the imaging device 1 with use of the first manufacturing method, which makes it possible to manufacture an imaging device having high quality and high performance.

The imaging device 1 manufactured with use of such a first manufacturing method has characteristics different from those of an imaging device manufactured by the second manufacturing method. Specifically, in the imaging device 1 manufactured by the first manufacturing method, for example, the through electrodes 120E, 121E, and TGV each have a substantially constant thickness (size in the substrate plane direction) from the second substrate 200 to the first substrate 100. Alternatively, in a case where the through electrodes 120E, 121E, and TGV each have a tapered shape, they have a tapered shape having a constant slope. In the imaging device 1 including such through electrodes 120E, 121E, and TGV, the pixels 541 are easily miniaturized.

Herein, in a case where the imaging device 1 is manufactured by the first manufacturing method, the active element is formed on the second substrate 200 after bonding the first substrate 100 and the second substrate 200 (the semiconductor layer 200S) together; therefore, heating treatment necessary for formation of the active element also affects the first substrate 100. For this reason, as described above, the pad sections 120 and 121 provided in the first substrate 100 preferably use an electrically conductive material having high heat resistance. For example, the pad sections 120 and 121 preferably use a material having a higher melting point (that is, higher heat resistance) than the melting point of at least some of wiring materials included in the wiring layer 200T of the second substrate 200. For example, the pad sections 120 and 121 use an electrically conductive material having high heat resistance such as doped polysilicon, tungsten, titanium, and titanium nitride. This makes it possible to manufacture the imaging device 1 with use of the first manufacturing method described above.

The pad sections 120 and 121 may include a metal material such as tantalum nitride (TaN), aluminum (Al), and copper (Cu).

The passivation film 122 is provided throughout the front surface of the semiconductor layer 100S to cover the pad sections 120 and 121, for example (FIG. 6). The passivation film 122 includes, for example, a silicon nitride (SiN) film. The interlayer insulating film 123 covers the pad sections 120 and 121 with the passivation film 122 interposed therebetween. The interlayer insulating film 123 is provided throughout the front surface of the semiconductor layer 100S, for example. The interlayer insulating film 123 includes, for example, a silicon oxide (SiO) film. The bonding film 124 is provided on a bonding surface between the first substrate 100 (specifically the wiring layer 100T) and the second substrate 200. That is, the bonding film 124 is in contact with the second substrate 200. The bonding film 124 is provided throughout the main surface of the first substrate 100. The bonding film 124 includes, for example, a silicon nitride film.

The light-receiving lens 401 is opposed to the semiconductor layer 100S with the fixed electric charge film 112 and the insulating film 111 interposed therebetween, for example (FIG. 6). The light-receiving lens 401 is provided at a position opposed to the photodiode PD of each of the pixels 541A, 541B, 541C, and 541D, for example.

The second substrate 200 includes the semiconductor layer 200S and the wiring layer 200T in this order from side of the first substrate 100. The semiconductor layer 200S includes a silicon substrate. In the semiconductor layer 200S, a well region 211 is provided in the thickness direction. The well region 211 is, for example, a p-type semiconductor region. The second substrate 200 includes the pixel circuit 200X disposed for each of the pixel sharing units 539. The pixel circuit 200X is provided on front surface side (side of the wiring layer 200T) of the semiconductor layer 200S, for example. In the imaging device 1, the second substrate 200 is bonded to the first substrate 100 to cause back surface side (side of the semiconductor layer 200S) of the second substrate 200 to be opposed to front surface side (side of the wiring layer 100T) of the first substrate 100. That is, the second substrate 200 is bonded face-to-back to the first substrate 100.

Figure 10:
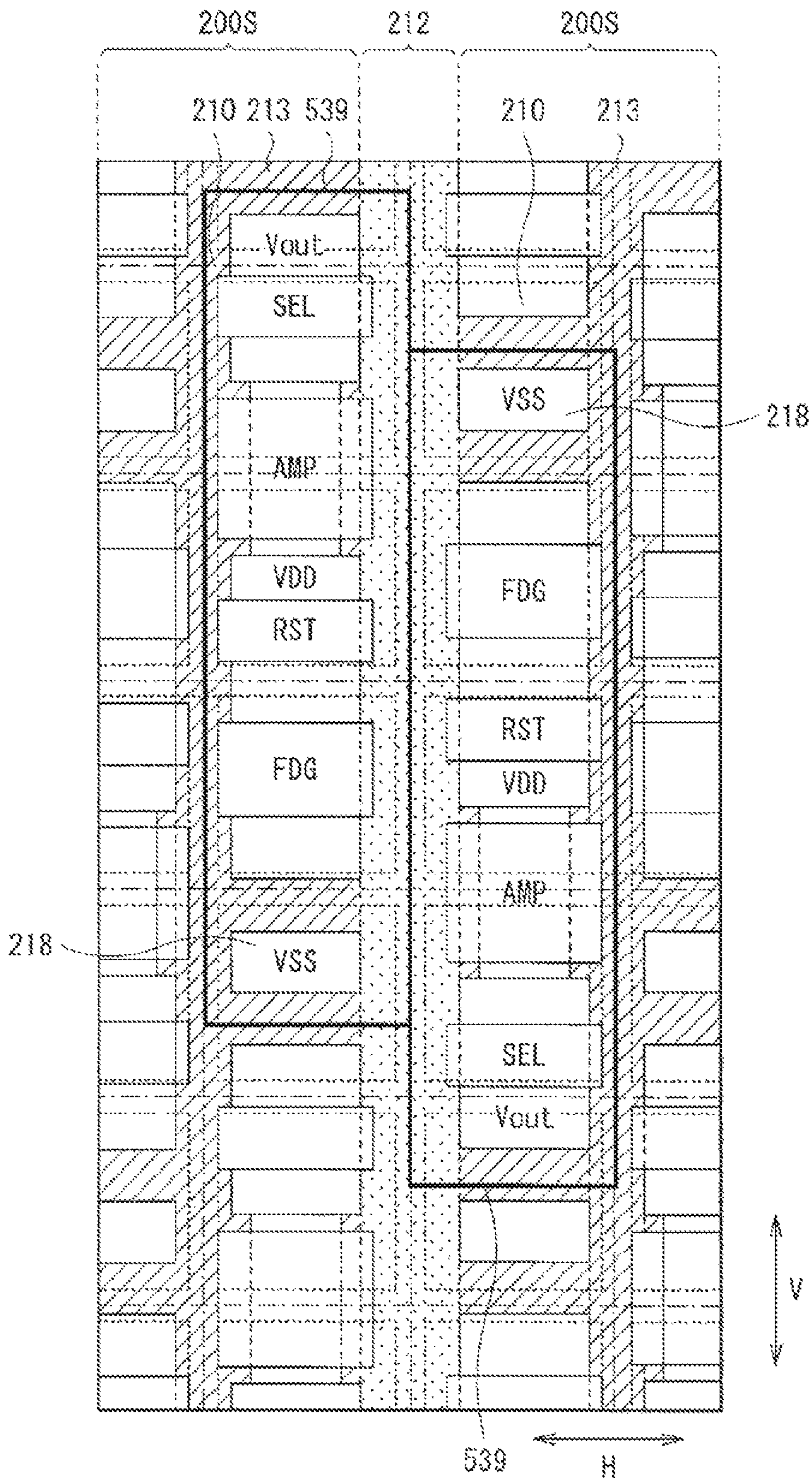
FIG. 10 is a schematic view of an example of a planar configuration in a horizontal direction with respect to a main surface of the second substrate (a semiconductor layer) illustrated in FIG. 6.
Figure 11:
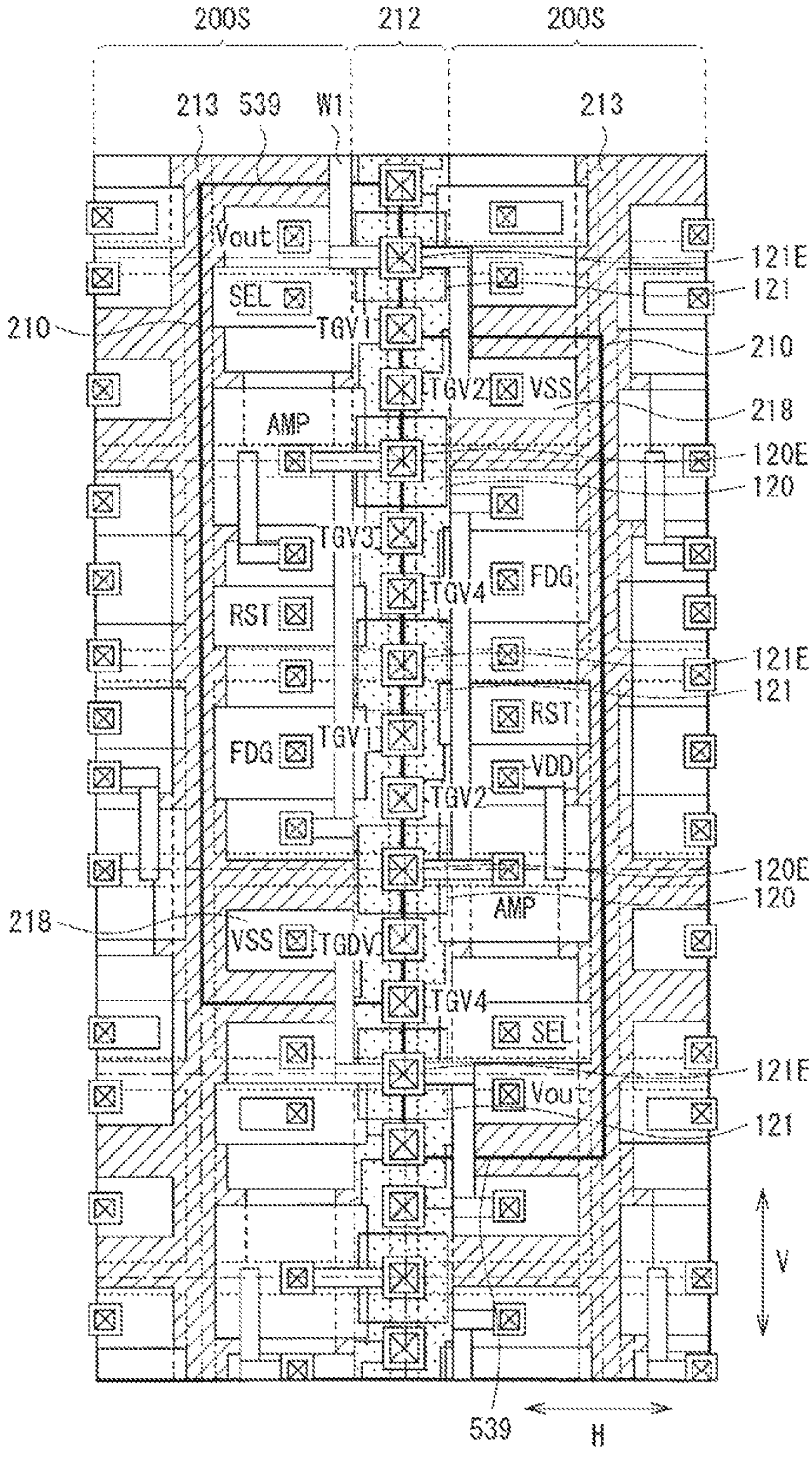
FIG. 11 is a schematic view of an example of a planar configuration of main parts of a pixel circuit and the first substrate together with a first wiring layer illustrated in FIG. 6.
Figure 12:
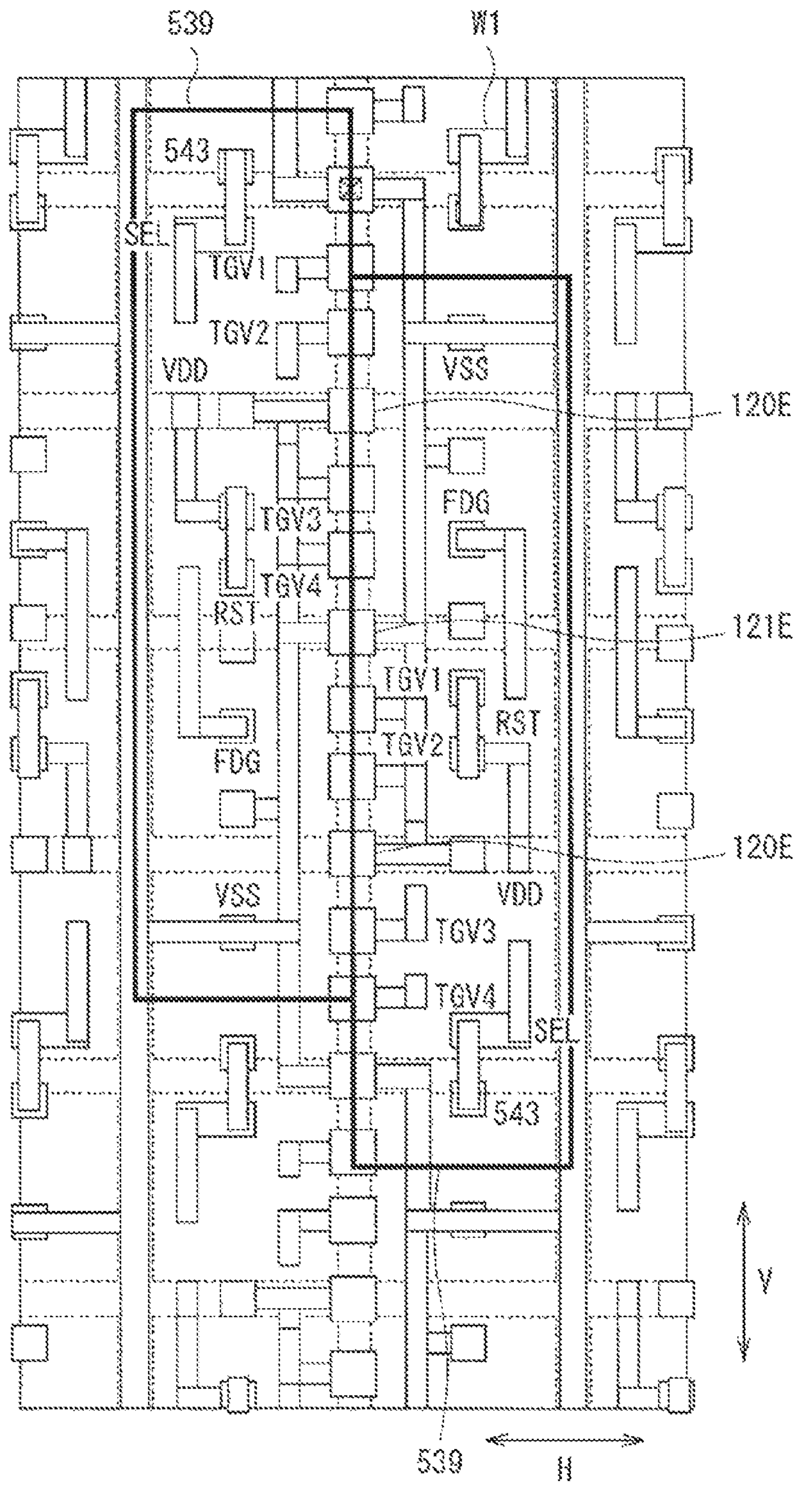
FIG. 12 is a schematic view of an example of a planar configuration of the first wiring layer and a second wiring layer illustrated in FIG. 6.
Figure 13:
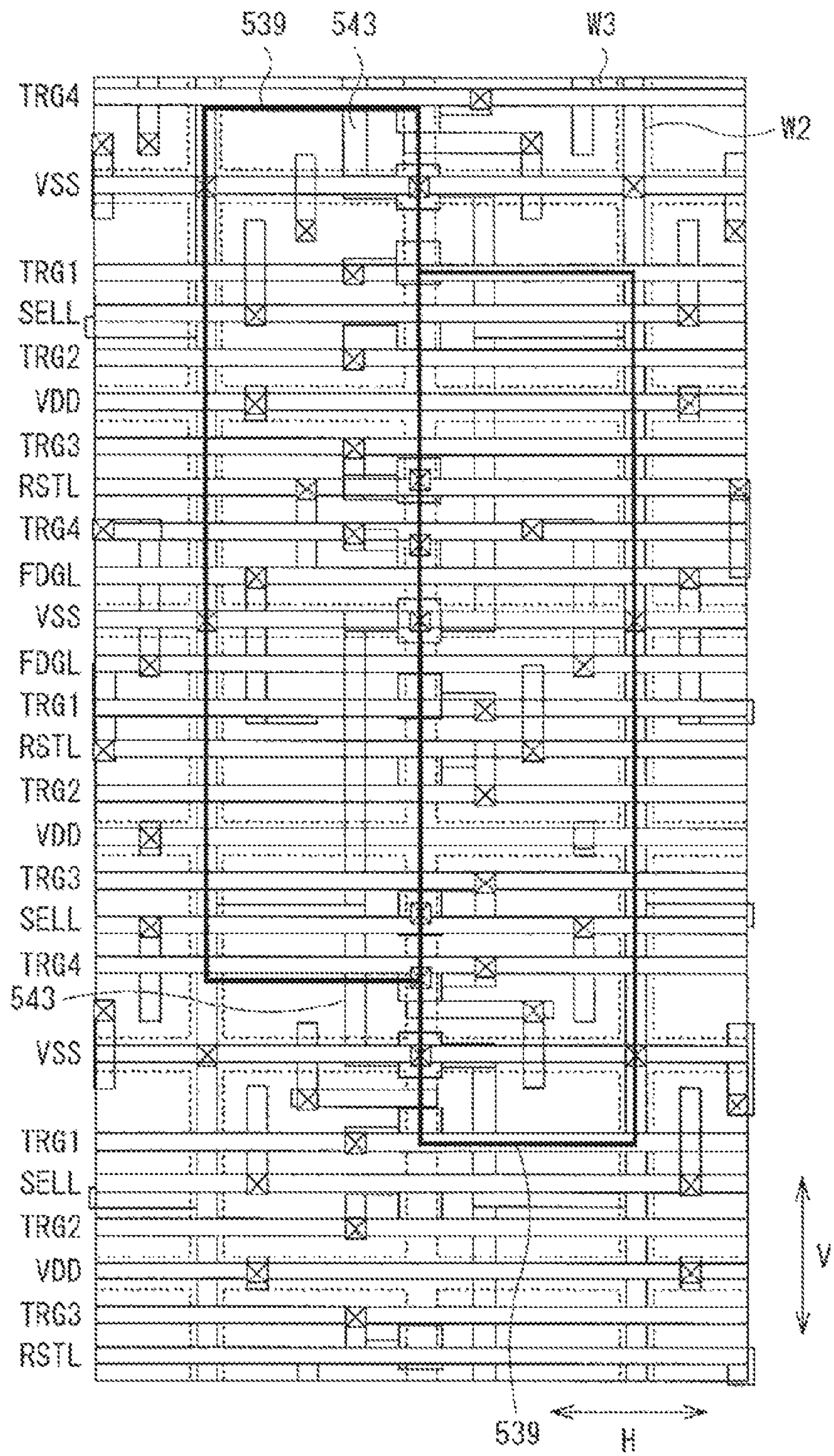
FIG. 13 is a schematic view of an example of a planar configuration of the second wiring layer and a third wiring layer illustrated in FIG. 6.
Figure 14:
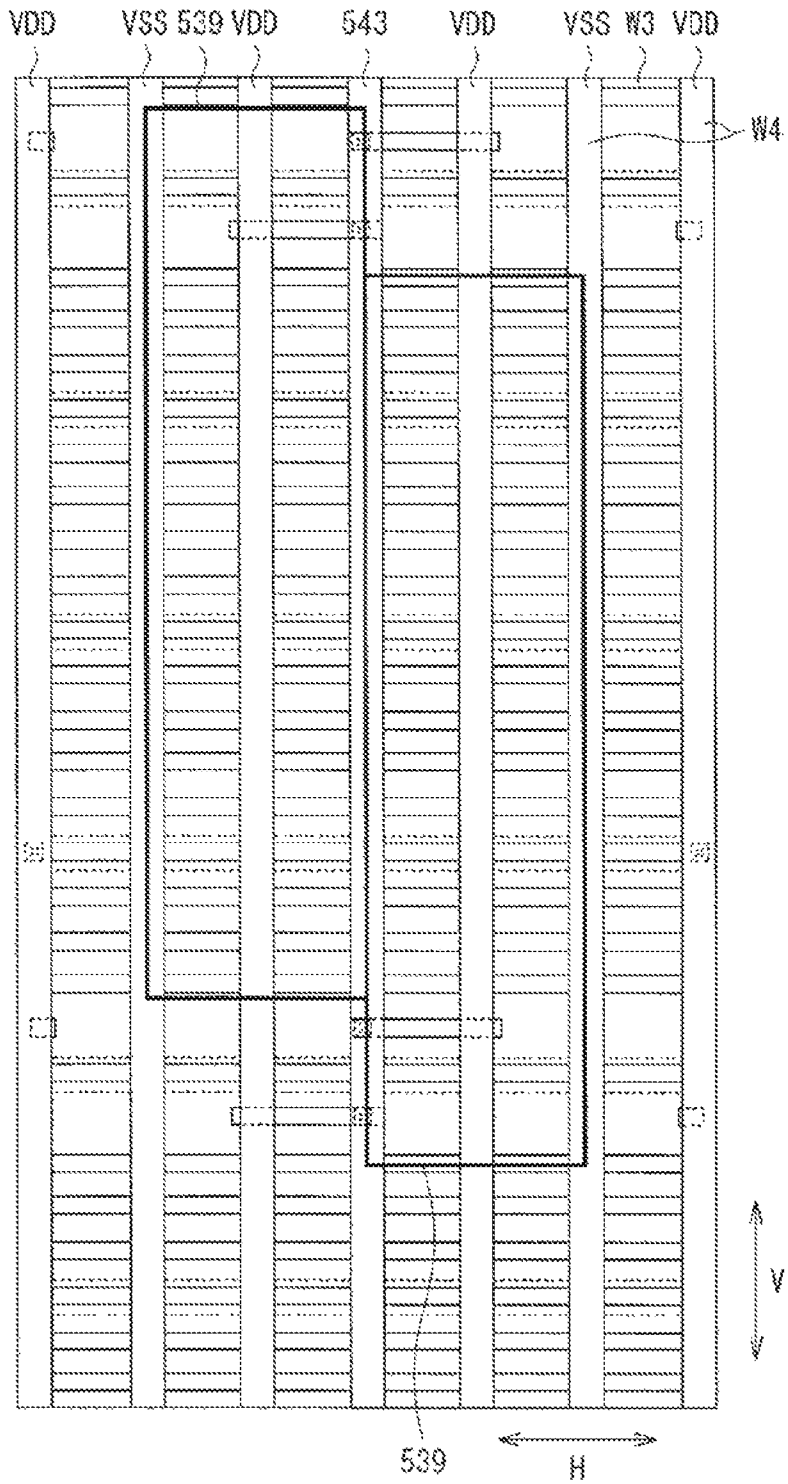
FIG. 14 is a schematic view of an example of a planar configuration of the third wiring layer and a fourth wiring layer illustrated in FIG. 6.

FIGS. 10 to 14 schematically illustrates an example of a planar configuration of the second substrate 200. FIG. 10 illustrates a configuration of the pixel circuit 200X provided in proximity to the front surface of the semiconductor layer 200S. FIG. 11 schematically illustrates a configuration of each part of the wiring layer 200T (specifically, a first wiring layer W1 to be described later), the semiconductor layer 200S coupled to the wiring layer 200T, and the first substrate 100. FIGS. 12 to 14 each illustrate an example of a planar configuration of the wiring layer 200T. The configuration of the second substrate 200 is described below with use of FIGS. 10 to 14 together with FIG. 6. In FIGS. 10 and 11, the contour of the photodiode PD (a boundary between the pixel separation section 117 and the photodiode PD) is indicated by a broken line, and a boundary between the semiconductor layer 200S in a portion overlapping the gate electrode of each of the transistors included in the pixel circuit 200X and the element separation region 213 or the insulating region 212 is indicated by a dotted line. In a portion overlapping the gate electrode of the amplification transistor AMP, a boundary between the semiconductor layer 200S and the element separation region 213 and a boundary between the element separation region 213 and the insulating region 212 are provided on one side in a channel width direction. The configuration of the second substrate 200 is described below with use of FIGS. 10 to 14 together with FIG. 6.

The second substrate 200 includes the insulating region 212 that divides the semiconductor layer 200S, and the element separation region 213 that is provided in a portion in the thickness direction of the semiconductor layer 200S (FIG. 6). For example, in the insulating region 212 provided between two pixel circuits 200X adjacent to each other in the H direction, the through electrodes 120E and 121E and the through electrodes TGV (through electrodes TGV1, TGV2, TGV3, and TGV4) of two pixel sharing units 539 coupled to the two pixel circuits 200X are disposed (FIG. 11). Herein, the through electrode 120E corresponds to a specific example of a "first through electrode" of the present disclosure, and the through electrode 121E corresponds to a specific example of a "second through electrode" of the present disclosure.

The insulating region 212 has substantially the same thickness as the thickness of the semiconductor layer 200S (FIG. 6). The semiconductor layer 200S is divided by the insulating region 212. The through electrodes 120E and 121E, and the through electrodes TGV are disposed in the insulating region 212. The insulating region 212 includes, for example, silicon oxide.

The through electrodes 120E and 121E are provided to penetrate through the insulating region 212 in the thickness direction. Upper ends of the through electrodes 120E and 121E are coupled to wiring lines (the first wiring layer W1, a second wiring layer W2, a third wiring layer W3, and a fourth wiring layer W4 that are to be described later) of the wiring layer 200T. The through electrodes 120E and 121E are provided to penetrate through the insulating region 212, the bonding film 124, the interlayer insulating film 123, and the passivation film 122, and lower ends thereof are coupled to the pad sections 120 and 121 (FIG. 6). The through electrode 120E electrically couples the pad section 120 and the pixel circuit 200X to each other. That is, the floating diffusion FD of the first substrate 100 is electrically coupled to the pixel circuit 200X of the second substrate 200 by the through electrode 120E. The through electrode 121E electrically couples the pad section 121 and the reference potential line VSS of the wiring layer 200T to each other. That is, the VSS contact region 118 of the first substrate 100 is electrically coupled to the reference potential line VSS of the second substrate 200 by the through electrode 121E.

The through electrode TGV is provided to penetrate through the insulating region 212 in the thickness direction. An upper end of the through electrode TGV is coupled to a wiring line of the wiring layer 200T. The through electrode TGV is provided to penetrate through the insulating region 212, the bonding film 124, the interlayer insulating film 123, the passivation film 122, and the interlayer insulating film 119, and a lower end thereof is coupled to the transfer gate TG (FIG. 6). Such a through electrode TGV electrically couples the transfer gate TG (a transfer gate TG1, TG2, TG3, or TG4) of each of the pixels 541A, 541B, 541C, and 541D and a wiring line (a portion of the row drive signal lines 542, specifically a wiring line TRG1, TRG2, TRG3, or TRG4 in FIG. 11 to be described later) of the wiring layer 200T to each other. That is, the transfer gate TG of the first substrate 100 is electrically coupled to a wiring line TRG of the second substrate 200 by the through electrode TGV to transmit a drive signal to each of the transfer transistors TR (the transfer transistors TR1, TR2, TR3, and TR4).

The insulating region 212 is a region for insulating, from the semiconductor layer 200S, the through electrodes 120E and 121E and the through electrodes TGV for electrically coupling the first substrate 100 and the second substrate 200 to each other. For example, in the insulating region 212 provided between two pixel circuits 200X (the pixel sharing units 539) adjacent to each other in the H direction, the through electrodes 120E and 121E, and the through electrodes TGV (the through electrodes TGV1, TGV2, TGV3, and TGV4) that are coupled to the two pixel circuits 200X are disposed. The insulating region 212 is provided to extend in the V direction, for example (FIGS. 8 and 9). Herein, arrangement of the horizontal portions TGb of the transfer gates TG is devised, thereby disposing the positions in the H direction of the through electrodes TGV closer to the positions in the H direction of the through electrodes 120E and 121E, as compared with the positions of the vertical portions TGa (FIGS. 7A and 9). For example, the through electrodes TGV are disposed at substantially the same positions in the H direction as the through electrodes 120E and 120E. This makes it possible to collectively provide the through electrodes 120E and 121E and the through electrodes TGV in the insulating region 212 that extends in the V direction. As another arrangement example, it is conceivable that the horizontal portion TGb is provided only in a region superimposed on the vertical portion TGa. In this case, the through electrode TGV is formed substantially directly above the vertical portion TGa, and the through electrode TGV is disposed in a substantially middle portion in the H direction and the Y direction of each of the pixels 541, for example. On this occasion, the position in the H direction of the through electrode TGV is significantly deviated from the positions in the H direction of the through electrodes 120E and 121E. For example, the insulating region 212 is provided around, for example, the through electrodes TGV and the through electrodes 120E and 121E to electrically insulate them from the semiconductor layer 200S in proximity thereto. In a case where the position in the H direction of the through electrode TGV and the positions in the H direction of the through electrodes 120E and 121E are significantly separated from each other, it is necessary to independently provide the insulating region 212 around each of the through electrodes 120E, 121E, and TGV. Accordingly, the semiconductor layer 200S is finely divided. In comparison with this, a layout in which the through electrodes 120E and 121E and the through electrodes TGV are collectively disposed in the insulating region 212 that extends in the V direction allows for an increase in size in the H direction of the semiconductor layer 200S. This makes it possible to secure a large area of a semiconductor element formation region in the semiconductor layer 200S. Thus, it is possible to increase the size of the amplification transistor AMP and reduce noise, for example.

In addition, in the imaging device 1, the first substrate 100 includes the pad sections 120; therefore, the through electrode 120E is provided for each of the pixel sharing units 539. Furthermore, the first substrate 100 includes the pad sections 121; therefore, the through electrode 121E is provided for every four pixels (the pixels 541A, 541B, 541C, and 541D). This makes it possible to reduce the number of the through electrodes 120E and 121E and make the insulating region 212 small. A reason for this is described below.

Figure 15A:
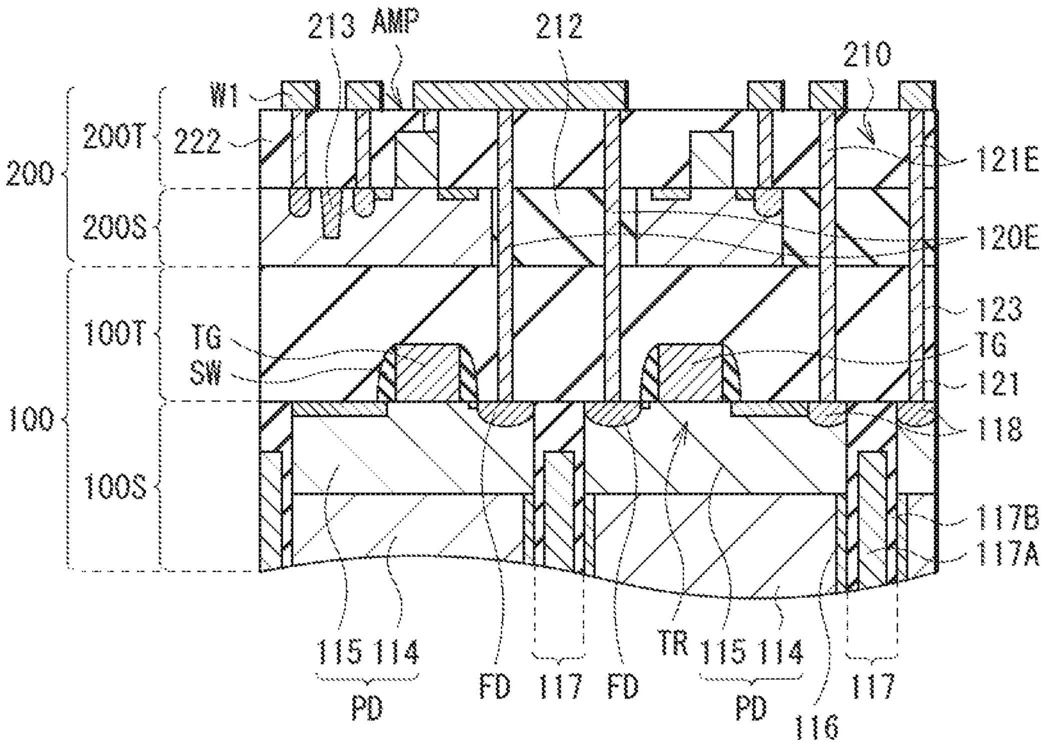
FIG. 15A is a schematic view of another example (3) of a cross-sectional configuration of the main parts of the first substrate and the second substrate illustrated in FIG. 6.
Figure 15B:
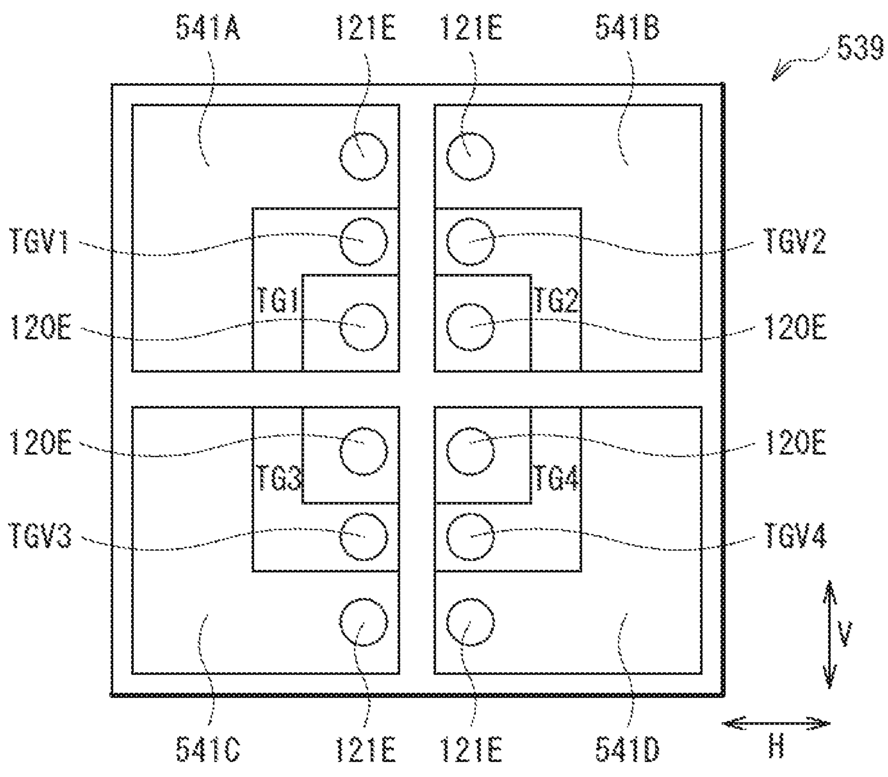
FIG. 15B is a schematic view of a planar configuration of the main parts of the first substrate and the second substrate illustrated in FIG. 15A.

FIGS. 15A and 15B schematically illustrate another example of the configuration of the main parts of the first substrate 100 and the second substrate 200. FIG. 15A illustrates a cross-sectional configuration of the main parts of the first substrate 100 and the second substrate 200, and FIG. 15B illustrates an example of a planar configuration of the pixel sharing unit 539.

As illustrated in FIG. 15A, it is possible to provide, in the second substrate 200, a wiring line for electrically coupling the floating diffusions FD (the floating diffusion FD1, FD2, FD3, and FD4) of the pixels 541A, 541B, 541C, and 541D to each other. For example, the floating diffusions FD of the pixels 541A, 541B, 541C, and 541D are coupled to each other by a wiring line (e.g., the first wiring layer W1) of the wiring layer 200T of the second substrate 200. In addition, a wiring line for electrically coupling the VSS contact regions 118 of the pixels 541A, 541B, 541C, and 541D to each other may be provided in the second substrate 200. In this case, the through electrodes 120E are coupled to the floating diffusions FD1, FD2, FD3, and FD4 of the pixels 541A, 541B, 541C, and 541D, and the through electrodes 121E are coupled to the VSS contact regions 118 of the pixels 541A, 541B, 541C, and 541D. Accordingly, one through electrode 120E and one through electrode 121E are disposed for each of four pixels (the pixels 541A, 541B, 541C, and 541D) (FIG. 15B). In a case where the number of the through electrodes 120E and the number of the through electrodes 121E are increased, the insulating region 212 becomes large.

In contrast, the pad sections 120 and 121 are provided in the first substrate 100, which allows the through electrodes 120E and 121E to be disposed for every four pixels (the pixels 541A, 541B, 541C, and 541D) (FIGS. 8A and 8B). Accordingly, it is possible to reduce the number of through electrodes and make the insulating region 212 small, as compared with the configuration illustrated in FIGS. 15A and 15B. This makes it possible to increase the formation area of the amplification transistor AMP and reduce noise. In addition, reduction in the number of through electrodes makes it possible to improve flexibility in layout. This makes it possible to decrease a parasitic capacitance, for example.

The element separation region 213 is provided on the front surface side of the semiconductor layer 200S. The element separation region 213 has an STI (Shallow Trench Isolation) structure. In the element separation region 213, the semiconductor layer 200S is engraved in the thickness direction (a direction perpendicular to the main surface of the second substrate 200), and an insulating film is embedded in an engraved portion. The insulating film includes, for example, silicon oxide. The element separation region 213 achieves element separation between a plurality of transistors included in the pixel circuit 200X in accordance with a layout of the pixel circuit 200X. The semiconductor layer 200S (specifically, the well region 211) extends below the element separation region 213 (a deep portion of the semiconductor layer 200S).

Hereinafter, description is given of a difference between a contour shape (a contour shape in the substrate plane direction) of the pixel sharing unit 539 in the first substrate 100 and a contour shape of the pixel sharing unit 539 in the second substrate 200 with reference to FIGS. 7A, 7B, and 10.

In the imaging device 1, the pixel sharing units 539 are provided over both the first substrate 100 and the second substrate 200. For example, the contour shape of the pixel sharing unit 539 provided in the first substrate 100 and the contour shape of the pixel sharing unit 539 provided in the second substrate 200 are different from each other.

In FIGS. 7A and 7B, a contour line of each of the pixels 541A, 541B, 541C, and 541D is indicated by an alternate long and short dashed line, and a contour line of the pixel sharing unit 539 is indicated by a heavy line. For example, the pixel sharing unit 539 of the first substrate 100 includes two pixels 541 (the pixels 541A and 541B) disposed adjacent to each other in the H direction and two pixels 541 (the pixels 541C and 541D) disposed adjacent thereto in the V direction. That is, the pixel sharing unit 539 of the first substrate 100 includes four adjacent pixels 541 in two rows by two columns, and the pixel sharing unit 539 of the first substrate 100 has a substantially square contour shape. In the pixel array section 540, such pixel sharing units 539 are arranged adjacent to each other with two-pixel pitches (pitches corresponding to two pixels 541) in the H direction and two-pixel pitches (pitches corresponding to two pixels 541) in the V direction.

In FIGS. 10 and 11, the contour line of each of the pixels 541A, 541B, 541C, and 541D is indicated by an alternate long and short dashed line, and the contour line of the pixel sharing unit 539 is indicated by a heavy line. For example, the contour shape of the pixel sharing unit 539 of the second substrate 200 is smaller in the H direction than that of the pixel sharing unit 539 of the first substrate 100, and is larger in the V direction than that of the pixel sharing unit 539 of the first substrate 100. For example, the pixel sharing unit 539 of the second substrate 200 is formed to have a size (a region) corresponding to one pixel in the H direction, and is formed to have a size corresponding to four pixels in the V direction. That is, the pixel sharing unit 539 of the second substrate 200 is formed to have a size corresponding to adjacent pixels arranged in one row by four columns, and the pixel sharing unit 539 of the second substrate 200 has a substantially rectangular contour shape.

For example, in each of the pixel circuits 200X, the selection transistor SEL, the amplification transistor AMP, the reset transistor RST, and the FD conversion gain switching transistor FDG are disposed in this order side by side in the V direction (FIG. 10). The contour shape of each of the pixel circuits 200X is provided as a substantially rectangular shape as described above, which makes it possible to dispose four transistors (the selection transistor SEL, the amplification transistor AMP, the reset transistor RST, and the FD conversion gain switching transistor FDG) side by side in one direction (the V direction in FIG. 10). This makes it possible to share the drain of the amplification transistor AMP and the drain of the reset transistor RST in one diffusion region (a diffusion region coupled to the power source line VDD). For example, it is possible to provide the formation region of each of the pixel circuits 200X in a substantially square shape (see FIG. 57 to be described later). In this case, two transistors are disposed in one direction, which makes it difficult to share the drain of the amplification transistor AMP and the drain of the reset transistor RST in one diffusion region. Accordingly, providing the formation region of the pixel circuit 200X in a substantially rectangular shape makes it easy to dispose four transistors close to each other, and makes it possible to make the formation region of the pixel circuit 200X small. That is, it is possible to miniaturize the pixels. In addition, in a case where it is not necessary to make the formation region of the pixel circuit 200X small, it is possible to make the formation region of the amplification transistor AMP large and reduce noise.

For example, in addition to the selection transistor SEL, the amplification transistor AMP, the reset transistor RST, and the FD conversion gain switching transistor FDG, the VSS contact region 218 coupled to the reference potential line VSS is provided in proximity to the front surface of the semiconductor layer 200S. The VSS contact region 218 includes, for example, a p-type semiconductor region. The VSS contact region 218 is electrically coupled to the VSS contact region 118 of the first substrate 100 (the semiconductor layer 100S) through a wiring line of the wiring layer 200T and the through electrode 121E. This VSS contact region 218 is provided at a position adjacent to the source of the FD conversion gain switching transistor FDG with the element separation region 213 interposed therebetween, for example (FIG. 10).

Next, description is given of a positional relationship between the pixel sharing unit 539 provided in the first substrate 100 and the pixel sharing unit 539 provided in the second substrate 200 with reference to FIGS. 7B and 10. For example, of two pixel sharing units 539 arranged side by side in the V direction of the first substrate 100, one (e.g., on upper side of a paper surface in FIG. 7B) pixel sharing unit 539 is coupled to one (e.g., on left side of a paper surface in FIG. 10) pixel sharing unit 539 of two pixel sharing units 539 arranged side by side in the H direction of the second substrate 200. For example, of the two pixel sharing units 539 arranged side by side in the V direction of the first substrate 100, the other (e.g., on lower side of the paper surface in FIG. 7B) pixel sharing unit 539 is coupled to the other (e.g., on right side of the paper surface in FIG. 10) pixel sharing unit 539 of the two pixel sharing units 539 arranged side by side in the H direction of the second substrate 200.

For example, in the two pixel sharing units 539 arranged side by side in the H direction of the second substrate 200, an internal layout (arrangement of transistors and the like) of one pixel sharing unit 539 is substantially equal to a layout obtained by inverting an internal layout of the other pixel sharing unit 539 in the V direction and the H direction. Effects achieved by this layout are described below.

In the two pixel sharing units 539 arranged side by side in the V direction of the first substrate 100, each of the pad sections 120 is disposed in a middle portion of the contour shape of the pixel sharing unit 539, that is, a middle portion in the V direction and the H direction of the pixel sharing unit 539 (FIG. 7B). Meanwhile, the pixel sharing unit 539 of the second substrate 200 has a substantially rectangular contour shape that is long in the V direction as described above; therefore, for example, the amplification transistor AMP coupled to the pad section 120 is disposed at a position deviated from the middle in V direction of the pixel sharing unit 539 to upper side of the paper surface. For example, in a case where internal layouts of the two pixel sharing units 539 arranged side by side in the H direction of the second substrate 200 are the same, a distance between the amplification transistor AMP of one pixel sharing unit 539 and the pad section 120 (e.g., the pad section 120 of the pixel sharing unit 539 on upper side of the paper surface in FIG. 7B) is relatively short. However, a distance between the amplification transistor AMP of the other pixel sharing unit 539 and the pad section 120 (e.g., the pad section 120 of the pixel sharing unit 539 on lower side of the paper surface in FIG. 7B) is long. Accordingly, an area of a wiring line necessary for coupling between the amplification transistor AMP and the pad section 120 is increased, which may complicate a wiring layout of the pixel sharing unit 539. This may affect miniaturization of the imaging device 1.

In contrast, internal layouts of the two pixel sharing units 539 arranged side by side in the H direction of the second substrate 200 are inverted to each other in at least the V direction, which makes it possible to shorten distances between the amplification transistors AMP of both the two pixel sharing units 539 and the pad sections 120. Accordingly, as compared with a configuration in which the internal layouts of two pixel sharing units 539 arranged side by side in the H direction of the second substrate 200 are the same, the imaging device 1 is easily miniaturized. It is to be noted that a planar layout of each of the plurality of pixel sharing units 539 of the second substrate 200 is bilaterally symmetrical in a range illustrated in FIG. 8; however, a layout including a layout of the first wiring layer W1 illustrated in FIG. 11 to be described later is bilaterally asymmetrical.

In addition, it is preferable that the internal layouts of the two pixel sharing units 539 arranged side by side in the H direction of the second substrate 200 be inverted to each other also in the H direction. A reason for this is described below. As illustrated in FIG. 11, the two pixel sharing units 539 arranged side by side in the H direction of the second substrate 200 are each coupled to the pad sections 120 and 121 of the first substrate 100. For example, the pad sections 120 and 121 are disposed in a middle portion in the H direction of the two pixel sharing units 539 arranged side by side in the H direction of the second substrate 200 (between the two pixel sharing units 539 arranged side by side in the H direction). Accordingly, the internal layouts of the two pixel sharing units 539 arranged side by side in the H direction of the second substrate 200 are inverted to each other also in the H direction, which makes it possible to decrease distances between each of the plurality of pixel sharing units 539 of the second substrate 200 and the pad sections 120 and 121. That is, the imaging device 1 is miniaturized more easily.

In addition, the position of the contour line of the pixel sharing unit 539 of the second substrate 200 may not be aligned with the position of the contour line of one of the pixel sharing units 539 of the first substrate 100. For example, in the two pixel sharing units 539 arranged side by side in the H direction of the second substrate 200, one (e.g., on upper side of a paper surface in FIG. 11) contour line in the V direction of one (e.g., on left side of the paper surface in FIG. 11) pixel sharing unit 539 is disposed outside one contour line in the V direction of a corresponding pixel sharing unit 539 (e.g., on upper side of the paper surface in FIG. 7B) of the first substrate 100. In addition, in the two pixel sharing units 539 arranged side by side in the H direction of the second substrate 200, the other (e.g., on lower side of the paper surface in FIG. 11) contour line in the V direction of the other (e.g., on right side of the paper surface in FIG. 11) pixel sharing unit 539 is disposed outside the other contour line in the V direction of a corresponding pixel sharing unit 539 (e.g., on lower side of the paper surface in FIG. 7B) of the first substrate 100. Disposing the pixel sharing units 539 of the second substrate 200 and the pixel sharing units 539 of the first substrate 100 relative to each other makes it possible to shorten a distance between the amplification transistor AMP and the pad section 120. This makes it easy to miniaturize the imaging device 1.

In addition, the positions of contour lines of the plurality of pixel sharing units 539 of the second substrate 200 may not be aligned. For example, the two pixel sharing units 539 arranged side by side in the H direction of the second substrate 200 are disposed in a state in which the positions of the contour lines in the V direction are deviated. This makes it possible to shorten the distance between the amplification transistor AMP and the pad section 120. This makes it easy to miniaturize the imaging device 1.

Description is given of repeated arrangement of the pixel sharing units 539 in the pixel array section 540 with reference to FIGS. 7B and 11. The pixel sharing unit 539 of the first substrate 100 has a size corresponding to two pixels 541 in the H direction and a size corresponding to two pixels 541 in the V direction (FIG. 7B). For example, in the pixel array section 540 of the first substrate 100, the pixel sharing units 539 having a size corresponding to the four pixels are repeatedly arranged adjacent to each other with two-pixel pitches (pitches corresponding to two pixels 541) in the H direction and two-pixel pitches (pitches corresponding to two pixels 541) in the V direction. Alternatively, in the pixel array section 540 of the first substrate 100, a pair of pixel sharing units 539 that are two pixel sharing units 539 disposed adjacent to each other in the V direction may be provided. In the pixel array section 540 of the first substrate 100, for example, the pairs of pixel sharing units 539 are repeatedly arranged adjacent to each other with two-pixel pitches (pitches corresponding to two pixels 541) in the H direction and four-pixel pitches (pitches corresponding to four pixels 541) in the V direction. The pixel sharing unit 539 of the second substrate 200 has a size corresponding to one pixel 541 in the H direction and a size corresponding to four pixels 541 in the V direction (FIG. 11). For example, in the pixel array section 540 of the second substrate 200, a pair of pixel sharing units 539 including two pixel sharing units 539 having a size corresponding to the four pixels 541 are provided. The pixel sharing units 539 are disposed adjacent to each other in the H direction and are disposed to be deviated in the V direction. In the pixel array section 540 of the second substrate 200, for example, the pairs of pixel sharing units 539 are repeatedly arranged adjacent to each other without space with two-pixel pitches (pitches corresponding to two pixels 541) in the H direction and four-pixel pitches (pitches corresponding to four pixels 541) in the V direction. Such repeated arrangement of the pixel sharing units 539 makes it possible to arrange the pixel sharing units 539 without space. This makes it easy to miniaturize the imaging device 1.

The amplification transistor AMP preferably has, for example, a three-dimensional structure such as a fin (Fin) type (FIG. 6). For example, the Fin type amplification transistor AMP includes a fin including a portion of the semiconductor layer 200S, a gate electrode having three flat surfaces that surround the fin, and a gate insulating film provided between the gate electrode and the fin. A transistor having a three-dimensional structure is a transistor in which a plurality of flat surfaces of the gate electrode opposed to a channel is provided or a transistor in which a curved surface of the gate electrode is provided around a channel. In a case where such a transistor having the three-dimensional structure has the same footprint (occupied area in FIG. 10) as that of a planar type transistor, it is possible to increase an effective gate width in the transistor, as compared with the planar type transistor. Accordingly, a large amount of current passes through the transistor having the three-dimensional structure to increase transconductance gm. This makes it possible to improve operation speed in the transistor having the three-dimensional structure, as compared with the planar type transistor. In addition, it is possible to reduce RN (Random Noise). In addition, the transistor having the three-dimensional structure has a larger gate area, as compared with the planar type transistor, which reduces RTS (Random Telegraph Signal) noise.

Using such a transistor having the three-dimensional structure for at least one of the amplification transistor AMP, the selection transistor SEL, the reset transistor RST, and the FD transfer transistor FDG makes it possible to improve transistor characteristics, e.g., to improve image quality. In particular, the amplification transistor AMP includes the transistor having three-dimensional structure, which makes it possible to effectively reduce noise and improve image quality. In addition, all of the amplification transistor AMP, the selection transistor SEL, the reset transistor RST, and the FD transfer transistor FDG may be configured with use of the transistor having the three-dimensional structure. On this occasion, the pixel circuit 200X is easily manufactured.

Figure 16A:
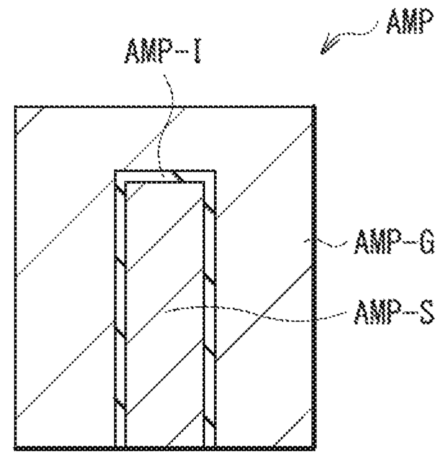
FIG. 16A is a schematic cross-sectional view of another example (1) of an amplification transistor illustrated in FIG. 6.
Figure 16B:
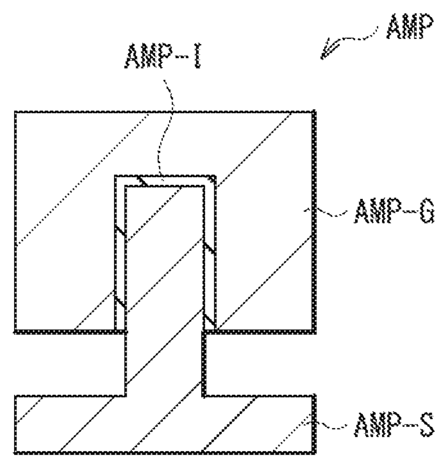
FIG. 16B is a schematic cross-sectional view of another example (2) of the amplification transistor illustrated in FIG. 6.
Figure 16C:
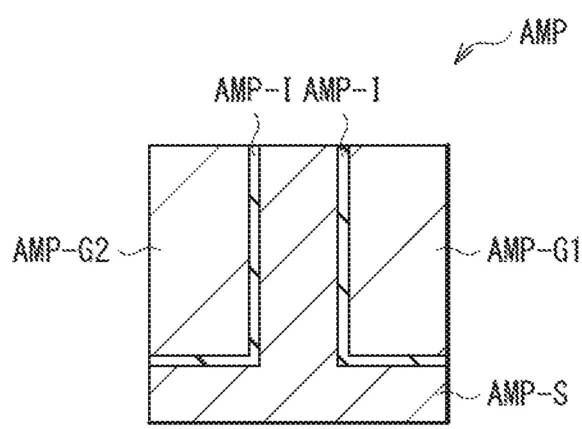
FIG. 16C is a schematic cross-sectional view of another example (3) of the amplification transistor illustrated in FIG. 6.
Figure 16D:
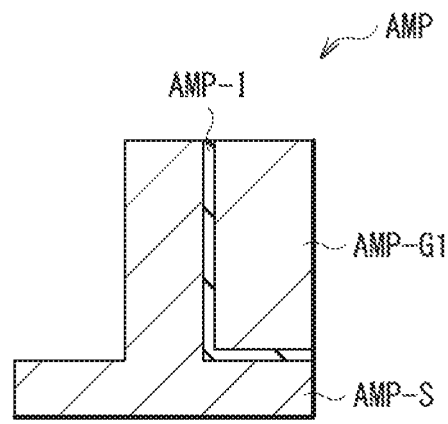
FIG. 16D is a schematic cross-sectional view of another example (4) of the amplification transistor illustrated in FIG. 6.
Figure 16E:
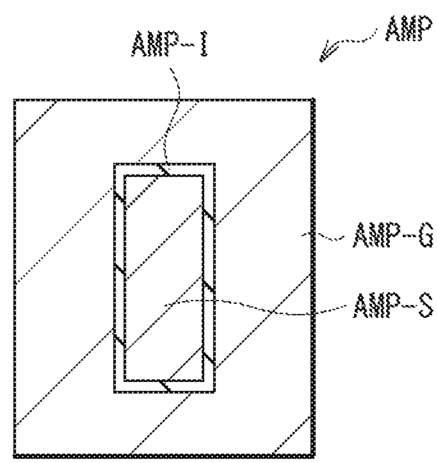
FIG. 16E is a schematic cross-sectional view of another example (5) of the amplification transistor illustrated in FIG. 6.
Figure 16F:
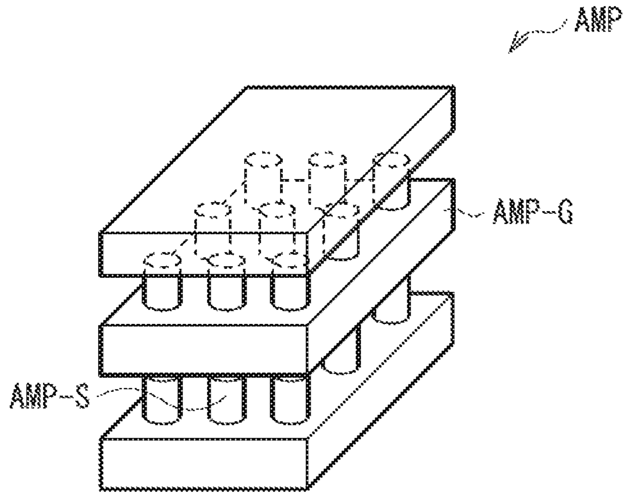
FIG. 16F is a schematic cross-sectional view of another example (6) of the amplification transistor illustrated in FIG. 6.
Figure 16G:
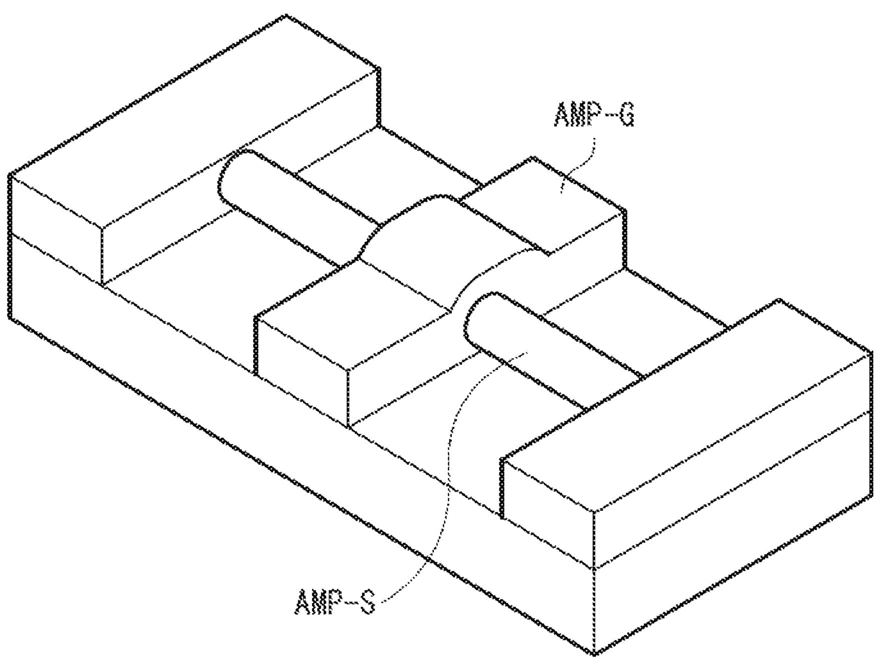
FIG. 16G is a schematic cross-sectional view of another example (7) of the amplification transistor illustrated in FIG. 6.

FIGS. 16A to 16G illustrate another example of the configuration of the amplification transistor AMP illustrated in FIG. 6. The amplification transistor AMP includes, for example, a semiconductor layer AMP-S, a gate electrode AMP-G provided around the semiconductor layer AMP-S, and a gate insulating film AMP-I provided between the gate electrode AMP-G and the semiconductor layer AMP-S. In a case where the amplification transistor AMP includes a Fin type transistor, the semiconductor layer AMP-S included in a fin may be provided separately from the semiconductor layer 200S around the semiconductor layer AMP-S (FIG. 16A). Alternatively, a portion in a height direction of the fin may be exposed from the gate electrode AMP-G (FIG. 16B). In addition, the amplification transistor AMP may have a double-gate structure (FIG. 16C). The amplification transistor AMP having the double-gate structure includes a pair of gate electrodes (gate electrodes AMP-G1 and AMP-G2) opposed to each other with the fin interposed therebetween. Alternatively, the amplification transistor AMP may have a single-gate structure (FIG. 16D). The amplification transistor AMP may have a GAA (Gate All Around) structure (FIG. 16E). In the amplification transistor AMP having the GAA structure, the entire periphery of the semiconductor layer AMP-S is surrounded by the gate electrode AMP-G. Alternatively, the amplification transistor AMP may have a vertical GAA structure (FIG. 16F). The amplification transistor AMP may have a lateral GAA structure, a nanowire (Nanowire) type (FIG. 16G), or a nanosheet (Nanosheet) type (not illustrated). The amplification transistor AMP may include a planar type transistor as illustrated in FIG. 8A and the like.

The wiring layer 200T includes, for example, the passivation film 221, the interlayer insulating film 222, and a plurality of wiring lines (the first wiring layer W1, the second wiring layer W2, the third wiring layer W3, and the fourth wiring layer W4). The passivation film 221 is, for example, in contact with the front surface of the semiconductor layer 200S, and covers the entire front surface of the semiconductor layer 200S. The passivation film 221 covers the respective gate electrodes of the selection transistor SEL, the amplification transistor AMP, the reset transistor RST, and the FD conversion gain switching transistor FDG. The interlayer insulating film 222 is provided between the passivation film 221 and the third substrate 300. The plurality of wiring lines (the first wiring layer W1, the second wiring layer W2, the third wiring layer W3, and the fourth wiring layer W4) are separated by the interlayer insulating film 222. The interlayer insulating film 222 includes, for example, silicon oxide.

In the wiring layer 200T, for example, the first wiring layer W1, the second wiring layer W2, the third wiring layer W3, the fourth wiring layer W4, and the contact sections 201 and 202 are provided in this order from side of the semiconductor layer 200S, and are insulated from each other by the interlayer insulating film 222. The interlayer insulating film 222 includes a plurality of coupling sections that couples the first wiring layer W1, the second wiring layer W2, the third wiring layer W3, or the fourth wiring layer W4 and a layer therebelow to each other. The coupling sections are portions in which an electrically conductive material is embedded in a coupling hole provided in the interlayer insulating film 222. For example, the interlayer insulating film 222 includes a coupling section 218V that couples the first wiring layer W1 and the VSS contact region 218 of the semiconductor layer 200S to each other. The coupling section 218V is provided at a position opposed to the semiconductor layer 200S.

For example, the hole diameter of such a coupling section (e.g., the coupling section 218V) that couples elements of the second substrate 200 to each other differs from hole diameters of the through electrodes 120E, 121E, and TGV. This makes it possible to enhance flexibility in design, as compared with a case where the hole diameter of the coupling section is the same as the hole diameters of the through electrodes 120E, 1211E, and TGV. In particular, the hole diameter of the coupling section that couples the elements of the second substrate 200 to each other is preferably smaller than the hole diameters of the through electrodes 120E and 121E, and the through electrode TGV. A reason for this is described below.

Figure 17:
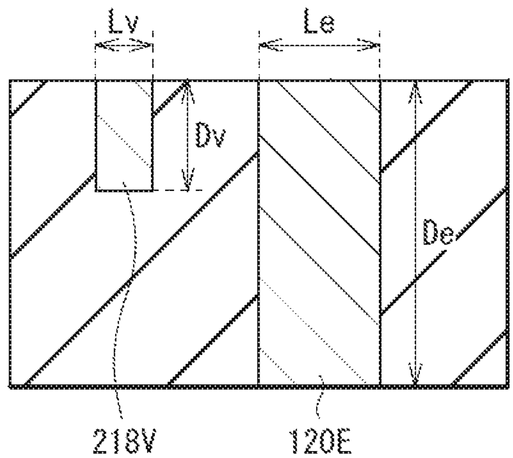
FIG. 17 is a schematic view for describing aspect ratios of a through electrode and a coupling section illustrated in FIG. 6.

FIG. 17 illustrates a relationship between sizes of the coupling section 218V and the through electrode 120E. The coupling section 218V has a height Dv (a size in the thickness direction of the interlayer insulating film 222) and a hole diameter Lv. The through electrode 120E has a height De and a hole diameter Le. The hole diameters Lv and Le each indicate a size of a portion in which the hole diameter becomes the largest when the hole diameters of the coupling section 218V and the through electrode 120E are changed in the thickness direction of the interlayer insulating film 222. The height Dv of the coupling section 218V provided in the second substrate 200, more specifically in the wiring layer 200T is smaller than the height De of the through electrode 120E that couples the first substrate 100 and the second substrate 200 to each other. For example, the hole diameter Lv of the coupling section 218V is designed to cause an aspect ratio (Dv/Lv) of the coupling section 218V to be substantially the same as an aspect ratio (De/Le) of the through electrode 120E. As described in detail later, the aspect ratio of the coupling section that couples the elements of the second substrate 200 to each other and the aspect ratio of the through electrodes 120E, 121E, and TGV that couple the first substrate 100 and the second substrate 200 to each other are made close to each other, which makes it possible to form them in one etching process.

For example, the through electrode 120E is coupled to the gate of the amplification transistor AMP and the source of the FD conversion gain switching transistor FDG (specifically, a coupling hole reaching the source of the FD conversion gain switching transistor FDG) by the first wiring layer W1. The first wiring layer W1 couples, for example, the through electrode 121E and the coupling section 218V to each other, which causes the VSS contact region 218 of the semiconductor layer 200S and the VSS contact region 118 of the semiconductor layer 100S to be electrically coupled to each other.

Next, description is given of a planar configuration of the wiring layer 200T with reference to FIGS. 12 to 14. FIG. 12 illustrates an example of a planar configuration of the first wiring layer W1 and the second wiring layer W2. FIG. 138 illustrates an example of a planar configuration of the second wiring layer W2 and the third wiring layer W3. FIG. 14 illustrates an example of a planar configuration of the third wiring layer W3 and the fourth wiring layer W4.

For example, the third wiring layer W3 includes wiring lines TRG1, TRG2, TRG3, and TRG4, SELL, RSTL, and FDGL that extend in the H direction (the row direction) (FIG. 13). These wiring lines correspond to the plurality of row drive signal lines 542 described with reference to FIG. 4. The wiring lines TRG1, TRG2, TRG3, and TRG4 respectively transmit drive signals to the transfer gates TG1, TG2, TG3, and TG4. The wiring lines TRG1, TRG2, TRG3, and TRG4 are respectively coupled to the transfer gates TG1, TG2, TG3, and TG4 through the second wiring layer W2, the first wiring layer W1, and the through electrode 120E. The wiring line SELL transmits a drive signal to the gate of the selection transistor SEL, the wiring line RSTL transmits a drive signal to the gate of the reset transistor RST, and the wiring line FDGL transmits a drive signal to the gate of the FD conversion gain switching transistor FDG. The wiring lines SELL, RSTL, and FDGL are respectively coupled to the gates of the selection transistor SEL, the reset transistor RST, and the FD conversion gain switching transistor FDG through the second wiring layer W2, the first wiring layer W1, and the coupling section.

For example, the fourth wiring layer W4 includes the power source line VDD, the reference potential line VSS, and the vertical signal line 543 that extend in the V direction (the column direction) (FIG. 14). The power source line VDD is coupled to the drain of the amplification transistor AMP and the drain of the reset transistor RST through the third wiring layer W3, the second wiring layer W2, the first wiring layer W1, and the coupling section. The reference potential line VSS is coupled to the VSS contact region 218 through the third wiring layer W3, the second wiring layer W2, the first wiring layer W1, and the coupling section 218V. In addition, the reference potential line VSS is coupled to the VSS contact region 118 of the first substrate 100 through the third wiring layer W3, the second wiring layer W2, the first wiring layer W1, the through electrode 121E, and the pad section 121. The vertical signal line 543 is coupled to the source (Vout) of the selection transistor SEL through the third wiring layer W3, the second wiring layer W2, the first wiring layer W1, and the coupling section.

The contact sections 201 and 202 may be provided at positions overlapping the pixel array section 540 in plan view (e.g., FIG. 3), or may be provided in the peripheral section 540B outside the pixel array section 540 (e.g., FIG. 6). The contact sections 201 and 202 are provided on the front surface (a surface on the side of the wiring layer 200T) of the second substrate 200. The contact sections 201 and 202 include, for example, metal such as Cu (copper) and A1 (aluminum). The contact sections 201 and 202 are exposed to the front surface (a surface on side of the third substrate 300) of the wiring layer 200T. The contact sections 201 and 202 are used for electrical coupling between the second substrate 200 and the third substrate 300 and bonding between the second substrate 200 and the third substrate 300.

FIG. 6 illustrates an example in which a peripheral circuit is provided in the peripheral section 540B of the second substrate 200. The peripheral circuit may include a portion of the row driving section 520, a portion of the column signal processor 550, and the like. In addition, as illustrated in FIG. 3, the peripheral circuit may not be disposed in the peripheral section 540B of the second substrate 200, and the coupling hole sections H1 and H2 may be disposed in proximity to the pixel array section 540.

The third substrate 300 includes, for example, the wiring layer 300T and the semiconductor layer 300S in this order from the side of the second substrate 200. For example, the front surface of the semiconductor layer 300S is provided on the side of the second substrate 200. The semiconductor layer 300S includes a silicon substrate. A circuit is provided in a portion on front surface side of the semiconductor layer 300S. Specifically, for example, at least a portion of the input section 510A, the row driving section 520, the timing controller 530, the column signal processor 550, the image signal processor 560, and the output section 510B is provided in the portion on the front surface side of the semiconductor layer 300S. The wiring layer 300T provided between the semiconductor layer 300S and the second substrate 200 includes, for example, an interlayer insulating film, a plurality of wiring layers separated by the interlayer insulating film, and the contact sections 301 and 302. The contact sections 301 and 302 are exposed to the front surface (a surface on the side of the second substrate 200) of the wiring layer 300T. The contact section 301 is coupled to the contact section 201 of the second substrate 200, and the contact section 302 is coupled to the contact section 202 of the second substrate 200. The contact sections 301 and 302 are electrically coupled to a circuit (e.g., at least one of the input section 510A, the row driving section 520, the timing controller 530, the column signal processor 550, the image signal processor 560, and the output section 510B) formed in the semiconductor layer 300S. The contact sections 301 and 302 include, for example, metal such as Cu (copper) and aluminum (Al). For example, an external terminal TA is coupled to the input section 510A through the coupling hole section H1, and an external terminal TB is coupled to the output section 510B through the coupling hole section H2.

[Method of Manufacturing Imaging Device 1]

Next, description is given of an example of a method of manufacturing the imaging device 1 with use of FIGS. 18A to 21F.

Figure 18A:
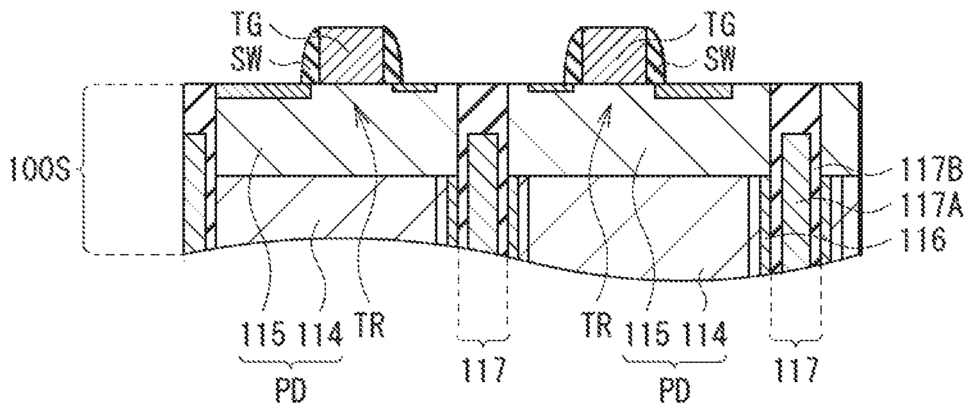

First, as illustrated in FIG. 18A, the p-well layer 115, the n-type semiconductor region 114, the pixel separation section 117, and the transfer transistor TR are formed. The transfer transistor TR is formed in the semiconductor layer 100S after forming the p-well layer 115, the n-type semiconductor region 114, and the pixel separation section 117. For example, the sidewall SW is formed on the side surface of the transfer gate TG.

Figure 18B:
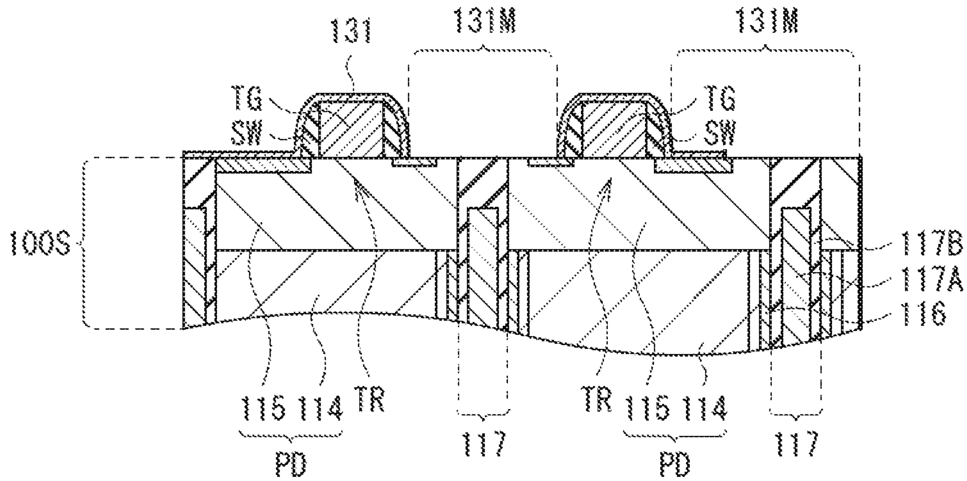
FIG. 18B is a schematic cross-sectional view of a process following FIG. 18A.
Figure 18C:
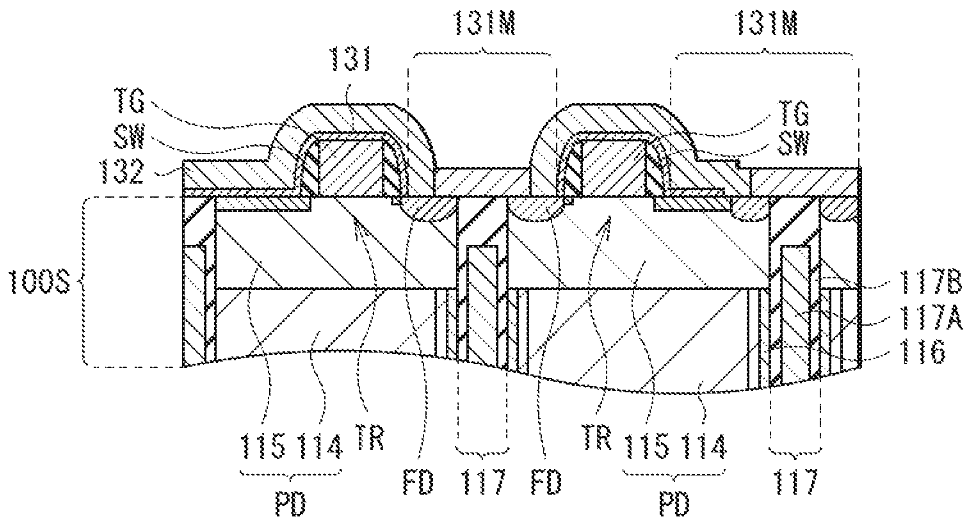
FIG. 18C is a schematic cross-sectional view of a process following FIG. 18B.
Figure 18D:
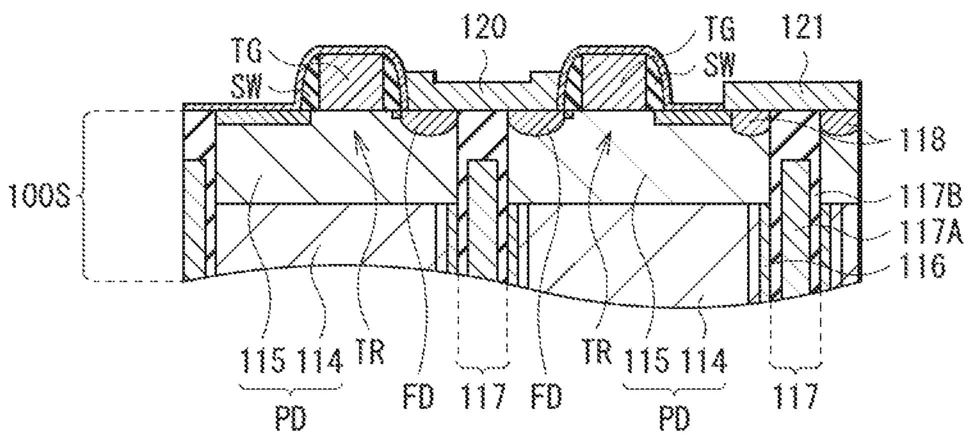
FIG. 18D is a schematic cross-sectional view of a process following FIG. 18C.

Next, the pad sections 120 and 121 are formed on the front surface of the semiconductor layer 100S. FIGS. 18B to 18D illustrate an example of a method of forming the pad sections 120 and 121. The pad sections 120 and 121 are formed as follows, for example.

First, an etching stopper film 131 is formed on the entire front surface of the semiconductor layer 100S to cover the transfer gate TG. The etching stopper film 131 is formed using, for example, an insulating film such as an oxide film or a nitride film. The oxide film is, for example, a silicon oxide (SiO) film, and the nitride film is, for example, silicon nitride (SiN) film. Next, as illustrated in FIG. 18B, openings 131M are formed in the etching stopper film 131. The openings 131M are provided in portions in which the pad sections 120 and 121 are formed. In the openings 131M, the front surface of the semiconductor layer 100S is exposed. After the openings 131M are formed in the etching stopper film 131, as illustrated in FIG. 18C, a polysilicon film 132 is formed on the entire front surface of the semiconductor layer 100S to cover the etching stopper film 131. This causes the polysilicon film 132 and the semiconductor layer 100S to be coupled to each other in the openings 131M. After the polysilicon film 132 is formed, for example, n-type ion implantation is selectively performed on the polysilicon film 132 formed in a region where the pad section 120 is to be formed, and p-type ion implantation is selectively performed on the polysilicon film 132 formed in a region where the pad section 121 is to be formed. Ion species for the ion implantation are diffused in the semiconductor layer 100S by a heating process to reduce contact resistance between the polysilicon film 132 and the semiconductor layer 100S. On this occasion, the floating diffusion FD is formed in each pixel 541 by the n-type ion implantation, and the VSS contact region 118 is formed in each pixel 541 by the p-type ion implantation. Thereafter, as illustrated in FIG. 18D, the polysilicon film 132 is patterned. On this occasion, etching of the polysilicon film 132 is controlled by the etching stopper film 131. A pattern of the polysilicon film 132 is formed as a pattern that is an inversion of a pattern of the etching stopper film 131. Patterning is performed to leave the polysilicon film 132 outside the openings 131M of the etching stopper film 131. For example, this makes it possible to form the pad sections 120 and 121 in predetermined regions. The pad section 120 is formed between sidewalls SW of the pixels 541 adjacent to each other. This method makes it possible to control the size of the pad section 120 by the size of the sidewall SW, which makes it possible to make the pad section 120 small and reduce a parasitic capacitance.

Figure 19A:
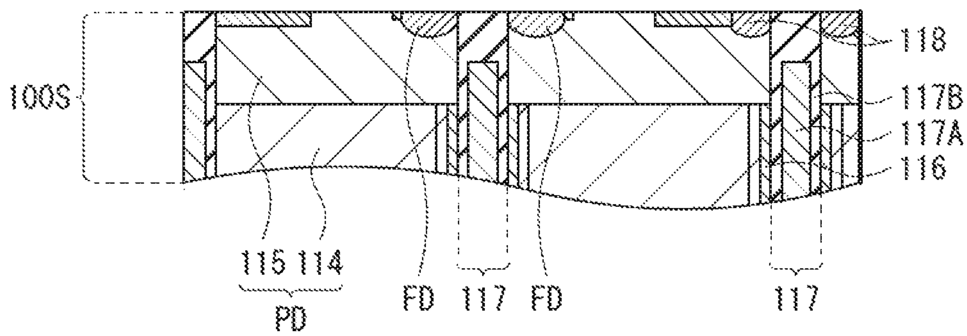
FIG. 19A is a schematic cross-sectional view of another example (1) of the processes illustrated in FIGS. 18A to 18D.
Figure 19B:
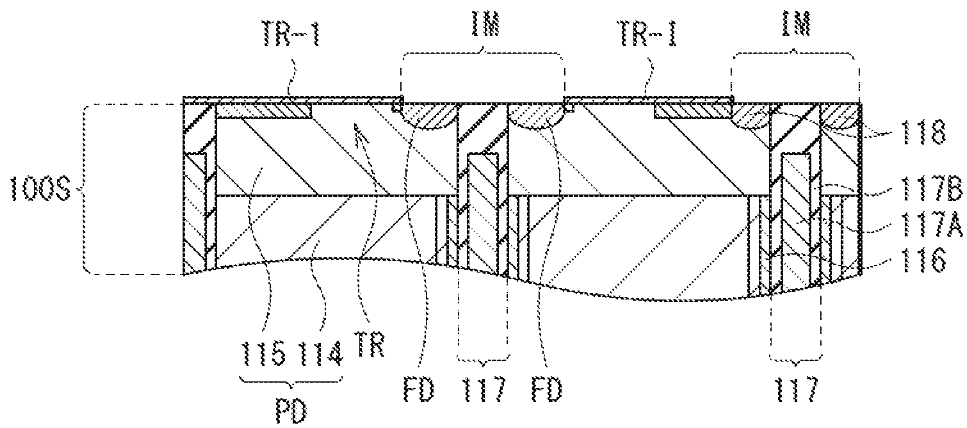
FIG. 19B is a schematic cross-sectional view of a process following FIG. 19A.
Figure 19C:
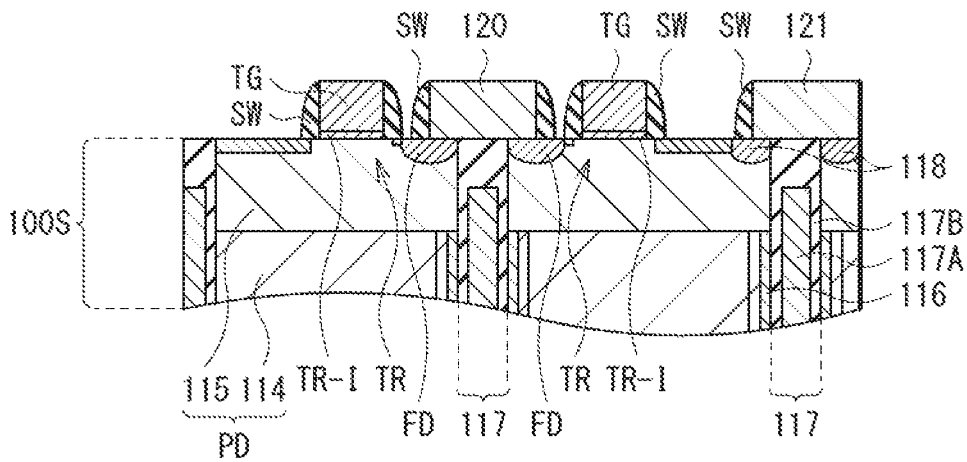
FIG. 19C is a schematic cross-sectional view of a process following FIG. 19B.

FIGS. 19A to 19C illustrate another example (1) of the method of forming the pad sections 120 and 121. In this method, the pad sections 120 and 121 are formed in the same process as a process of forming the transfer gate TG. Specific description is given below. First, as illustrated in FIG. 19A, the p-well layer 115, the pixel separation section 117, the VSS contact region 118, the n-type semiconductor region 114, and the floating diffusion FD are formed in the semiconductor layer 100S. Next, as illustrated in FIG. 19B, a gate insulating film TR-I having openings IM is formed on the front surface of the semiconductor layer 100S. The openings IM are provided in portions in which each of the pad sections 120 and 121 is to be formed. The openings IM of the gate insulating film TR-I are formed by a photolithography method, for example, after the gate insulating film TR-I is formed on the entire front surface of the semiconductor layer 100S. After the gate insulating film TR-I having the openings IM is formed, for example, a polysilicon film is formed on the gate insulating film TR-I. Next, the transfer gate TG and the pad sections 120 and 121 are formed by patterning the polysilicon film. Thereafter, as illustrated in FIG. 19C, the side walls SW are formed on the side surface of the transfer gate TG and the side surfaces of the pad sections 120 and 121. The pad sections 120 and 121 are formed by this method, thereby also forming the sidewalls SW on the side surfaces of the pad sections 120 and 121, for example, in addition to the side surface of the transfer gate TG.

Figure 20A:
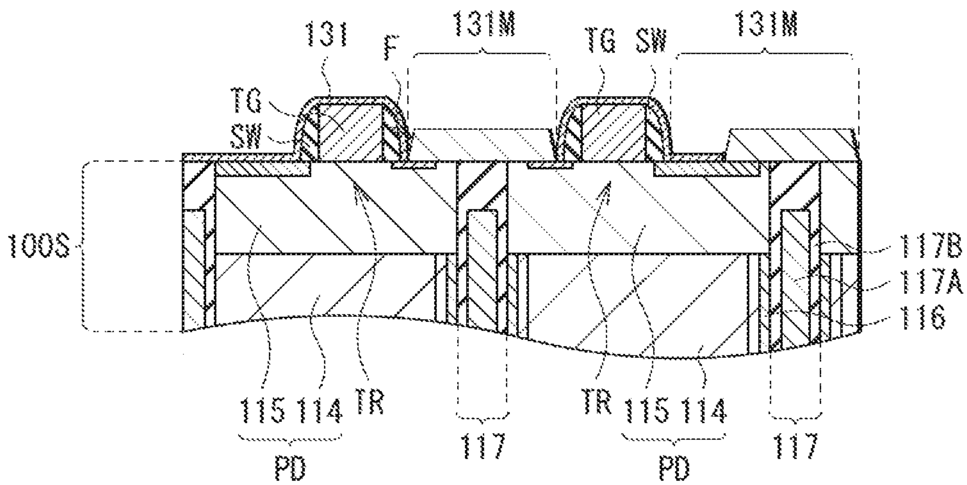
FIG. 20A is a schematic cross-sectional view of another example (2) of the processes illustrated in FIGS. 18A to 18D.
Figure 20B:
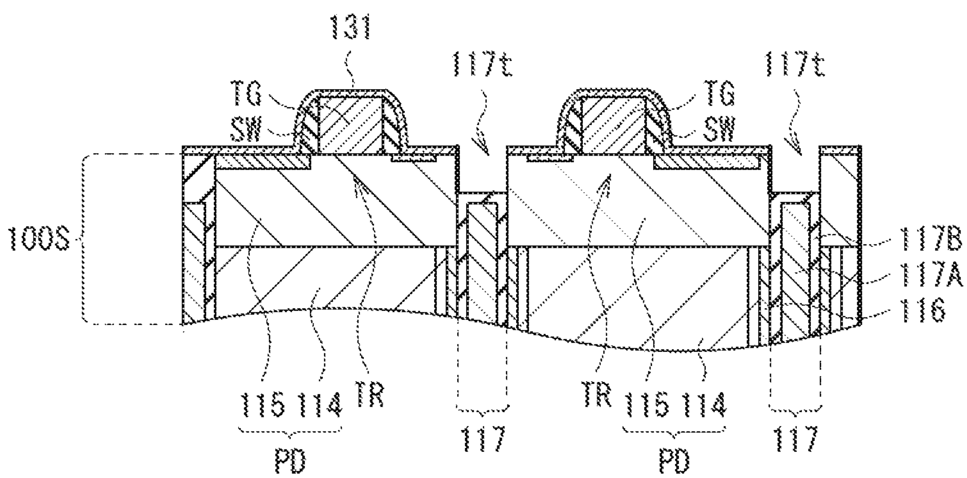
FIG. 20B is a schematic cross-sectional view of another example (3) of the processes illustrated in FIGS. 18A to 18D.
Figure 20C:
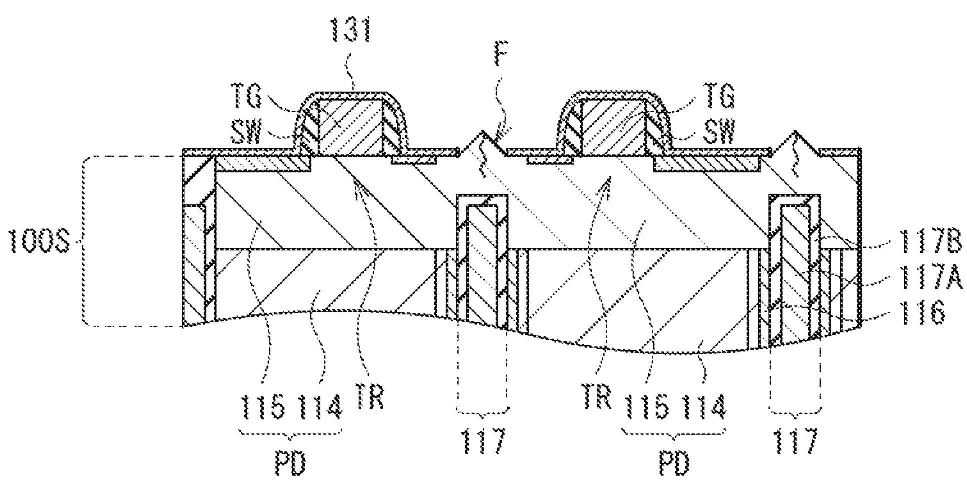
FIG. 20C is a schematic cross-sectional view of a process following FIG. 20B.

FIGS. 20A to 20C illustrate another example (2) of the method of forming the pad sections 120 and 121. In this method, the pad sections 120 and 121 are formed with use of a selective epitaxial growth method. Specific description is given below. First, the p-well layer 115, the n-type semiconductor region 114, the pixel separation section 117, and the transfer transistor TR are formed on the semiconductor layer 100 in a manner similar to that described above with reference to FIG. 18A. Next, the etching stopper film 131 having the openings 131M is formed on the front surface of the semiconductor layer 100S (FIG. 18B). On this occasion, a nitride film is preferably used for the etching stopper film 131. Thereafter, as illustrated in FIG. 20A, silicon (the semiconductor layer 100S) is epitaxially grown with use of the openings 131M of the etching stopper film 131. A silicon layer formed by the epitaxial growth is subjected to n-type ion implantation or p-type ion implantation. Thus, the floating diffusion FD and the VSS contact region 118 are formed together with the pad sections 120 and 121. In this method, a facet (Facet) is formed in each of the pad sections 120 and 121 by epitaxial growth.

Epitaxial growth of silicon (the semiconductor layer 100S) may be performed after the pixel separation section 117 is engraved as illustrated in FIG. 20B. On this occasion, side surfaces of the floating diffusion FD and the VSS contact region 118 are exposed by engraving the pixel separation section 117, and epitaxial growth is performed from the exposed side surfaces (FIG. 20C). Thereafter, a silicon layer formed by the epitaxial growth is subjected to n-type ion implantation or p-type ion implantation. Thus, the floating diffusion FD and the VSS contact region 118 are formed together with the pad sections 120 and 121. A facet is also formed in each of the pad sections 120 and 121 formed in such a manner. Alternatively, it is possible to engrave the pixel separation section 117 and perform epitaxial growth from side surfaces of regions where the floating diffusion FD and the VSS contact region 11 are to be formed, while performing epitaxial growth from the front surface of the semiconductor layer 100S. The pad sections 120 and 121 may be formed in such a manner.

After the pad sections 120 and 121 are formed, the passivation film 122 and the interlayer insulating film 123 are formed in this order on the front surface of the semiconductor layer 100S to cover the pad sections 120 and 121. Thus, the first substrate 100 is formed.

Figure 21A:
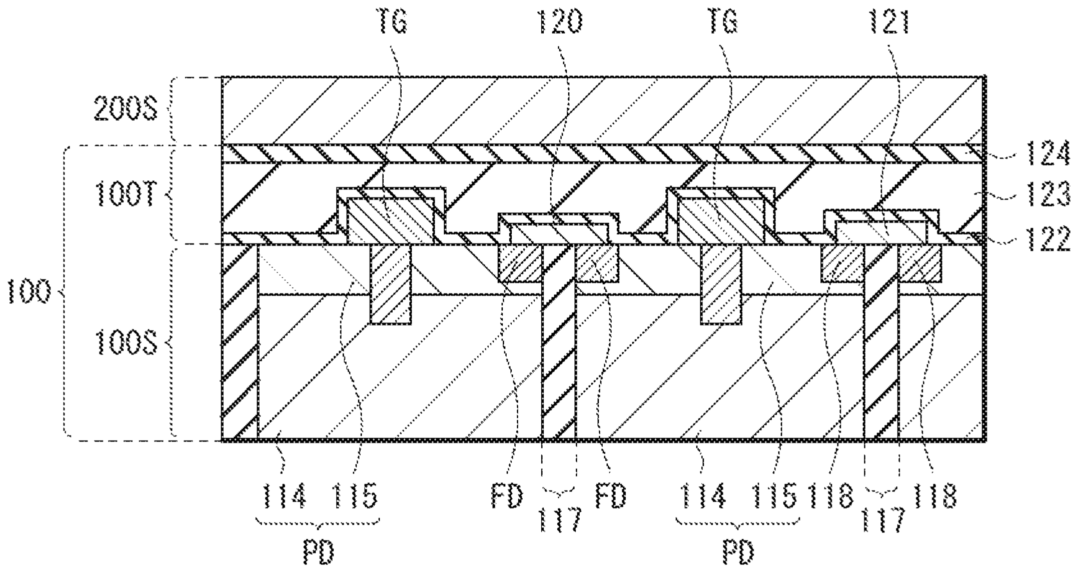
FIG. 21A is a schematic cross-sectional view of a process following FIG. 18D.

Next, as illustrated in FIG. 21A, the semiconductor layer 200S is bonded to the semiconductor layer 100S with the bonding film 124 interposed therebetween. Thereafter, the front surfaces of the semiconductor layer 100S and the semiconductor layer 200S are activated by, for example, plasma irradiation or the like, and then are washed with water and dried. Activation of the semiconductor layer 100S and the semiconductor layer 200S may be performed by a chemical agent, an ion beam, or the like. After the front surfaces of the semiconductor layer 100S and the semiconductor layer 200S are dried, the semiconductor layer 200S is thinned as necessary.

Figure 21B:
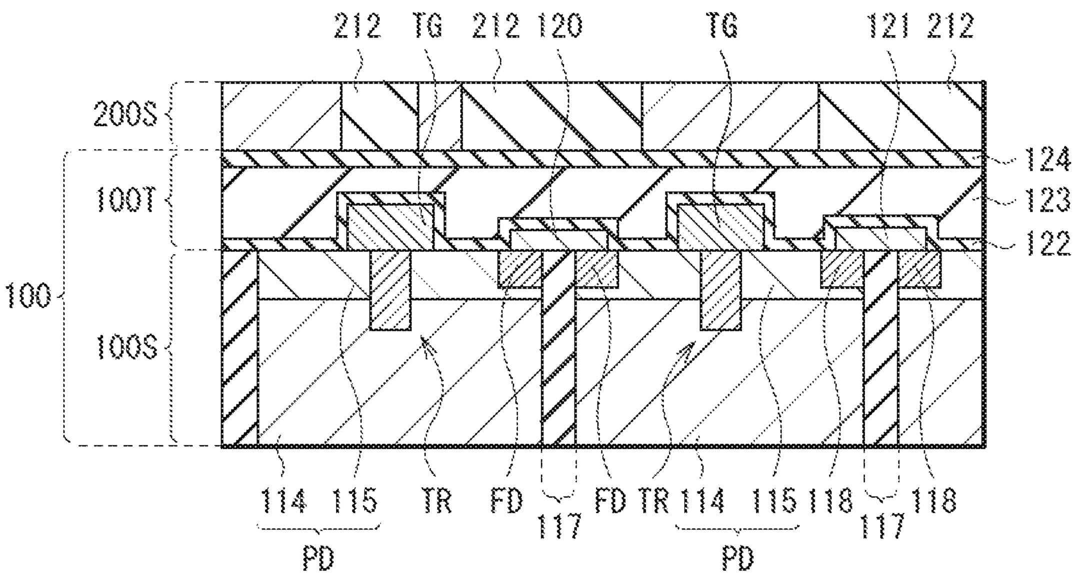
FIG. 21B is a schematic cross-sectional view of a process following FIG. 21A.

Next, as illustrated in FIG. 21B, the insulating region 212 that divides the semiconductor layer 200S is formed. The insulating region 212 is formed by removing a selective region of the semiconductor layer 200S with use of, for example, a dry etching method, and thereafter embedding an insulating material such as silicon oxide (SiO) in the region where the semiconductor layer 200S is removed. After the insulating region 212 is formed, the front surface of the semiconductor layer 200S and the front surface of the insulating region 212 are planarized.

Figure 21C:
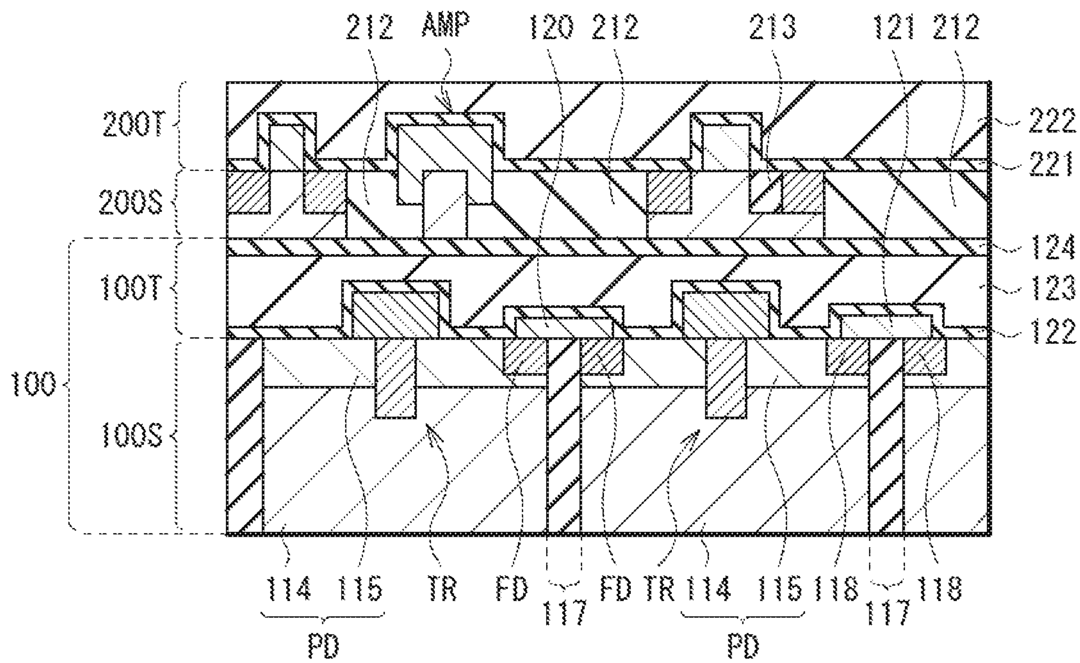
FIG. 21C is a schematic cross-sectional view of a process following FIG. 21B.

Next, as illustrated in FIG. 21C, a plurality of transistors included in the pixel circuit 200X, the passivation film 221, and the interlayer insulating film 222 are formed in this order. They are formed as follows, for example. First, the plurality of transistors such as the amplification transistor AMP, and the VSS contact region 218 are formed in proximity to the front surface of the semiconductor layer 200S. Herein, the pad sections 120 and 121 are formed with use of polysilicon having high heat resistance, which hinders characteristics of the pad sections 120 and 121 from being deteriorated even if high temperature treatment is performed to form the transistors. In addition, it is possible to use a thermal oxide film for gate insulating films of the transistors. After the plurality of transistors and the VSS contact region 118 are formed, the passivation film 221 and the interlayer insulating film 222 are formed in this order on the front surfaces of the semiconductor layer 200S and the insulating region 212 to cover the plurality of transistors. For example, the plurality of transistors, the passivation film 221, and the interlayer insulating film 222 are formed in such a manner.

Figure 21D:
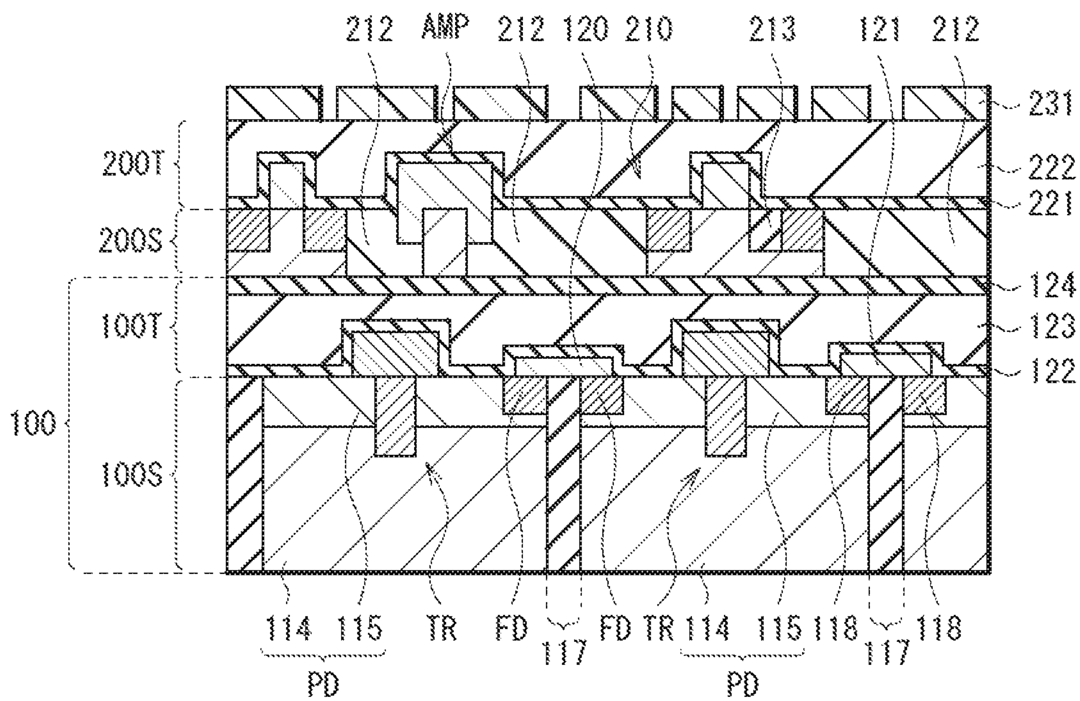
FIG. 21D is a schematic cross-sectional view of a process following FIG. 21C.

Next, as illustrated in FIG. 21D, a resist film 231 having a predetermined pattern is formed on the interlayer insulating film 222. The resist film 231 has openings in a region where the coupling section (e.g., the coupling section 218V or the like) on the front surface side of the semiconductor layer 200S is to be formed, and regions where the through electrodes 120E, 121E, and TGV that reach the first substrate 100 are to be formed. Herein, as described above, the hole diameter of the coupling section is smaller than the hole diameters of the through electrodes 120E, 121E, and TGV, and, for example, the aspect ratio of the coupling section and the aspect ratios of the through electrodes 120E and 121E are designed to be substantially the same as each other. This makes it possible to simultaneously perform etching of the coupling section and etching of the through electrodes 120E, 121E, and TGV. The etching is specifically described below.

Figure 21E:
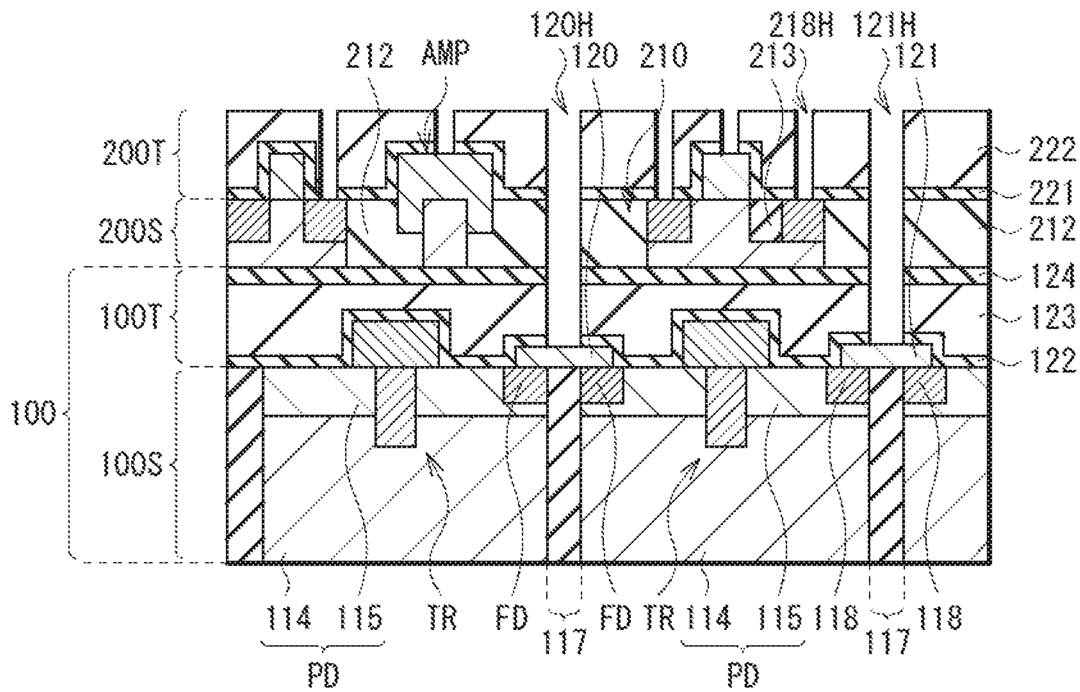
FIG. 21E is a schematic cross-sectional view of a process following FIG. 21D.

As illustrated in FIG. 21E, in a case where dry etching of the interlayer insulating film 222 and the passivation film 221 is performed with use of the pattern of the resist film 231, the coupling holes 120H and 121H each having a relatively large hole diameter are formed to penetrate through the interlayer insulating film 222, the passivation film 221, the bonding film 124, the interlayer insulating film 123, and the passivation film 122. In contrast, when a coupling hole 218H having a relatively small hole diameter penetrates through the interlayer insulating film 222 and the passivation film 221, etching is self-stopped. Accordingly, even if the coupling hole 218H that is shallower than the coupling holes 120H and 121H is formed simultaneously with the coupling holes 120H and 121H, occurrence of over etching is suppressed. In a later process, the through electrodes 120E and 121E are formed in the coupling holes 120H and 121H, and the coupling section 218V is formed in the coupling hole 218H. For example, in a case where the hole diameter of the coupling section and the hole diameters of the through electrodes 120E, 121E, and TGV are the same as each other, etching of the coupling section and etching of the through electrodes 120E, 121E, and TGV are performed in processes different from each other. Accordingly, making the diameter of the coupling section smaller than the diameters of the through electrodes 120E, 121E, and TGV makes it possible to reduce the number of processes and facilitate a process of manufacturing the imaging device 1. It is to be noted that a coupling hole (a coupling hole where the through electrode TGV is to be formed) reaching the transfer gate TG is not illustrated in FIG. 21E.

After the coupling hole (e.g., the coupling hole 218H) on the front surface side of the semiconductor layer 200S and the coupling holes (e.g., the coupling holes 120H and 121H) reaching the first substrate 100 are formed in such a manner, an electrically conductive material is embedded in the coupling holes. This forms the through electrodes 120E, 121E, and TGV, and the coupling section 218V.

Figure 21F:
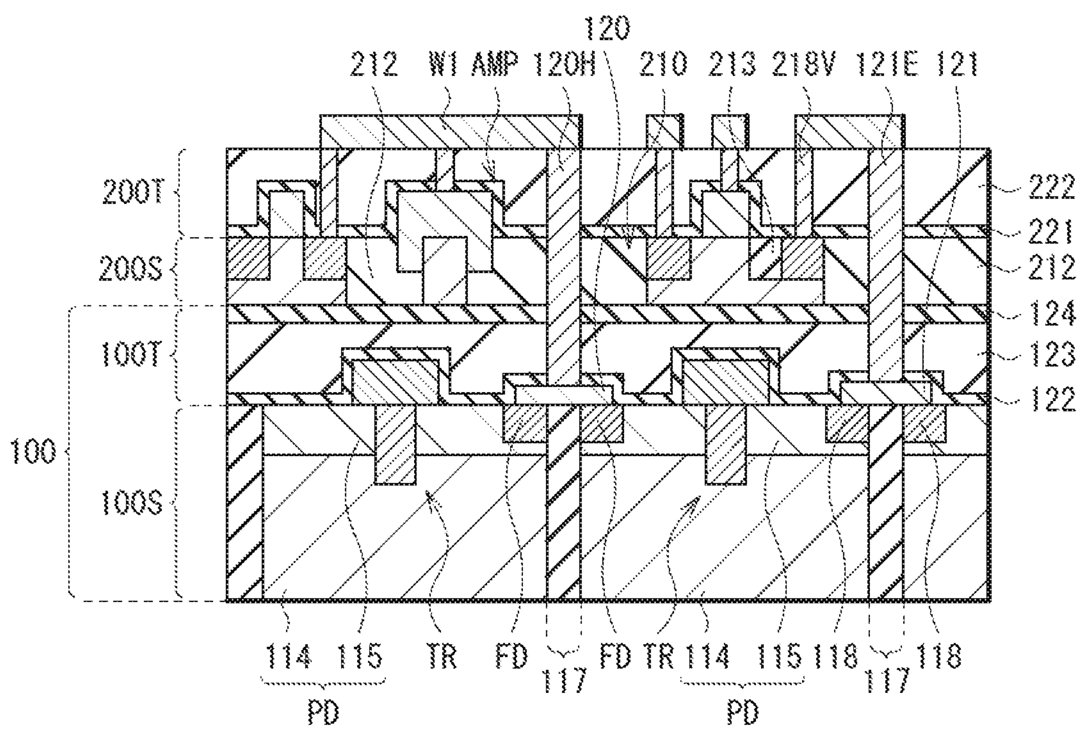
FIG. 21F is a schematic cross-sectional view of a process following FIG. 21E.

Next, as illustrated in FIG. 21F, the first wiring layer W1 is formed on the semiconductor layer 200S with the interlayer insulating film 222 interposed therebetween. Thereafter, the second wiring layer W2, the third wiring layer W3, the fourth wiring layer W4, and the contact sections 201 and 202 are formed in this order to form the wiring layer 200T. Thus, the second substrate 200 is formed.

Finally, the third substrate including the semiconductor layer 300S and the wiring layer 300T is bonded to the second substrate 200. On this occasion, the contact sections 201 and 202 formed in the wiring layer 200T of the second substrate 200 and the contact sections 301 and 302 formed in the wiring layer 300T of the third substrate 300 are bonded together. Thus, the second substrate 200 and the third substrate 300 are electrically coupled to each other. For example, it is possible to manufacture the imaging device 1 in such a manner.

Hereinafter, description is given of characteristics of the imaging device 1.

In general, an imaging device includes a photodiode and a pixel circuit as main components. Herein, in a case where the area of the photodiode is increased, electric charges generated as a result of photoelectric conversion are increased, which consequently makes it possible to improve a signal-to-noise ratio (S/N ratio) of a pixel signal, thereby allowing the imaging device to output more favorable image data (image information). Meanwhile, in a case where the size of a transistor (specifically, the size of an amplification transistor) included in the pixel circuit is increased, noise generated in the pixel circuit is reduced, which consequently makes it possible to improve an S/N ratio of an imaging signal, thereby allowing the imaging device to output more favorable image data (image information).

However, it is conceivable that in an imaging device in which the photodiode and the pixel circuit are provided in the same semiconductor substrate, in a case where the area of the photodiode is increased within a limited area of the semiconductor substrate, the size of the transistor included in the pixel circuit is decreased. In addition, it is conceivable that in a case where the size of the transistor included in the pixel circuit is increased, the area of the photodiode is decreased.

To solve these issues, the imaging device 1 according to the present embodiment uses a structure in which a plurality of pixels 541 shares one pixel circuit 200X, and the shared pixel circuit 200X is disposed to be superimposed on the photodiodes PD. This makes it possible to make the area of the photodiode PD as large as possible within the limited area of the semiconductor substrate and make the size of the transistor included in the pixel circuit 200X as large as possible. This makes it possible to improve the S/N ratio of the pixel signal, thereby allowing the imaging device 1 to output more favorable image data (image information).

In a case where a structure in which a plurality of pixels 541 shares one pixel circuit 200X and the pixel circuit 200X is disposed to be superimposed on the photodiodes PD is achieved, a plurality of wiring lines that is coupled from the respective floating diffusions FD of the plurality of pixels 541 to one pixel circuit 200X extends. In order to secure a large area of the semiconductor layer 200S in which the pixel circuit 200X is formed, for example, it is possible to form a coupling wiring line that couples the plurality of extending wiring lines to each other to combine them into one. For a plurality of wiring lines extending from the VSS contact region 118, it is possible to form a coupling wiring line that couples the plurality of wiring lines extending to each other to combine them into one.

For example, it is conceivable that in a case where a coupling wiring line that couples the plurality of wiring lines extending from the respective floating diffusions FD of the plurality of pixels 541 to each other is formed in the semiconductor layer 200S in which the pixel circuit 200X is formed, an area where the transistors included in the pixel circuit 200X are to be formed is decreased. Likewise, it is conceivable that in a case where a coupling wiring line that couples the plurality of wiring lines extending from the VSS contact regions 118 of the plurality of pixels 541 to each other to combine them into one is formed in the semiconductor layer 200S in which the pixel circuit 200X is formed, an area where the transistors included in the pixel circuit 200X are to be formed is decreased.

To solve these issues, for example, the imaging device 1 according to the present embodiment is able to have a structure in which a plurality of pixels 541 shares one pixel circuit 200X, and the shared pixel circuit 200X is disposed to be superimposed on the photodiodes PD, as well as a structure in which the coupling wiring line that couples the floating diffusions FD of the plurality of pixels 541 to each other to combine them into one, and the coupling wiring line that couples the VSS contact regions 118 included in the plurality of pixels 541 to each other to combine them into one are provided in the first substrate 100.

Herein, in a case where the second manufacturing method described above is used as a manufacturing method for providing, in the first substrate 100, the coupling wiring line that couples the floating diffusions FD of the plurality of pixels 541 to each other to combine them into one, and the coupling wiring line that couples the VSS contact regions 118 of the plurality of pixels 541 to each other to combine them into one, it is possible to perform manufacturing with use of appropriate processes corresponding to the configurations of the first substrate 100 and the second substrate 200 and manufacture an imaging device having high quality and high performance. In addition, it is possible to form the coupling wiring lines of the first substrate 100 and the second substrate 200 by an easy process. Specifically, in a case where the second manufacturing method described above is used, an electrode coupled to the floating diffusion FD and an electrode coupled to the VSS contact region 118 are provided on the front surface of the first substrate 100 and the front surface of the second substrate 200 that form a bonding boundary surface between the first substrate 100 and the second substrate 200. Furthermore, even if displacement occurs between the electrodes provided on the front surfaces of the first substrate 100 and the second substrate 200 upon bonding the two substrate together, the electrodes formed on the front surfaces of the two substrates are preferably made large to cause the electrodes formed on the front surfaces of the two substrates to be in contact with each other. In this case, it is considered difficult to dispose the electrodes described above in the limited area of each pixel included in the imaging device 1.

To solve an issue that a large electrode is necessary on the bonding boundary surface between the first substrate 100 and the second substrate 200, for example, in the imaging device 1 according to the present embodiment, it is possible to use the first manufacturing method described above as a manufacturing method of sharing one pixel circuit 200X by a plurality of pixels 541 and disposing the shared pixel circuit 200X to superimpose the shared pixel circuit 200X on the photodiodes PD. This makes it possible to facilitate alignment of elements formed in the first substrate 100 and the second substrate 200 and manufacture an imaging device having high quality and high performance. Furthermore, it is possible to include a unique structure formed by using this manufacturing method. That is, a structure in which the semiconductor layer 100S and the wiring layer 100T of the first substrate 100, and the semiconductor layer 200S and the wiring layer 200T of the second substrate 200 are stacked in this order, that is, a structure in which the first substrate 100 and the second substrate 200 are stacked face-to-back is included, and through electrodes 120E and 121E are included that penetrate through the semiconductor layer 200S and the wiring layer 100T of the first substrate 100 from the front surface side of the semiconductor layer 200S of the second substrate 200 and reach the front surface of the semiconductor layer 100S of the first substrate 100.

In a structure in which the coupling wiring line that couples the floating diffusions FD of the plurality of pixels 541 to each other to combine them into one and the coupling wiring line that couples the VSS contact regions 118 of the plurality of pixels 541 to each other to combine them into one are provided in the first substrate 100, this structure and the second substrate 200 are stacked with use of the first manufacturing method, and the pixel circuit 200X is formed in the second substrate 200, which may cause heating treatment necessary for formation of an active element included in the pixel circuit 200X to affect the coupling wiring lines described above formed in the first substrate 100.

Therefore, to solve an issue that heating treatment for formation of the active element described above affects the coupling wiring lines described above, in the imaging device 1 according to the present embodiment, it is desirable that an electrically conductive material having high heat resistance be used for the coupling wiring line that couples the floating diffusions FD of the plurality of pixels 541 to each other to combine them into one and the coupling wiring line that couples the VSS contact regions 118 of the plurality of pixels 541 to each other to combine them into one. Specifically, as the electrically conductive material having high heat resistance, it is possible to use a material having a higher melting point than that of at least some of wiring materials included in the wiring layer 200T of the second substrate 200.

As described above, for example, the imaging device 1 according to the present embodiment includes (1) a structure in which the first substrate 100 and the second substrate 200 are stacked face-to-back (specifically, a structure in which the semiconductor layer 100S and the wiring layer 100T of the first substrate 100 and the semiconductor layer 200S and the wiring layer 200T of the second substrate 200 are stacked in this order), (2) a structure in which the through electrodes 120E and 121E are provided that penetrate from the front surface side of the semiconductor layer 200S of the second substrate 200 to the front surface of the semiconductor layer 100S of the first substrate 100 through the semiconductor layer 200S and the wiring layer 100T of the first substrate 100, and (3) a structure in which the coupling wiring line that couples the floating diffusions FD included in the plurality of pixels 541 to each other to combine them into one and the coupling wiring line that couples the VSS contact regions 118 included in the plurality of pixels 541 to each other to combine them into one are formed with use of an electrically conductive material having high heat resistance, which makes it possible to provide, in the first substrate 100, a coupling wiring line that couples the floating diffusions FD included in the plurality of pixels 541 to each other to combine them into one and a coupling wiring line that couples the VSS contact regions 118 included in the plurality of pixels 541 to each other to combine them into one, without providing a large electrode at an interface between the first substrate 100 and the second substrate 200.

[Operation of Imaging Device 1]

Figure 22:
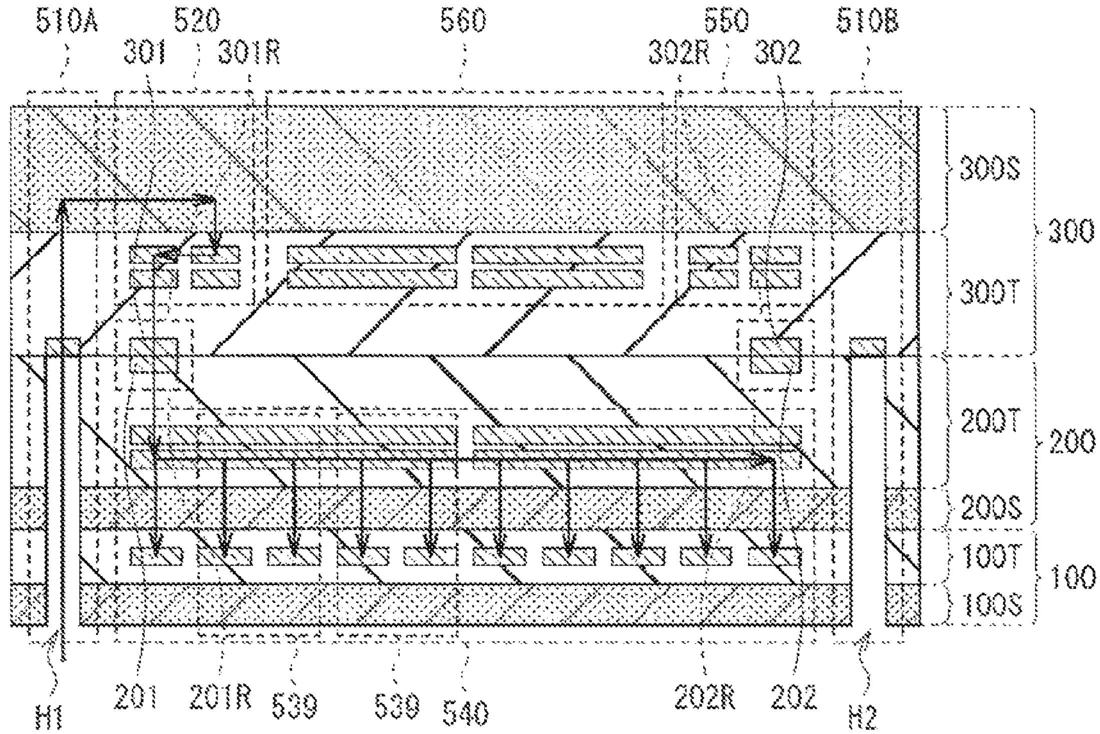
FIG. 22 is a schematic view for describing paths of an input signal and the like to the imaging device illustrated in FIG. 3.
Figure 23:
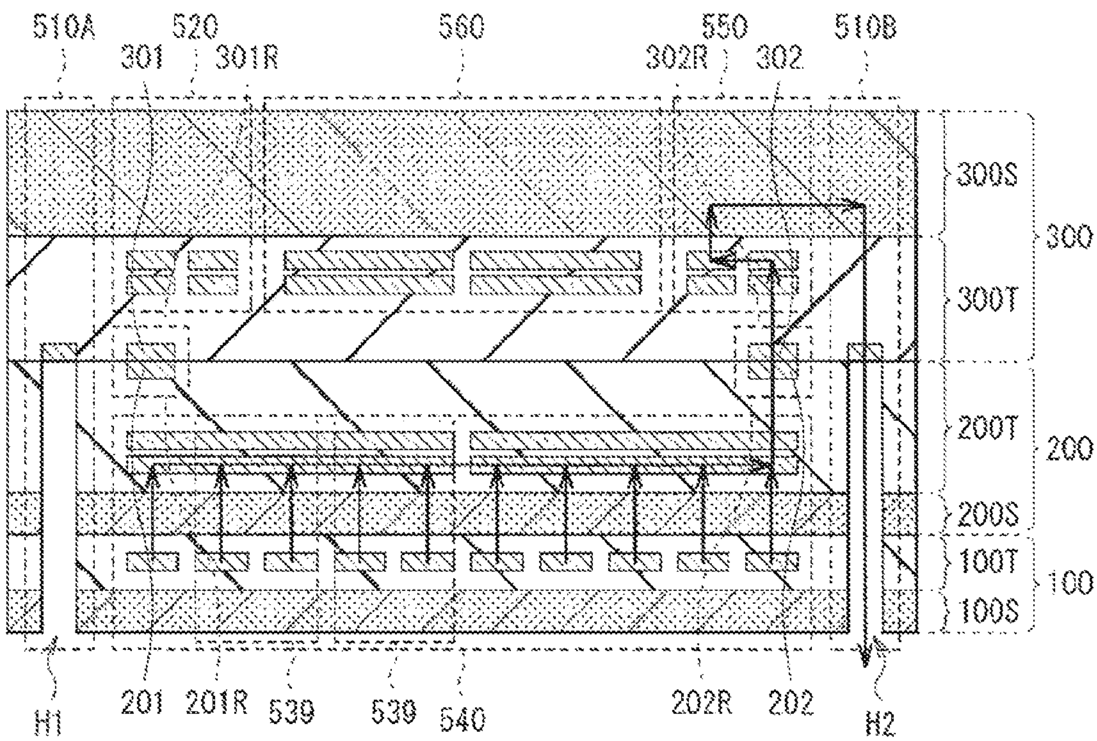
FIG. 23 is a schematic view for describing a signal path of a pixel signal of the imaging device illustrated in FIG. 3.

Next, description is given of an operation of the imaging device 1 with use of FIGS. 22 and 23. FIGS. 22 and 23 correspond to FIG. 3 with an arrow indicating a path of each signal. FIG. 22 illustrates paths, indicated by arrows, of an input signal to be inputted from outside to the imaging device 1, a power source potential, and a reference potential.

FIG. 23 illustrates a signal path, indicated by arrows, of a pixel signal to be outputted from the imaging device 1 to outside. For example, the input signal (e.g., a pixel clock and a synchronization signal) inputted to the imaging device 1 through the input section 510A is transmitted to the row driving section 520 of the third substrate 300, and row drive signals are generated in the row driving section 520. The row drive signals are transmitted to the second substrate 200 through the contact sections 301 and 201. Furthermore, the row drive signals reach each of the pixel sharing units 539 of the pixel array section 540 through the row drive signal lines 542 in the wiring layer 200T. A drive signal other than a drive signal of the transfer gate TG among the row drive signals having reached the pixel sharing unit 539 of the second substrate 200 is inputted to the pixel circuit 200X to drive each of the transistors included in the pixel circuit 200X. The drive signal of the transfer gate TG is inputted to the transfer gates TG1, TG2, TG3, and TG4 of the first substrate 100 through the through electrodes TGV to drive the pixels 541A, 541B, 541C, and 541D (FIG. 22). In addition, the power source potential and the reference potential supplied from outside of the imaging device 1 to the input section 510A (the input terminal 511) of the third substrate 300 are transmitted to the second substrate 200 through the contact sections 301 and 201 to be supplied to the pixel circuit 200X of each of the pixel sharing units 539 through a wiring line in the wiring layer 200T. The reference potential is also supplied to the pixels 541A, 541B, 541C, and 541D of the first substrate 100 through the through electrodes 121E. Meanwhile, the pixel signals photoelectrically converted in the pixels 541A, 541B, 541C, and 541D of the first substrate 100 are transmitted to the pixel circuit 200X of the second substrate 200 for each pixel sharing unit 539 through the through electrodes 120E. A pixel signal based on the pixel signal is transmitted from the pixel circuit 200X to the third substrate 300 through the vertical signal line 543 and the contact sections 202 and 302. The pixel signal is processed in the column signal processor 550 and the image signal processor 560 of the third substrate 300, and then outputted to outside through the output section 510B (FIG. 23).

[Effects]

In the present embodiment, the pixels 541A, 541B, 541C, and 541D (the pixel sharing units 539), and the pixel circuits 200X are provided in mutually different substrates (the first substrate 100 and the second substrate 200). This makes it possible to increase the areas of the pixels 541A, 541B, 541C, and 541D and the pixel circuits 200X, as compared with a case where the pixels 541A, 541B, 541C, and 541D and the pixel circuits 200X are formed in the same substrate. This consequently makes it possible to increase the amount of pixel signals obtained by photoelectric conversion and reduce transistor noise of the pixel circuits 200X. Accordingly, it is possible to improve the signal-to-noise ratio of the pixel signal, thereby allowing the imaging device 1 to output more favorable pixel data (image information). In addition, it is possible to miniaturize the imaging device 1 (in other words, reduce the pixel size and downsize the imaging device 1). Reduction in the pixel size makes it possible to increase the number of pixels per unit area, thereby allowing the imaging device 1 to output an image having high image quality.

In addition, in the imaging device 1, the first substrate 100 and the second substrate 200 are electrically coupled to each other by the through electrodes 120E and 121E provided in the insulating region 212. For example, a method of coupling the first substrate 100 and the second substrate 200 to each other by bonding pad electrodes together and a method of coupling the first substrate 100 and the second substrate 200 to each other by a through wiring line (e.g., a TSV ((Thorough Si Via)) penetrating through a semiconductor layer may be considered. As compared with such methods, providing the through electrodes 120E and 121E in the insulating region 212 makes it possible to reduce an area necessary for coupling between the first substrate 100 and the second substrate 200. This makes it possible to reduce the pixel size and further downsize the imaging device 1. In addition, further miniaturization of an area per pixel makes it possible to further enhance resolution. In a case where reduction in chip size is not necessary, it is possible to expand formation regions of the pixels 541A, 541B, 541C, and 541D and the pixel circuits 200X. This consequently makes it possible to increase the amount of the pixel signals obtained by photoelectric conversion and to reduce noise of the transistors included in the pixel circuits 200X. This makes it possible to improve the signal-to-noise ratio of the pixel signal, thereby allowing the imaging device 1 to output more favorable pixel data (image information).

In addition, in the imaging device 1, the pixel circuits 200X, and the column signal processor 550 and the image signal processor 560 are provided in mutually different substrates (the second substrate 200 and third substrate 300). As compared with a case where the pixel circuits 200X, the column signal processor 550, and the image signal processor 560 are formed in the same substrate, it is possible to increase the areas of the pixel circuits 200X and the areas of the column signal processor 550 and the image signal processor 560. This makes it possible to reduce noise generated in the column signal processor 550 and mount a more advanced image processing circuit in the image signal processor 560. Accordingly, it is possible to improve the signal-to-noise ratio of the pixel signal, thereby allowing the imaging device 1 to output more favorable pixel data (image information).

In addition, in the imaging device 1, the pixel array section 540 is provided in the first substrate 100 and the second substrate 200, and the column signal processor 550 and the image signal processor 560 are provided in the third substrate 300. In addition, the contact sections 201, 202, 301, and 302 that couple the second substrate 200 and the third substrate 300 to each other are formed above the pixel array section 540. This makes it possible to freely lay out the contact sections 201, 202, 301, and 302 without interference in layout by various types of wiring lines included in a pixel array. Accordingly, it is possible to use the contact sections 201, 202, 301, and 302 for electrical coupling between the second substrate 200 and the third substrate 300. For example, flexibility in layout in the column signal processor 550 and the image signal processor 560 is increased by using the contact sections 201, 202, 301, and 302. This makes it possible to reduce noise generated in the column signal processor 550 and mount a more advanced image processing circuit in the image signal processor 560. Accordingly, it is possible to improve the signal-to-noise ratio of the pixel signal, thereby allowing the imaging device 1 to output more favorable pixel data (image information).

In addition, in the imaging device 1, the pixel separation section 117 penetrates through the semiconductor layer 100S. This makes it possible to suppress color mixture among the pixels 541A, 541B, 541C, and 541D even in a case where a distance between adjacent pixels (the pixels 541A, 541B, 541C, and 541D) is decreased by miniaturization of an area per pixel. Accordingly, it is possible to improve the signal-to-noise ratio of the pixel signal, thereby allowing the imaging device 1 to output more favorable pixel data (image information).

In addition, in the imaging device 1, the pixel circuit 200X is provided for each pixel sharing unit 539. Accordingly, as compared with a case where the pixel circuit 200X is provided for each of the pixels 541A, 541B, 541C, and 541D, it is possible to expand formation regions of the transistors (the amplification transistor AMP, the reset transistor RST, the selection transistor SEL, and the FD conversion gain switching transistor FDG) included in the pixel circuit 200X. For example, expanding the formation region of the amplification transistor AMP makes it possible to suppress noise. Accordingly, it is possible to improve the signal-to-noise ratio of the pixel signal, thereby allowing the imaging device 1 to output more favorable pixel data (image information).

Furthermore, in the imaging device 1, the pad section 120 that electrically couples the floating diffusions FD (the floating diffusions FD1, FD2, FD3, and FD4) of four pixels (the pixels 541A, 541B, 541C, and 541D) to each other is provided in the first substrate 100. Accordingly, as compared with a case where such a pad section 120 is provided in the second substrate 200, it is possible to reduce the number of through electrodes (the through electrodes 120E) that couple the first substrate 100 and the second substrate 200 to each other. This makes it possible to make the insulating region 212 small and secure sufficiently large formation regions (the semiconductor layer 200S) of the transistors included in the pixel circuit 200X. This makes it possible to reduce noise of the transistors included in the pixel circuit 200X, which makes it possible to improve the signal-to-noise ratio of the pixel signal, thereby allowing the imaging device 1 to output more favorable pixel data (image information). Furthermore, the number of through electrodes is reduced, which makes it possible to improve flexibility in layout. This makes it possible to also reduce a parasitic capacitance, for example.

Furthermore, in the imaging device 1, the transistors such as the amplification transistor AMP included in the pixel circuit 200X include a transistor having a three-dimensional structure. This makes it possible to increase an effective gate width while maintaining a footprint, as compared with a case where a planar type transistor is used. Accordingly, it is possible to improve transistor performance (such as operation speed and RN) without obstructing miniaturization of pixels. In addition, a gate area is increased, which makes it possible to reduce RTS noise. This makes it possible to suppress an influence of noise on an image more effectively.

In addition, in the imaging device 1, the hole diameter of the coupling section (e.g., the coupling section 218V) provided in the wiring layer 200T of the second substrate 200 and the hole diameters of the through electrodes 120E, 121E, and TGV that reach the first substrate 100 from the second substrate 200 are different from each other. This makes it possible to improve flexibility in layout.

In addition, in the present embodiment, regarding the second substrate 200, description has been given of an example in which the amplification transistor AMP, the reset transistor RST, and the selection transistor SEL that are allowed to be included in the pixel circuit 200X are formed in one semiconductor layer 200S; however, at least one transistor may be formed in an semiconductor layer 200S-1, and the remaining transistors may be formed in a semiconductor layer 200S-2 that is different from the semiconductor layer 100S and the semiconductor layer 200S-1. Although the semiconductor layer 200S-2 is not illustrated, for example, an insulating layer, a coupling section, and a coupling wiring line are formed above the semiconductor layer 200S-1 (corresponding to the semiconductor layer 200S), and the semiconductor layer 200S-2 is further stacked thereon. This another semiconductor layer 200S-2 is stacked on a surface on side opposite to a surface stacked on the semiconductor layer 100S of the interlayer insulating film 123, and it is possible to form a desired transistor in the semiconductor layer 200S-2. As an example, it is possible to form the amplification transistor AMP in the semiconductor layer 200S-1, and from the reset transistor RST and/or the selection transistor SEL in the semiconductor layer 200S-2.

In addition, a plurality of other semiconductor layers may be provided, and a desired one of the transistors of the pixel circuit 200X may be provided in each of the other semiconductor layers. As an example, it is possible to form the amplification transistor AMP in the semiconductor layer 200S-1. Furthermore, in a case where an insulating layer, a coupling section, and a coupling wiring line are stacked on the semiconductor layer 200S and the semiconductor layer 200S-2 is further stacked thereon, it is possible to form the reset transistor RST in the semiconductor layer 200S-2. In a case where an insulating layer, a coupling section, and a coupling wiring line are stacked on the semiconductor layer 200S-2 and a semiconductor layer 200S-3 is further stacked thereon, it is possible to form the selection transistor SEL in the semiconductor layer 200S-3. The transistors formed in the semiconductor layers 200S-1, 200S-2, and 200S-3 may be any of the transistors included in the pixel circuit 200X.

Thus, a structure in which a plurality of semiconductor layers is provided in the second substrate 200 makes it possible to decrease the area of the semiconductor layer 200S occupied by one pixel circuit 200X. If it is possible to decrease the area of each pixel circuit 200X or miniaturize each transistor, it is also possible to decrease the area of the chip. In addition, it is possible to increase the area of a desired transistor among the amplification transistor, the reset transistor, and the selection transistor that are allowed to be included in the pixel circuit 200X. In particular, increasing the area of the amplification transistor makes it possible to expect a noise reduction effect.

Figure 53:
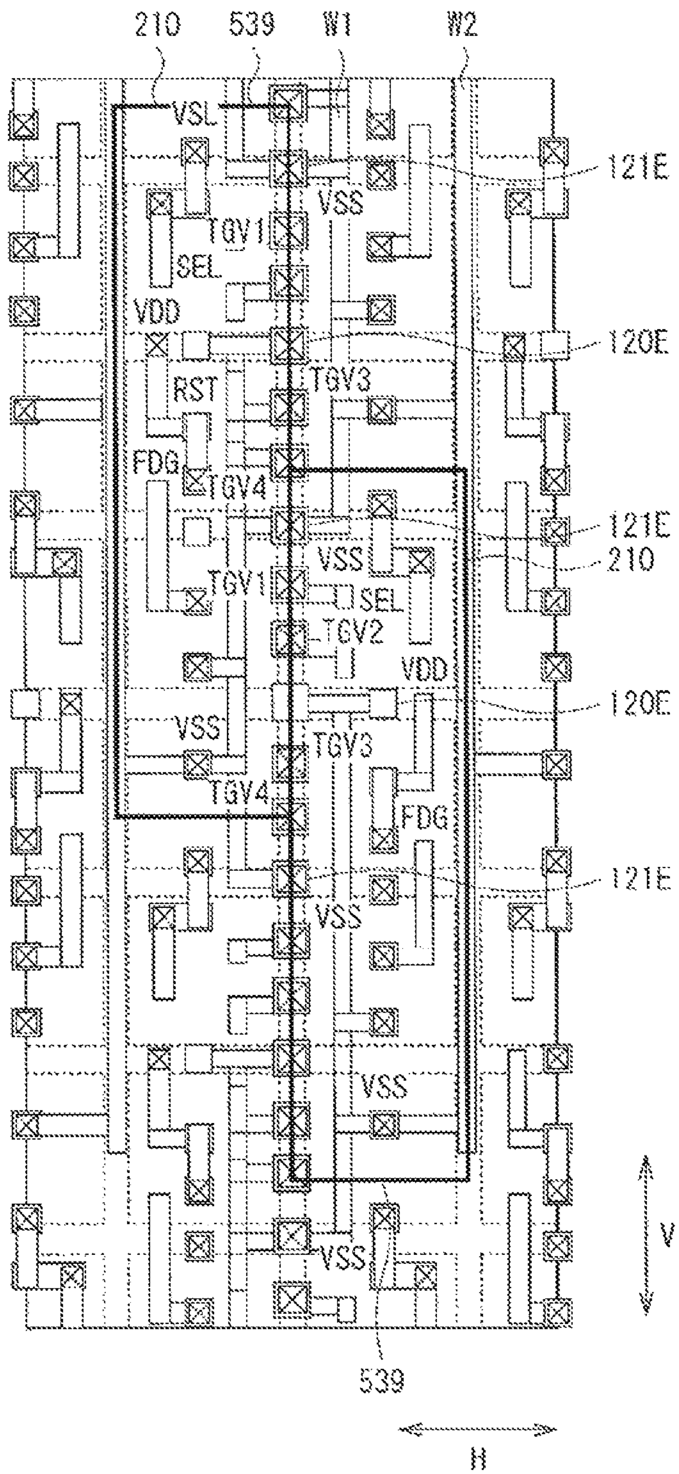
FIG. 53 is a schematic view of an example of a planar configuration of the second wiring layer together with the first wiring layer illustrated in FIG. 52.

It is to be noted that as described above, in a case where the pixel circuit 200X is formed dividedly in a plurality of semiconductor layers (e.g., the semiconductor layers 200S-1, 200S-2, and 200S-3), for example, as illustrated in FIG. 53 corresponding to a modification example 13 to be described later, in a substrate (a lower substrate 1210) including the gate electrode 23 of the amplification transistor AMP, a gate electrode 1231 may be provided in contact with a wiring line L1002 (corresponding to the through electrode 120E). Furthermore, as illustrated in FIG. 139, the wiring line L1002 (corresponding to the through electrode 120E) is provided to penetrate through element separation regions 213A and 213B provided in respective semiconductor layers (e.g., the lower substrate 1210 and an upper substrate 1220).

Modification examples of the imaging device 1 according to the embodiment described above are described below. In the following modification examples, common components to those in the embodiment described above are denoted by same reference signs.

2. Modification Example 1

In the present modification example, the floating diffusion FD includes an n-type impurity, e.g., arsenic (As), having a slower diffusion rate than that of phosphorus (P). This makes it possible to suppress a decrease in an accumulated electric charge amount of the photodiode PD resulting from excessive diffusion of the impurity. A reason for this is described below.

Figure 24:
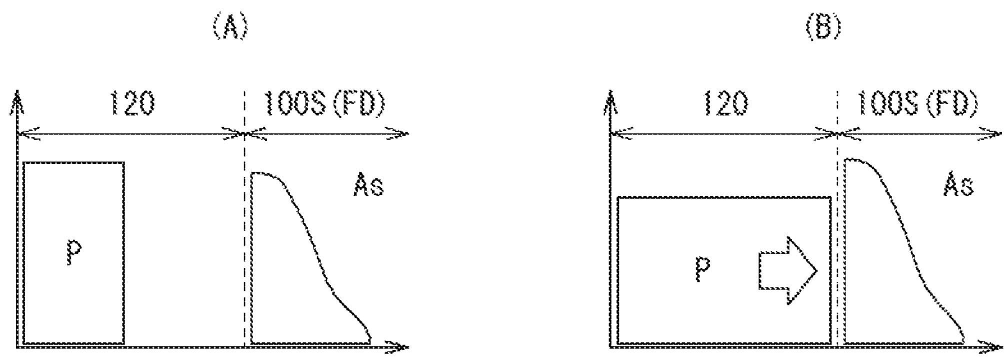
FIG. 24 (A) is a schematic view for describing a state before a heat treatment process of an imaging device according to a modification example 1, and (B) is a schematic view for describing a state after the heat treatment process of the imaging device illustrated in (A).
Figure 25:
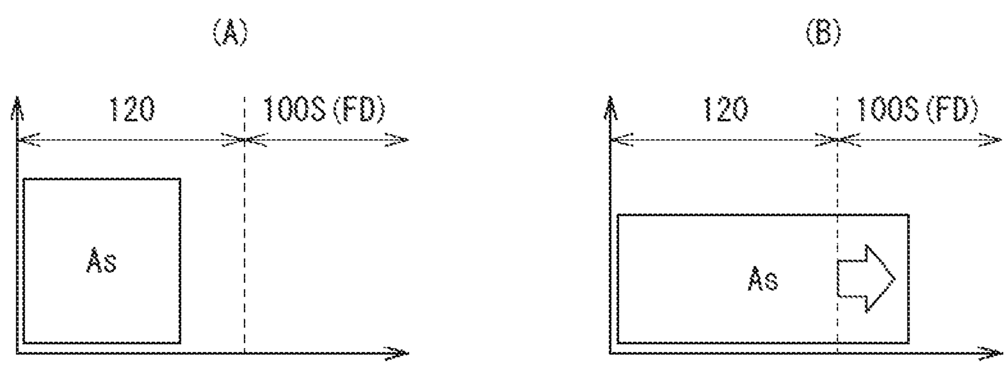
FIG. 25 (A) is a schematic view for describing another example of the state before the heat treatment process of the imaging device illustrated in FIG. 24, and (B) is a schematic view for describing a state after the heat treatment process of the imaging device illustrated in (A).

(A) and (B) of FIG. 24 and (A) and (B) of FIG. 25 schematically illustrate an influence of a heat treatment process (annealing) of the pad section 120 and the semiconductor layer 100S (specifically, the floating diffusion FD). (A) of FIG. 24 and (A) of FIG. 25 illustrate a state of the n-type impurity before annealing and (B) of FIG. 24 and (B) of FIG. 25 illustrate a state of the n-type impurity after annealing.

Arsenic is diffused in the floating diffusion FD, which hinders excessive diffusion even after the heat treatment process ((A) and (B) of FIG. 24) because arsenic has a slower diffusion rate than phosphorus. In addition, phosphorus diffused in the pad section 120 is diffused to the semiconductor layer 100S over a predetermined diffusion distance; therefore, as compared with a case where phosphorus is diffused to the semiconductor layer 100S, an effective diffusion distance is increased, which hinders an influence on the photodiode. Accordingly, including arsenic in at least the floating diffusion FD hinders reduction in the formation region of the photodiode PD resulting from excessive diffusion of the n-type impurity. This makes it possible to suppress a decrease in the accumulated electric charge amount of the photodiode PD.

As illustrated in (A) and (B) of FIG. 25, arsenic may be diffused from the pad section 120 by the heat treatment process to form the floating diffusion FD. That is, the pad section 120 and the floating diffusion FD may include arsenic. On this occasion, the impurity (arsenic) concentration in the floating diffusion FD is lower than the impurity concentration in the pad section 120. Phosphorus may be diffused from the pad section 120 by the heat treatment process to form the floating diffusion FD.

In a case where the pad section 121 and the VSS contact region 118 include a p-type impurity, the pad section 121 and the VSS contact region 118 include, for example, boron (B). On this occasion, for example, boron is diffused from the pad section 121 by the heat treatment process to form the VSS contact region 118. This hinders a decrease in the formation region of the photodiode PD resulting from excessive diffusion of the p-type impurity This makes it possible to suppress a decrease in the accumulated electric charge amount of the photodiode PD.

Thus, the imaging device 1 in which the floating diffusion FD or the VSS contact region 118 includes an impurity having a slow diffusion rate also achieves effects similar to those described in the above embodiment. In addition, it is possible to suppress a decrease in the accumulated electric charge amount of the photodiode PD.

3. Modification Example 2

Figure 26A:
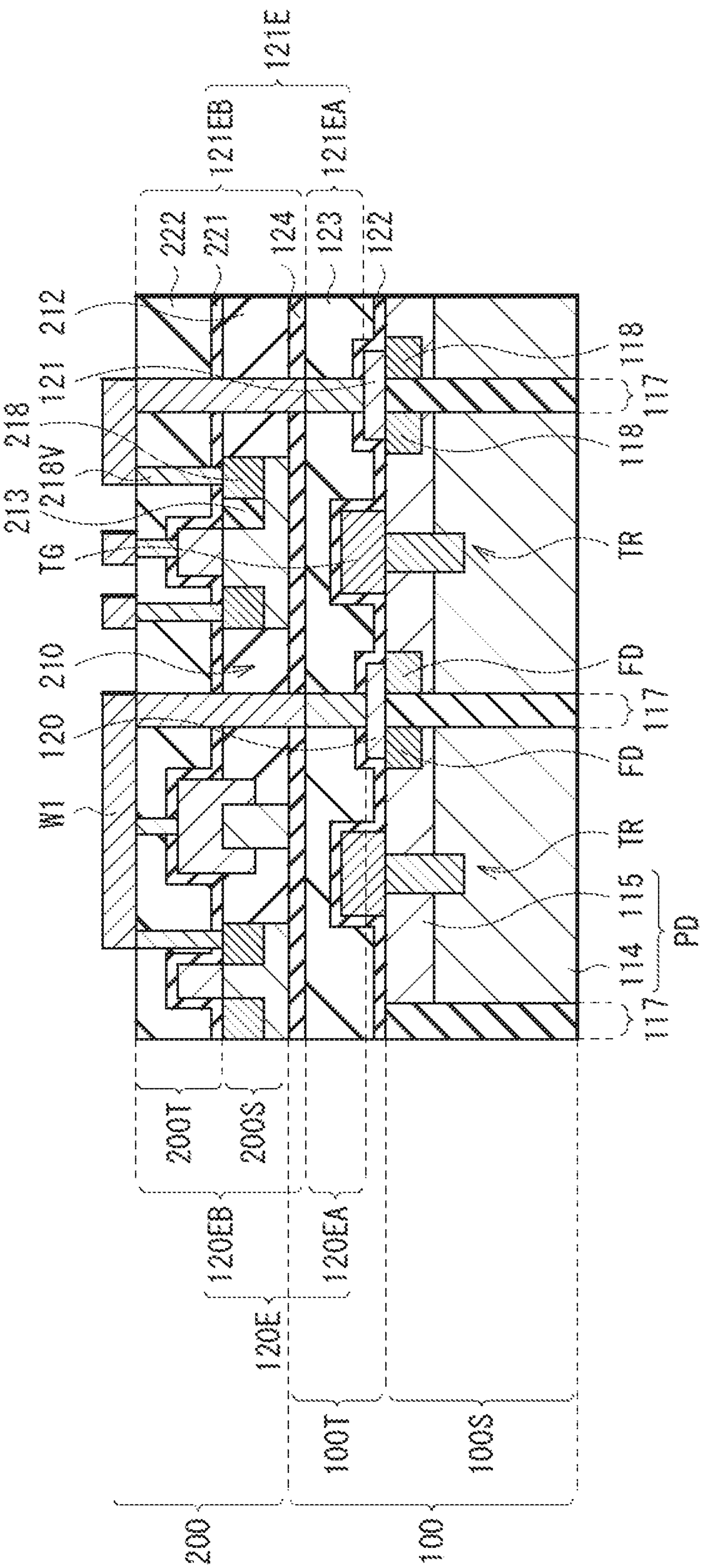
FIG. 26A is a schematic view of a cross-sectional configuration of a main part of an imaging device according to a modification example 2.
Figure 26B:
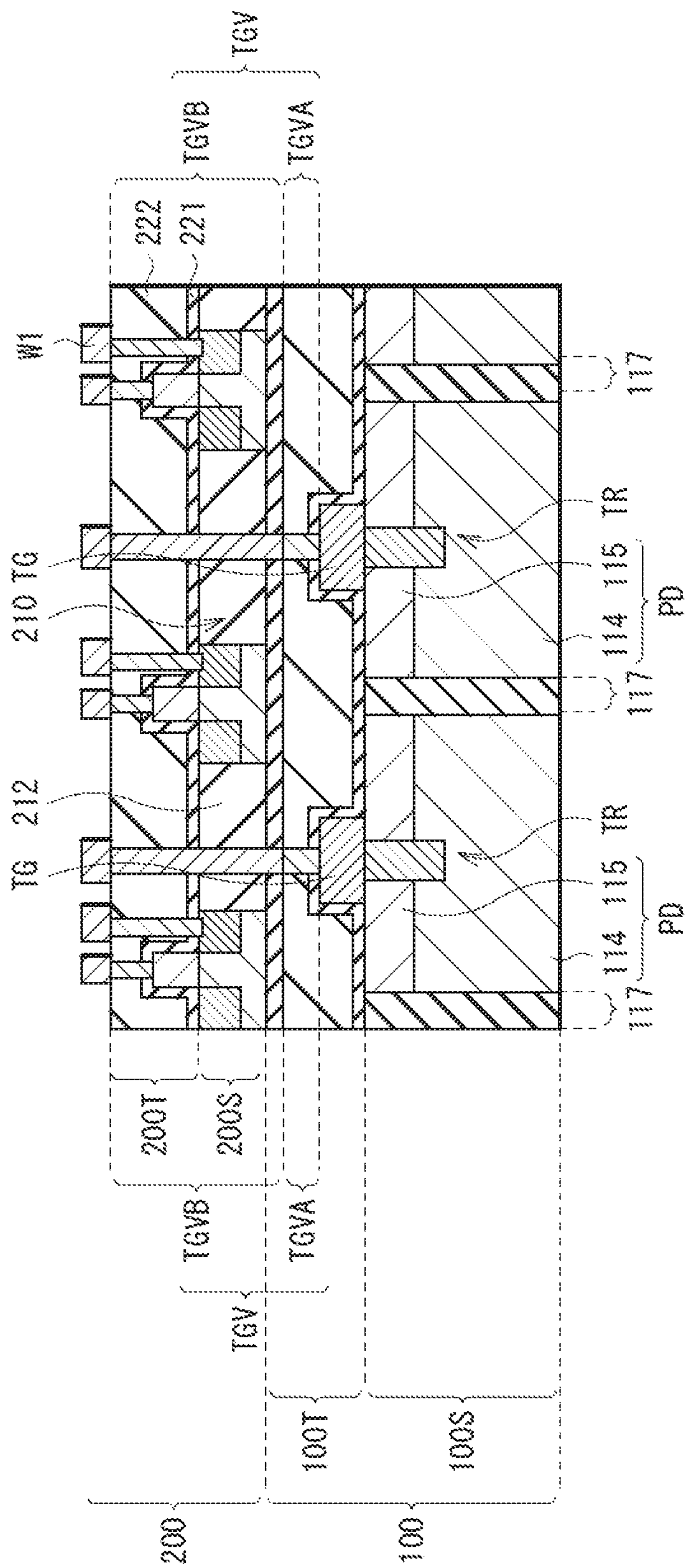
FIG. 26B is a schematic view of a cross-sectional configuration of another portion of the imaging device illustrated in FIG. 26A.

FIGS. 26A and 26B illustrate a modification example of a cross-sectional configuration of a main part of the imaging device 1 according to the embodiment described above. FIG. 26A schematically illustrates a cross-sectional configuration in proximity to the through electrodes 120E and 121E, and corresponds to FIG. 8A described in the above embodiment. FIG. 26B schematically illustrates a cross-sectional configuration in proximity to the through electrode TGV.

In the present modification example, the through electrode 120E includes a first portion 120EA and a second portion 120EB from the side of the semiconductor layer 100S. The through electrode 121E includes a first portion 121EA and a second portion 121EB from the side of the semiconductor layer 100S. The through electrode TGV includes a first portion TGVA and a second portion TGVB from the side of the semiconductor layer 100S. The imaging device 1 according to the present modification example differs from the imaging device 1 described in the above embodiment in this point.

The first portion 120EA of the through electrode 120E is coupled to the pad section 120 and the second portion 120EB (FIG. 26A). The first portion 120EA is provided in, for example, the wiring layer 100T of the first substrate 100, and an upper end surface thereof is provided on substantially the same plane as the bonding film 124. A lower end surface of the first portion 120EA is in contact with the pad section 120.

The first portion 121EA of the through electrode 121E is coupled to the pad section 121 and the second portion 121EB. The first portion 121EA is provided in, for example, the wiring layer 100T of the first substrate 100, and an upper end surface thereof is provided on substantially the same plane as the bonding film 124. A lower end surface of the first portion 121EA is in contact with the pad section 121.

The first portion TGVA of the through electrode TGV is coupled to the transfer gate TG and the second portion TGVB (FIG. 26B). The first portion TGVA is provided in, for example, the wiring layer 100T of the first substrate 100, and an upper end surface thereof is provided on substantially the same plane as the bonding film 124. A lower end surface of the first portion TGVA is in contact with the transfer gate TG (more specifically, the horizontal portion TGb).

The first portions 120EA, 121EA, and TGVA include, for example, polysilicon. The first portions 120EA and TGVA include, for example, polysilicon doped with an n-type impurity, and the first portion 121EA includes, for example, polysilicon doped with a p-type impurity. For example, as described above with reference to FIG. 15A, in a case where the pad sections 120 and 121 are not provided in the imaging device 1, the lower end surfaces of the first portions 120EA and 121EA may be in contact with the front surface of the semiconductor layer 100S.

The second portion 120EB of the through electrode 120E is coupled to the first portion 120EA and the first wiring layer W1 (FIG. 26A). The second portion 120EB is provided in, for example, the insulating region 212 and the wiring layer 200T of the second substrate 200. A lower end surface of the second portion 120EB is provided on the substantially the same plane as a lower end surface of the insulating region 212, and is bonded to the first portion 120EA. An upper end surface of the second portion 120EB is in contact with the first wiring layer W1.

The second portion 121EB of the through electrode 121E is coupled to the first portion 121EA and the first wiring layer W1. The second portion 121EB is provided in, for example, the insulating region 212 and the wiring layer 200T of the second substrate 200. A lower end surface of the second portion 121EB is provided on substantially the same plane as the lower end surface of the insulating region 212, and is bonded to the first portion 121EA. An upper end surface of the second portion 121EB is in contact with the first wiring layer W1.

The second portion TGVB of the through electrode TGV is coupled to the first portion TGVA and the first wiring layer W1 (FIG. 26B). The second portion TGVB is provided in, for example, the insulating region 212 and the wiring layer 200T of the second substrate 200. A lower end surface of the second portion TGVB is provided on substantially the same plane as the lower end surface of the insulating region 212, and is bonded to the first portion TGVA. An upper end surface of the second portion TGVB is in contact with the first wiring layer W1.

The second portions 120EB, 121EB, and TGVB may include a material different from constituent materials of the first portions 120EA, 121EA, and TGVA. The second portions 120EB, 121EB, and TGVB include, for example, an electrically conductive metal material such as tungsten (W).

The through electrodes 120E, 121E, and TGV including the first portions 120EA, 121EA, and TGVA and the second portions 120EB, 121EB, and TGVB are formed as follows, for example (FIGS. 27A to 27D). Herein, although the through electrode TGV is not illustrated and described, it is possible to form the through electrode TGV similarly to the through electrodes 120E and 121E.

Figure 27A:
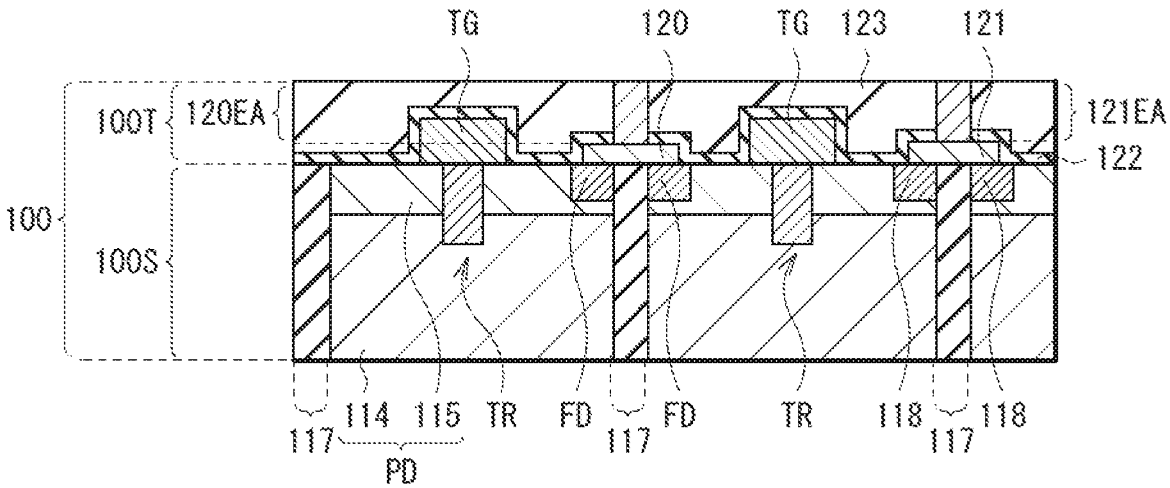
FIG. 27A is a schematic cross-sectional view of one process of a method of manufacturing the imaging device illustrated in FIG. 26A.

First, the first substrate 100 is formed in a manner similar to that described in the above embodiment. Next, as illustrated in FIG. 27A, the first portions 120EA and 121EA that penetrate through the interlayer insulating film 123 and the passivation film 122 of the first substrate 100 and reach the pad sections 120 and 121 are formed. On this occasion, for example, first, after coupling holes reaching the pad sections 120 and 121 are formed, non-doped polysilicon is filled in the coupling holes. Next, ion implantation of an n-type impurity is performed on the first portion 120EA, and ion implantation of a p-type impurity is performed on the first portion 121EA. Herein, the first portions 120EA and 121EA are formed in the first substrate 100, which makes it possible to perform ion implantation before bonding the semiconductor layer 200S to the first substrate 100. This makes it easier to perform ion implantation on the first portions 120EA and 121EA, as compared with a case where portions of the first portions 120EA and 121EA are formed in the second substrate 200 (see FIG. 31 to be described later).

An alignment mark may be formed simultaneously with formation of the first portions 120EA and 121EA. This makes it possible to form the alignment mark at a position closer to the second substrate 200, as compared with a case where the alignment mark is formed in the semiconductor layer 100S. This makes it possible to improve alignment accuracy in a lithography process in forming the second substrate 200.

Figure 27B:
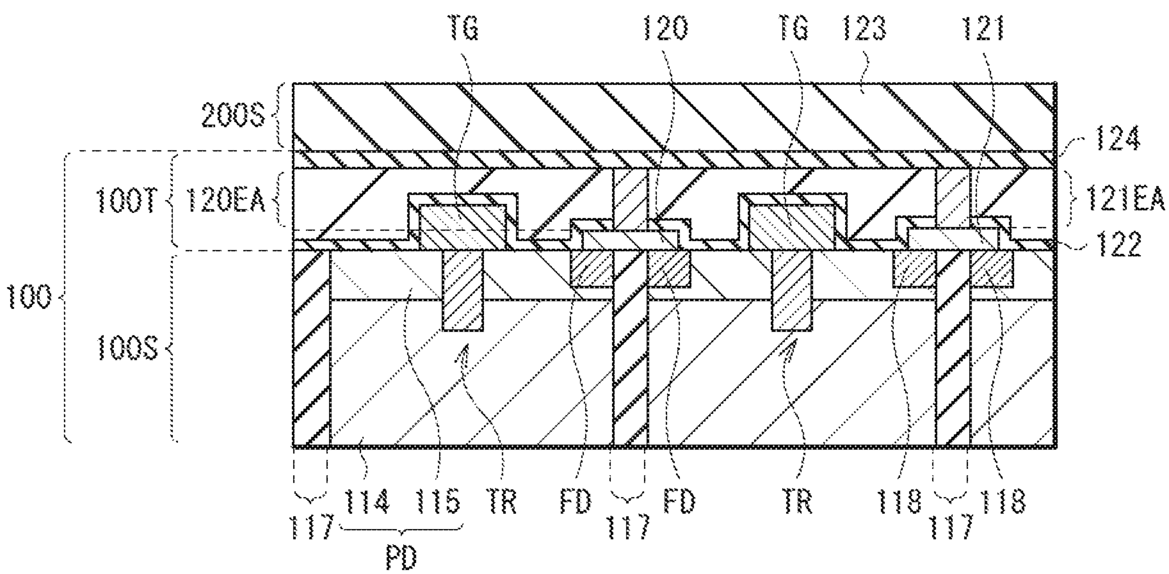
FIG. 27B is a schematic cross-sectional view of a process following FIG. 27A.

After the first portions 120EA and 121EA are formed, as illustrated in FIG. 27B, the semiconductor layer 200S is bonded to the first substrate 100 with the bonding film 124 interposed therebetween. Herein, the first portions 120EA and 121EA include polysilicon, which hinders metal contamination in forming the second substrate 200.

Figure 27C:
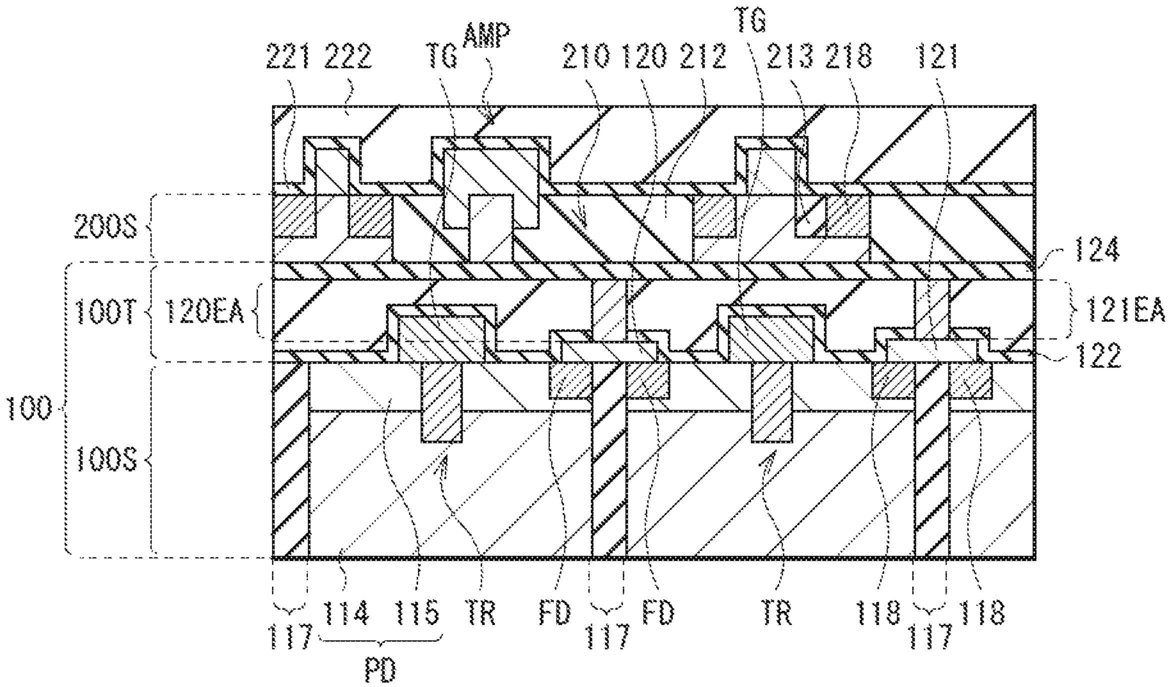
FIG. 27C is a schematic cross-sectional view of a process following FIG. 27B.
Figure 27D:
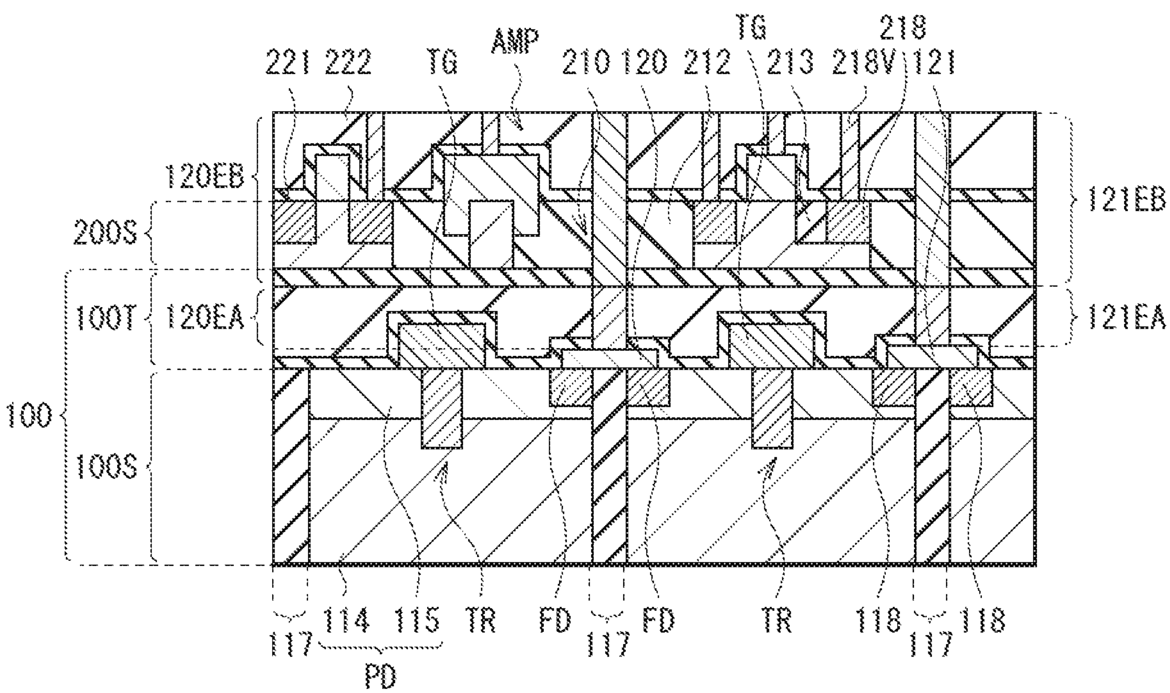
FIG. 27D is a schematic cross-sectional view of a process following FIG. 27C.

After the semiconductor layer 200S is bonded to the first substrate 100, as illustrated in FIG. 27C, the insulating region 212, the element separation region 213, the transistors such as the amplification transistor AMP, the passivation film 221, and the interlayer insulating film 222 are formed. Thereafter, as illustrated in FIG. 27D, the second portions 120EB and 121EB are formed to be bonded to the first portions 120EA and 121EA. Thus, the through electrodes 120E and 121E are formed. For example, displacement or a difference in thickness resulting from formation of the first portions 120EA and 121EA and the second portions 120EB and 121EB at different timings occurs in bonding sections between the first portions 120EA and 121EA and the second portions 120EB and 121EB. A barrier film may be formed in the bonding sections between the first portions 120EA and 121EA and the second portions 120EB and 121EB. The barrier film includes, for example, titanium (Ti), tantalum (Ta), or titanium nitride (TiN). The coupling section 218V reaching the VSS contact region 218 is formed by, for example, a lithography process different from a process of forming the second portions 120EB and 121EB.

The through electrodes 120E, 121E, and TGV include the first portions 120EA, 121EA, and TGVA and the second portions 120EB, 121EB, and TGVB in such a manner, which makes it possible to decrease the hole diameters of the through electrodes 120E, 121E, and TGV. A reason for this is described below.

For example, in a manufacturing process, it is desirable that aspect ratios (a height/a hole diameter, see FIG. 17) of the through electrode and the coupling section be 10 or less. A reason for this is to secure a process margin. The through electrodes 120E, 121E, and TGV that couple the second substrate 200 and the first substrate 100 to each other have, for example, a larger height, as compared with a coupling section (such as the coupling section 218V) that couples elements of the second substrate 200 to each other. Accordingly, in order to achieve the aspect ratios described above, the hole diameters of the through electrodes 120E, 121E, and TGV are designed to be large. For example, in a case where heights of the through electrodes 120E, 121E, and TGV are 2 μm, the hole dimeters thereof are designed to be 0.2 μm or greater. However, as the hole diameters of the through electrodes 120E, 121E, and TGV are increased, the insulating region 212 is expanded. That is, the semiconductor layer 200S may be made small.

Herein, the through electrodes 120E, 121E, and TGV include the first portions 120EA, 121EA, and TGVA and the second portions 120EB, 121EB, and TGVB. Accordingly, the height of each of the first portions 120EA, 121EA, and TGVA and the second portions 120EB, 121EB, and TGVB is smaller than the heights of the through electrodes 120E, 121E, and TGV. This makes it possible to decrease the hole diameter of the first portions 120EA, 121EA, and TGVA and the second portions 120EB, 121EB, and TGVB. Accordingly, it is possible to decrease the hole diameters of the through electrodes 120E, 121E, and TGV while achieving the aspect ratios described above. For example, in a case where the heights of the first portions 120EA, 121EA, and TGV are 0.6 μm and the heights of the second portions 120EB, 121EB, and TGVB are 1.4 μm, it is possible for the first portions 120EA, 121EA, and TGV to have a hole diameter of 60 nm, and it is possible for the second portions 120EB, 121EB, and TGVB to have a hole diameter of 140 nm. This makes it possible to make the insulating region 212 small. That is, it is possible to make the semiconductor layer 200S large and form large transistors included in the pixel circuit 200X. This makes it possible to improve the signal-to-noise ratio of the pixel signal, thereby allowing the imaging device 1 to output more favorable pixel data (image information).

FIGS. 28 to 31 illustrate other examples of the cross-sectional configuration of the through electrodes 120E and 121E illustrated in FIG. 26A. Herein, although the through electrode TGV is not illustrated and described, it is possible to configure the through electrode TGV similarly to the through electrodes 120E and 121E.

Figure 28:
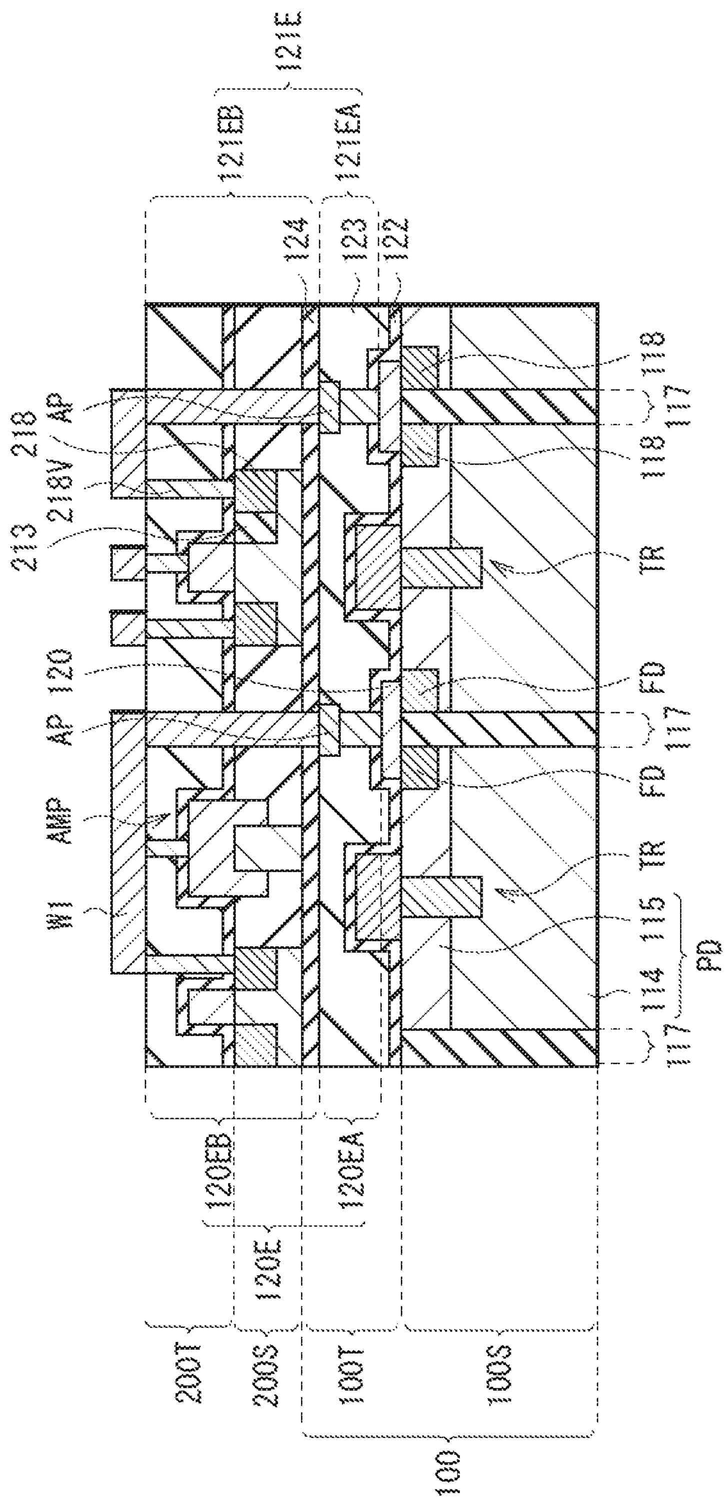
FIG. 28 is a schematic cross-sectional view of another example (1) of the imaging device illustrated in FIG. 26A.

The first portions 120EA and 121EA may each include an enlarged portion AP (FIG. 28). The enlarged portions AP are portions having a larger occupied area than the occupied areas of other portions of the first portions 120EA and 121EA (thicknesses of the first portions 120EA and 121EA, occupied areas in a substrate surface direction), and are provided at upper ends of the first portions 120EA and 121EA. That is, the second portions 120EB and 121EB are bonded to the enlarged portions AP. Providing such enlarged portions AP in the first portions 120EA and 121EA makes it possible to secure contact areas therebetween and suppress an increase in electrical resistance even in a case where misalignment occurs between the first portions 120EA and 121EA and the second portions 120EB and 121EB.

Figure 29:
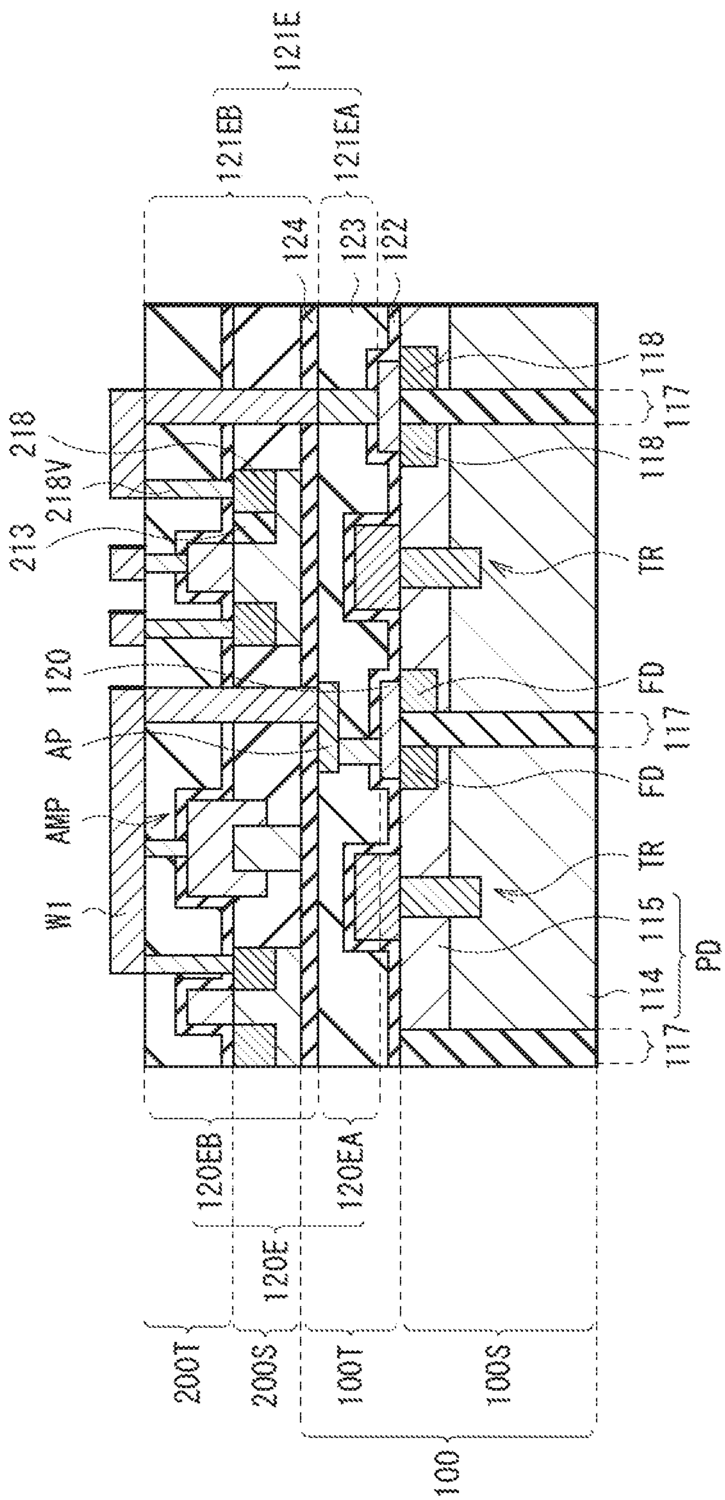
FIG. 29 is a schematic cross-sectional view of another example (2) of the imaging device illustrated in FIG. 26A.

In addition, positions (positions in the substrate surface direction) of the first portions 120EA and 121EA other than the enlarged portions AP and positions of the second portions 120EB and 121EB may be different from each other (FIG. 29). This makes it possible to improve flexibility in layout.

Figure 30:
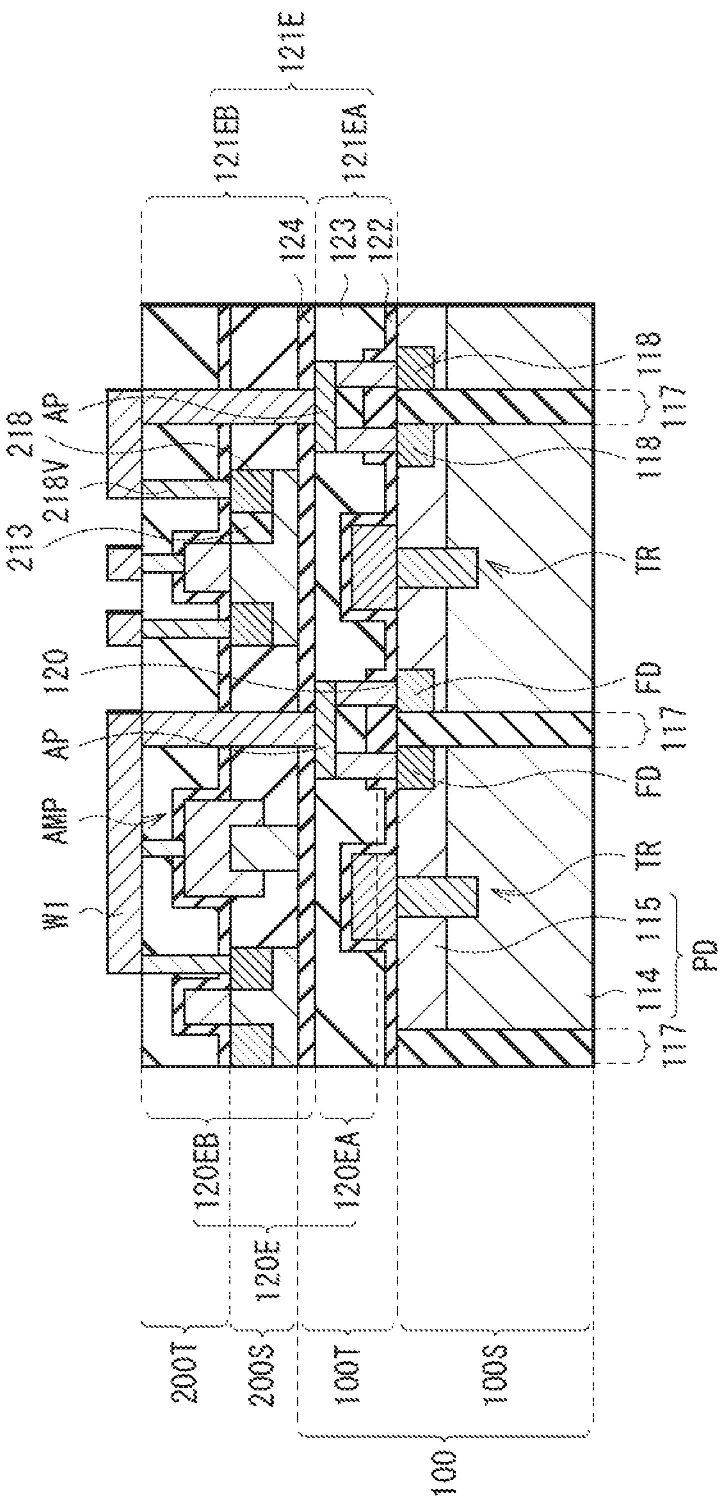
FIG. 30 is a schematic cross-sectional view of another example (3) of the imaging device illustrated in FIG. 26A.

In addition, the first portions 120EA and 121EA other than the enlarged portions AP may be branched (FIG. 30). For example, the first portions 120EA and 121EA are branched from the enlarged portions AP into four. Four portions into which the first portion 120EA is branched are each in contact with the semiconductor layer 100S, and are coupled to the floating diffusions FD. That is, it is possible to electrically couple the floating diffusions FD of the pixel sharing units 539 to each other by the enlarged portion AP. Four portions into which the first portion 121EA is branched are each in contact with the semiconductor layer 100S, and are coupled to the VSS contact regions 118. That is, it is possible to electrically couple the VSS contact regions 118 of the pixel sharing units 539 to each other by the enlarged portion AP. Thus, the pad sections 120 and 121 become unnecessary by branching the first portions 120EA and 121EA from the enlarged portions AP. This makes it possible to eliminate processes of forming the pad sections 120 and 121 and reduce process cost.

Figure 31:
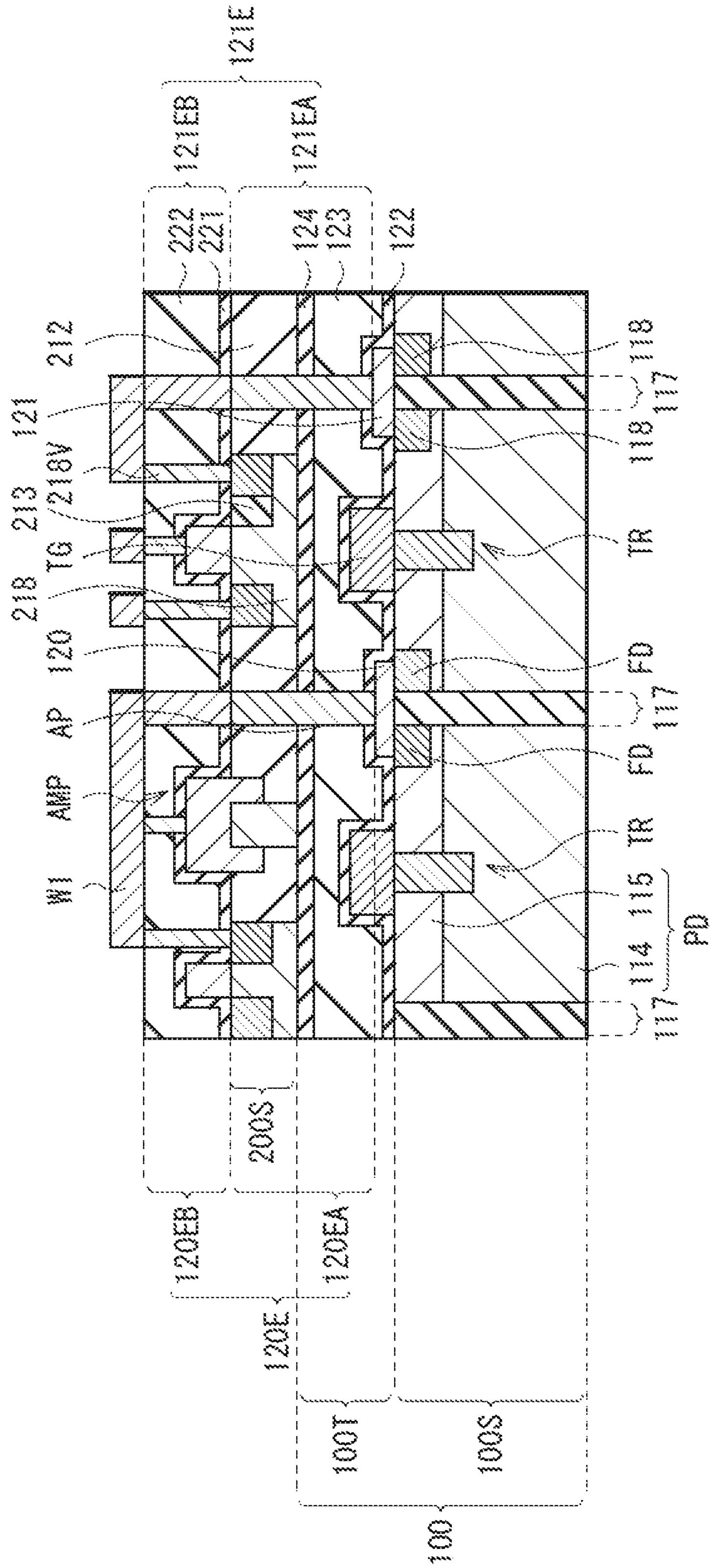
FIG. 31 is a schematic cross-sectional view of another example (4) of the imaging device illustrated in FIG. 26A.
Figure 32:
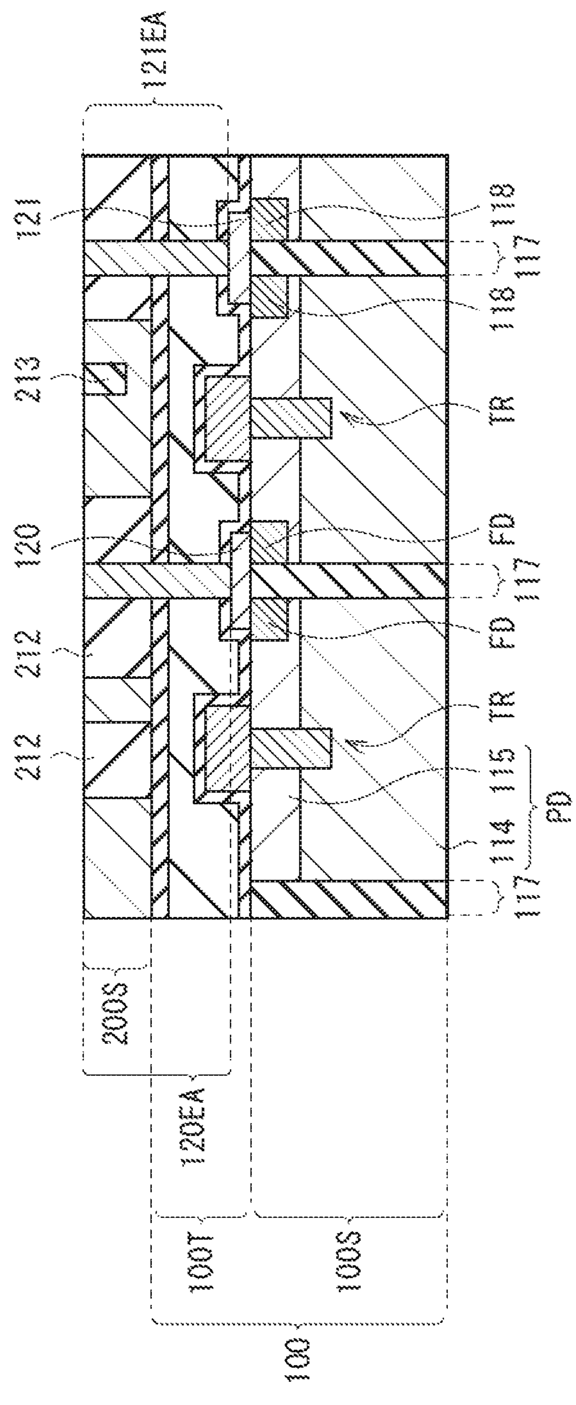
FIG. 32 is a schematic cross-sectional view of one process of a method of manufacturing the imaging device illustrated in FIG. 31.

Portions of the first portions 120EA and 121EA may be provided in the second substrate 200 (FIG. 31). For example, the first portions 120EA and 121EA are provided to penetrate through the passivation film 122, the interlayer insulating film 123, the bonding film 124, and the insulating region 212. The upper end surfaces of the first portions 120EA and 121EA are provided on substantially the same plane as the passivation film 221 of the second substrate 200, for example. In the through electrodes 120E and 121E including such first portions 120EA and 121EA, the heights of the second portions 120EB and 121EB bonded to the first portions 120EA and 121EA are substantially the same as the height of a bonding section such as the coupling section 218V, which makes it possible to form the second portions 120EB and 121EB and the bonding section in the same lithography process. Such through electrodes 120E and 121E are formed as follows, for example (FIGS. 32 to 33B).

First, as described in the above embodiment, the semiconductor layer 200S is bonded to the first substrate 100 to form the insulating region 212 and the element separation region 213 (FIG. 21B). Next, as illustrated in FIG. 32, the first portions 120EA and 121EA that penetrate through the insulating region 212, the bonding film 124, the interlayer insulating film 123, and the passivation film 122 and reach the pad sections 120 and 121 are formed. Next, the transistors such as the amplification transistor AMP, the passivation film 221, and the interlayer insulating film 222 are formed (see FIG. 27C). Thereafter, the second portions 120EB and 121EB are formed to be bonded to the first portions 120EA and 121EA. On this occasion, it is possible to from the bonding section such as the coupling section 218V in the same lithography process as the second portions 120EB and 121EB.

Figure 33A:
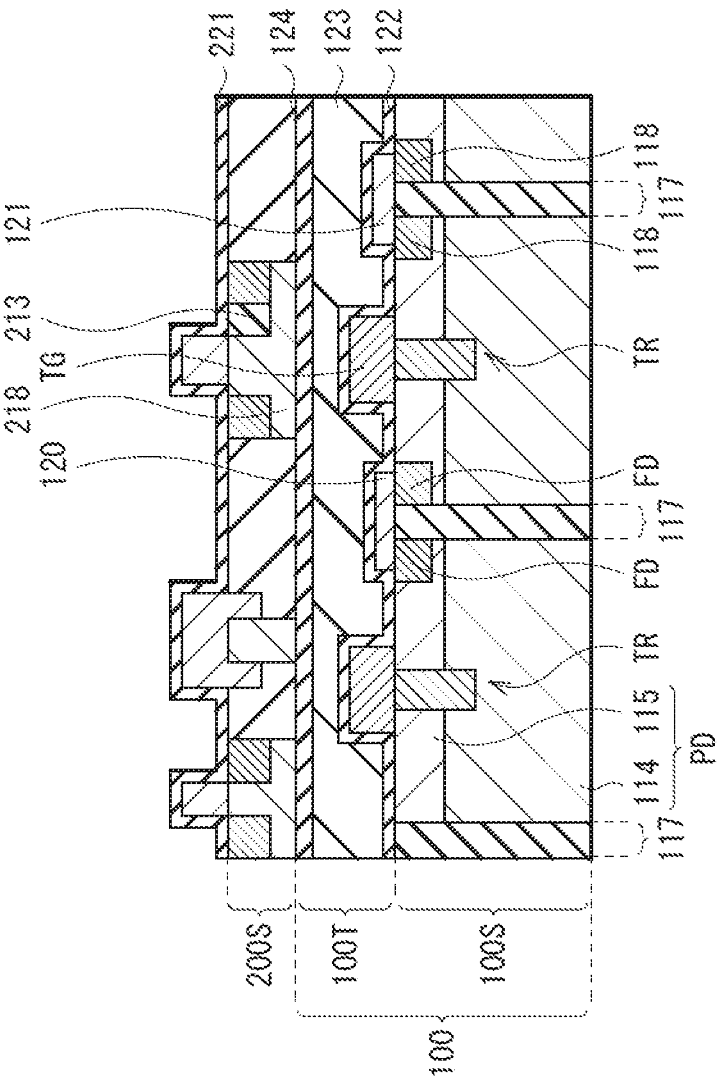
FIG. 33A is a schematic cross-sectional view of another example of the method of manufacturing the imaging device illustrated in FIG. 32.
Figure 33B:
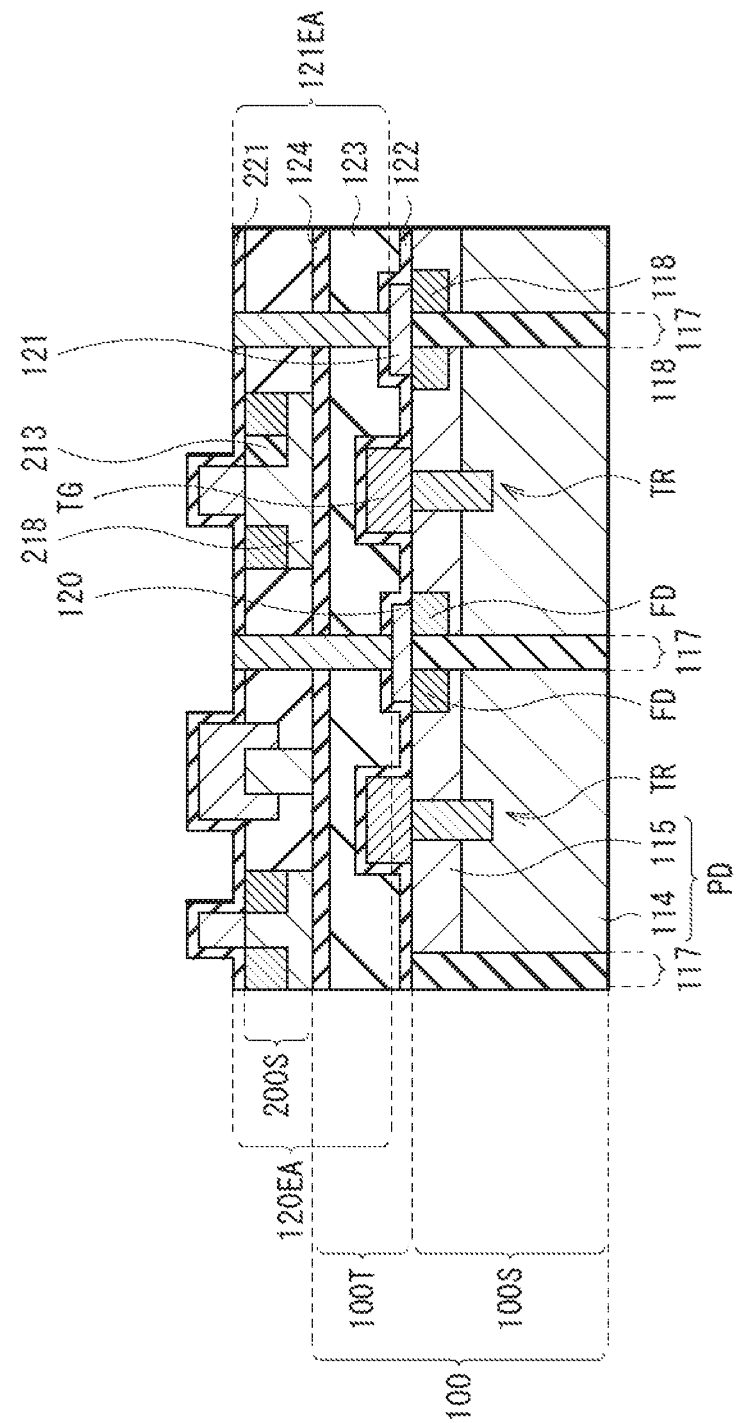
FIG. 33B is a schematic cross-sectional view of a process following FIG. 33A.

Alternatively, as illustrated in FIGS. 33A and 33B, after the transistors such as the amplification transistor AMP and the passivation film 221 are formed, the first portions 120EA and 121EA that penetrate through the passivation film 221, the insulating region 212, the bonding film 124, the interlayer insulating film 123, and the passivation film 122 and reach the pad sections 120 and 121 may be formed.

The imaging device 1 including such through electrodes 120E, 121E, and TGV also achieves effects similar to those described in the above embodiment. Furthermore, it is possible to decrease the hole diameters of the through electrodes 120E, 121E, and TGV, which makes it possible to make the insulating region 212 small This makes it possible to make the semiconductor layer 200S large and form large transistors included in the pixel circuit 200X. Accordingly, it is possible to improve the signal-to-noise ratio of the pixel signal, thereby allowing the imaging device 1 to output more favorable pixel data (image information).

4. Modification Example 3

Figure 34:
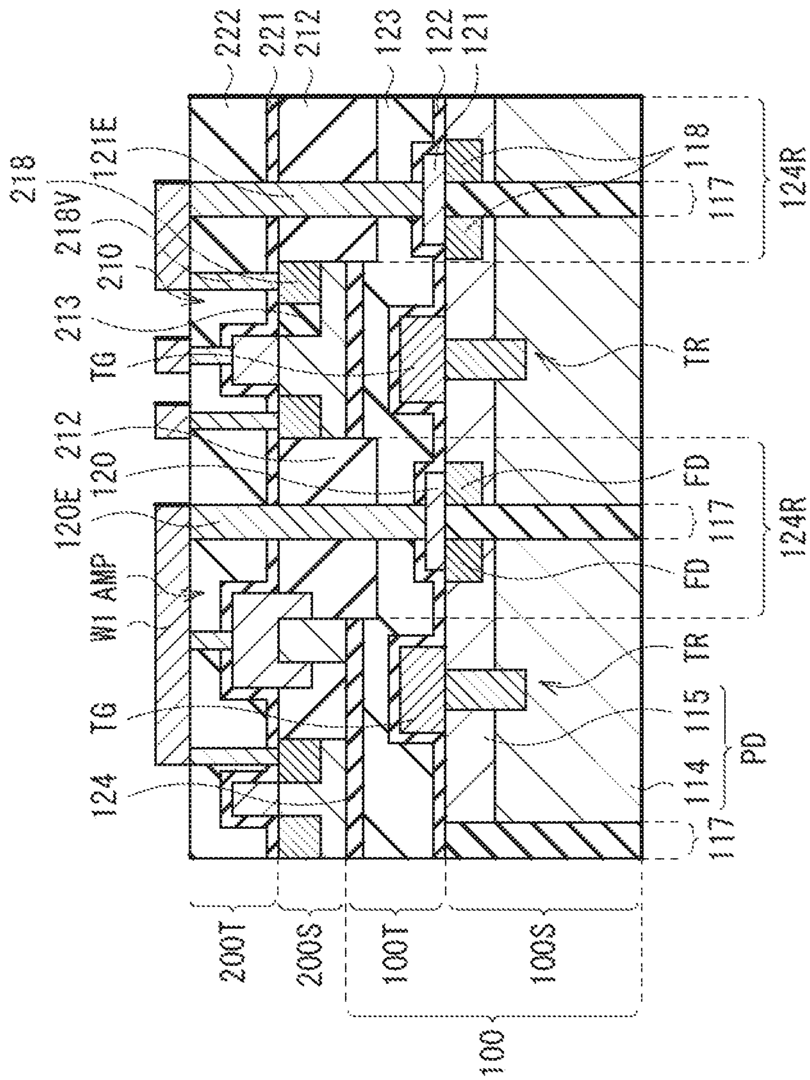
FIG. 34 is a schematic view of a cross-sectional configuration of a main part of an imaging device according to a modification example 3.

FIG. 34 illustrates a modification example of a cross-sectional configuration of a main part of the imaging device 1 according to the embodiment described above. FIG. 34 schematically illustrates a configuration in proximity to the bonding surface between the first substrate 100 and the second substrate 200 (the semiconductor layer 200S), and corresponds to FIG. 8A described in the above embodiment. In the present modification example, the bonding film 124 is provided in a selective region between the first substrate 100 and the second substrate 200. The imaging device 1 according to the present modification example differs from the imaging device 1 described in the above embodiment in this point.

The bonding film 124 includes a bonding surface between the first substrate 100 and the second substrate 200, more specifically between the wiring layer 100T and the semiconductor layer 200S. The bonding film 124 is provided in a selective region between the wiring layer 100T and the semiconductor layer 200S. In other words, a region where the bonding film 124 is provided and a gap 124R of the bonding film 124 are present in the bonding surface between the wiring layer 100T and the semiconductor layer 200S.

For example, the bonding film 124 is provided in a portion opposed to the semiconductor layer 200S, and the gap 124R of the bonding film 124 is provided in a portion opposed to the insulating region 212. In other words, the insulating region 212 is selectively disposed in the gap 124R of the bonding film 124. The through electrodes 120E and 121E penetrate through the insulating region 212 and the gap 124R of the bonding film 124, and are coupled to the pad sections 120 and 121. That is, the bonding film 124 is provided to avoid the through electrodes 120E and 121E, and the through electrodes 120E and 121E are configured not to penetrate through the bonding film 124. Herein, although the through electrode TGV is not illustrated and described, similarly to the through electrodes 120E and 121E, the through electrode TGV also penetrates through the insulating region 212 and the gap 124R of the bonding film 124, and is coupled to the transfer gate TG.

Such a gap 124R of the bonding film 124 is formed as follows, for example. First, as described in the above embodiment, after the first substrate 100 is formed, the semiconductor layer 200S is bonded to the first substrate 100 with the bonding film 124 interposed therebetween (FIG. 21A).

Figure 35:
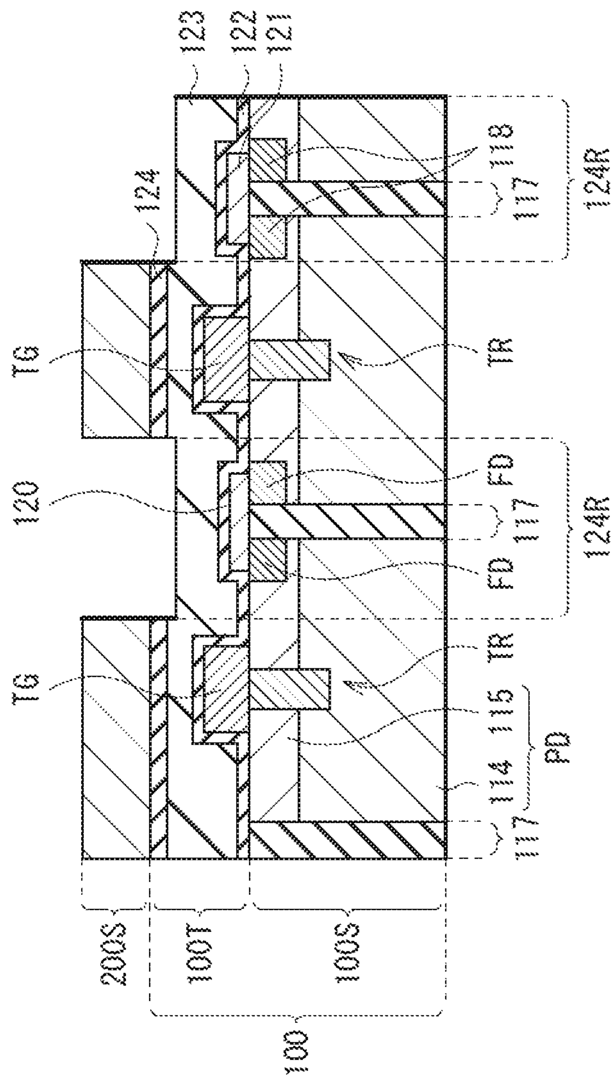
FIG. 35 is a schematic cross-sectional view of one process of a method of manufacturing the imaging device illustrated in FIG. 34.

Next, as illustrated in FIG. 35, the semiconductor layer 200S in a region where the insulating region 212 is to be formed is removed with use of a dry etching method. On this occasion, the bonding film 124 in a region where the insulating region 212 is to be formed is removed by overetching. Thus, the gap 124R of the bonding film 124 is formed, and a bonding surface between the wiring layer 100T (the first substrate 100) and the semiconductor layer 200S (the second substrate 200) is partially removed. After the gap 124R of the bonding film 124 is formed, the insulating region 212 is formed. Subsequent processes are performed similarly to those described in the above embodiment, which makes it possible to complete the imaging device 1.

The through electrodes 120E, 121E, and TGV each penetrate through such a gap 124R of the bonding film 124, which makes it possible to suppress occurrence of leakage through the bonding film 124 in the through electrodes 120E, 121E, and TGV. A reason for this is described below.

A coarse oxide film is formed on the bonding surface between the first substrate 100 and the second substrate 200. Accordingly, in a case where the bonding film 124 is present between the through electrode 120E, the through electrode 121E, and the through electrode TGV, a leakage current resulting from a decline in pressure resistance of the bonding film 124 may be generated.

In particular, in a case where the bonding film 124 includes a nitride film including silicon nitride (SiN) or the like, a leakage current is easily generated. In addition, in a case where fluorocarbon plasma etching is used for etching in forming the through electrodes 120E, 121E, and TGV, a fluorocarbon film is deposited thickly on the nitride film. In a case where etching proceeds without appropriately removing the fluorocarbon film due to process variations, an opening failure may occur in proximity to the bonding film 124. That is, in a case where the bonding film 124 includes a nitride film, yields may decrease due to fluorocarbon plasma etching.

In contrast, in the present modification example, the through electrodes 120E, 121E, and TGV each penetrate through the gap 124R of the bonding film 124; therefore, no bonding surface is present in proximity to the through electrodes 120E, 121E, and TGV. This makes it possible to suppress generation of a leakage current between the through electrode 120E, the through electrode 121E, and the through electrode TGV due to a coarse bonding surface.

In addition, even if the bonding film 124 includes a nitride film including silicon nitride (SiN) or the like, occurrence of an opening failure resulting from process variations is suppressed, which makes it possible to suppress a decrease in yields. Furthermore, using a nitride film for the bonding film 124 makes it possible to improve bonding strength between the first substrate 100 and the second substrate 200, as compared with a case where an oxide film is used for the bonding film 124. In addition, it is possible to effectively suppress occurrence of contamination into the first substrate 100 in a process of manufacturing the second substrate 200 and subsequent manufacturing processes. In addition, a passivation effect is achieved by using a nitride film for the bonding film 124, which makes it possible to improve transistor characteristics of the transfer transistor TR provided in the first substrate 100.

Figure 36:
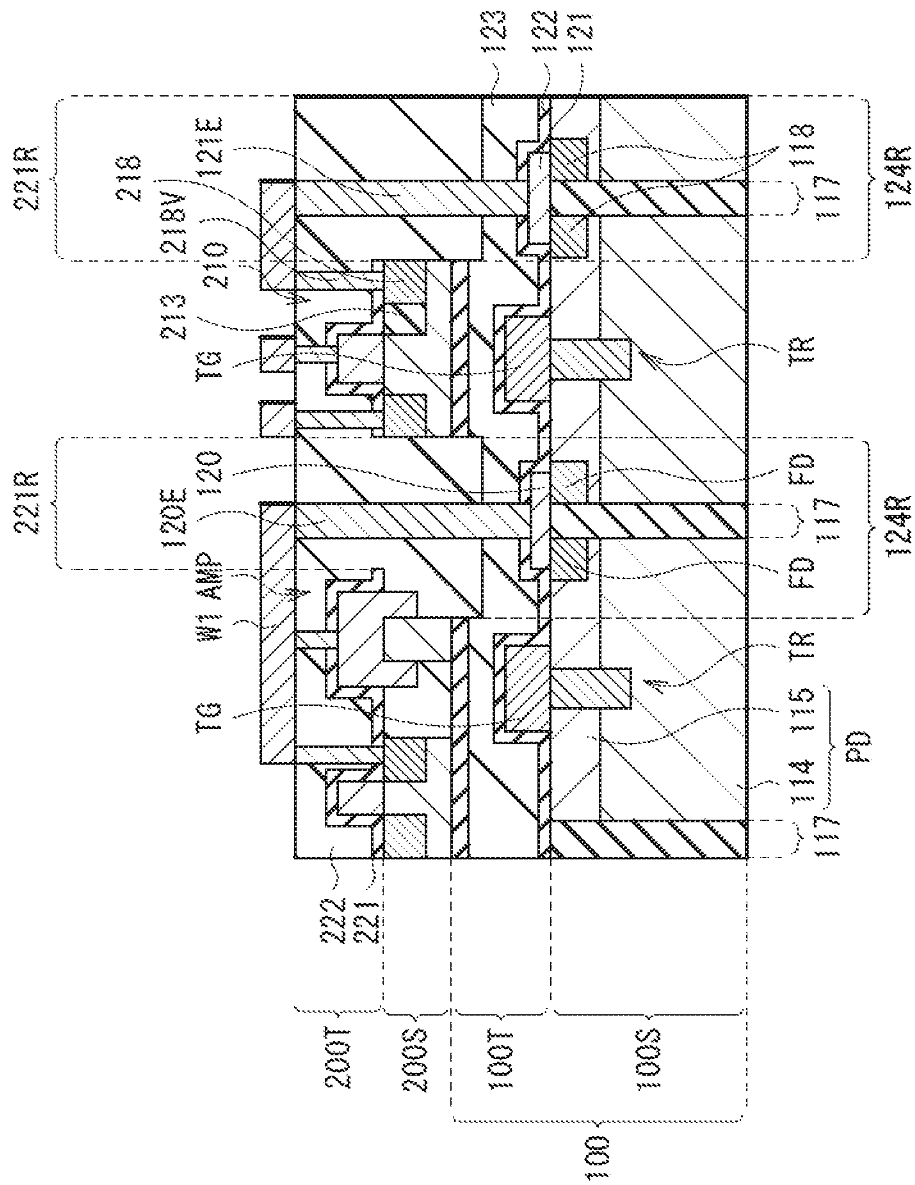
FIG. 36 is a schematic cross-sectional view of another example of the imaging device illustrated in FIG. 34.

FIG. 36 illustrates another example of a cross-sectional configuration in proximity to the bonding surface between the first substrate 100 and the second substrate 200 illustrated in FIG. 34. In such a manner, the passivation film 221 that covers a plurality of transistors (such as the amplification transistor AMP) provided in the second substrate 200 may be provided in a selective region, and a gap 221R may be provided in the passivation film 221. The passivation film 221 may include an opening in place of the gap 221R. The gap 221R or the opening of the passivation film 221 is provided at a position opposed to the gap 124R of the bonding film 124, for example. The through electrodes 120E and 121E are coupled to the pad sections 120 and 121 through the gaps 221R (or the openings) of the passivation film 221, the insulating region 212, and the gaps 124R of the bonding film 124. Providing the gap 221R or the opening in the passivation film 221 in such a manner makes it possible to suppress generation of a leakage current between the through electrode 120E, the through electrode 121E, and the through electrode TGV through the passivation film 221. In particular, in a case where the passivation film 221 includes a nitride film including silicon nitride (SiN) or the like, it is possible to effectively suppress the leakage current.

The imaging device 1 including such a bonding film 124 or such a passivation film 221 also achieves effects similar to those described in the above embodiment. Furthermore, it is possible to suppress generation of a leakage current caused by the through electrodes 120E, 121E, and TGV penetrating through the bonding film 124 or the passivation film 221. This makes it possible to improve reliability.

5. Modification Example 4

Figure 37:
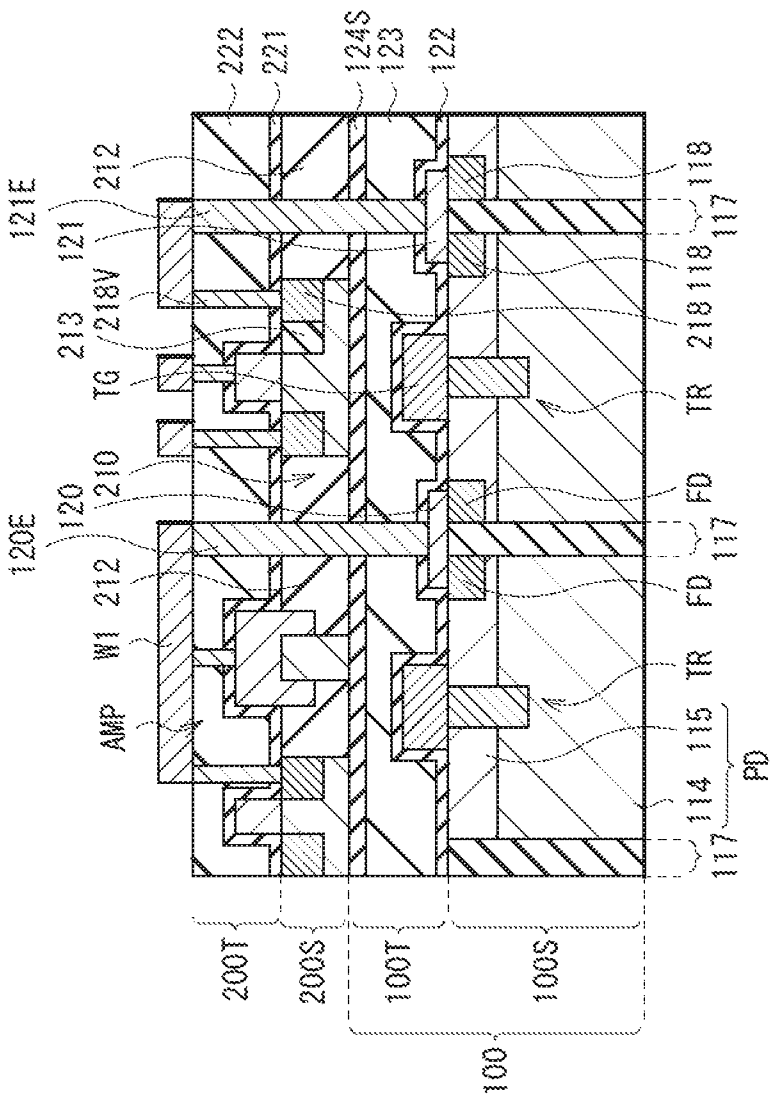
FIG. 37 is a schematic view of a cross-sectional configuration of a main part of an imaging device according to a modification example 4.

FIG. 37 illustrates a modification example of a cross-sectional configuration of a main part of the imaging device 1 according to the embodiment described above. FIG. 37 schematically illustrates a configuration in proximity to the bonding surface between the first substrate 100 and the second substrate 200 (the semiconductor layer 200S), and corresponds to FIG. 8A described in the above embodiment. In the present modification example, a bonding film 124S includes an oxide film including silicon oxide (SiO) or the like. The imaging device 1 according to the present modification example differs from the imaging device 1 described in the above embodiment in this point.

The bonding film 124S includes a bonding surface between the first substrate 100 and the second substrate 200, more specifically between the wiring layer 100T and the semiconductor layer 200S, similarly to the bonding film 124 described in the above embodiment. Using an oxide film for the bonding film 124S makes it possible to suppress generation of a leakage current caused by the through electrodes 120E, 121E, and TGV penetrating through the nitride film. In addition, as described in the above modification example 3, occurrence of an opening failure resulting from process variations is suppressed, which makes it possible to suppress a decrease in yields.

The imaging device 1 including such a bonding film 124S also achieves effects similar to those described in the above embodiment. Furthermore, it is possible to suppress generation of a leakage current caused by the through electrodes 120E, 121E, and TGV penetrating through the nitride film. This makes it possible to improve reliability. In addition, it is possible to suppress occurrence of an opening failure and improve yields.

6. Modification Example 5

Figure 38:
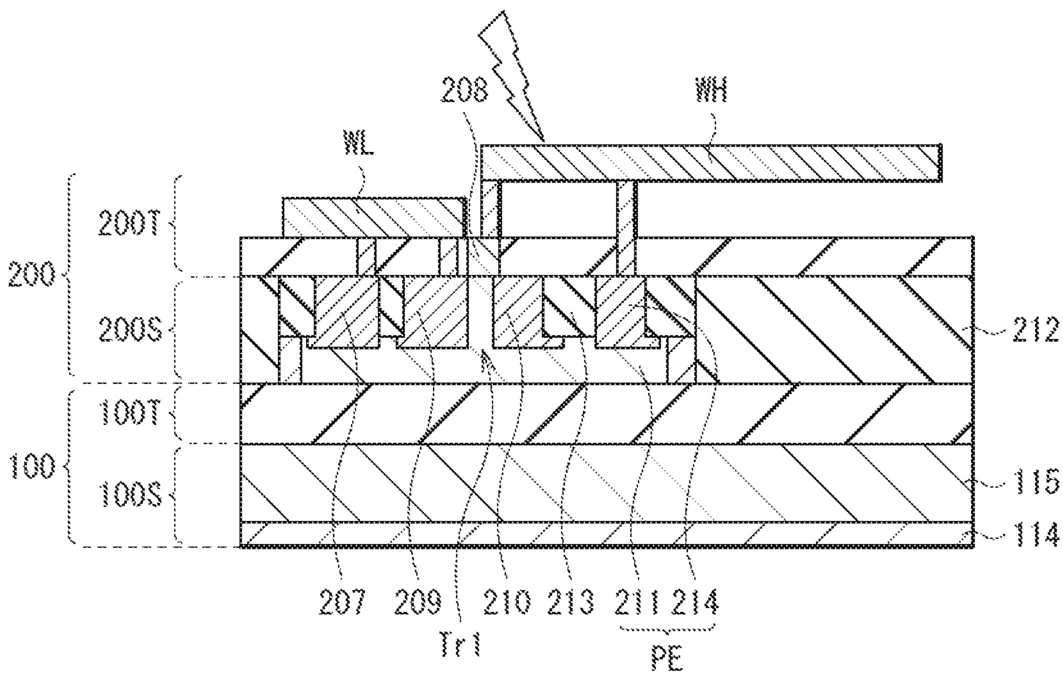
FIG. 38 is a schematic view of a cross-sectional configuration of a main part of an imaging device according to a modification example 5.

FIG. 38 illustrates a modification example of a cross-sectional configuration of a main part of the imaging device 1 described in the above embodiment. FIG. 38 schematically illustrates main parts of the first substrate 100 and the second substrate 200 (the semiconductor layer 200S). In the present modification example, a protection element PE for protecting a transistor included in the imaging device 1 is provided. The imaging device 1 according to the present modification example differs from the imaging device 1 described in the above embodiment in this point.

The protection element PE is provided to protect a transistor (a transistor Tr1) provided in the semiconductor layer 200S, for example. The transistor Tr1 is, for example, the amplification transistor AMP, the reset transistor RST, the FD transfer transistor FDG, or the selection transistor SEL. The transistor Tr1 includes, for example, a gate electrode 208 provided on the front surface of the semiconductor layer 200S, and n-type semiconductor regions 209 and 210 provided in the well region 211 of the semiconductor layer 200S. A gate insulating film (not illustrated) is provided between the gate electrode 208 and the semiconductor layer 200S. The n-type semiconductor regions 209 and 210 function as a source and a drain of the transistor Tr1. One (the n-type semiconductor region 209 in FIG. 38) of the n-type semiconductor regions 209 and 210 is electrically coupled to a p-type semiconductor region 207 (e.g., the VSS contact region 218 in FIG. 6) by, for example, a coupling wiring line WL provided in the wiring layer 200T. The coupling wiring line WL is provided in, for example, the first wiring layer W1.

The protection element PE is provided in, for example, the semiconductor layer 200S. The element separation region 213 is provided between the protection element PE and the transistor Tr1. The protection element PE includes the well region 211 and an n-type semiconductor region 214 provided in the well region 211. That is, the protection element PE includes a diode having a pn junction. For example, the element separation region 213 is provided, for example, between the other (the n-type semiconductor region 210 in FIG. 38) of n-type semiconductor regions 209 and 210 of the transistor Tr1 and the n-type semiconductor region 210 of the protection element PE. The protection element PE is provided so as to share the well region 211 with the transistor Tr1. Herein, the semiconductor layer 200S corresponds to a specific example of a "third semiconductor layer" of the present disclosure, and the well region 211 corresponds to a specific example of a "second region of a second semiconductor layer" and a "third region of a third semiconductor layer" of the present disclosure. That is, herein, the second semiconductor layer and the third semiconductor layer are integrated.

The n-type semiconductor region 210 of the protection element PE and the gate electrode 208 of the transistor Tr1 are electrically coupled to each other through, for example, an antenna wiring line WH provided in the wiring layer 200T. The antenna wiring line WH inputs a signal to the gate electrode 208 of the transistor Tr1, for example. The antenna wiring line WH is provided in a stacking direction of the first substrate 100 and the second substrate 200 at a position farther from the semiconductor layer 200S (a position closer to the third substrate) than the coupling wiring line WL. In other words, the coupling wiring line WL is provided in the stacking direction of the first substrate 100 and the second substrate 200 at a position closer to the semiconductor layer 200S than the antenna wiring line WH. The antenna wiring line WH is opposed to the semiconductor layer 100S with the semiconductor layer 200S interposed therebetween. The antenna wiring line WH is, for example, a wiring line provided in the wiring layer 200T, and is provided in, for example, the second wiring layer W2, the third wiring layer W3, or the fourth wiring layer W4.

Figure 39:
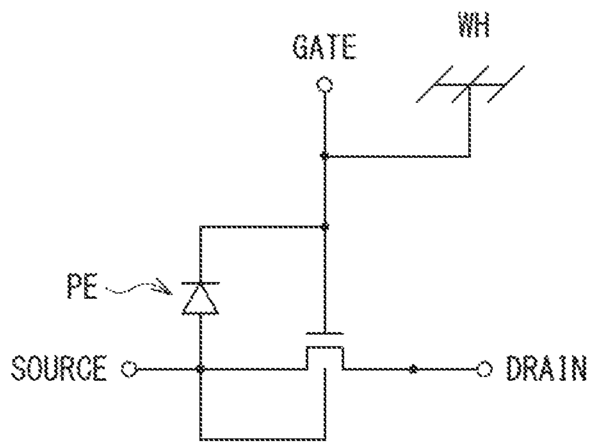
FIG. 39 is a circuit diagram illustrating a relationship between a transistor and a protection element illustrated in FIG. 38.

FIG. 39 is a circuit diagram illustrating an example of a relationship between the transistor Tr1 and the protection element PE. The protection element PE is provided, for example, between a gate and the source of the transistor Tr1.

Providing such a protection element PE makes it possible to suppress a decrease in yields resulting from PID (Plasma Induced Damage), for example. A reason for this is described below.

For example, in forming a wiring line, a via (Via), and the like of the imaging device 1, plasma treatment is performed. In a case where one of a gate electrode, a source, and a drain of a transistor is coupled to the wiring line or the via, the wiring line or the like acts as an antenna that collects charges from plasma. In a case where the charges collected in the wiring line or the via exceeds a predetermined amount, a potential difference arises between the gate electrode of the transistor Tr1 and the semiconductor layer. This causes an FN (Fowler Nordheim) tunnel current to pass through the gate insulating film of the transistor Tr1, which may deteriorate the gate insulating film. For example, a threshold voltage (Vth) of the transistor varies due to such PID, which may affect yields. For example, it is conceivable that the influence of PID is suppressed by adjusting a ratio between a gate area of the transistor and an area of the wiring line or the via coupled to the transistor, that is, a so-called antenna ratio. However, the antenna ratio is increased depending on design. In this case, it is difficult to suppress the influence of PID.

In contrast, in the present modification, the protection element PE coupled to the gate electrode 208 of the transistor Tr1 through the antenna wiring line WH is provided. Accordingly, even if charges are collected in the antenna wiring line WH by plasma treatment in forming the antenna wiring line WH, the charges flow in the protection element PE, which suppresses variations in the threshold voltage Vth of the transistor Tr1 resulting from PID, and the like. If the potential of the semiconductor layer provided with the protection element PE and a potential of the semiconductor layer 200S provided with the transistor TR1 are significantly different from each other, in spite of providing the protection element PE, a potential difference may arise between the gate electrode 208 of the transistor Tr1 and the semiconductor layer 200S, and the influence of PID may not be sufficiently suppressed. Herein, both the protection element PE and the transistor Tr1 are provided in the semiconductor layer 200S; therefore, when the protection element PE is brought into conduction, the gate electrode 208 of the transistor and the semiconductor layer 200S have substantially the same potential. This makes it possible to more reliably suppress the influence of PID on the transistor Tr1 and suppress a decrease in yields. In addition, adjustment of the antenna ratio is unnecessary, which makes it possible to improve flexibility in design of the imaging device 1.

FIGS. 40 to 50 illustrate other examples of the transistor Tr1 and the protection element PE illustrated in FIG. 38.

Figure 40:
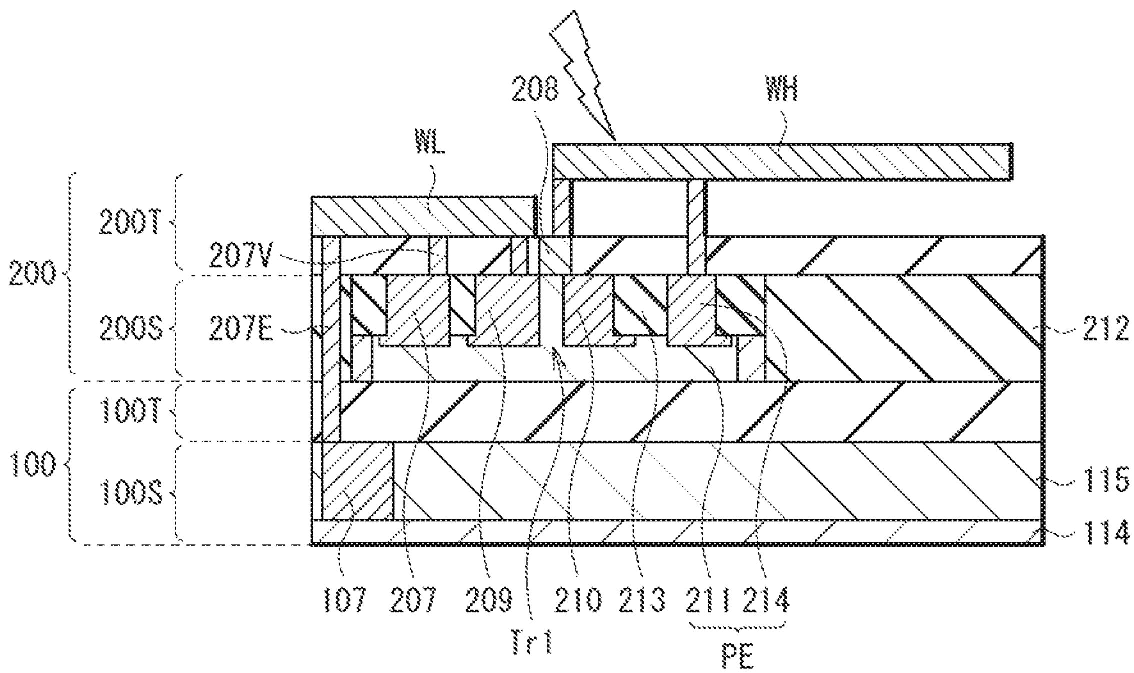
FIG. 40 is a schematic cross-sectional view of another example (1) of the imaging device illustrated in FIG. 38.

The p-type semiconductor region 207 of the semiconductor layer 200S may be electrically coupled to a p-type semiconductor region 107 (e.g., the VSS contact region 118 in FIG. 6) of the semiconductor layer 100S through the coupling wiring line WL (FIG. 40). The p-type semiconductor region 207 is electrically coupled to the p-type semiconductor region 107 through, for example, a coupling section 207V (e.g., the coupling section 218V in FIG. 6), the coupling wiring line WL, and a through electrode 207E (e.g., the through electrode 121E in FIG. 6). Accordingly, when the protection element PE is brought into conduction, the potential of the gate electrode 208 of the transistor Tr1 becomes substantially the same as the potential of the semiconductor layer 200S and the potential of the semiconductor layer 100S. Accordingly, PID to the transistor Tr1 is suppressed.

Figure 41:
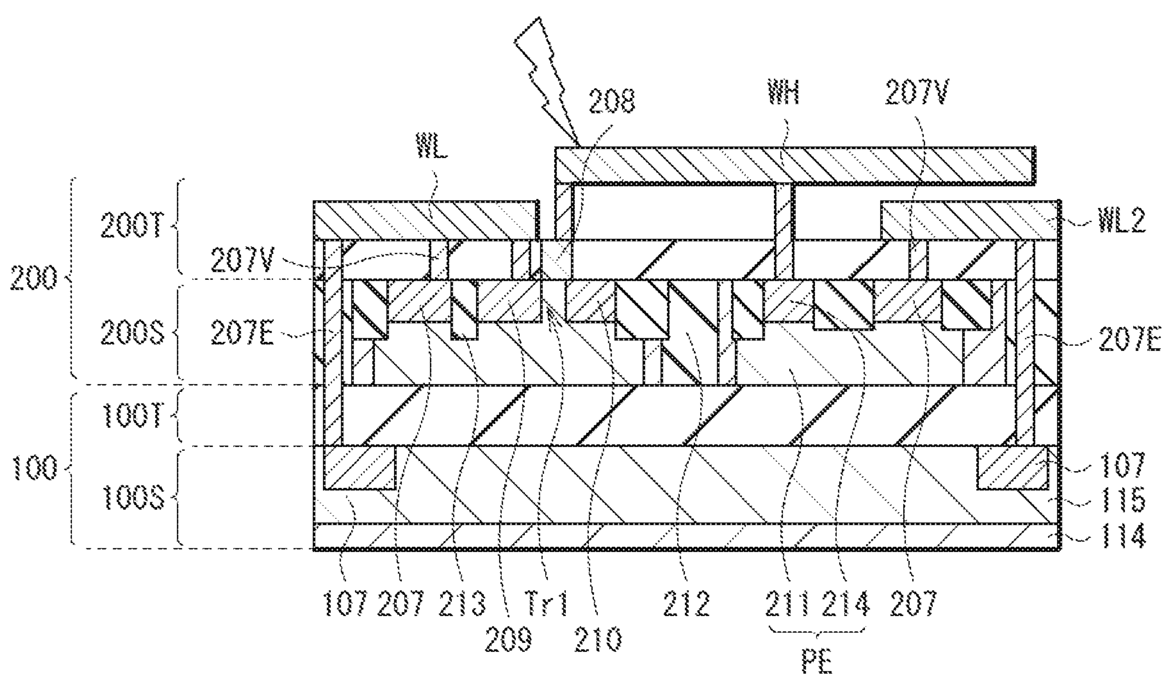
FIG. 41 is a schematic cross-sectional view of another example (2) of the imaging device illustrated in FIG. 38.

The semiconductor layer 200S provided with the transistor Tr1 and the semiconductor layer 200S provided with the protection element PE may be divided by the insulating region 212 (FIG. 41). For example, at this time, the p-type semiconductor region 207 of the semiconductor layer 200S provided with the transistor Tr1 is coupled to the p-type semiconductor region 107 of the semiconductor layer 100S through a coupling wiring line WL1, and the p-type semiconductor region 27 of the semiconductor layer 200S provided with the protection element PE is coupled to the p-type semiconductor region 107 of the semiconductor layer 100S through a coupling wiring line WL2. Accordingly, when the protection element PE is brought into conduction, the potential of the gate electrode 208 of the transistor Tr1 becomes substantially the same as the potential of the semiconductor layer 200S provided with the transistor Tr1, the potential of the semiconductor layer 200S provided with the protection element PE, and the potential of the semiconductor layer 100S. Accordingly, PID to the transistor Tr1 is suppressed.

Figure 42:
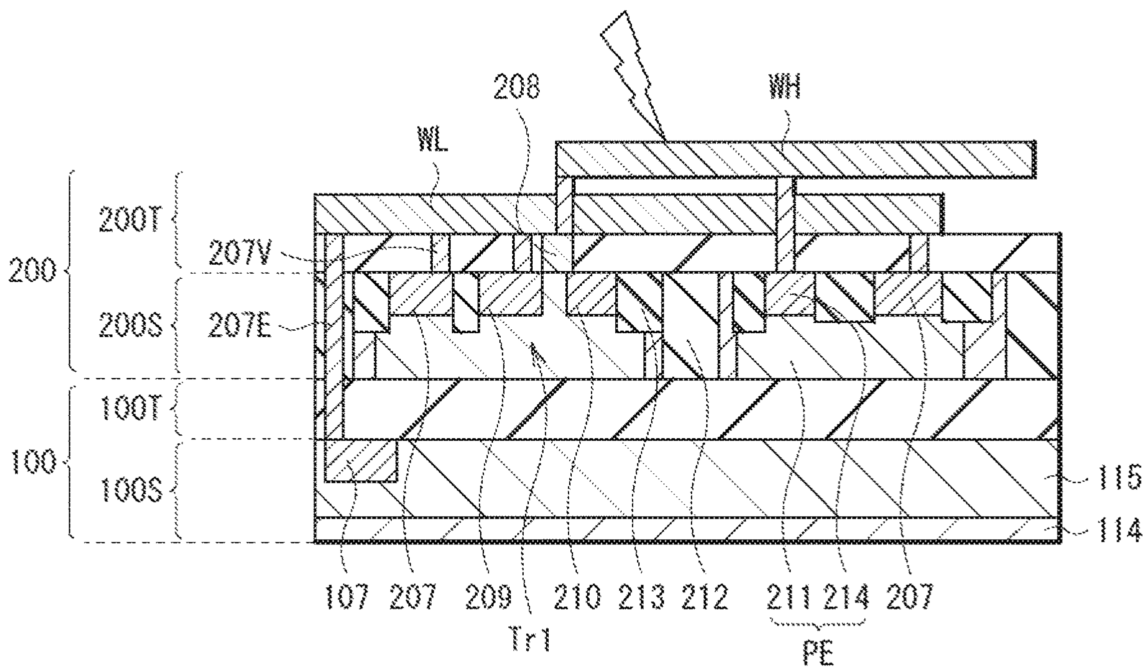
FIG. 42 is a schematic cross-sectional view of another example (3) of the imaging device illustrated in FIG. 38.

The p-type semiconductor region 207 of the semiconductor layer 200S provided with the transistor Tr1 and the p-type semiconductor region 207 of the semiconductor layer 200S provided with the protection element PE may be electrically coupled to each other by the coupling wiring line WL (FIG. 42). Even on this occasion, PID to the transistor Tr1 is suppressed in a manner similar to that described with reference to FIG. 41.

Figure 43:
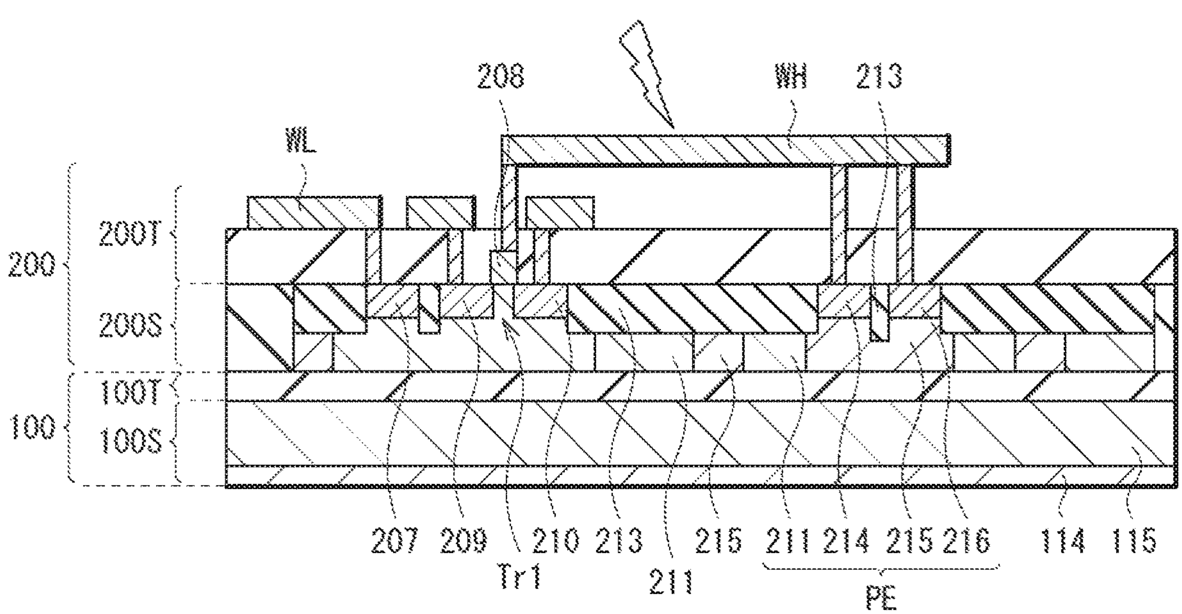
FIG. 43 is a schematic cross-sectional view of another example (4) of the imaging device illustrated in FIG. 38.

The protection element PE may include a diode having a plurality of pn junctions (FIG. 43). For example, the protection element PE includes the well region 211, the n-type semiconductor region 214, a n-well region 215, and a p-type semiconductor region 216. The n-well region 215 is provided adjacent to the well region 211. The n-type semiconductor region 214 is an n-type impurity diffusion region provided in the n-well region 215, and is provided in proximity to the front surface of the semiconductor layer 200S. The p-type semiconductor region 216 is a p-type impurity diffusion region provided in the n-well region 215, and is provided in proximity to the front surface of the semiconductor layer 200S. For example, the n-type semiconductor region 214 and the p-type semiconductor region 216 are provided in this order from side of the transistor Tr1, and the element separation region 213 is provided each between the n-type semiconductor region 210 of the transistor Tr1 and the n-type semiconductor region 214 and between the n-type semiconductor region 214 and the p-type semiconductor region 216. For example, the n-type semiconductor region 214 and the p-type semiconductor region 216 of the protection element PE are electrically coupled to the gate electrode 208 of the transistor Tr1 through the antenna wiring line WH. For example, the protection element PE is provided in the semiconductor layer 200S that is the same as the semiconductor layer 200S of the transistor Tr1, and the protection element PE shares the well region 211 with the transistor Tr1. Accordingly, when the protection element PE is brought into conduction, the potential of the gate electrode 208 of the transistor Tr1 becomes substantially the same as the potential of the semiconductor layer 200S in a manner similar to that described above with reference to FIG. 38. Accordingly, PID to the transistor Tr1 is suppressed.

Figure 44:
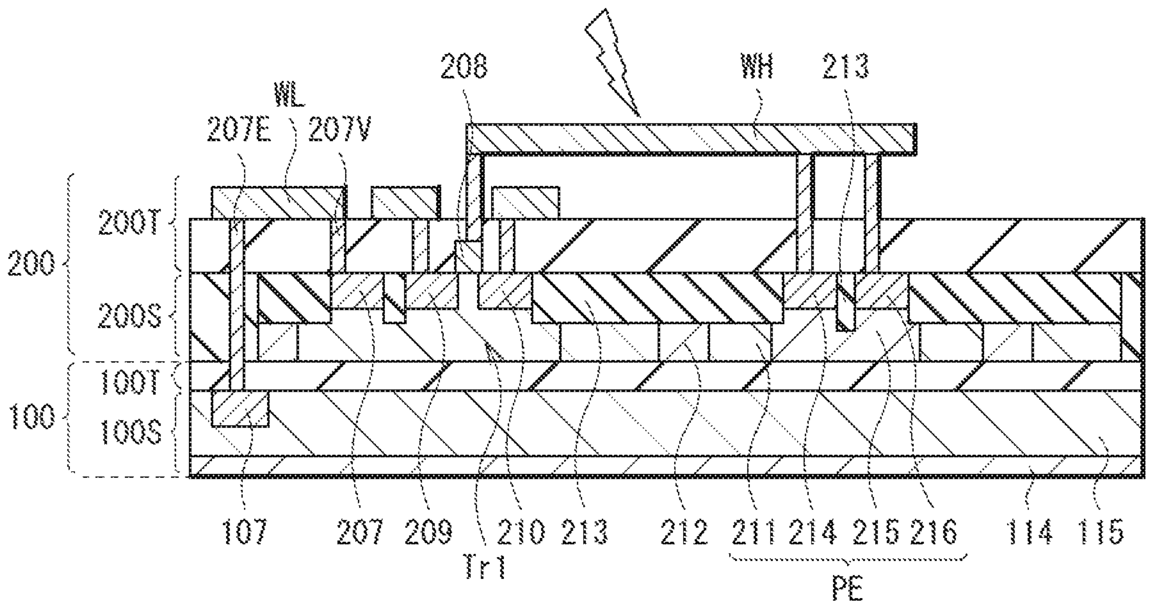
FIG. 44 is a schematic cross-sectional view of another example (5) of the imaging device illustrated in FIG. 38.
Figure 45:
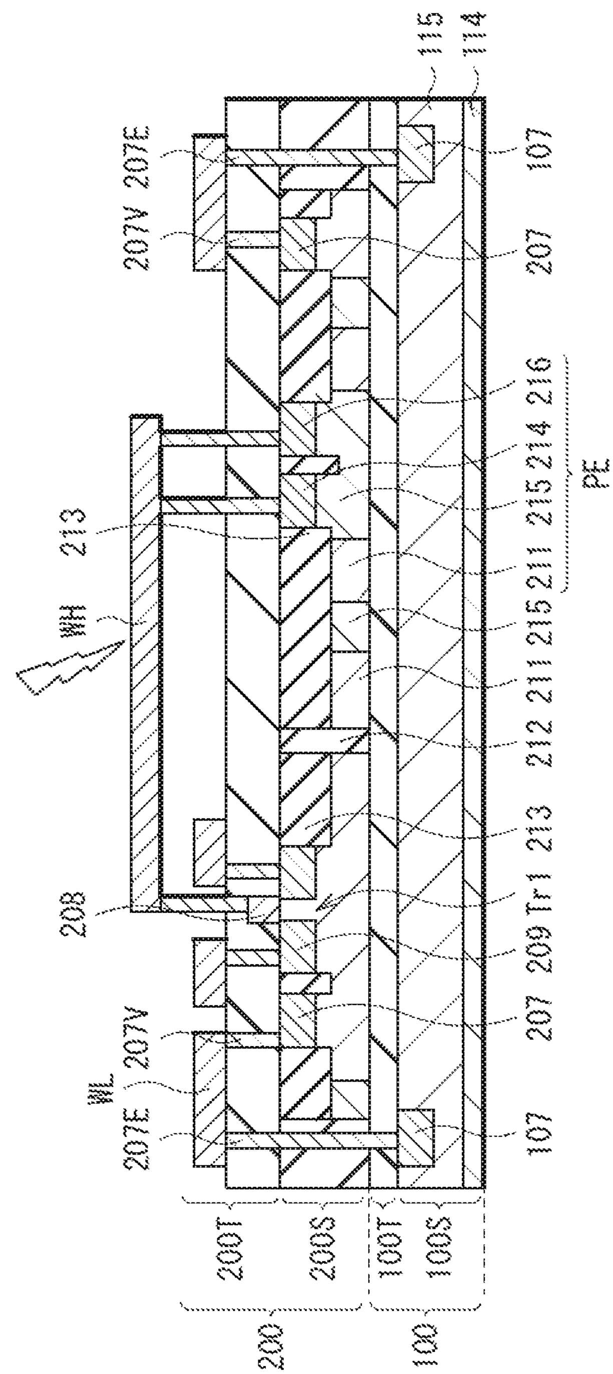
FIG. 45 is a schematic cross-sectional view of another example (6) of the imaging device illustrated in FIG. 38.
Figure 46:
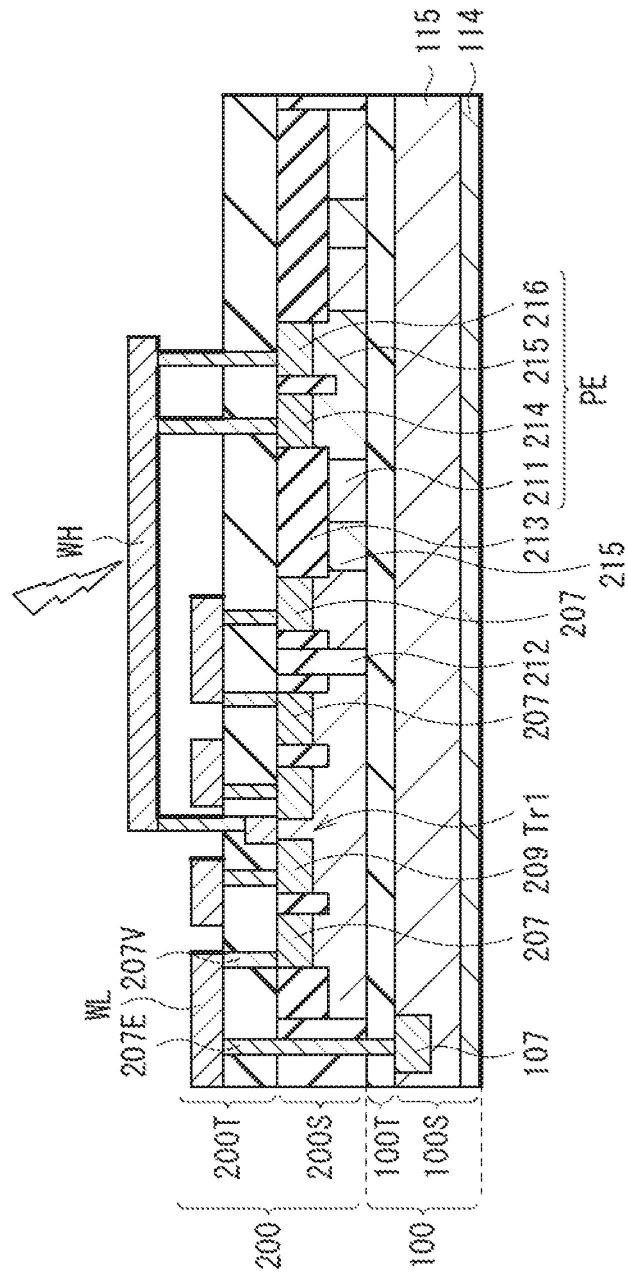
FIG. 46 is a schematic cross-sectional view of another example (7) of the imaging device illustrated in FIG. 38.

In the semiconductor layer 200S provided with the protection element PE having a plurality of pn junctions, in a manner similar to that described above with reference to FIG. 40, the p-type semiconductor region 207 may be electrically coupled to the p-type semiconductor region 107 of the semiconductor layer 100S through the coupling wiring line WL (FIG. 44). Alternatively, in a manner similar to that described above with reference to FIG. 41, the semiconductor layer 200S provided with the transistor Tr1 and the semiconductor layer 200S provided with the protection element PE may be divided by the insulating region 212 (FIG. 45). On this occasion, in a manner similar to that described above with reference to FIG. 42, the p-type semiconductor region 207 of the semiconductor layer 200S provided with the transistor Tr1 and the p-type semiconductor region 207 of the semiconductor layer 200S provided with the protection element PE may be electrically coupled to each other by the coupling wiring line WL (FIG. 46).

Figure 47:
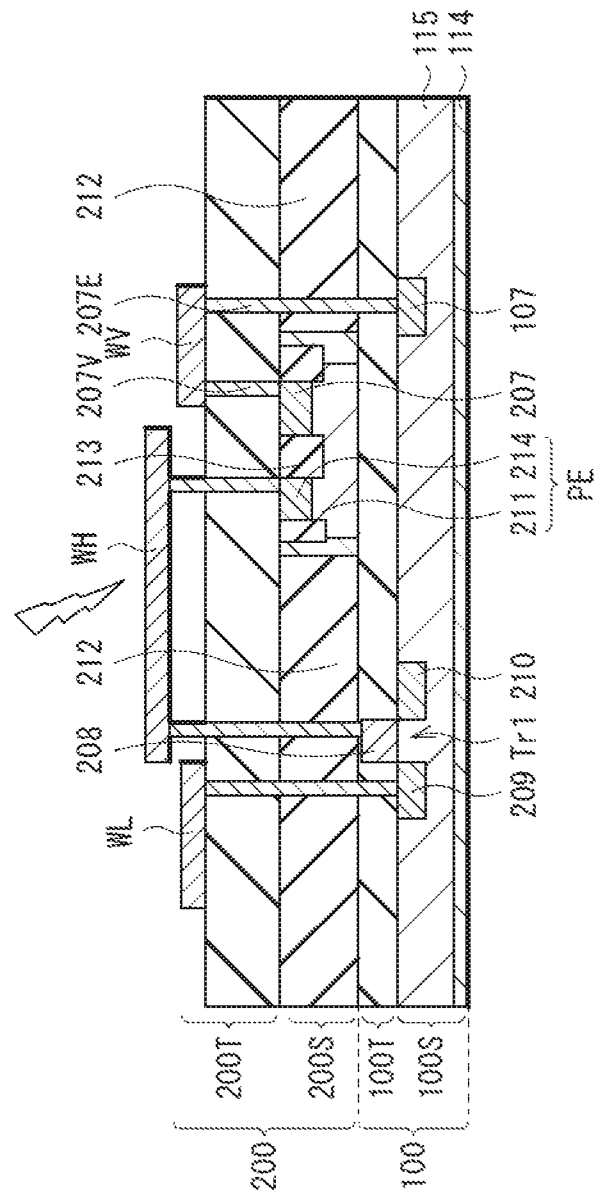
FIG. 47 is a schematic cross-sectional view of another example (8) of the imaging device illustrated in FIG. 38.
Figure 48:
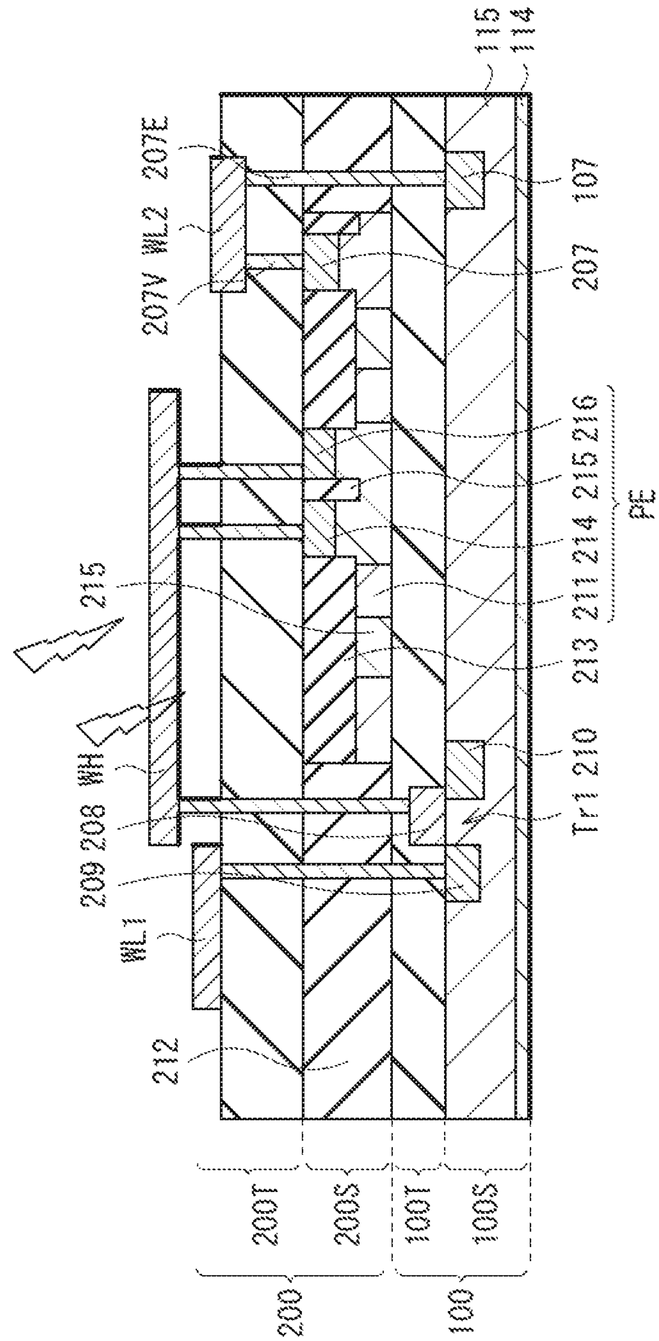
FIG. 48 is a schematic cross-sectional view of another example (9) of the imaging device illustrated in FIG. 38.

The transistor Tr1 to which the protection element PE is coupled may be provided in, for example, the semiconductor layer 100S of the first substrate 100 (FIG. 47). The transistor Tr1 is, for example, the transfer transistor Tr. The protection element PE is provided in, for example, the semiconductor layer 200S of the second substrate 200. The p-type semiconductor region 207 provided in the semiconductor layer 200S is electrically coupled to the p-type semiconductor region 107 of the semiconductor layer 100S through the coupling wiring line WL. Accordingly, when the protection element PE is brought into conduction, the potential of the gate electrode 208 of the transistor Tr1 becomes substantially the same as the potential of the semiconductor layer 100S. Accordingly, PID to the transistor Tr1 is suppressed. In a manner similar to that described above with reference to FIGS. 43 to 46, the protection element PE coupled to the transistor Tr1 provided in the semiconductor layer 100S may include a diode having a plurality of pn junctions (FIG. 48).

Figure 49:
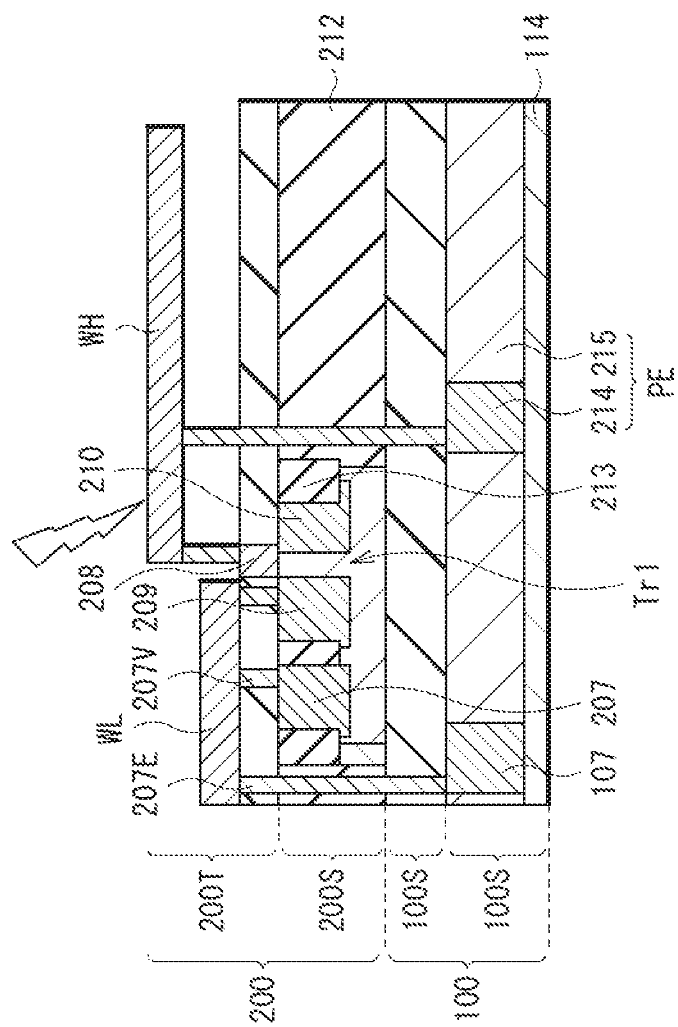
FIG. 49 is a schematic cross-sectional view of another example (10) of the imaging device illustrated in FIG. 38.
Figure 50:
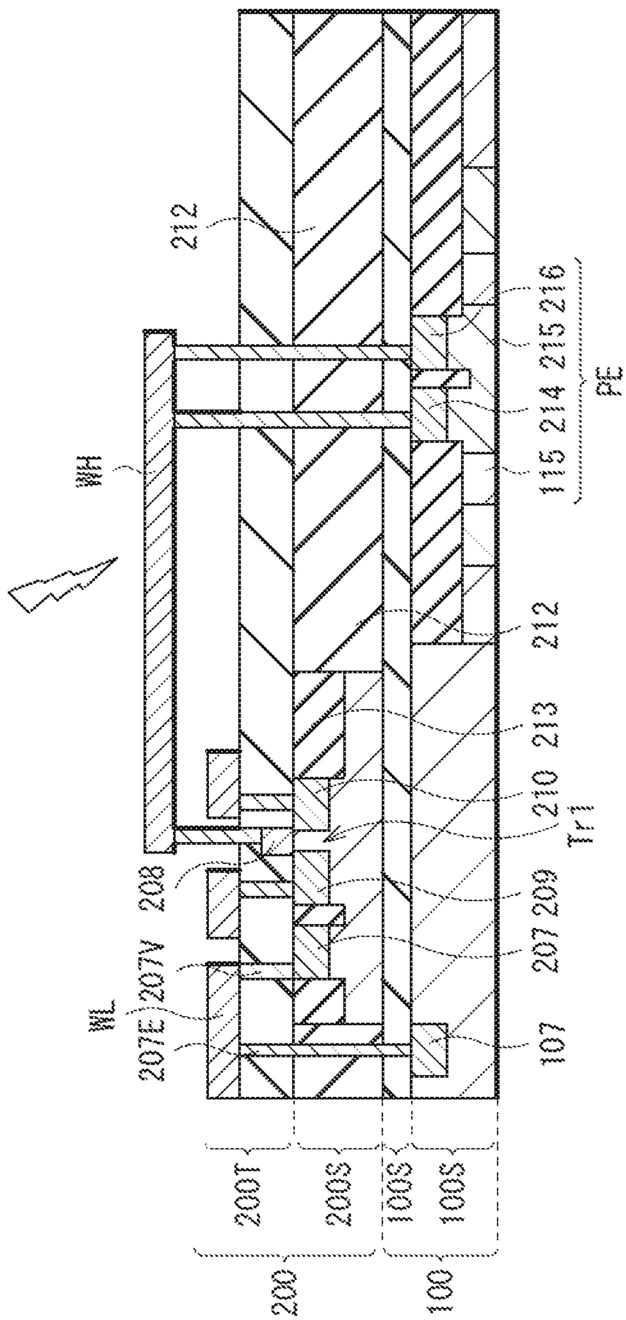
FIG. 50 is a schematic cross-sectional view of another example (11) of the imaging device illustrated in FIG. 38.

The transistor Tr1 provided in the semiconductor layer 200S of the second substrate 200 may be coupled to the protection element PE provided in the semiconductor layer 100S of the first substrate 100 (FIG. 49). On this occasion, the protection element PE includes the p-well layer 115 and the n-type semiconductor region 214 provided in the p-well layer 115. The gate electrode 208 of the transistor Tr1 is electrically coupled to the n-type semiconductor region 214 of the protection element PE through the antenna wiring line WH. For example, the p-type semiconductor region 207 provided in the semiconductor layer 200S is electrically coupled to the p-type semiconductor region 107 provided in the semiconductor layer 100S through the coupling wiring line WL. Accordingly, when the protection element PE is brought into conduction, the potential of the gate electrode 208 of the transistor Tr1 becomes substantially the same as the potential of the semiconductor layer 200S and the potential of the semiconductor layer 100S. Accordingly, PID to the transistor Tr1 is suppressed. In a manner similar to that described above with reference to FIGS. 43 to 46, the protection element PE coupled to the transistor Tr1 provided in the semiconductor layer 100S may include a diode having a plurality of pn junctions (FIG. 50).

The imaging device 1 including such a protection element PE also achieves effects similar to those described in the above embodiment. Furthermore, the protection element PE makes it possible to suppress the influence of PID and improve yields. It is to be noted that description herein has been given of an example in which the protection element PE is coupled to the gate electrode 208 of the transistor Tr1 through the antenna wiring line WH; however, the protection element PE may be coupled to the source or the drain of the transistor Tr1 through the antenna wiring line WH. Even on this occasion, the protection element PE makes it possible to suppress the influence of PID and improve yields in a manner similar to that described above.

7. Modification Example 6

Figure 51:
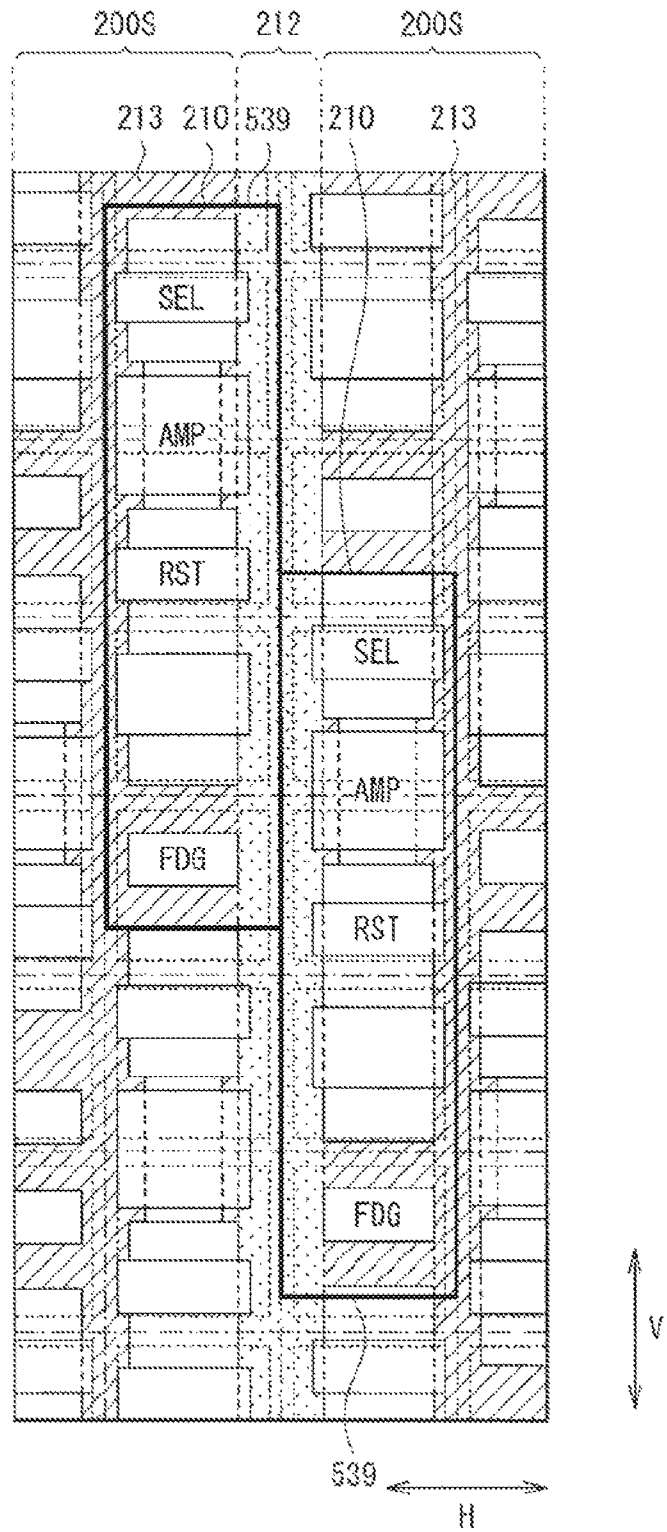
FIG. 51 is a schematic view of a modification example of a planar configuration of the second substrate (the semiconductor layer) illustrated in FIG. 10.
Figure 52:
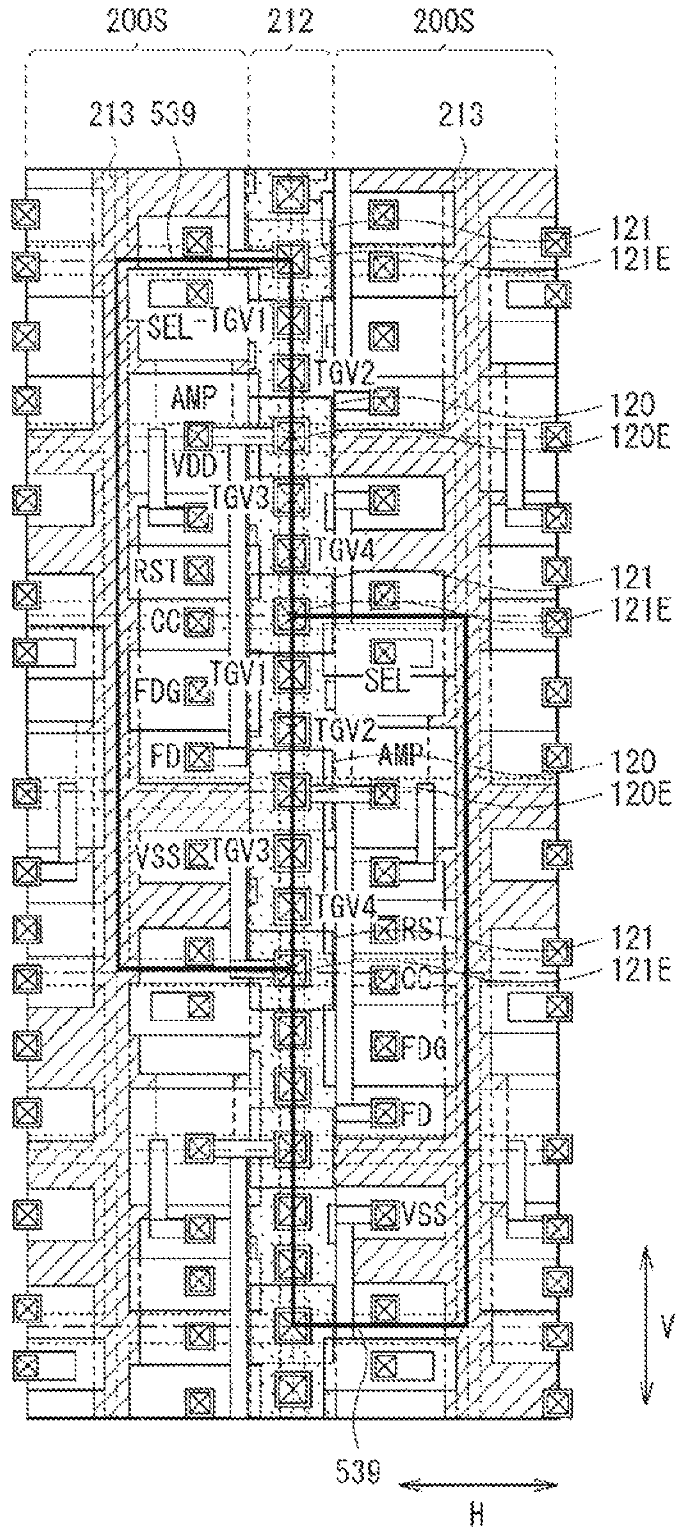
FIG. 52 is a schematic view of a planar configuration of main parts of the first wiring layer and the first substrate together with the pixel circuit illustrated in FIG. 51.
Figure 54:
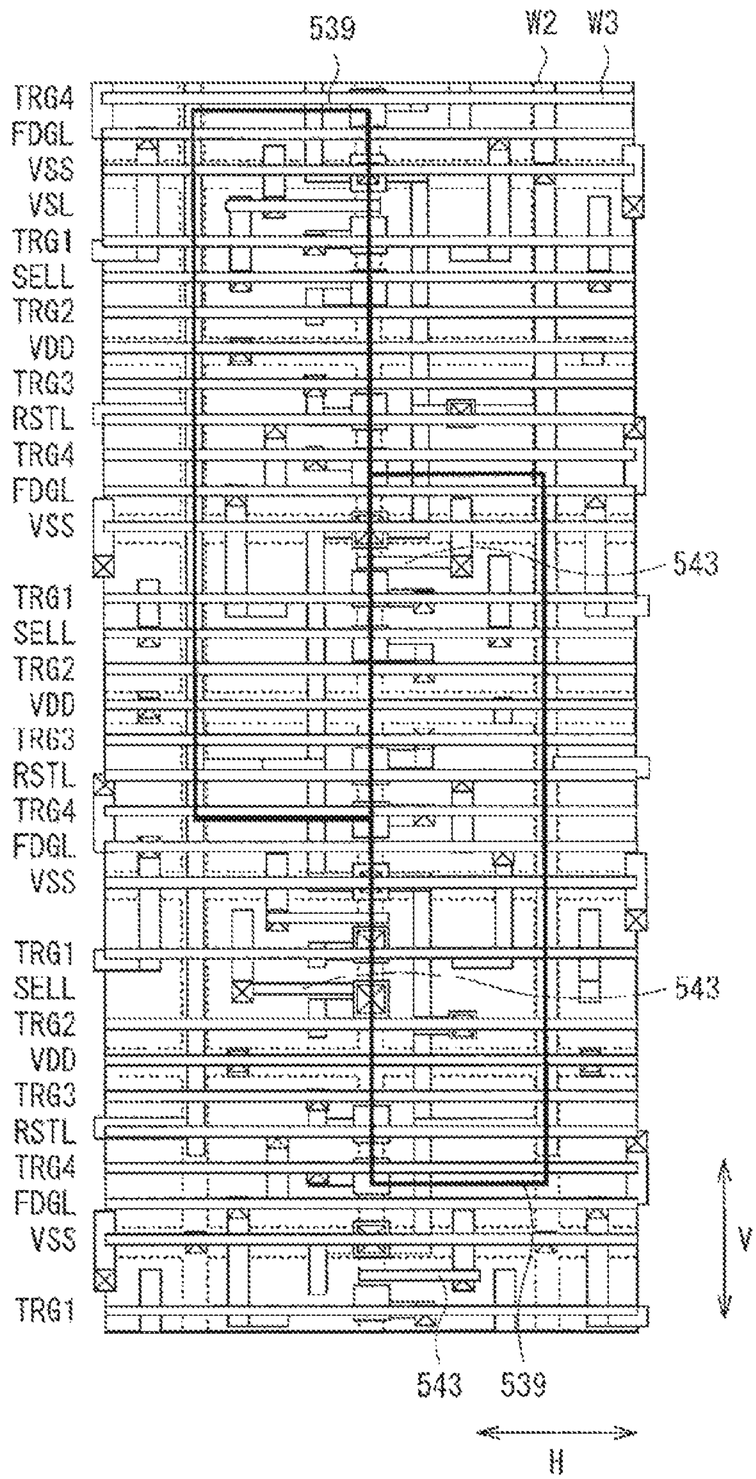
FIG. 54 is a schematic view of an example of a planar configuration of the third wiring layer together with the second wiring layer illustrated in FIG. 53.
Figure 55:
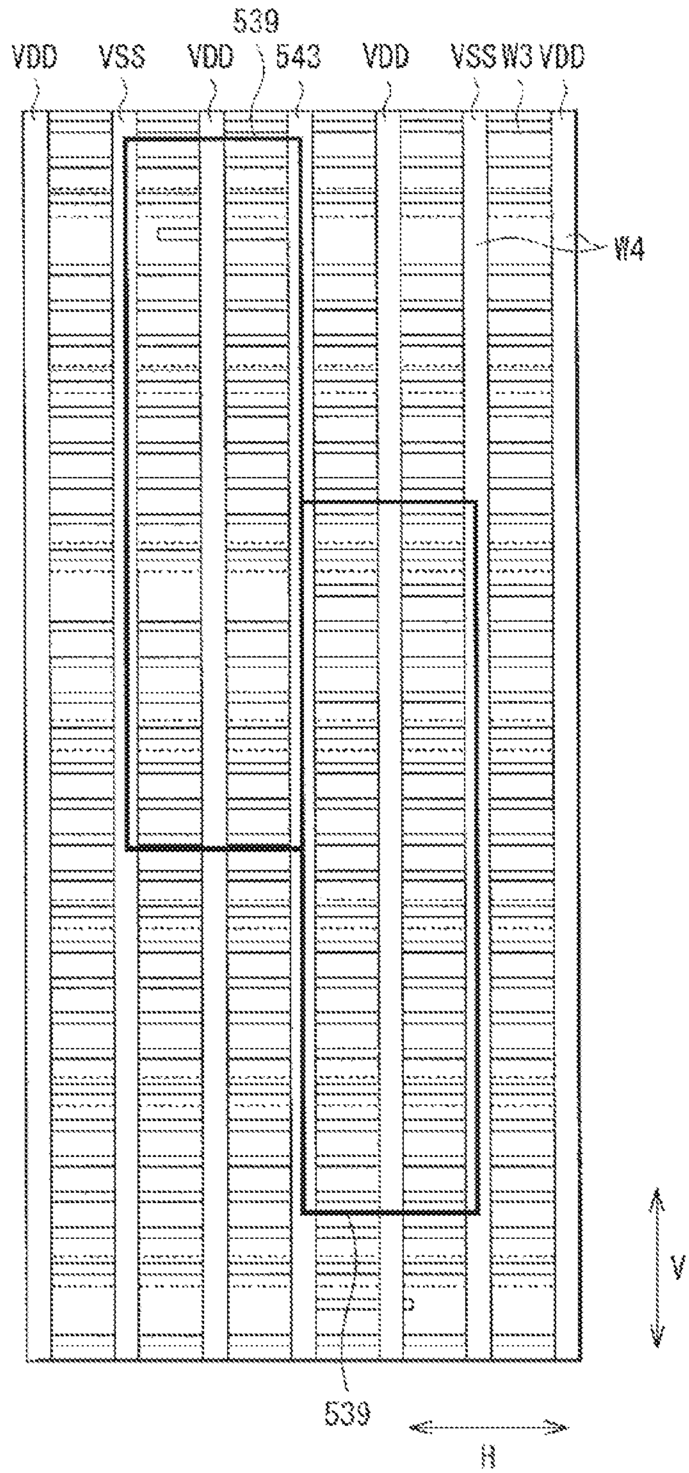
FIG. 55 is a schematic view of an example of a planar configuration of the fourth wiring layer together with the third wiring layer illustrated in FIG. 54.

FIGS. 51 to 55 illustrate a modification example of a planar configuration of the imaging device 1 according to the embodiment described above. FIG. 51 schematically illustrates a planar configuration in proximity to the front surface of the semiconductor layer 200S of the second substrate 200, and corresponds to FIG. 10 described in the above embodiment. FIG. 52 schematically illustrates a configuration of each part of the first wiring layer W1, the semiconductor layer 200S coupled to the first wiring layer W1, and the first substrate 100, and corresponds to FIG. 11 described in the above embodiment. FIG. 53 illustrates an example of a planar configuration of the first wiring layer W1 and the second wiring layer W2, and corresponds to FIG. 12 described in the above embodiment. FIG. 54 illustrates an example of a planar configuration of the second wiring layer W2 and the third wiring layer W3, and corresponds to FIG. 13 described in the above embodiment. FIG. 55 illustrates an example of a planar configuration of the third wiring layer W3 and the fourth wiring layer W4, and corresponds to FIG. 14 described in the above embodiment.

In the present modification example, as illustrated in FIG. 52, in two pixel sharing units 539 arranged side by side in the H direction of the second substrate 200, an internal layout of one (e.g., on right side of a paper surface) pixel sharing unit 539 has a configuration obtained by inverting an internal layout of the other (e.g., on left side of the paper surface) pixel sharing unit 539 only in the H direction. In addition, deviation in the V direction between the contour line of the one pixel sharing unit 539 and the contour line of the other pixel sharing unit 539 is larger than deviation (FIG. 11) described in the above embodiment. In such a manner, increasing the deviation in the V direction makes it possible to decrease a distance between the amplification transistor AMP of the other pixel sharing unit 539 and the pad section 120 coupled to the amplification transistor AMP (the pad section 120 of the other (on lower side of the paper surface) of the two pixel sharing units 539 arranged side by side in the V direction illustrated in FIG. 7B). Such a layout allows the modification example 6 of the imaging device 1 illustrated in FIGS. 51 to 55 to make the areas of the two pixel sharing units 539 arranged side by side in the H direction to each other the same as the areas of the pixel sharing units 539 of the second substrate 200 described in the above embodiment without inverting planar layouts of the two pixel sharing units 539 in the V direction to each other. It is to be noted that the planar layout of the pixel sharing unit 539 of the first substrate 100 is the same as the planar layout (FIGS. 7A and 7B) described in the above embodiment. Thus, the imaging device 1 according to the present modification example is able to achieve effects similar to those in the imaging device 1 described in the above embodiment. The arrangement of the pixel sharing units 539 of the second substrate 200 is not limited to the arrangements described in the above embodiment and the present modification example.

8. Modification Example 7

Figure 56:
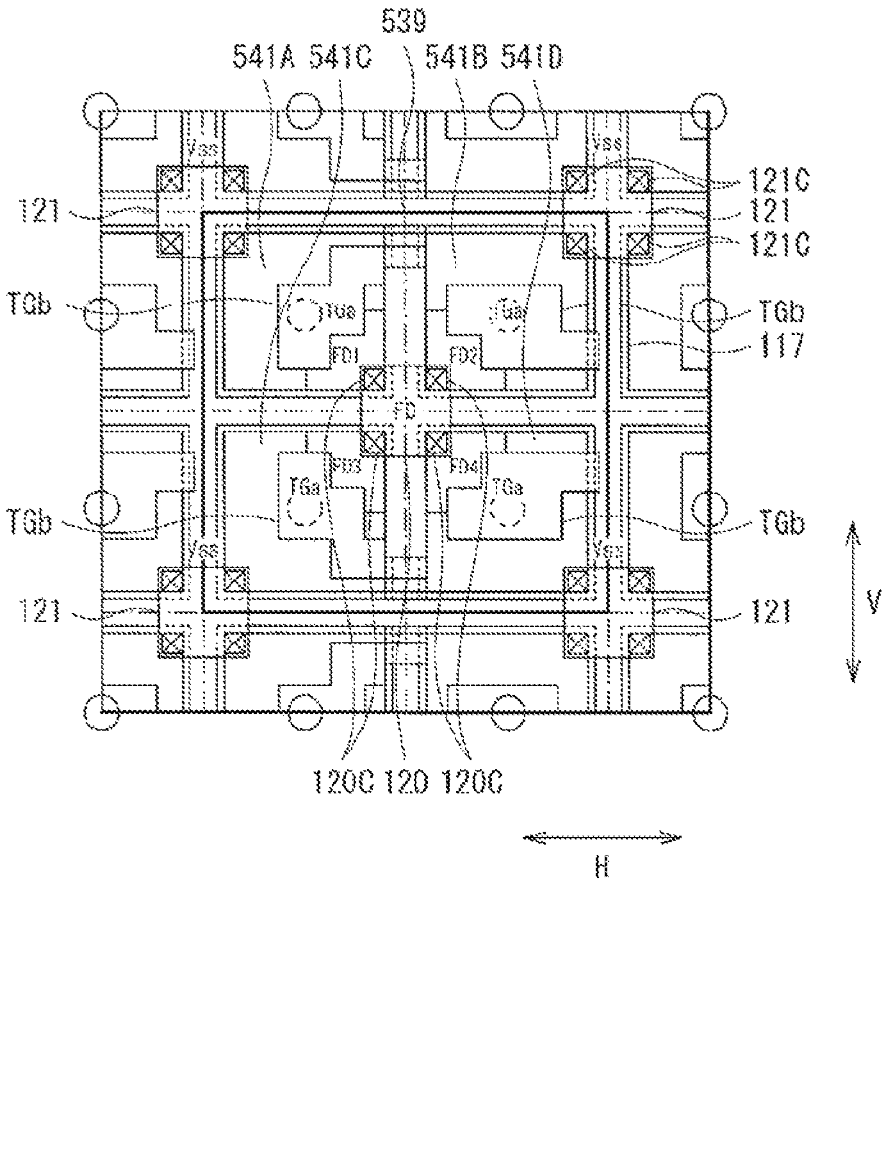
FIG. 56 is a schematic view of a modification example of a planar configuration of the first substrate illustrated in FIG. 7A.
Figure 57:
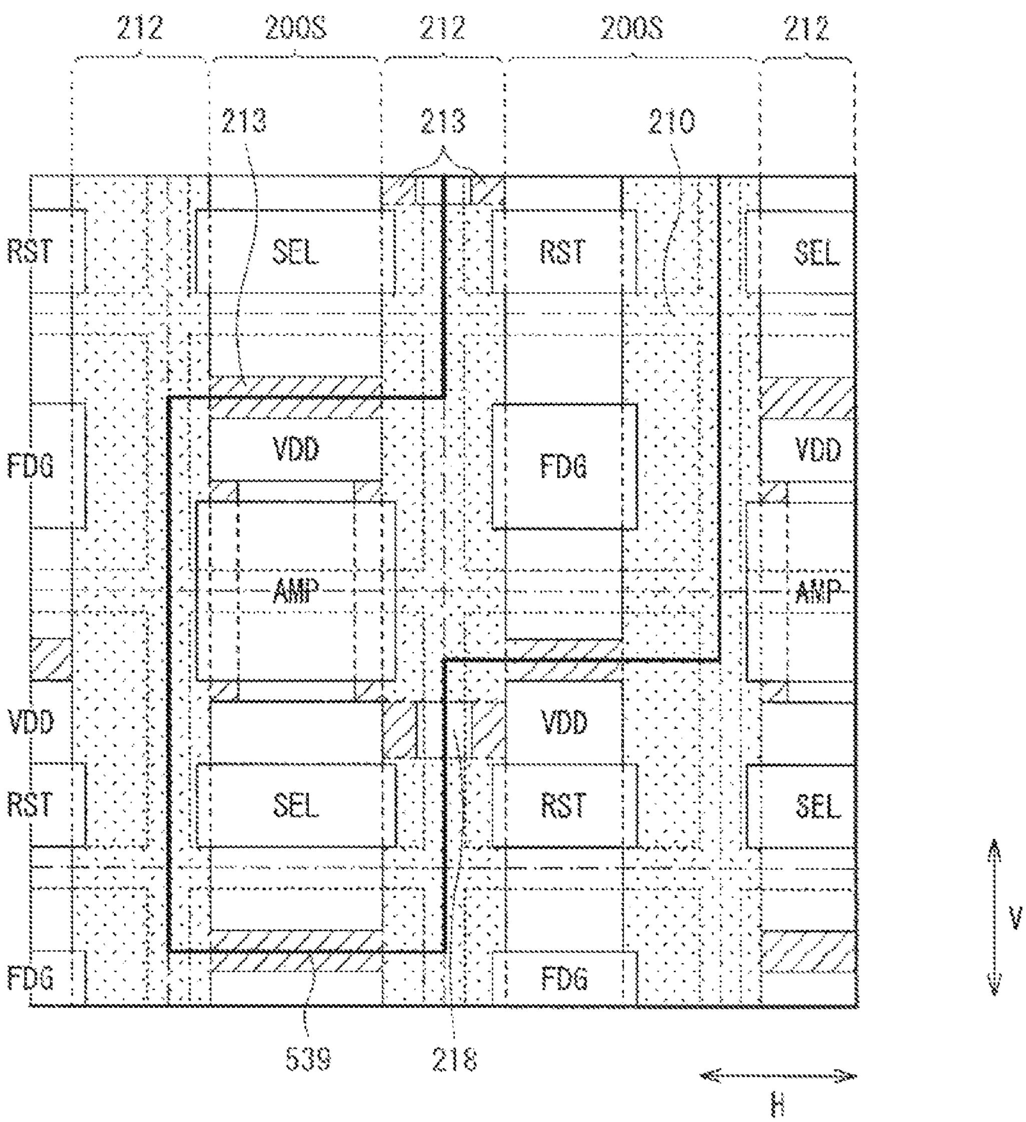
FIG. 57 is a schematic view of an example of a planar configuration of the second substrate (the semiconductor layer) stacked on the first substrate illustrated in FIG. 56.
Figure 58:
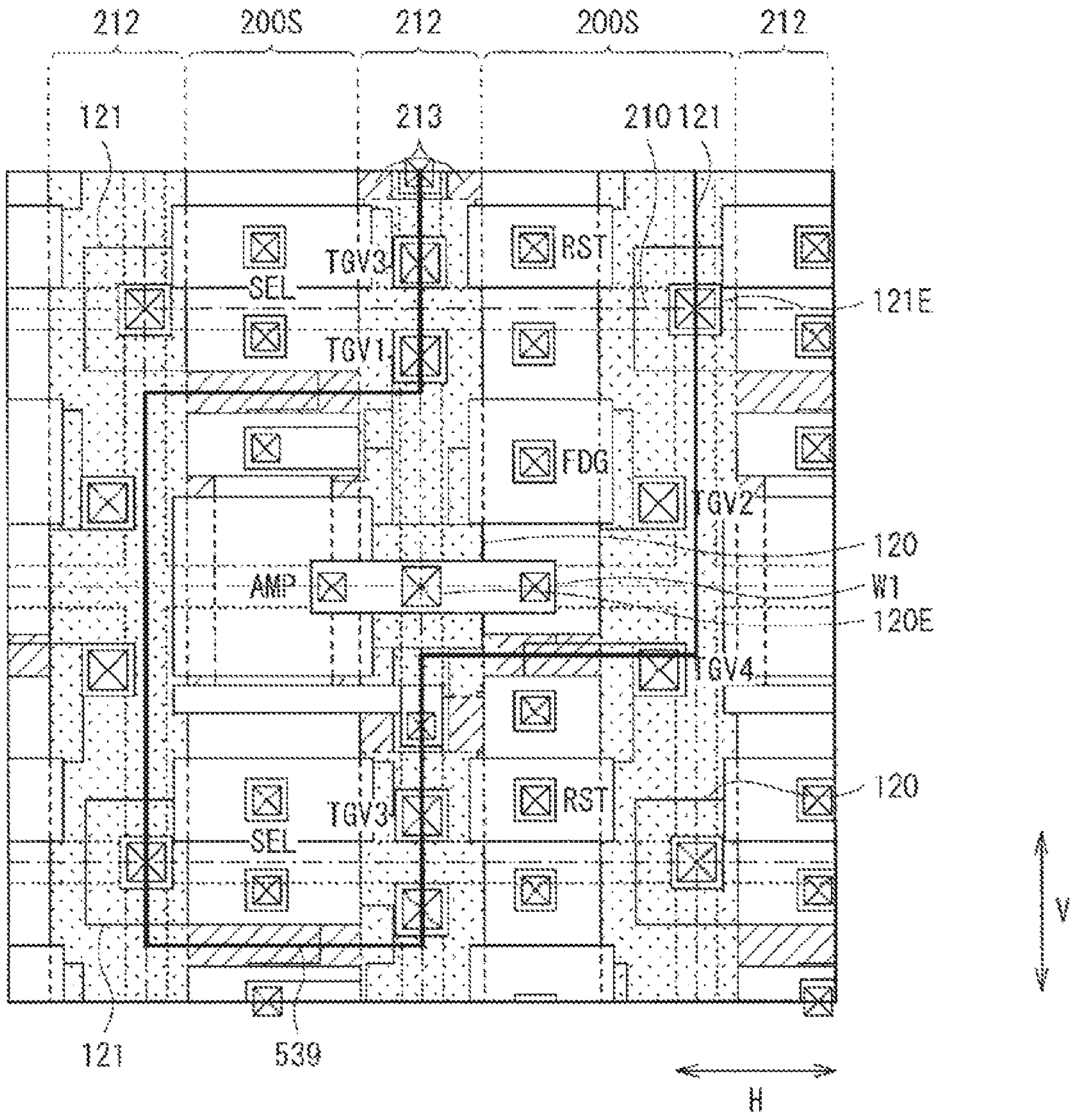
FIG. 58 is a schematic view of an example of a planar configuration of the first wiring layer together with the pixel circuit illustrated in FIG. 57.
Figure 59:
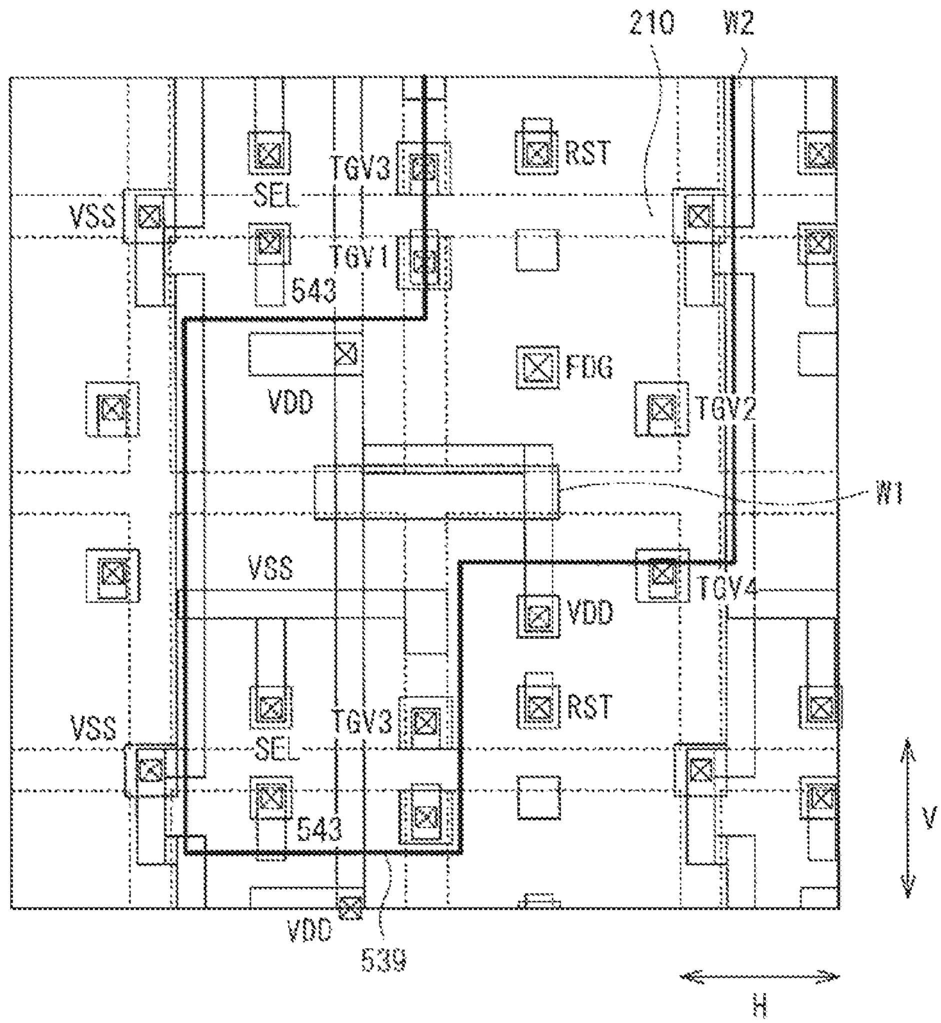
FIG. 59 is a schematic view of an example of a planar configuration of the second wiring layer together with the first wiring layer illustrated in FIG. 58.
Figure 60:
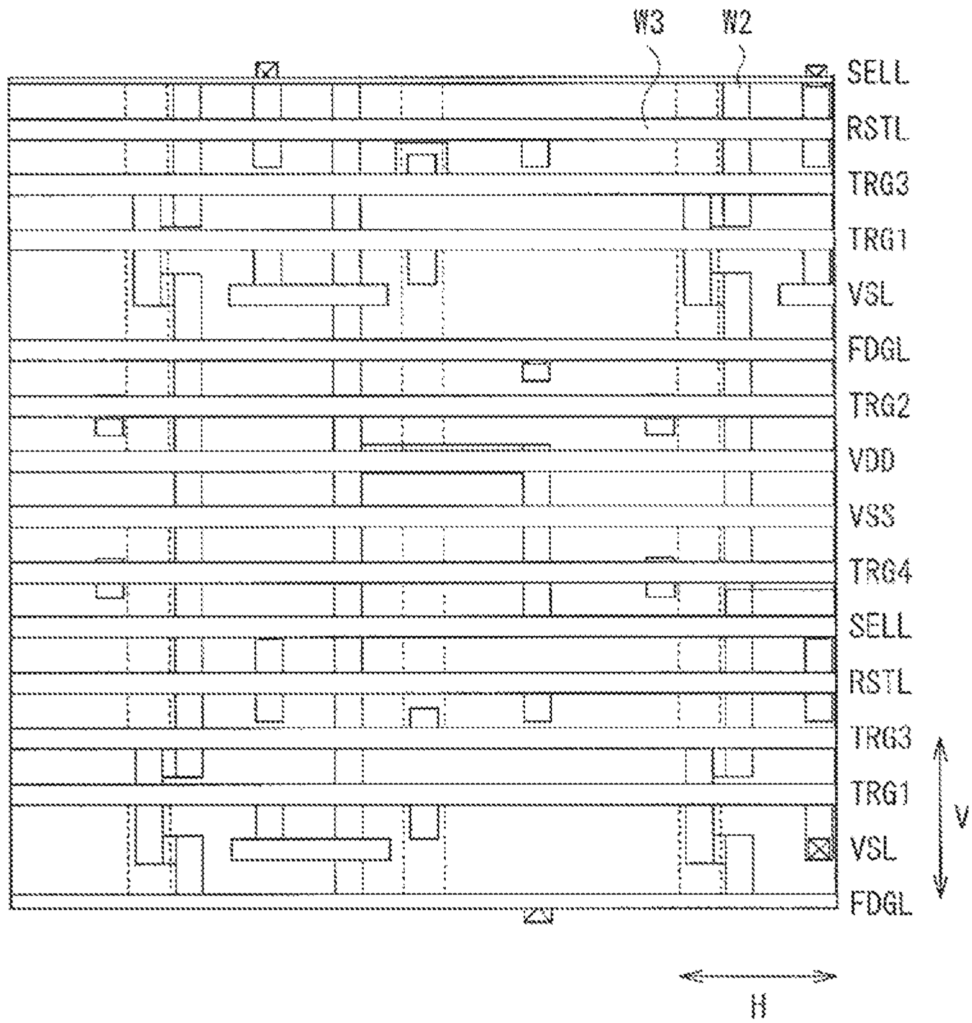
FIG. 60 is a schematic view of an example of a planar configuration of the third wiring layer together with the second wiring layer illustrated in FIG. 59.
Figure 61:
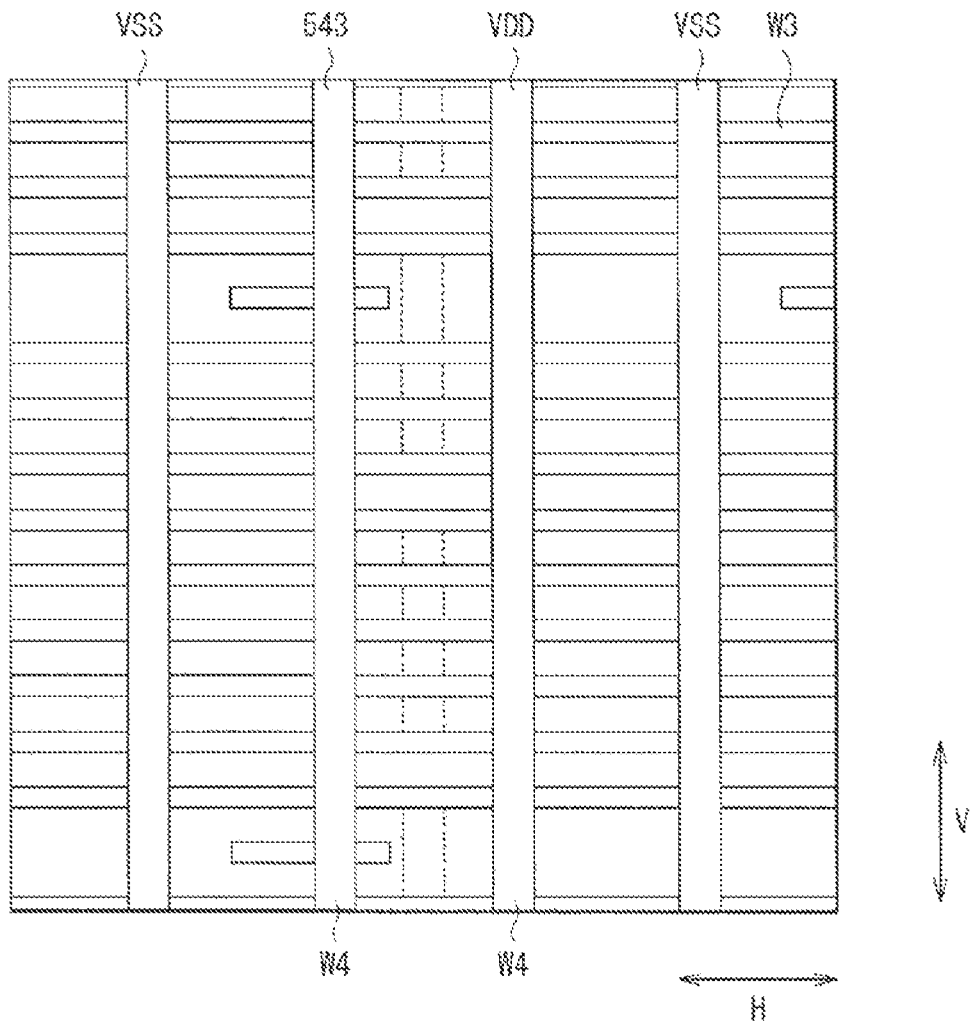
FIG. 61 is a schematic view of an example of a planar configuration of the fourth wiring layer together with the third wiring layer illustrated in FIG. 60.

FIGS. 56 to 61 illustrate a modification example of a planar configuration of the imaging device 1 according to the embodiment described above. FIG. 56 schematically illustrates a planar configuration of the first substrate 100, and corresponds to FIG. 7A described in the above embodiment. FIG. 57 schematically illustrates a planar configuration in proximity to the front surface of the semiconductor layer 200S of the second substrate 200, and corresponds to FIG. 10 described in the above embodiment. FIG. 58 schematically illustrates a configuration of each part of the first wiring layer W1, the semiconductor layer 200S coupled to the first wiring layer W1, and the first substrate 100, and corresponds to FIG. 11 described in the above embodiment. FIG. 59 illustrates an example of a planar configuration of the first wiring layer W1 and the second wiring layer W2, and corresponds to FIG. 12 described in the above embodiment. FIG. 60 illustrates an example of a planar configuration of the second wiring layer W2 and the third wiring layer W3, and corresponds to FIG. 13 described in the above embodiment. FIG. 61 illustrates an example of a planar configuration of the third wiring layer W3 and the fourth wiring layer W4, and corresponds to FIG. 14 described in the above embodiment.

In the present modification example, the contour of each of the pixel circuits 200X has a substantially square planar shape (FIG. 57 and the like). The planar configuration of the imaging device 1 according to the present modification example differs from the planar configuration of the imaging device 1 described in the above embodiment in this point.

For example, the pixel sharing unit 539 of the first substrate 100 is formed over a pixel region of two rows by two columns in a manner similar to that described in the above embodiment and has a substantially square planar shape (FIG. 56). For example, in each of the pixel sharing units 539, the horizontal portions TGb of the transfer gates TG1 and TG3 of the pixel 541A and the pixel 541C in one pixel column extend in directions from positions superimposed on the vertical portions TGa toward a middle portion of the pixel sharing unit 539 in the H direction (more specifically, in directions toward outer edges of the pixels 541A and 541C and a direction toward the middle portion of the pixel sharing unit 539), and the horizontal portions TGb of the transfer gates TG2 and TG4 of the pixels 541B and the pixel 541D in the other pixel column extend in directions from positions superimposed on the vertical portions TGa toward outside of the pixel sharing unit 539 in the H direction (more specifically, in directions toward outer edges of the pixels 541B and 541D and a direction toward outside of the pixel sharing unit 539). The pad section 120 coupled to the floating diffusions FD is provided in the middle portion of the pixel sharing unit 539 (a middle portion in the H direction and the V direction of the pixel sharing unit 539), and the pad section 121 coupled to the VSS contact regions 118 is provided at an end of the pixel sharing unit 539 at least in the H direction (in the H direction and the V direction in FIG. 56).

As another arrangement example, it is conceivable that the horizontal portions TGb of the transfer gates TG1, TG2, TG3, and TG4 are provided only in regions opposed to the vertical portions TGa. On this occasion, in a manner similar to that described in the above embodiment, the semiconductor layer 200S is easily divided finely. Accordingly, it is difficult to form large transistors of the pixel circuit 200X. In contrast, in a case where the horizontal portions TGb of the transfer gates TG1, TG2, TG3, and TG4 extend from the positions superimposed on the vertical portions TGa in the H direction as with the modification example described above, it is possible to increase the width of the semiconductor layer 200S in a manner similar to that described in the above embodiment. Specifically, it is possible to dispose the positions in the H direction of the through electrodes TGV1 and TGV3 coupled to the transfer gates TG1 and TG3 in proximity to the position in the H direction of the through electrode 120E, and dispose the positions in the H direction of the through electrodes TGV2 and TGV4 coupled to the transfer gates TG2 and TG4 in proximity to the position in the H direction of the through electrode 121E (FIG. 58). This makes it possible to increase the width (a size in the H direction) of the semiconductor layer 200S extending in the V direction in a manner similar to that described in the above embodiment. Accordingly, it is possible to increase the sizes of the transistors of the pixel circuit 200X, specifically the size of the amplification transistor AMP. This consequently makes it possible to improve the signal-to-noise ratio of the pixel signal, thereby allowing the imaging device 1 to output more favorable pixel data (image information).

The pixel sharing unit 539 of the second substrate 200 has, for example, substantially the same sizes as the sizes in the H direction and the V direction of the pixel sharing unit 539 of the first substrate 100, and is provided over a region substantially corresponding to a pixel region of two rows by two columns. For example, in each of the pixel circuits 200X, the selection transistor SEL and the amplification transistor AMP are disposed side by side in the V direction in one semiconductor layer 200S extending in the V direction, and the FD conversion gain switching transistor FDG and the reset transistor RST are disposed side by side in the V direction in one semiconductor layer 200S extending in the V direction. The one semiconductor layer 200S provided with the selection transistor SEL and the amplification transistor AMP and the one semiconductor layer 200S provided with the FD conversion gain switching transistor FDG and the reset transistor RST are arranged side by side in the H direction with the insulating region 212 interposed therebetween. The insulating region 212 extends in the V direction (FIG. 57).

Herein, the contour of the pixel sharing unit 539 of the second substrate 200 is described with reference to FIGS. 57 and 58. For example, the pixel sharing unit 539 of the first substrate 100 illustrated in FIG. 56 is coupled to the amplification transistor AMP and the selection transistor SEL provided to one (on left side of a paper surface in FIG. 58) in the H direction of the pad sections 120, and the FD conversion gain switching transistor FDG and the reset transistor RST provided to another one (on right side of the paper surface in FIG. 58) in the H direction of the pad sections 120. The contour of the pixel sharing unit 539 of the second substrate 200 including the amplification transistor AMP, the selection transistor SEL, the FD conversion gain switching transistor FDG, and the reset transistor RST is determined by the following four outer edges.

A first outer edge is an outer edge of one end (an end on upper side of the paper surface in FIG. 58) in the V direction of the semiconductor layer 200S including the selection transistor SEL and the amplification transistor AMP. The first outer edge is provided between the amplification transistor AMP included in that pixel sharing unit 539 and the selection transistor SEL included in the pixel sharing unit 539 adjacent to one side (on upper side of the paper surface in FIG. 58) in the V direction of that pixel sharing unit 539. More specifically, the first outer edge is provided in a middle portion in the V direction of the element separation region 213 between the amplification transistor AMP and the selection transistor SEL. A second outer edge is an outer edge of another end (an end on lower side of the paper surface in FIG. 58) in the V direction of the semiconductor layer 200S including the selection transistor SEL and the amplification transistor AMP. The second outer edge is provided between the selection transistor SEL included in that pixel sharing unit 539 and the amplification transistor AMP included in the pixel sharing unit 539 adjacent to another side (on lower side of the paper surface in FIG. 58) in the V direction of that pixel sharing unit 539. More specifically, the second outer edge is provided in a middle portion in the V direction of the element separation region 213 between the selection transistor SEL and the amplification transistor AMP. A third outer edge is an outer edge of another end (an end on lower side of the paper surface in FIG. 58) in the V direction of the semiconductor layer 200S including the reset transistor RST and the FD conversion gain switching transistor FDG. The third outer edge is provided between the FD conversion gain switching transistor FDG included in that pixel sharing unit 539 and the reset transistor RST included in the pixel sharing unit 539 adjacent to another side (on lower side of the paper surface in FIG. 58) in the V direction of that pixel sharing unit 539. More specifically, the third outer edge is provided in a middle portion in the V direction of the element separation region 213 between the FD conversion gain switching transistor FDG and the reset transistor RST. A fourth outer edge is an outer edge of one end (an end on upper side of the paper surface in FIG. 58) in the V direction of the semiconductor layer 200S including the reset transistor RST and the FD conversion gain switching transistor FDG. The fourth outer edge is provided between the reset transistor RST included in that pixel sharing unit 539 and the FD conversion gain switching transistor FDG (not illustrated) included in the pixel sharing unit 539 adjacent to one side (on upper side of the paper surface in FIG. 58) in the V direction of that pixel sharing unit 539. More specifically, the fourth outer edge is provided in a middle portion in the V direction of the element separation region 213 (not illustrated) between the reset transistor RST and the FD conversion gain switching transistor FDG.

In the contour of the pixel sharing unit 539 of the second substrate 200 including such first, second, third, and fourth outer edges, the third and fourth outer edges are disposed to be deviated on one side in the V direction from the first and second outer edges (in other words, to be offset on one side in the V direction). Using such a layout makes it possible to dispose both the gate of the amplification transistor AMP and the source of the FD conversion gain switching transistor FDG as close as possible to the pad section 120. This makes it easier to decrease the area of a wiring line that couples them to each other and miniaturize the imaging device 1. It is to be noted that the VSS contact region 218 is provided between the semiconductor layer 200S including the selection transistor SEL and the amplification transistor AMP and the semiconductor layer 200S including the reset transistor RST and the FD conversion gain switching transistor FDG. For example, a plurality of pixel circuits 200X has the same arrangement as each other.

The imaging device 1 including such a second substrate 200 also achieves effects similar to those described in the above embodiment. The arrangement of the pixel sharing unit 539 of the second substrate 200 is not limited to the arrangements described in the above embodiment and the present modification example.

9. Modification Example 8

Figure 62:
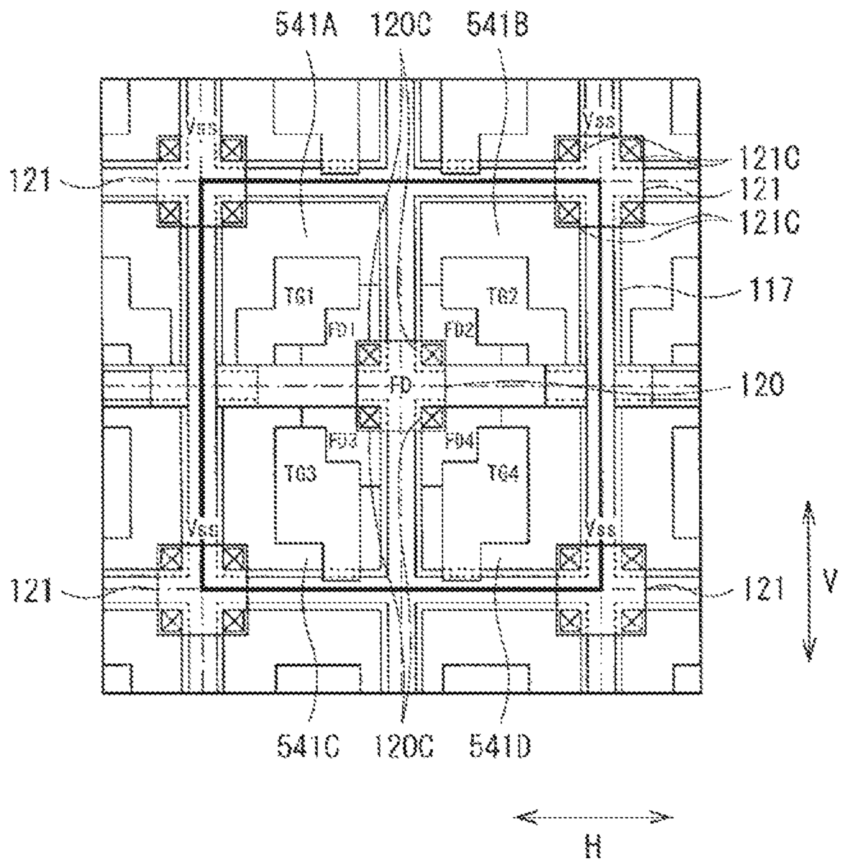
FIG. 62 is a schematic view of another example of the planar configuration of the first substrate illustrated in FIG. 56.
Figure 63:
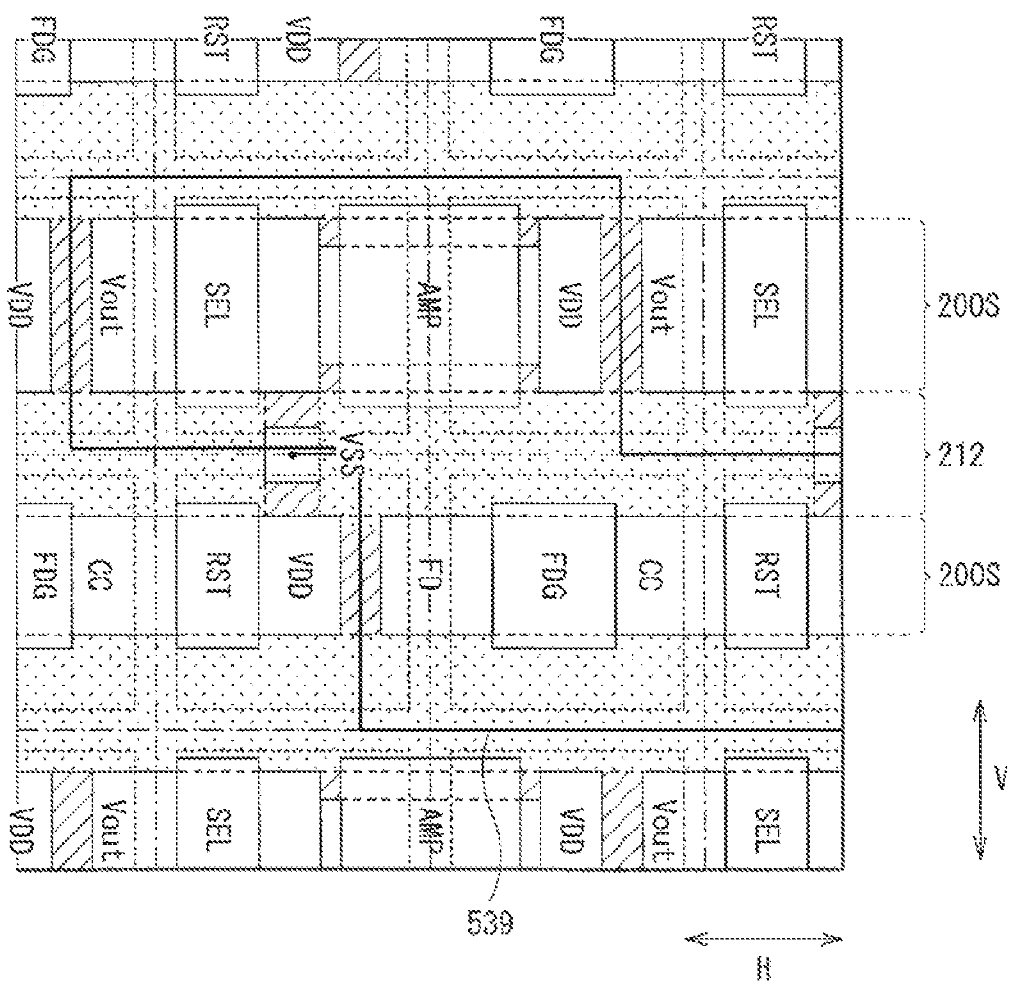
FIG. 63 is a schematic view of an example of a planar configuration of the second substrate (the semiconductor layer) stacked on the first substrate illustrated in FIG. 62.
Figure 64:
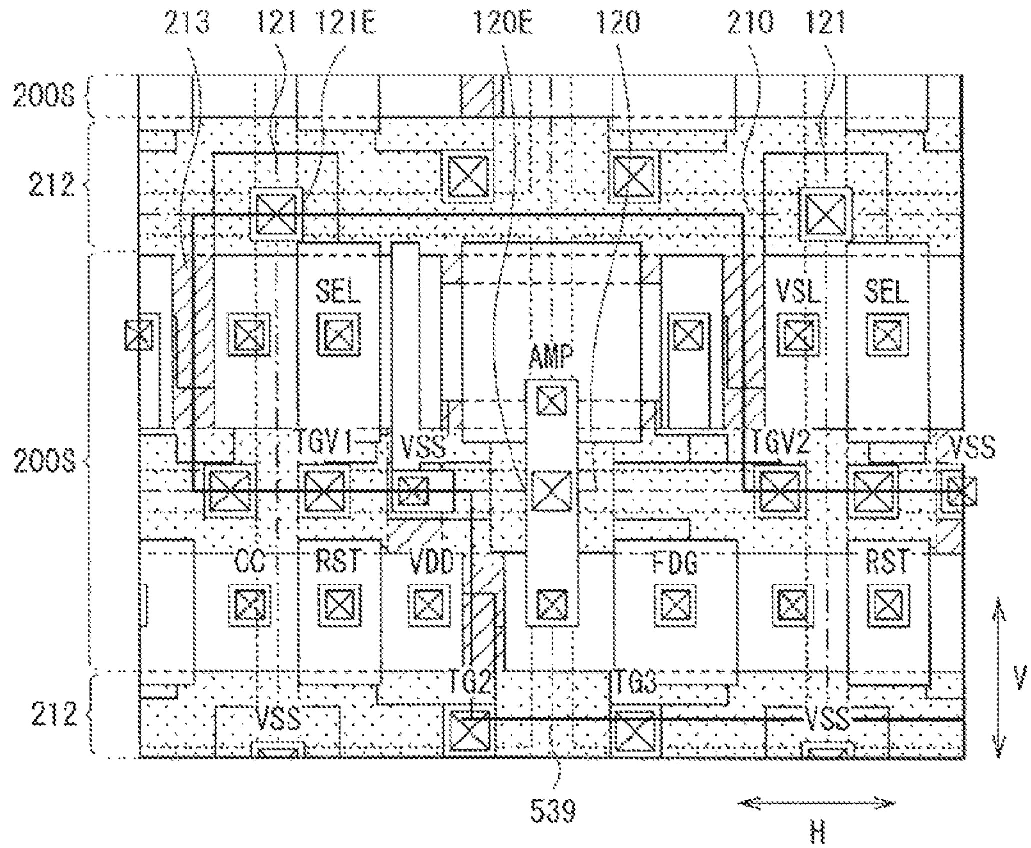
FIG. 64 is a schematic view of an example of a planar configuration of the first wiring layer together with the pixel circuit illustrated in FIG. 63.
Figure 65:
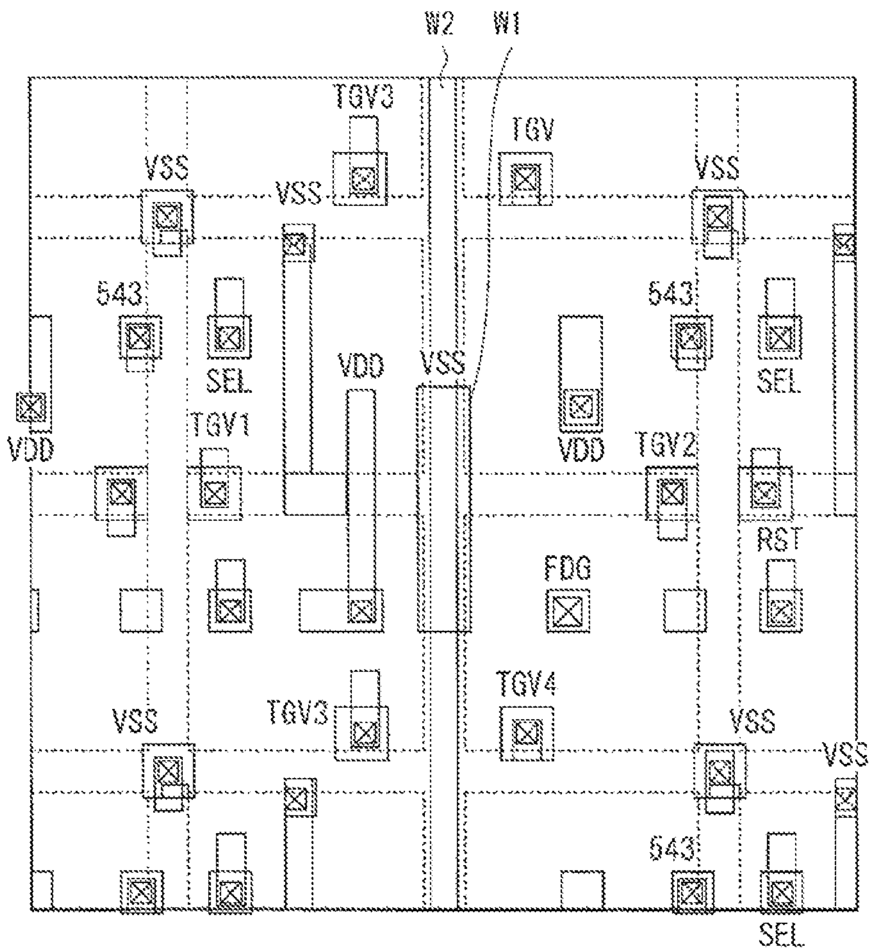
FIG. 65 is a schematic view of an example of a planar configuration of the second wiring layer together with the first wiring layer illustrated in FIG. 64.
Figure 66:
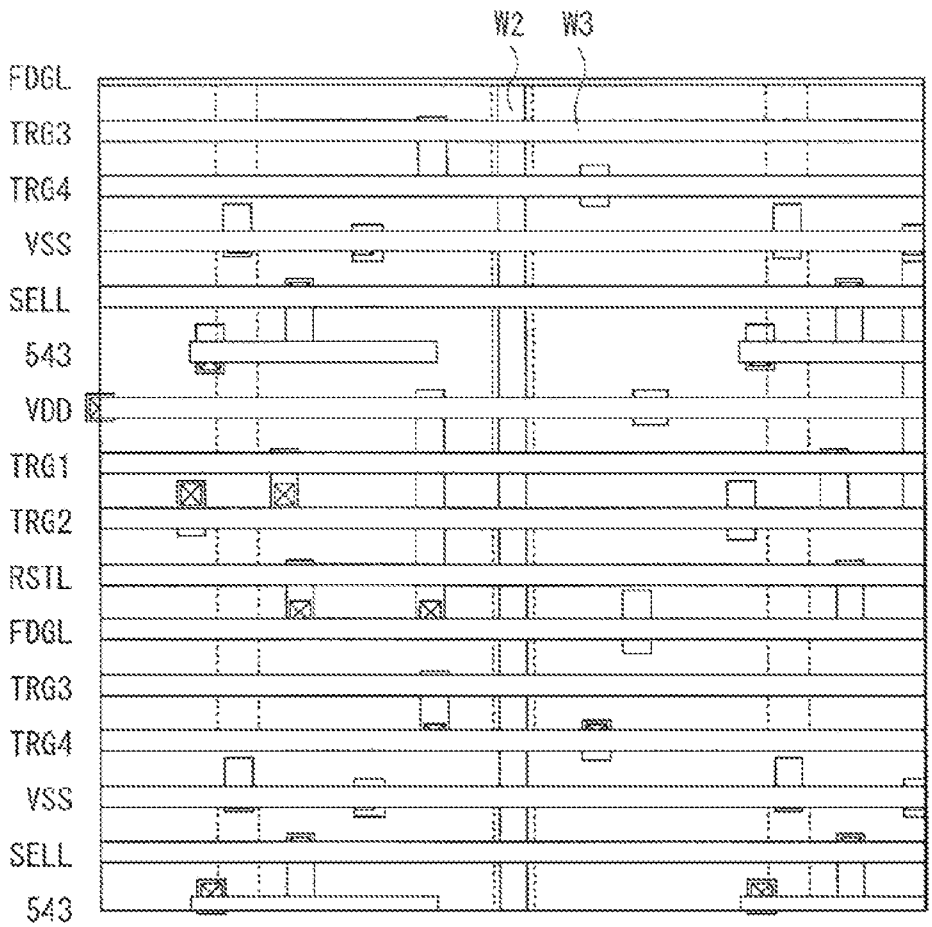
FIG. 66 is a schematic view of an example of a planar configuration of the third wiring layer together with the second wiring layer illustrated in FIG. 65.
Figure 67:
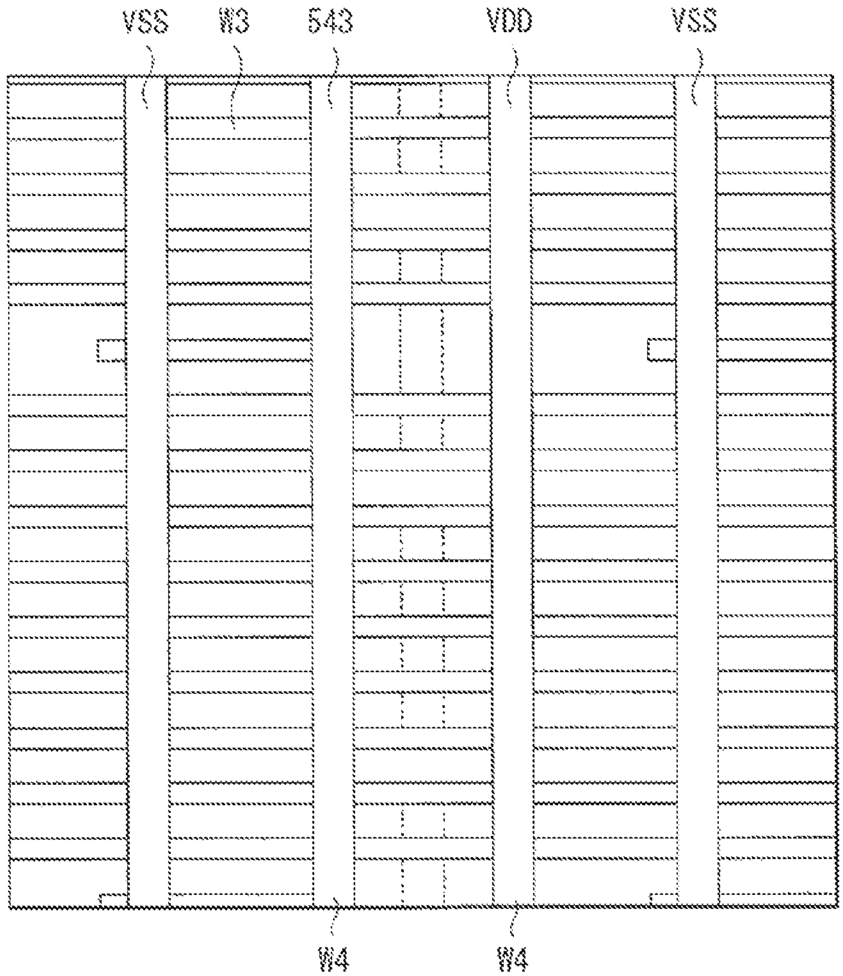
FIG. 67 is a schematic view of an example of a planar configuration of the fourth wiring layer together with the third wiring layer illustrated in FIG. 66.

FIGS. 62 to 67 illustrate a modification example of a planar configuration of the imaging device 1 according to the embodiment described above. FIG. 62 schematically illustrates a planar configuration of the first substrate 100, and corresponds to FIG. 7B described in the above embodiment. FIG. 63 schematically illustrates a planar configuration in proximity to the front surface of the semiconductor layer 200S of the second substrate 200, and corresponds to FIG. 8 described in the above embodiment. FIG. 64 schematically illustrates a configuration of each part of the first wiring layer W1, the semiconductor layer 200S coupled to the first wiring layer W1, and the first substrate 100, and corresponds to FIG. 11 described in the above embodiment. FIG. 65 illustrates an example of a planar configuration of the first wiring layer W1 and the second wiring layer W2, and corresponds to FIG. 12 described in the above embodiment. FIG. 66 illustrates an example of a planar configuration of the second wiring layer W2 and the third wiring layer W3, and corresponds to FIG. 13 described in the above embodiment. FIG. 67 illustrates an example of a planar configuration of the third wiring layer W3 and the fourth wiring layer W4, and corresponds to FIG. 14 described in the above embodiment.

In the present modification example, the semiconductor layer 200S of the second substrate 200 extends in the H direction (FIG. 64). That is, the present modification example substantially corresponds to a configuration obtained by rotating, by 90 degrees, the planar configuration of the imaging device 1 illustrated in FIG. 57 described above and the like.

For example, the pixel sharing unit 539 of the first substrate 100 is formed over a pixel region of two rows by two columns in a manner similar to that described in the above embodiment and has a substantially square planar shape (FIG. 62). For example, in each of the pixel sharing units 539, the transfer gates TG1 and TG2 of the pixel 541A and the pixel 541B in one pixel row extend in the V direction toward the middle portion of the pixel sharing unit 539, and the transfer gates TG3 and TG4 of the pixel 541C and the pixel 541D in the other pixel row extend in the V direction toward outside of the pixel sharing unit 539. The pad section 120 coupled to the floating diffusions FD is provided in the middle portion of the pixel sharing unit 539, and the pad section 121 coupled to the VSS contact regions 118 is provided at an end of the pixel sharing unit 539 at least in the V direction (in the H direction and the V direction in FIG. 62). On this occasion, the positions in the V direction of the through electrodes TGV1 and TGV2 of the transfer gates TG1 and TG2 are close to the position in the V direction of the through electrode 120E, and the positions in the V direction of the through electrodes TGV3 and TGV4 of the transfer gates TG3 and TG4 are close to the position in the V direction of the through electrode 121E (FIG. 64). Accordingly, it is possible to increase the width (the size in the V direction) of the semiconductor layer 200S extending in the H direction because of a reason similar to that described in the above embodiment. This makes it possible to increase the size of the amplification transistor AMP and suppress noise.

In each of the pixel circuits 200X, the selection transistor SEL and the amplification transistor AMP are disposed side by side in the H direction, and the reset transistor RST is disposed at a position adjacent in the V direction to the selection transistor SEL with the insulating region 212 interposed therebetween (FIG. 63). The FD conversion gain switching transistor FDG is disposed side by side in the H direction with the reset transistor RST. The VSS contact region 218 is provided in an island shape in the insulating region 212. For example, the third wiring layer W3 extends in the H direction (FIG. 66), and the fourth wiring layer W4 extends in the V direction (FIG. 67).

The imaging device 1 including such a second substrate 200 also achieves effects similar to those described in the above embodiment. The arrangement of the pixel sharing unit 539 of the second substrate 200 is not limited to the arrangements described in the above embodiment and the present modification example. The semiconductor layer 200S described in the above embodiment and the modification example 6 may extend in the H direction, for example.

10. Modification Example 9

Figure 68:
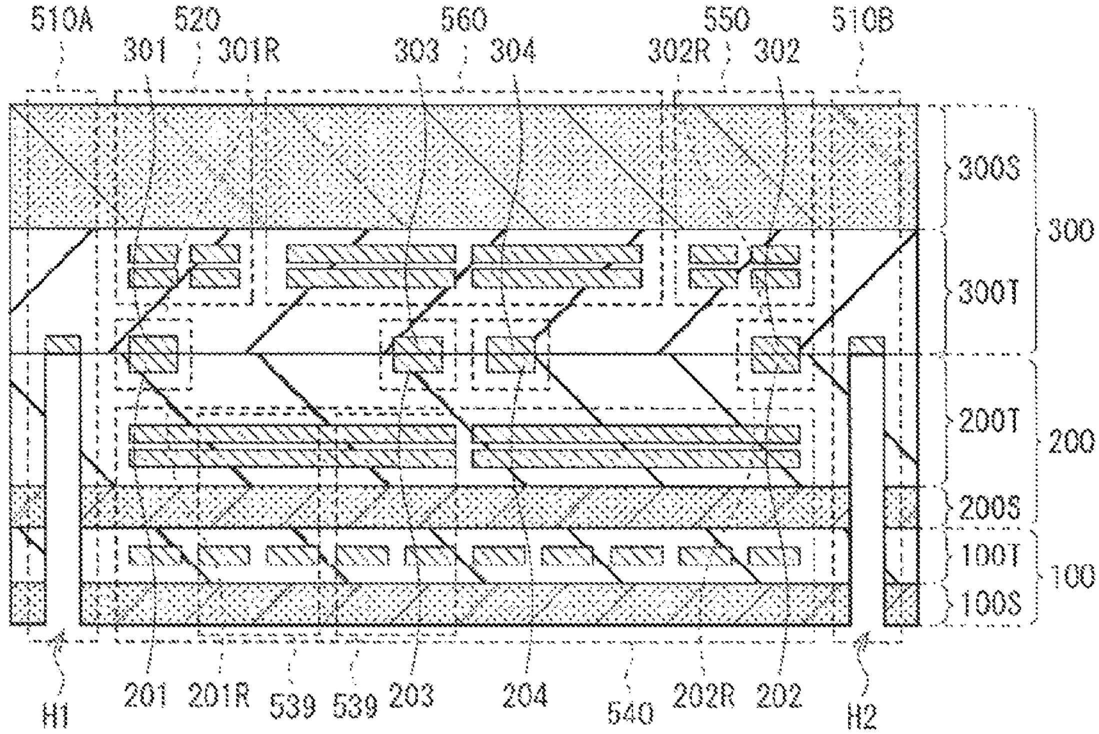
FIG. 68 is a schematic cross-sectional view of another example of the imaging device illustrated in FIG. 3.

FIG. 68 schematically illustrates a modification example of a cross-sectional configuration of the imaging device 1 according to the embodiment described above. FIG. 68 corresponds to FIG. 3 described in the above embodiment. In the present modification example, the imaging device 1 includes contact sections 203, 204, 303, and 304 at positions opposed to the middle portion of the pixel array section 540 in addition to the contact sections 201, 202, 301, and 302. The imaging device 1 according to the present modification example differs from the imaging device 1 described in the above embodiment in this point.

The contact sections 203 and 204 are provided in the second substrate 200, and are exposed to a bonding surface with the third substrate 300. The contact sections 303 and 304 are provided in the third substrate 300, and are exposed to a bonding surface with the second substrate 200. The contact section 203 is in contact with the contact section 303, and the contact section 204 is in contact with the contact section 304. That is, in the imaging device 1, the second substrate 200 and the third substrate 300 are coupled to each other by the contact sections 203, 204, 303, and 304 in addition to the contact sections 201, 202, 301, and 302.

Figure 69:
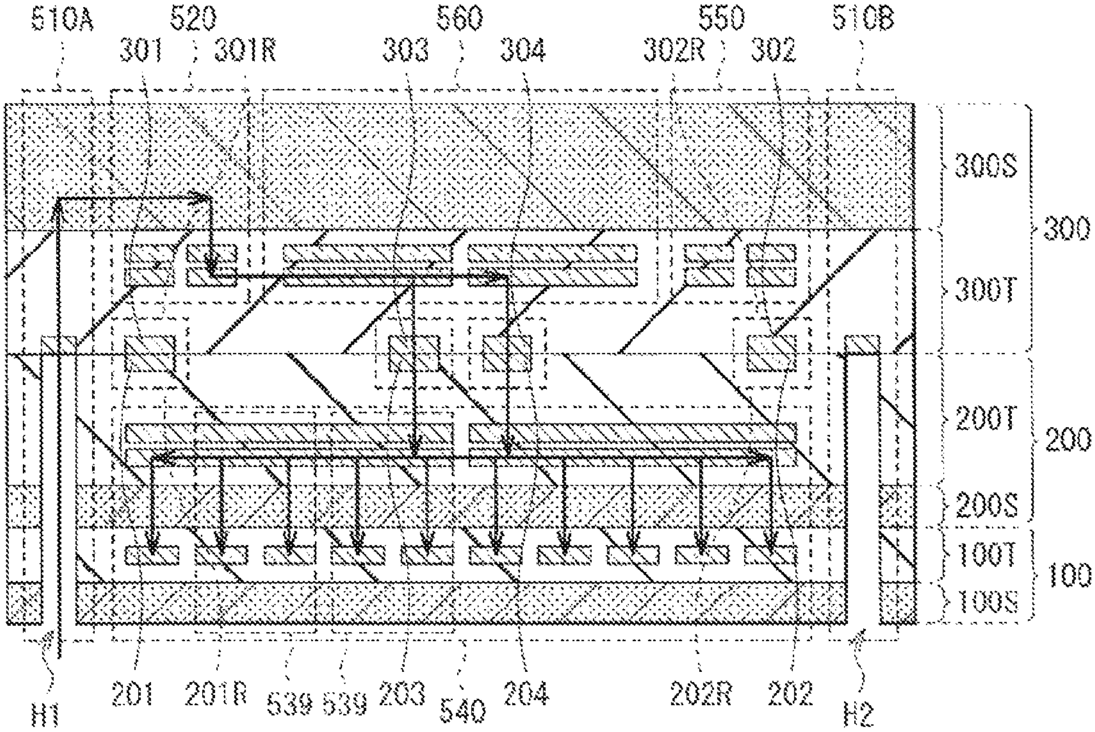
FIG. 69 is a schematic view for describing paths of an input signal and the like to the imaging device illustrated in FIG. 68.
Figure 70:
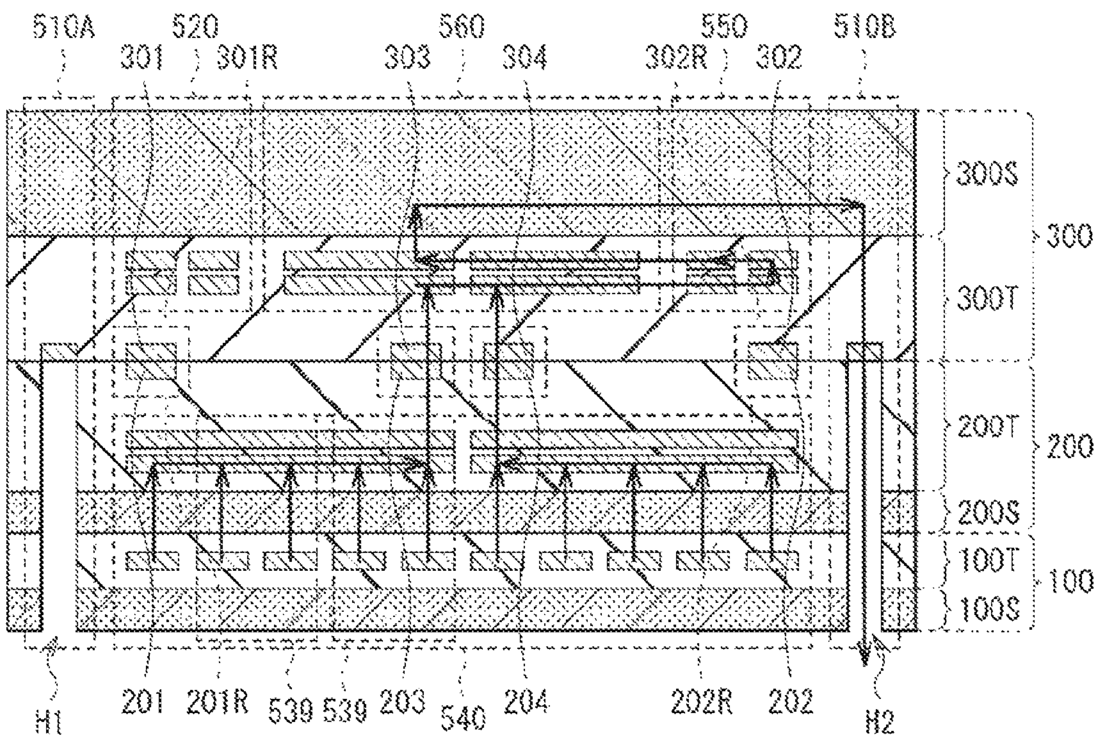
FIG. 70 is a schematic view for describing a signal path of a pixel signal of the imaging device illustrated in FIG. 68.

Next, an operation of the imaging device 1 is described with use of FIGS. 69 and 70. FIG. 69 illustrates paths, indicated by arrows, of an input signal to be inputted from outside to the imaging device 1, a power source potential and a reference potential. FIG. 70 illustrates a signal path, indicated by arrows, of a pixel signal to be outputted from the imaging device 1 to outside. For example, the input signal inputted to the imaging device 1 through the input section 510A is transmitted to the row driving section 520 of the third substrate 300, and row drive signals are generated in the row driving section 520. The row drive signals are transmitted to the second substrate 200 through the contact sections 303 and 203. Furthermore, the row drive signals reach each of the pixel sharing units 539 of the pixel array section 540 through the row drive signal lines 542 in the wiring layer 200T. A drive signal other than a drive signal of the transfer gate TG among the row drive signals having reached the pixel sharing unit 539 of the second substrate 200 is inputted to the pixel circuit 200X to drive each of the transistors included in the pixel circuit 200X. The drive signal of the transfer gate TG is inputted to the transfer gates TG1, TG2, TG3, and TG4 of the first substrate 100 through the through electrodes TGV to drive the pixels 541A, 541B, 541C, and 541D. In addition, the power source potential and the reference potential supplied from outside of the imaging device 1 to the input section 510A (the input terminal 511) of the third substrate 300 are transmitted to the second substrate 200 through the contact sections 303 and 203 to be supplied to the pixel circuit 200X of each of the pixel sharing units 539 through a wiring line in the wiring layer 200T. The reference potential is also supplied to the pixels 541A, 541B, 541C, and 541D of the first substrate 100 through the through electrodes 121E. Meanwhile, the pixel signals photoelectrically converted in the pixels 541A, 541B, 541C, and 541D of the first substrate 100 are transmitted to the pixel circuit 200X of the second substrate 200 for each pixel sharing unit 539. A pixel signal based on the pixel signal is transmitted from the pixel circuit 200X to the third substrate 300 through the vertical signal line 543 and the contact sections 204 and 304. The pixel signal is processed in the column signal processor 550 and the image signal processor 560 of the third substrate 300, and then outputted to outside through the output section 510B.

The imaging device 1 including such contact sections 203, 204, 303, and 304 also achieves effects similar to those described in the above embodiment. it is possible to change the positions, the number and the like of contact sections, which are coupling targets of wiring lines through the contact sections 303 and 304, depending on design of a circuit and the like of the third substrate 300.

11. Modification Example 10

Figure 71:
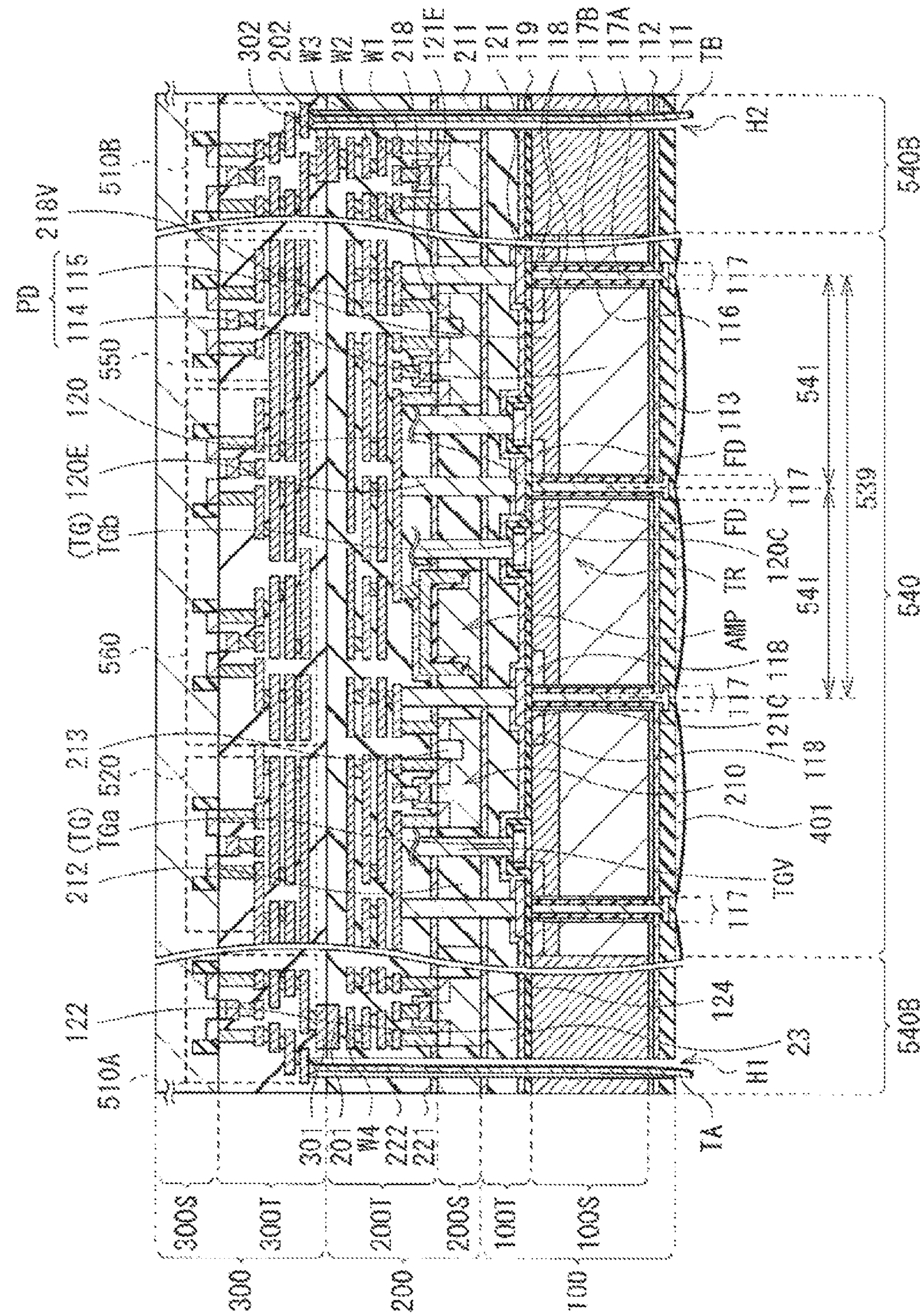
FIG. 71 is a schematic cross-sectional view of another example of the imaging device illustrated in FIG. 6.

FIG. 71 illustrates a modification example of a cross-sectional configuration of the imaging device 1 according to the embodiment described above. FIG. 71 corresponds to FIG. 6 described in the above embodiment. In the present modification example, the transfer transistor TR having a planar structure is provided in the first substrate 100. The imaging device 1 according to the present modification example differs from the imaging device 1 described in the above embodiment in this point.

The transfer transistor TR includes the transfer gate TG including only the horizontal portion TGb. In other words, the transfer gate TG does not include the vertical portion TGa, and is provided opposed to the semiconductor layer 100S.

The imaging device 1 including the transfer transistor TR having such a planar structure also achieves effects similar to those described in the above embodiment. Furthermore, it is conceivable that the planar transfer gate TG is provided in the first substrate 100 to form the photodiode PD closer to the front surface of the semiconductor layer 100S as compared with a case where the vertical transfer gate TG is provided in the first substrate 100, thereby increasing a saturation signal amount (Qs). In addition, it is conceivable that a method of forming the planar transfer gate TG in the first substrate 100 has a smaller number of manufacturing processes as compared with a method of forming the vertical transfer gate TG in the first substrate 100, which hinders an adverse influence on the photodiode PD due to the manufacturing processes.

12. Modification Example 11

Figure 72:
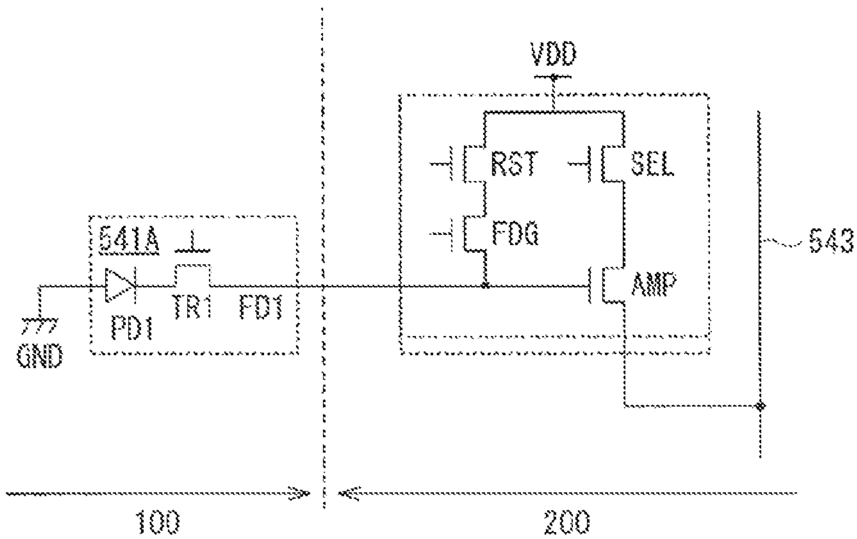
FIG. 72 is a diagram illustrating another example of an equivalent circuit illustrated in FIG. 4.

FIG. 72 illustrates a modification example of the pixel circuit of the imaging device according to the embodiment described above. FIG. 72 corresponds to FIG. 4 described in the above embodiment. In the present modification example, the pixel circuit 200X is provided for each pixel (pixel 541A). That is, the pixel circuit 200X is not shared by a plurality of pixels. The imaging device 1 according to the present modification example differs from the imaging device 1 described in the above embodiment in this point.

The imaging device 1 according to the present modification example is the same as the imaging device 1 described in the above embodiment in that the pixels 541A and the pixel circuits 200X are provided in mutually different substrates (the first substrate 100 and the second substrate 200). Accordingly, the imaging device 1 according to the present modification example is also able to achieve effects similar to those described in the above embodiment.

13. Modification Example 12

Figure 73:
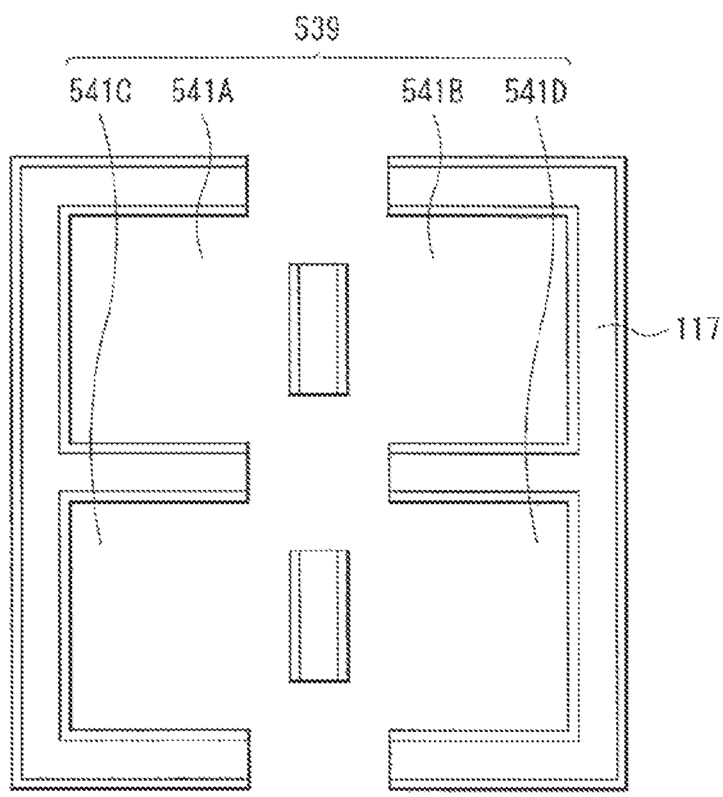

FIG. 73 illustrates a modification example of a planar configuration of the pixel separation section 117 described in the above embodiment. A clearance may be provided in the pixel separation section 117 that surrounds each of the pixels 541A, 541B, 541C, and 541D. That is, the entire periphery of each of the pixels 541A, 541B, 541C, and 541D may not be surrounded by the pixel separation section 117. For example, clearances of the pixel separation section 117 are provided in proximity to the pad sections 120 and 121 (see FIG. 7B).

In the embodiment described above, description has been given of an example in which the pixel separation section 117 has the FTI structure that penetrates through the semiconductor layer 100S (see FIG. 6); however, the pixel separation section 117 may have a structure other than the FTI structure. For example, the pixel separation section 117 may not be provided to completely penetrate through the semiconductor layer 100S, and may have a so-called DTI (Deep Trench Isolation) structure.

14. Modification Example 13

Figure 74:
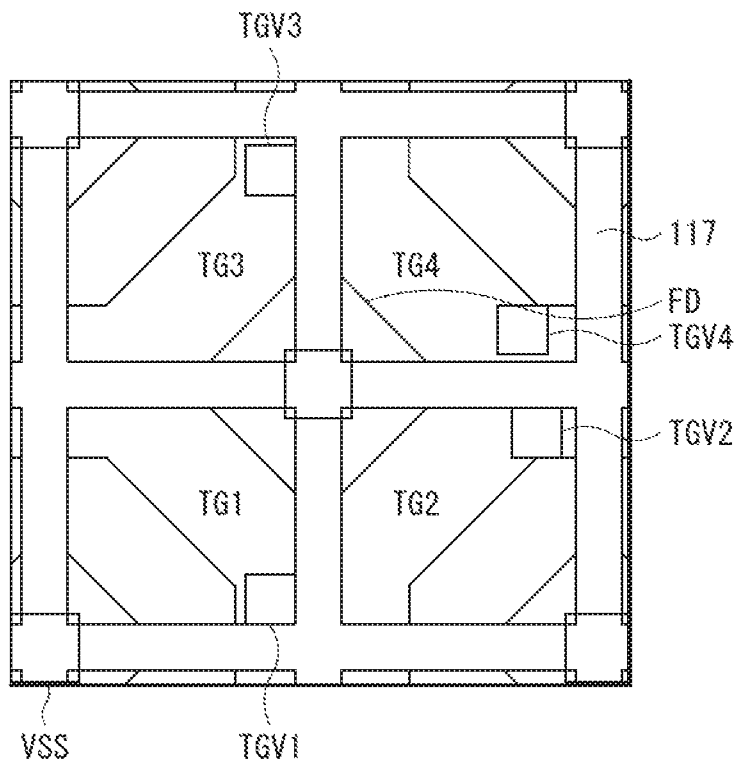
FIG. 74 is a schematic view of a modification example of the planar configuration of the first substrate illustrated in FIG. 7A.
Figure 75:
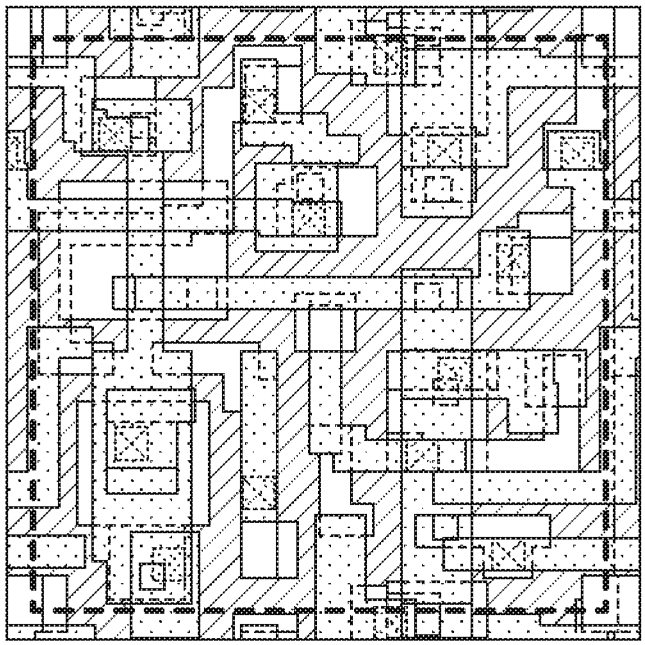
FIG. 75 is a schematic view of an example of a planar configuration of the first wiring layer and the second wiring layer with respect to the first substrate illustrated in FIG. 74.
Figure 76:
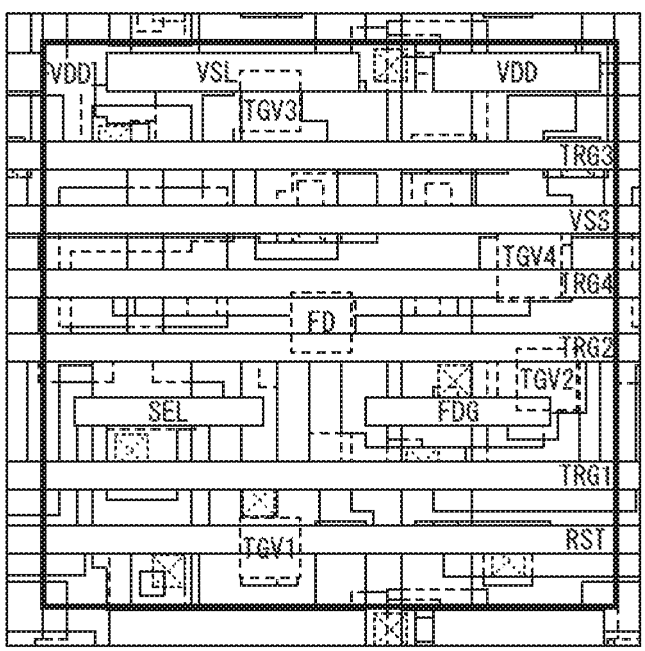
FIG. 76 is a schematic view of an example of a planar configuration of the second wiring layer and the third wiring layer with respect to the first substrate illustrated in FIG. 74.

FIG. 74 schematically illustrates a modification example of a planar configuration of main parts of the first substrate 100 and the second substrate 200 of the imaging device 1 according to the embodiment described above. FIG. 75 schematically illustrates a modification example of a planar configuration of the first wiring layer W1 and the second wiring layer W2. FIG. 76 schematically illustrates a modification example of a planar configuration of the second wiring layer W2 and the third wiring layer W3. The present modification example differs from the imaging device 1 described in the above embodiment in that the through electrodes TGV are disposed asymmetrically in the pixel sharing unit 539.

Figure 77:
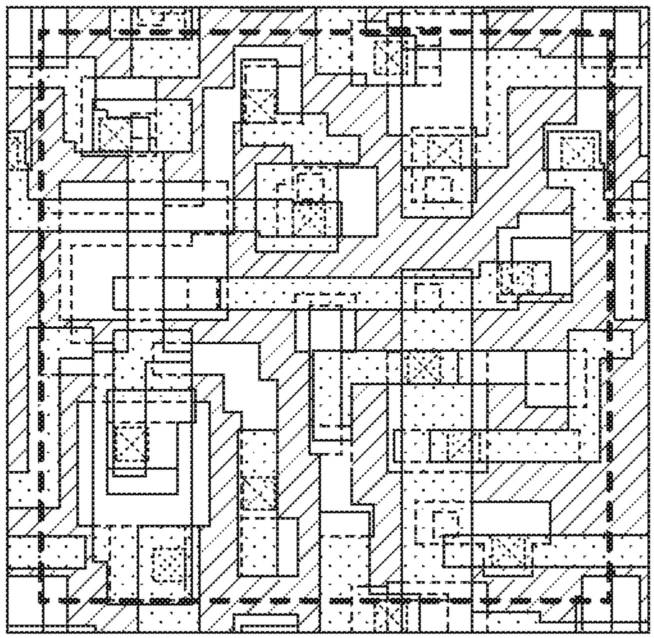
FIG. 77 is a schematic view of another example of the planar configuration of the first wiring layer and the second wiring layer with respect to the first substrate illustrated in FIG. 74.
Figure 78:
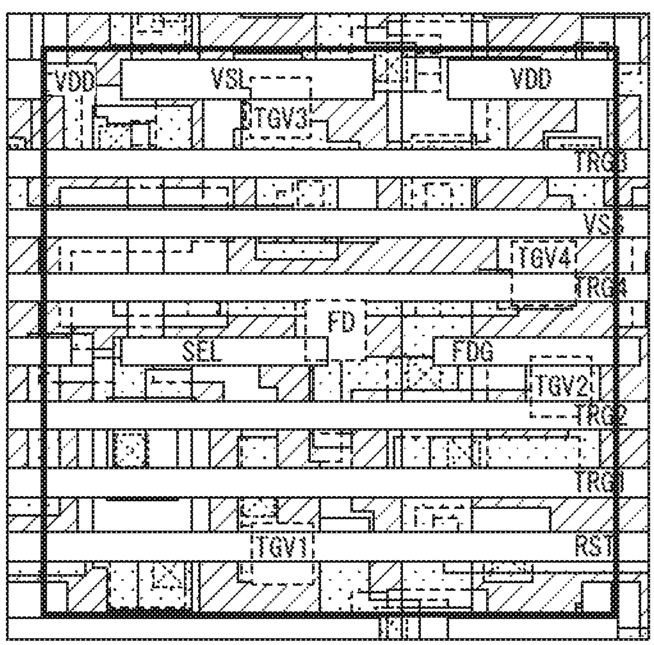
FIG. 78 is a schematic view of another example of the planar configuration of the second wiring layer and the third wiring layer with respect to the first substrate illustrated in FIG. 74.

Furthermore, as illustrated in FIGS. 77 and 78, replacing the wiring line TRG2 with wiring lines (indicated by SEL and FDG in FIGS. 76 and 78) coupled to the selection transistor SEL and the FD conversion gain switching transistor FDG makes it possible to further reduce a capacitance between wiring lines.

Asymmetrically disposing the through electrodes TGV in the pixel sharing unit 539 in such a manner makes it possible to reduce capacitances between the wiring lines TRG1, TRG2, TRG3, TRG4, SELL, RSTL, and FDGL that extend in one direction (e.g., the H direction) and are formed in the third wiring layer W3. This makes it possible to prevent a loss in the saturation signal amount Qs resulting from potential deepening and a decrease in a barrier from a sensor pixel to the floating diffusion FD, by an influence of a readout electrode of an readout pixel, under a readout electrode of an adjacent non-readout pixel.

Furthermore, disposing respective wiring lines coupled to the selection transistor SEL and the FD conversion gain switching transistor FDG between the through electrodes TGV (e.g., the through electrode TGV2 and the through electrode TGV4) close to each other in the pixel sharing unit 539 makes it possible to decrease a capacitance between the wiring line TRG2 and the wiring line TRG4 between which an inter-wiring capacitance becomes the largest.

15. Modification Example 14

In the imaging device 1, in general, the semiconductor layer 200S in which pixel transistors (the amplification transistor AMP, the selection transistor SEL, the reset transistor RST, and the FD conversion gain switching transistor FDG) are formed has, for example, a structure in which two semiconductor layers 200S are disposed side by side in each of the pixel sharing units 539; however, in the semiconductor layer 200S below a transistor having a three-dimensional structure (e.g., the amplification transistor AMP illustrated in FIG. 80), a depletion layer may expand more than expected, which may cause, for example, the selection transistor SEL to be isolated and not coupled to a well. Accordingly, it is preferable that a well contact region 217 be provided in the semiconductor layer 200S.

Figure 79:
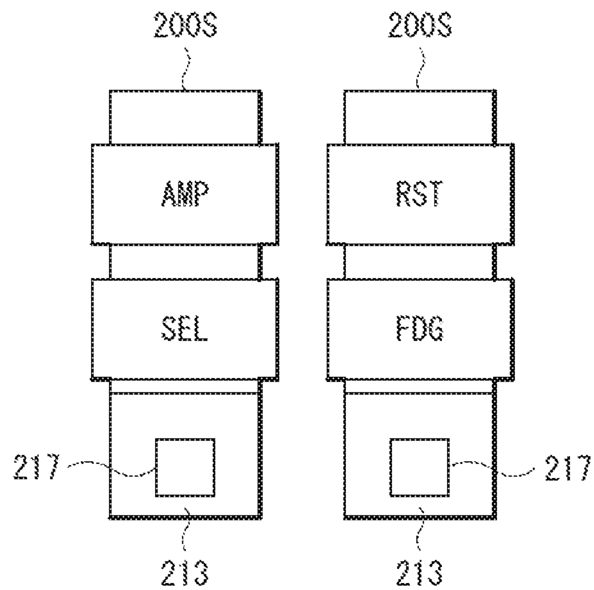
FIG. 79 is a schematic view of an example of a layout of a second substrate according to a modification example 14 of the present disclosure.
Figure 80:
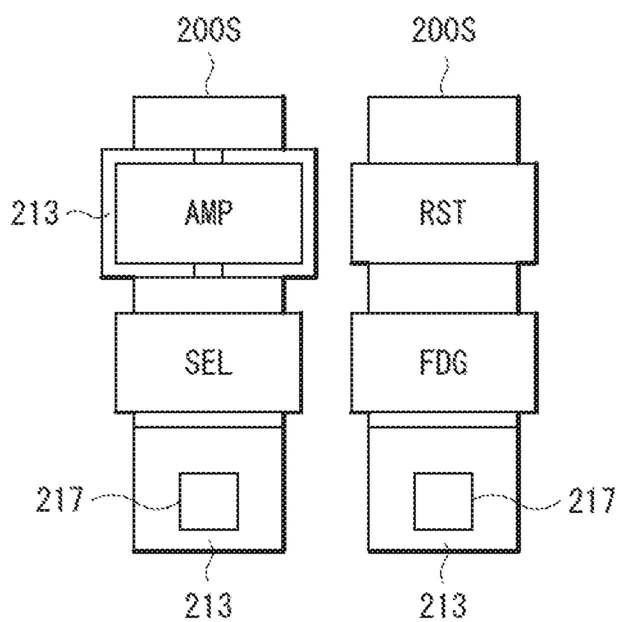
FIG. 80 is a schematic view of another layout of the second substrate according to the modification example 14 of the present disclosure.

FIG. 79 illustrates a modification example of a planar configuration of the semiconductor layer 200S of the imaging device 1 according to the embodiment described above. For example, the well contact region 217 may be provided in each of two semiconductor layers 200S arranged side by side. This makes it possible to individually apply a voltage to each of the two semiconductor layers 200S, which makes it possible to avoid a substrate bias effect and improve linearity. In addition, on this occasion, the amplification transistor AMP is not limited to a planar type (FIG. 79), and may have a three-dimensional structure such as a fin (Fin) type as illustrated in FIG. 80.

Figure 81:
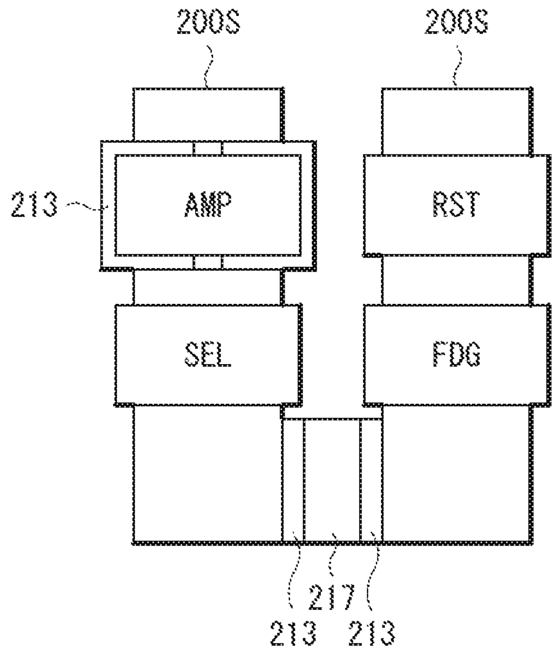
FIG. 81 is a schematic view of another layout of the second substrate according to the modification example 14 of the present disclosure.

FIG. 81 illustrates a modification example of a planar configuration of the semiconductor layer 200S of the imaging device 1 according to the embodiment described above. For example, the well contact region 217 may be provided between two semiconductor layers arranged side by side, and the one well contact region 217 may be shared by the two semiconductor layers 200S. This makes it possible to reduce the well contact region 217 formed in two semiconductor layers 200S arranged side by side, thereby making it possible to increase the size of each pixel transistor.

Figure 82:
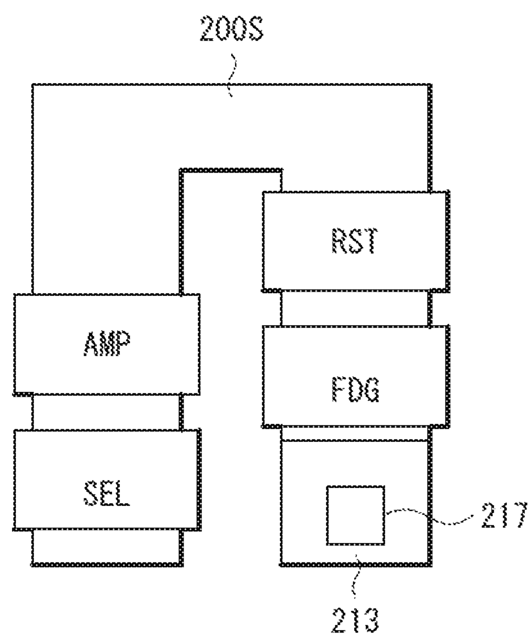
FIG. 82 is a schematic view of another layout of the second substrate according to the modification example 14 of the present disclosure.
Figure 83:
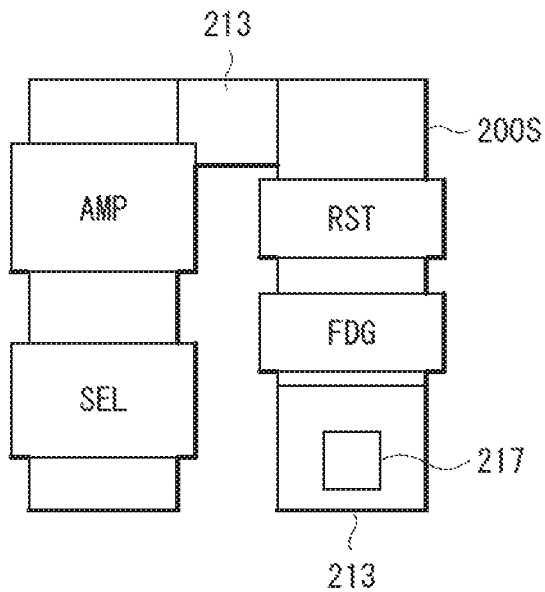
FIG. 83 is a schematic view of another layout of the second substrate according to the modification example 14 of the present disclosure.

FIG. 82 illustrates a modification example of a planar configuration of the semiconductor layer 200S of the imaging device 1 according to the embodiment described above. For example, the well contact region 217 may be provided in one of two semiconductor layers 200S arranged side by side and the two semiconductor layers 200S may be coupled to each other. In addition, in this case, the two semiconductor layers 200S may be coupled to each other by the element separation region 213 as illustrated in FIG. 83, for example.

Figure 84:
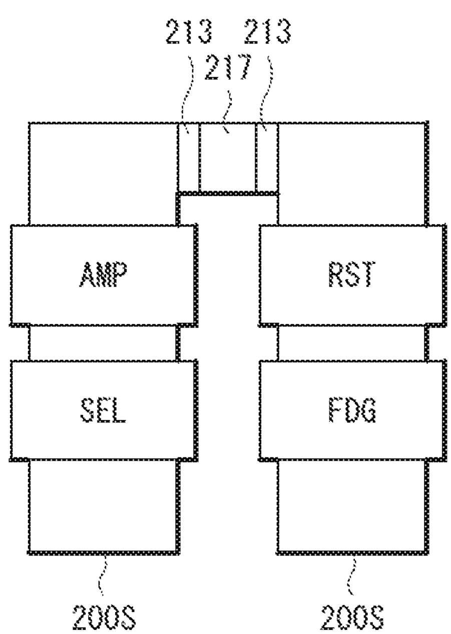
FIG. 84 is a schematic view of another layout of the second substrate according to the modification example 14 of the present disclosure.

FIG. 84 illustrates a modification example of a planar configuration of the semiconductor layer 200S of the imaging device 1 according to the embodiment described above. For example, the well contact region 217 may be provided between two semiconductor layers 200S arranged side by side, and portions without GP of the semiconductor layers 200S may be coupled to each other. This makes it possible to increase the size of each pixel transistor, as compared with a case where the well contact region 217 is provided in one of two semiconductor layers 200S, as illustrated in FIGS. 82 and 83.

Figure 85:
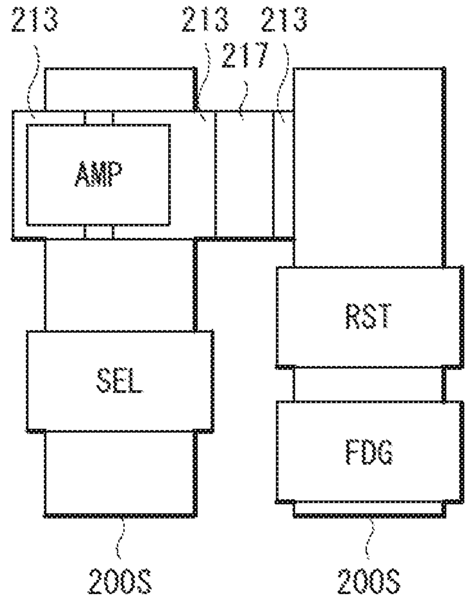
FIG. 85 is a schematic view of another layout of the second substrate according to the modification example 14 of the present disclosure.

FIG. 85 illustrates a modification example of a planar configuration of the semiconductor layer 200S of the imaging device 1 according to the embodiment described above. For example, the well contact region 217 may be provided between two semiconductor layers arranged side by side. In FIG. 85, the well contact region 217 is coupled to the two semiconductor layers 200S arranged side by side by the element separation region 213 overlapping GPs of the two semiconductor layers 200S. This makes it possible to increase the size of each pixel transistor.

Figure 86:
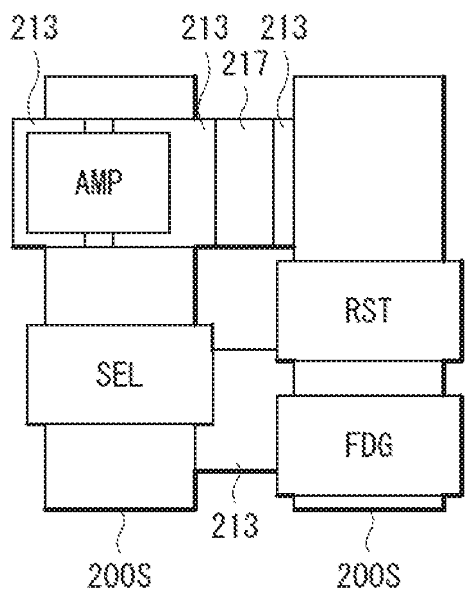
FIG. 86 is a schematic view of another layout of the second substrate according to the modification example 14 of the present disclosure.

FIG. 86 illustrates a modification example of a planar configuration of the semiconductor layer 200S of the imaging device 1 according to the embodiment described above. For example, the well contact region 217 may be provided between two semiconductor layers arranged side by side similarly to FIG. 85, and for coupling between the two semiconductor layers 200S, in addition to coupling by the element separation regions 213 overlapping the GPs, the element separation region 213 overlapping GPs may be further provided and the two semiconductor layers 200S may be coupled to each other by the element separation region 213. This makes it possible to further reduce a possibility that each pixel transistor and a well are not coupled to each other.

Figure 87:
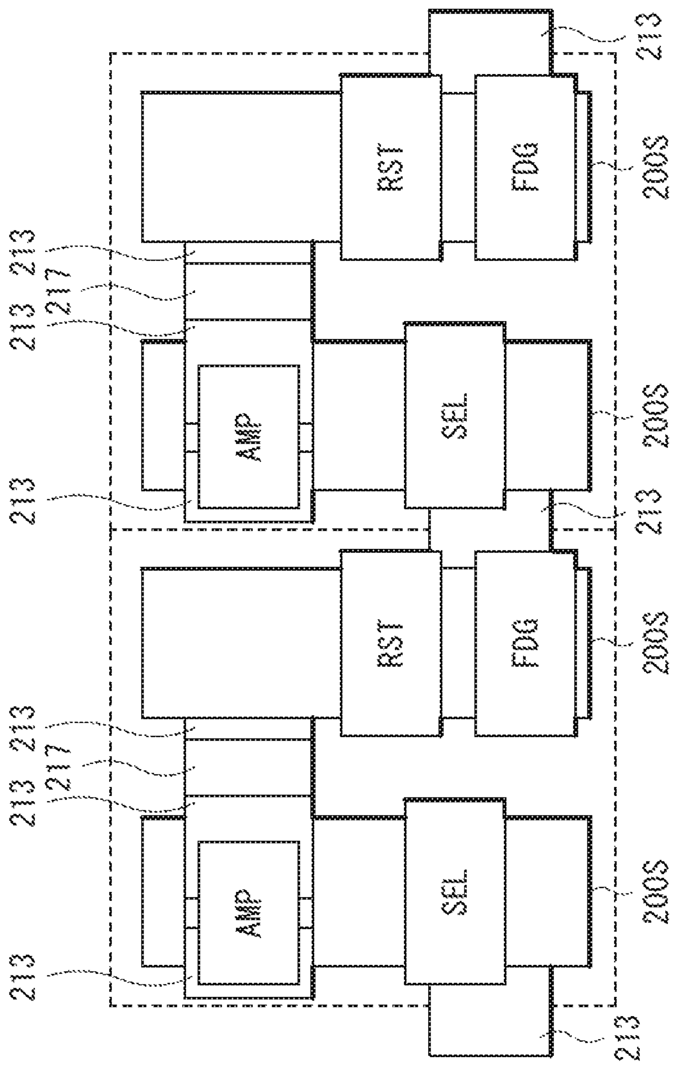
FIG. 87 is a schematic view of another layout of the second substrate according to the modification example 14 of the present disclosure.

FIG. 87 illustrates a modification example of a planar configuration of the semiconductor layer 200S of the imaging device 1 according to the embodiment described above. For example, the well contact region 217 may be provided between two semiconductor layers arranged side by side in the pixel sharing unit 539 and the two semiconductor layers 200S arranged side by side may be coupled to each other by the element separation regions 213 overlapping the GPs of the two semiconductor layers 200S, and in adjacent pixel sharing units 539, the semiconductor layer 200S of one pixel sharing unit 539 and the semiconductor layer 200S of the pixel sharing unit 539 adjacent to the one pixel sharing unit 539 may be coupled to each other by the element separation region 213 overlapping the GPs.

Figure 88:
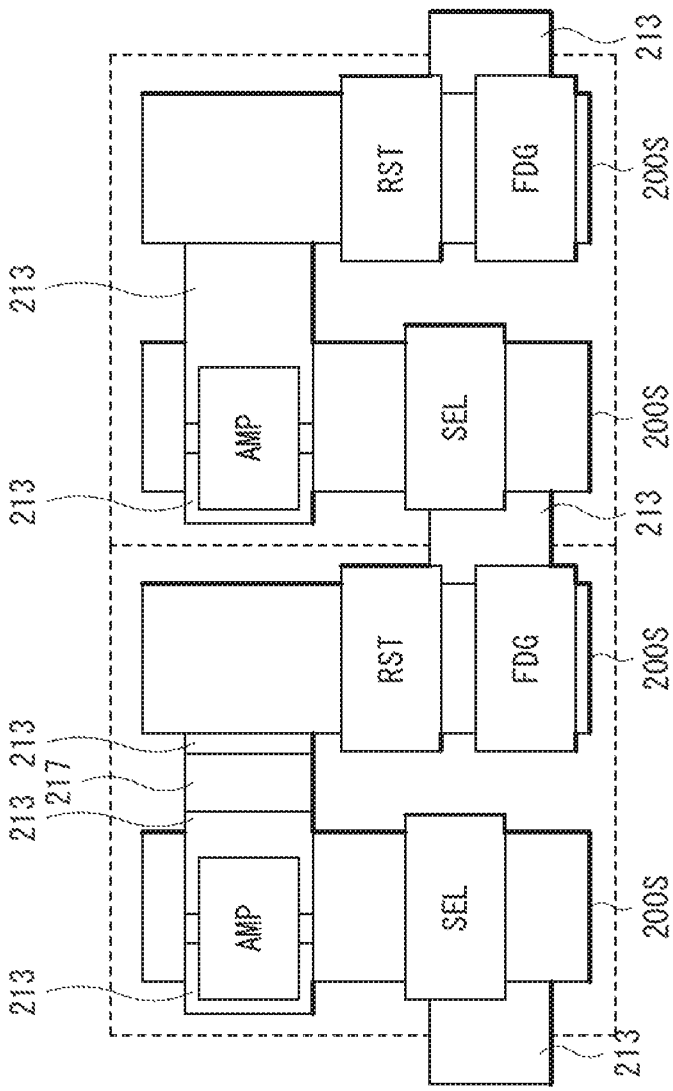
FIG. 88 is a schematic view of another layout of the second substrate according to the modification example 14 of the present disclosure.

FIG. 88 illustrates a modification example of a planar configuration of the semiconductor layer 200S of the imaging device 1 according to the embodiment described above. FIG. 87 illustrates an example in which the well contact region 217 is provided in each of two pixel sharing units 539 coupled to each other by the element separation region 213; however, the well contact region 217 may be provided in only one of the pixel sharing units 539.

Figure 89:
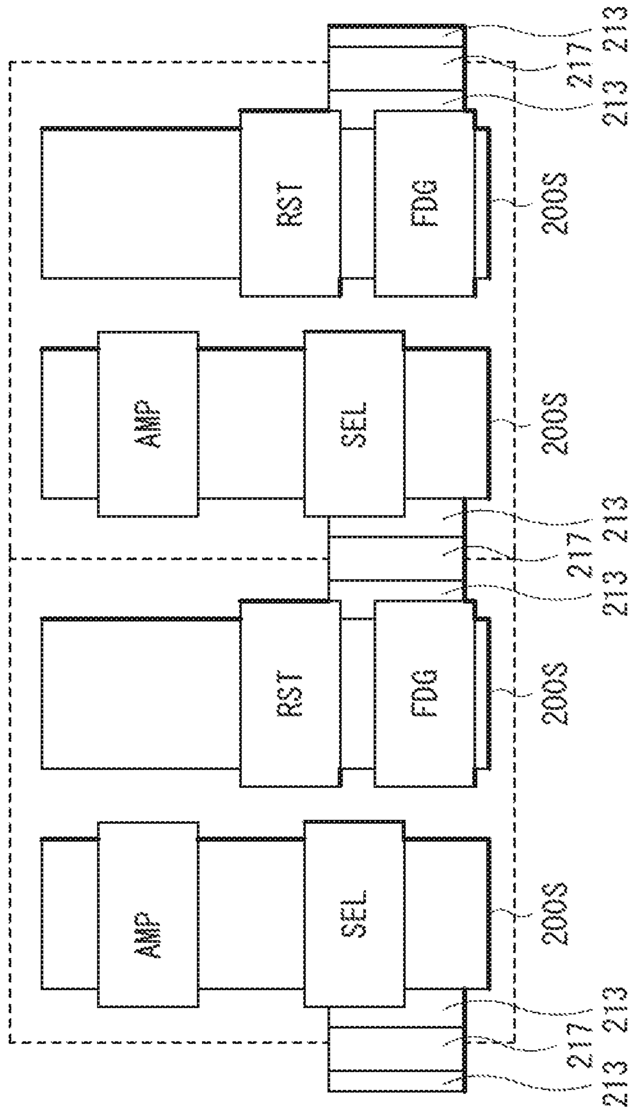
FIG. 89 is a schematic view of another layout of the second substrate according to the modification example 14 of the present disclosure.

FIG. 89 illustrates a modification example of a planar configuration of the semiconductor layer 200S of the imaging device 1 according to the embodiment described above. The well contact region 217 shared by two semiconductor layers 200S is not necessarily shared by two semiconductor layers 200S in the pixel sharing unit 539, and may be shared by two semiconductor layers 200S of the pixel sharing units 539 adjacent to each other, for example, as illustrated in FIG. 89.

16. Modification Example 15

Figure 90:
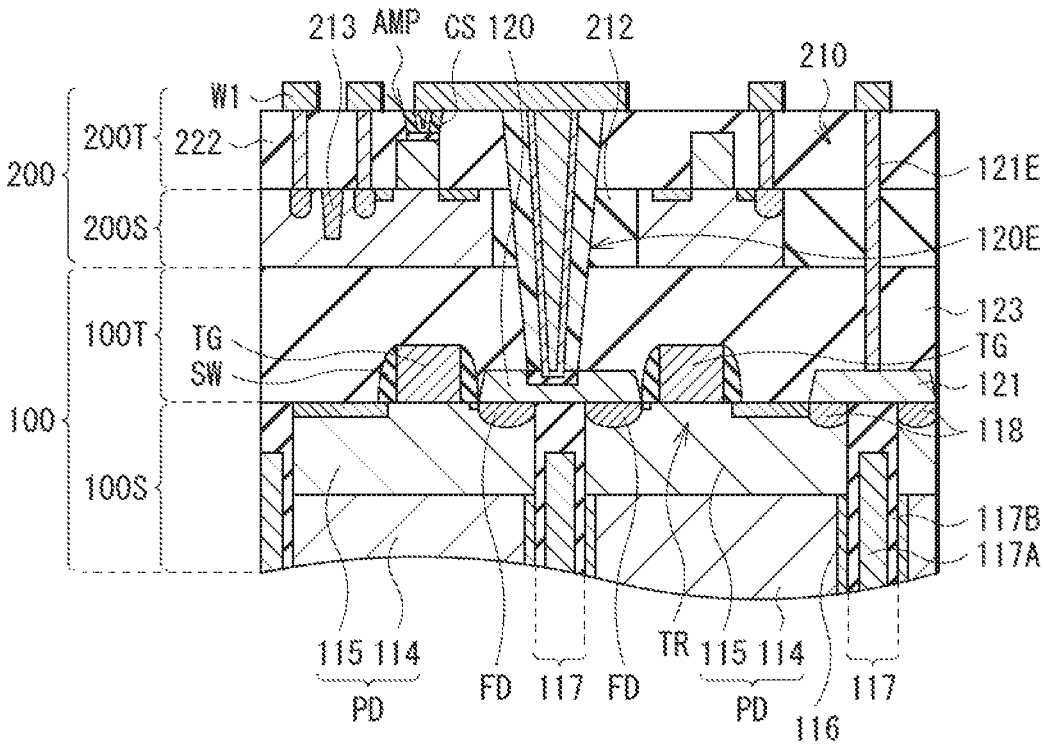
FIG. 90 is a schematic view of an example of a cross-sectional configuration of main parts of a first substrate and a second substrate according to a modification example 15 of the present disclosure.
Figure 91:
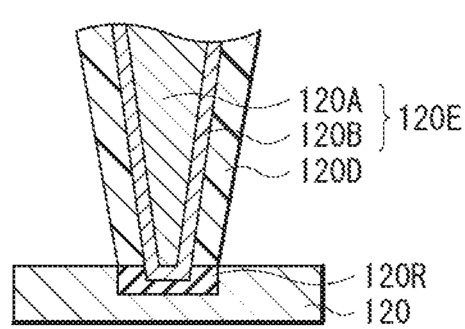
FIG. 91 is an enlarged view of a coupling portion between a pad section and a through electrode illustrated in FIG. 90.

FIG. 90 illustrates a modification example of a cross-sectional configuration of the coupling wiring line CS between the through electrode 120E that electrically couples the first substrate 100 and the second substrate 200 to each other, and the pixel transistor (e.g., the amplification transistor AMP) in the imaging device 1 according to the embodiment described above. FIG. 91 illustrates an enlarged view of a coupling portion between the through electrode 120E and the pad section 120 illustrated in FIG. 90.

It is possible to form the through electrode 120E and the coupling wiring line CS of the present modification example as follows. It is to be noted that the through electrode 120E is described below as an example; however, it is possible to form the coupling wiring line CS similarly.

As described above, for the through electrode 120E, the interlayer insulating film 222 and the passivation film 221 are dry-etched with use of a pattern of a resist film 231 to form the coupling hole 120H. On this occasion, the coupling hole 120H is formed to have a hole diameter larger than the diameter of the desired through electrode 120E. Next, after a metal film including titanium (Ti), cobalt (Co), nickel (Ni), or the like is formed down to a bottom of the coupling hole 120H by, for example, sputtering, annealing treatment is performed to alloy polysilicon (Poly Si) of the pad section 120 exposed to a bottom surface of the coupling hole 120H. Next, an unreacted metal film is removed by wet etching. Subsequently, an oxide film is formed in the coupling hole 12H with use of, for example, atomic layer deposition (ALD) method to cause the coupling hole 120H to have a desired hole diameter. Next, the oxide film formed on the bottom portion of the coupling hole 120H is removed by etching-back. Thereafter, for example, a titanium nitride (TiN) film (barrier metal) and a tungsten (W) film are formed in this order respectively with use of the ALD method and a chemical vapor deposition (CVD) method, and then a front surface is planarized by chemical mechanical polishing (CMP). Thus, the through electrode 120E illustrated in FIG. 90 is formed.

In the through electrode 120E and the coupling wiring line CS formed as described above, for example, a TiN film 120B is formed as a barrier metal around a W film 120A, and an oxide film 120D is formed around the TiN film 120B. In addition, an alloy region 120R having a diameter larger than those of the through electrode 120E and the coupling wiring line CS is formed in each of a coupling section with the pad section 120 coupled to the through electrode 120E and a coupling section with the gate of the amplification transistor AMP coupled to the coupling wiring line CS. Furthermore, a coupling section between the through electrode 120E and the alloy region 120R and a coupling section between the coupling wiring line CS and the alloy region 120R are partially removed by etching back.

In the through electrode 120E and the coupling wiring line CS having such a configuration, the hole diameter of a coupling hole (e.g., the coupling hole 120H) for processing of an interlayer insulating film (e.g., the interlayer insulating film 222 and the passivation film 221) is increased, which makes it possible to form a thick metal film including Ti or the like formed in the bottom portion of the coupling hole 120H. This makes it possible to suppress a Ti sputtering amount, thereby making it possible to suppress a W volcano (reaction between $WF_6$ and Ti). In addition, Ti is not present on a side surface of each of a coupling section between the through electrode 120E and the alloy region 120R and a coupling section between the coupling wiring line CS and the alloy region 120R, which makes it possible to decrease resistance of the coupling sections. In addition, it is possible to suppress a white spot due to metal contamination.

Figure 92:
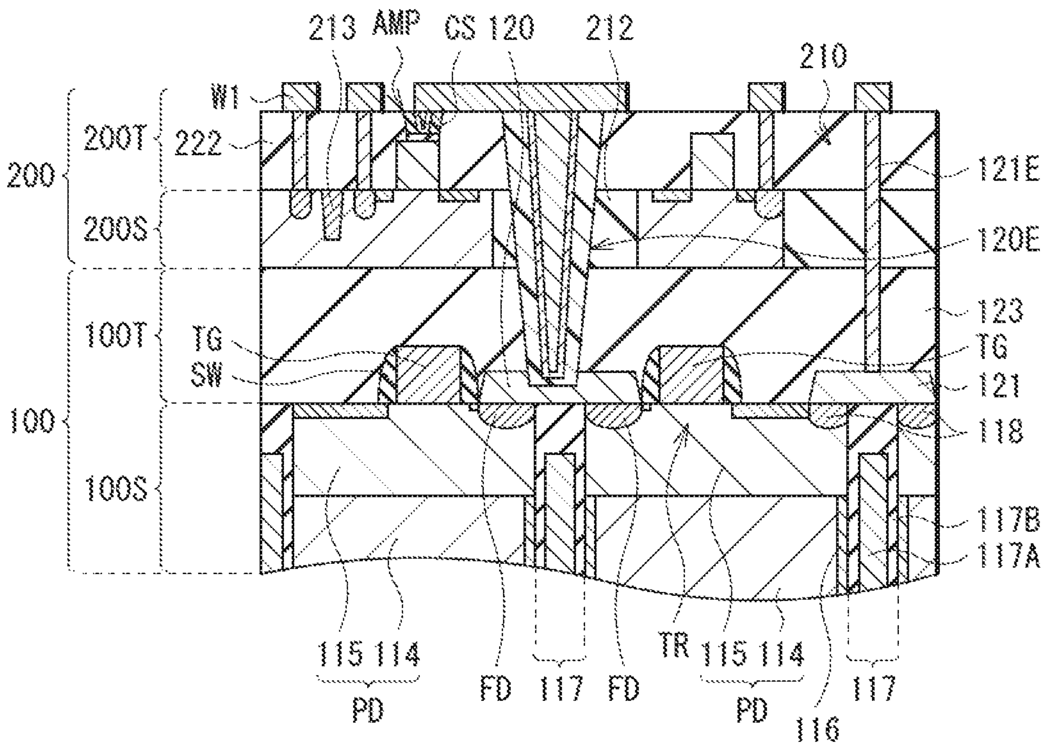
FIG. 92 is a schematic view of another example of the cross-sectional configuration of the main parts of the first substrate and the second substrate according to the modification example 15 of the present disclosure.

Besides this, the structures of the through electrode 120E and the coupling wiring line CS may be, for example, a configuration as illustrated in FIG. 92. It is possible to form the structures of the through electrode 120E and the coupling wiring line CS illustrated in FIG. 92 as follows. After a metal film including Ti, Co, Ni. or the like is formed on a side surface and a bottom surface of a coupling hole (e.g., the coupling hole 120H) with use of the ALD method, annealing treatment is performed to alloy polysilicon (Poly Si) of the pad section 120 in the bottom portion of the coupling hole 120H. Next, a TiN film and a tungsten (W) film are formed in the coupling hole 120H in this order respectively with use of the ALD method and the CVD method, and then a front surface is planarized by CMP. Thus, the through electrode 120E illustrated in FIG. 92 is formed.

17. Modification Example 16

Figure 93:
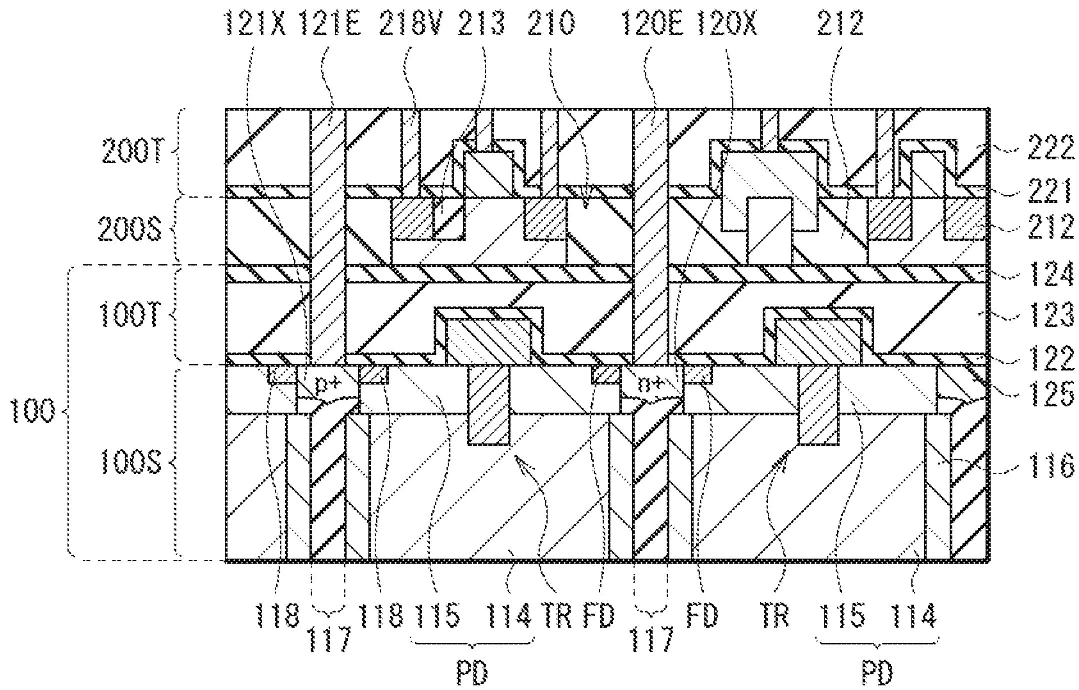
FIG. 93 is a schematic view of an example of a cross-sectional configuration of main parts of a first substrate and a second substrate according to a modification example 16 of the present disclosure.
Figure 94:
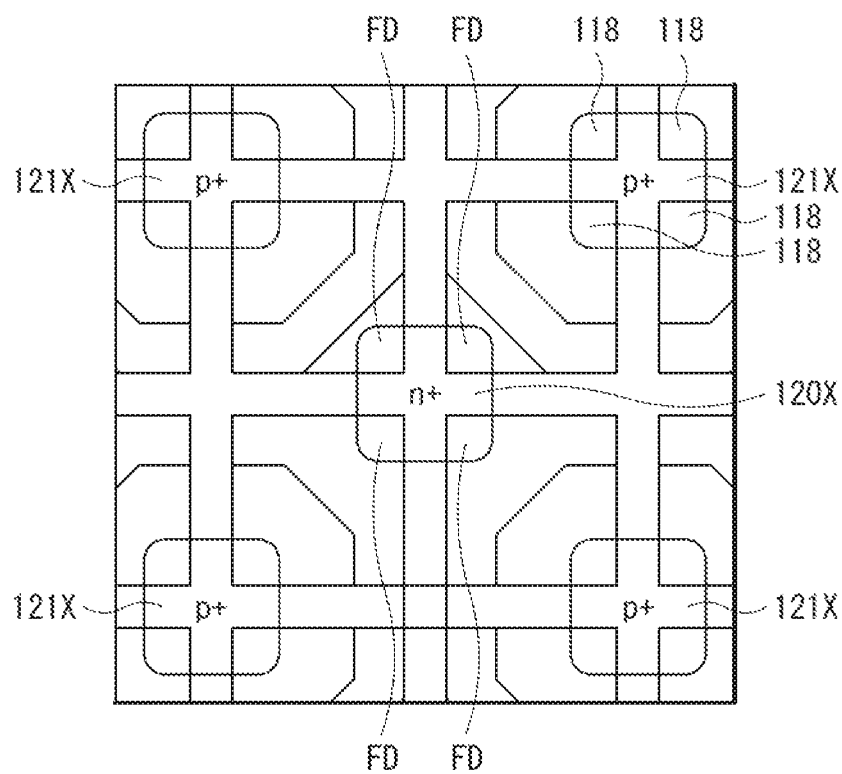

FIG. 93 illustrates a modification example of a cross-sectional configuration of main parts of the first substrate 100 and the second substrate 200 of the imaging device 1 according to the embodiment described above. FIG. 94 illustrates a planar configuration of the main part of the first substrate 100 illustrated in FIG. 93. The present modification example differs from the imaging device 1 described in the above embodiment in that contact sections 120X and 121X corresponding to the pad sections 120 and 121 described above are formed above the pixel separation section 117 to be embedded.

The contact sections 120X and 121X each include polysilicon (Poly Si) in which an n-type or p-type impurity is diffused. The through electrodes 120E and 121E are respectively coupled to the contact sections 120X and 121X. A plurality of floating diffusions FD and a plurality of VSS contact regions 118 are respectively formed around the contact sections 120X and 121X similarly to the embodiment described above. That is, the contact section 120X and the plurality of floating diffusions FD are electrically coupled to each other at a side wall, and the contact section 121X and the plurality of VSS contact regions 118 are electrically coupled to each other at a side wall.

In such a manner, the contact sections 120X and 121X are formed in proximity to the front surface of the semiconductor layer 100S to be embedded, thereby securing a distance to the transfer gate TG of the transfer transistor TR, as compared with the embodiment described above. This makes it possible to decrease a parasitic capacitance.

It is possible to manufacture such contact sections 120X and 121X as follows.

Figure 95A:
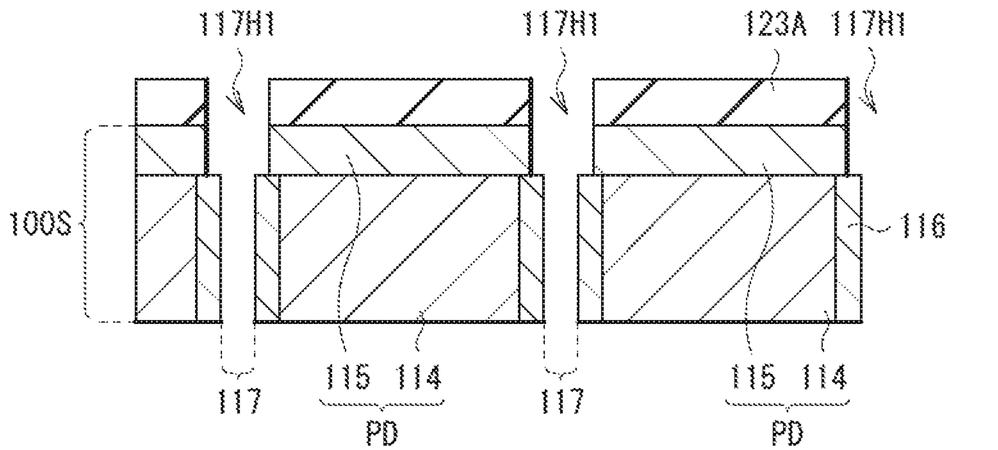
Figure 95B:
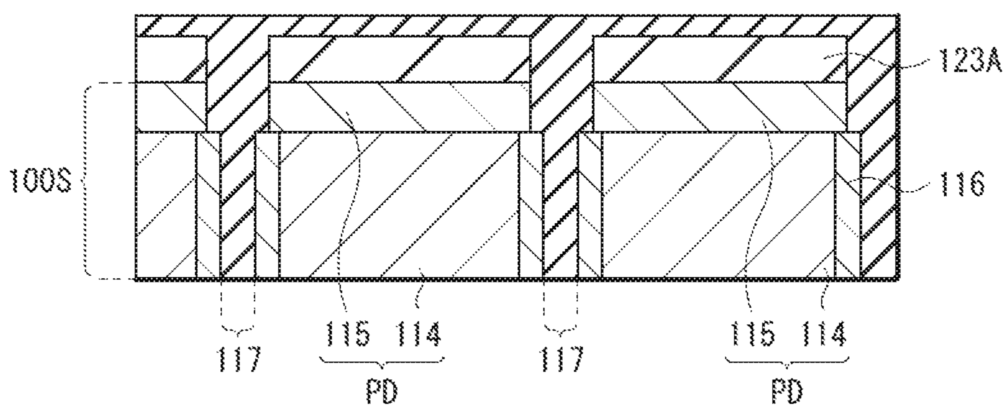
Figure 95C:
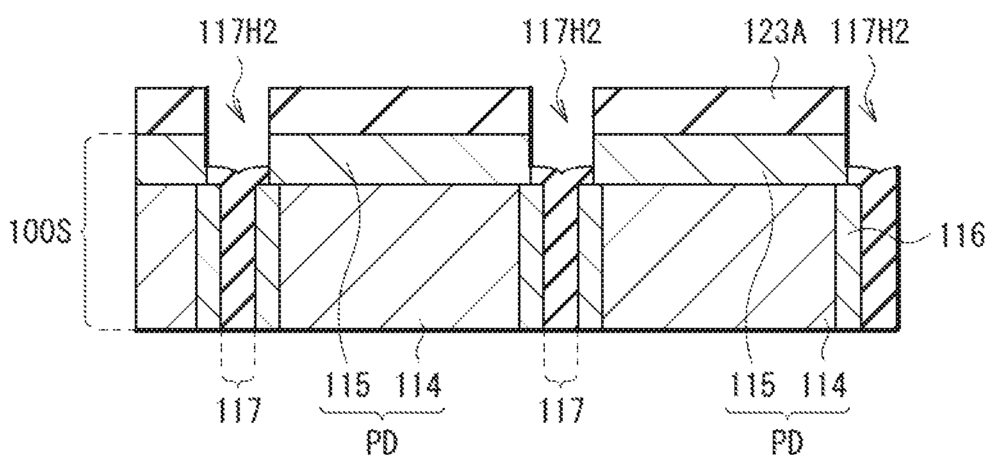

First, as illustrated in FIG. 95A, an opening 117H1 having a predetermined depth is formed. Next, as illustrated in FIG. 95B, a light-shielding film 117A and an insulating film 117B (both not illustrated) included in the pixel separation section 117 are embedded in the opening 117H1, and thereafter an opening 117H2 having a predetermined depth (e.g., about 150 nm) is formed on the front surface of the semiconductor layer 100S by etching-back as illustrated in FIG. 95C.

Figure 95D:
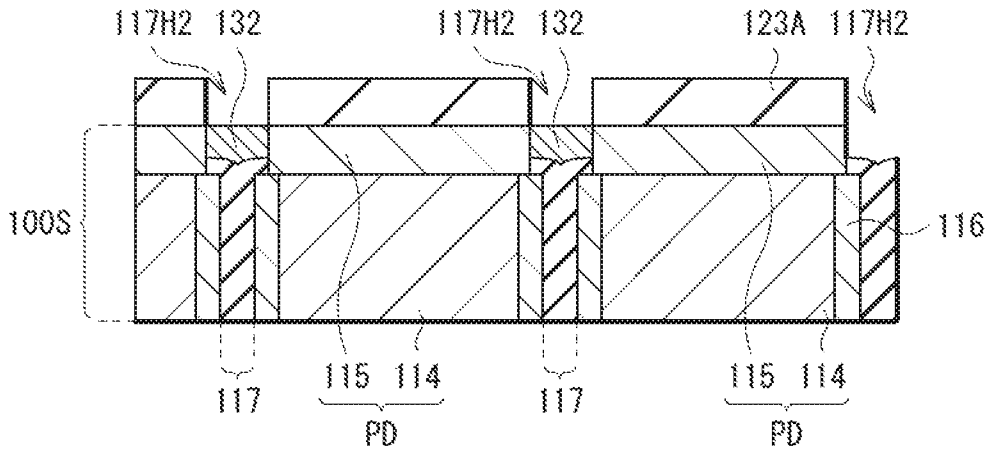
Figure 95E:
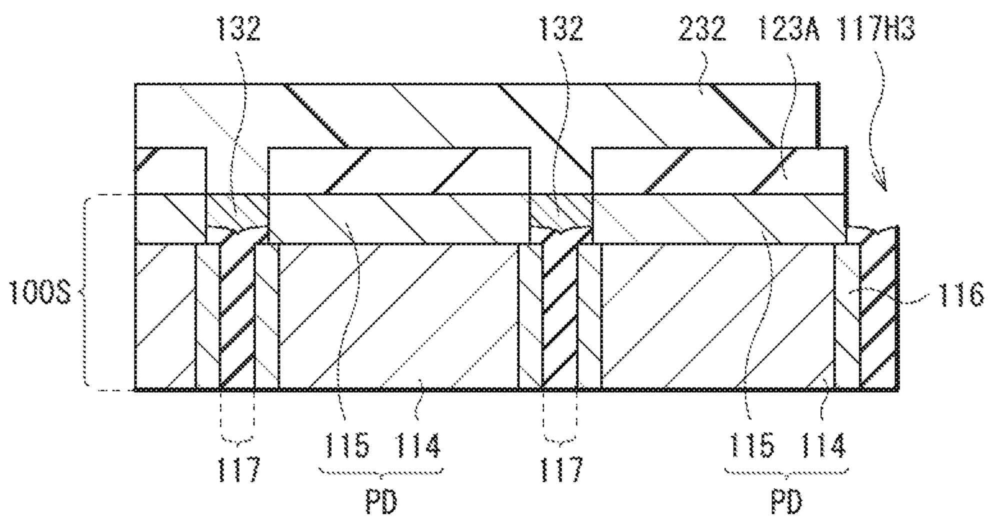
Figure 95F:
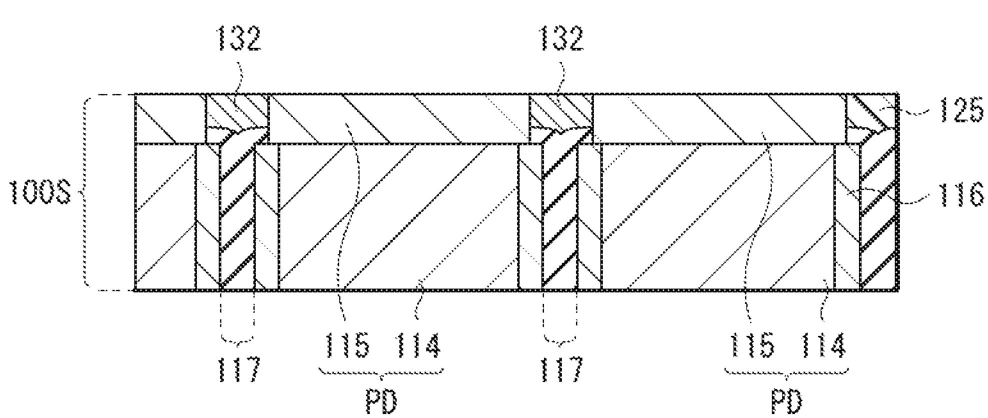

Next, as illustrated in FIG. 95D, after the polysilicon film 132 is embedded in the opening 117H2, the polysilicon film 132 is etched back to cause the height of a front surface of the polysilicon film 132 to become substantially the same as the height of the front surface of the semiconductor layer 100S. Next, as illustrated in FIG. 95E, a resist film 232 having a predetermined pattern is formed, and the polysilicon film 132 formed on the unnecessary pixel separation section 117 is removed by etching-back with use of a photolithography method. Next, as illustrated in FIG. 95F, an opening 117H3 formed by removal of polysilicon (Poly Si) is filled with an insulating film 125 with use of high-density plasma (HDP) CVD, and thereafter the front surface of the semiconductor layer 100S in which the polysilicon film 132 and the insulating film 125 are embedded is planarized by CMP.

Figure 95G:
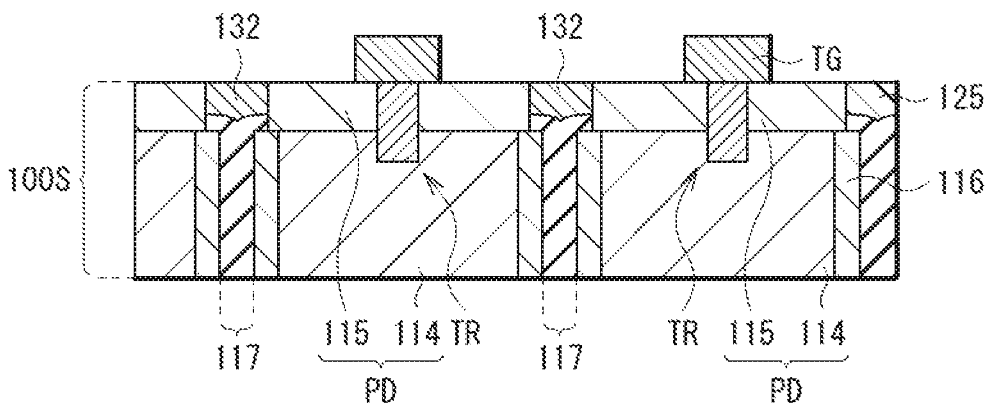
Figure 95H:
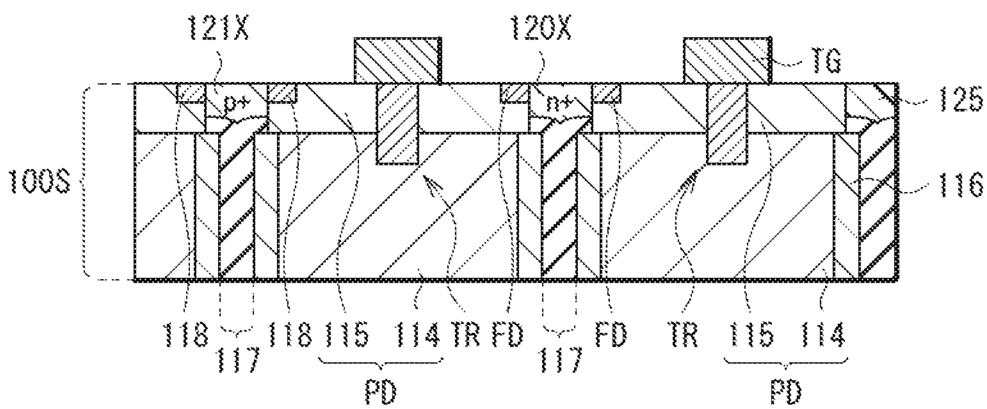

Next, as illustrated in FIG. 95G, after the transfer gates TG are formed at predetermined positions, as illustrated in FIG. 95H, p-type or n-type ion implantation and annealing treatment are selectively performed on the polysilicon film 132 formed in each of regions where the contact sections 120X and 121X are to be formed. Thus, the contact sections 120X and 121X illustrated in FIG. 93 and the like are formed.

Figure 97:
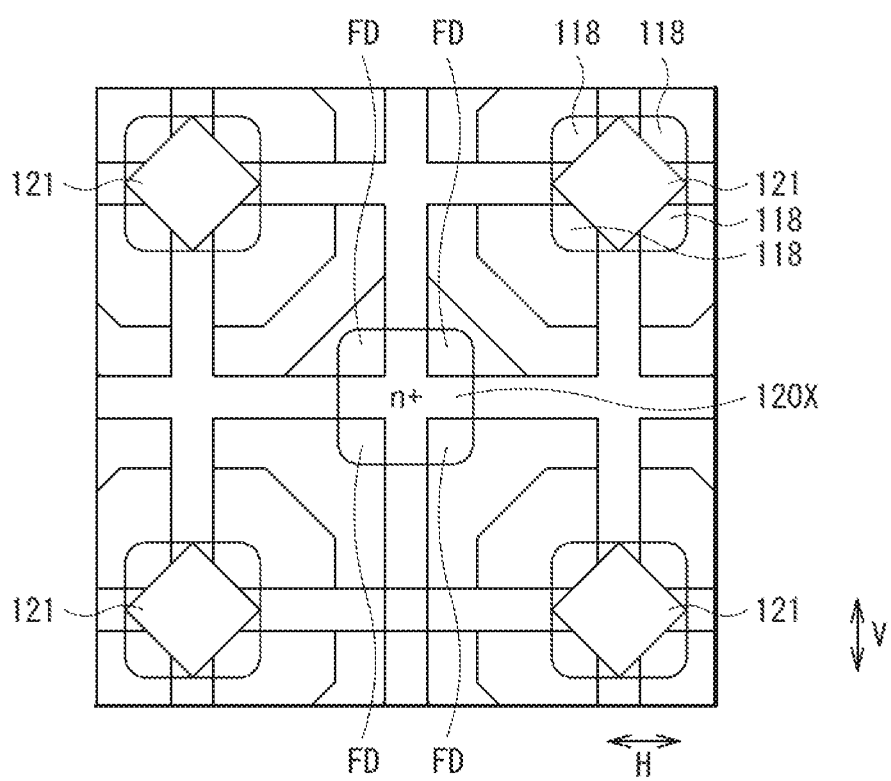
Figure 98:
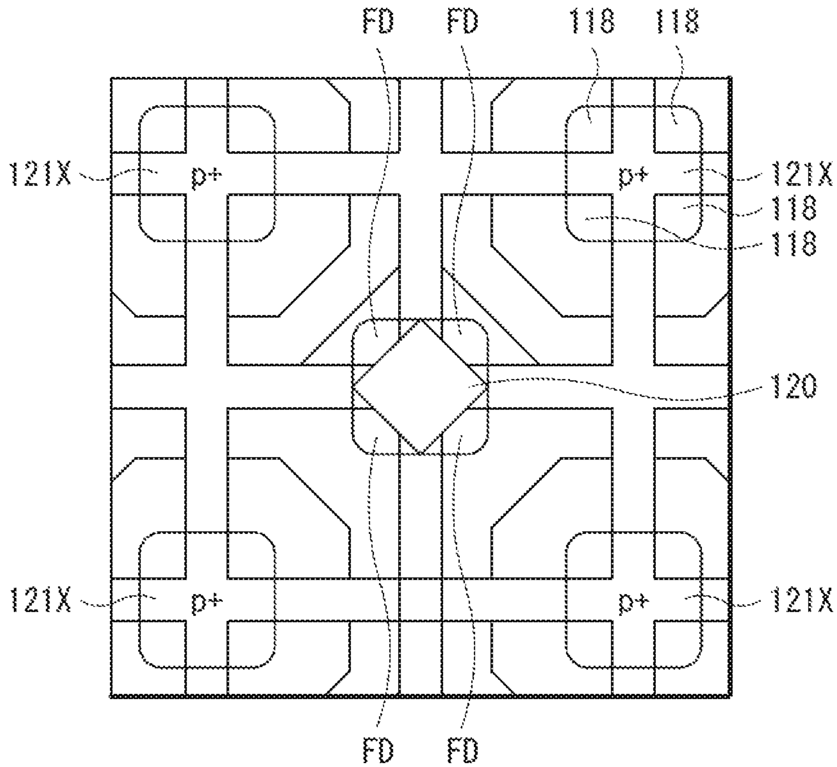

In addition, FIG. 93 illustrates an example in which both the pad sections 120 and 121 described above are formed using polysilicon (Poly Si) in which an n-type or p-type impurity is diffused; however, for example, as illustrated in FIGS. 96 and 97, only the pad section 120 may be formed, as the contact section 120X, using polysilicon (Poly Si) in which an n-type impurity is diffused. Alternatively, as illustrated in FIG. 98, only the pad section 121 may be formed, as the contact section 121X, using polysilicon (Poly Si) in which an p-type impurity is diffused.

In a case where one of the pad sections 120 and 121 described above are formed using polysilicon (Poly Si) in which an n-type or p-type impurity is diffused in such a manner, it is possible to manufacture them as follows, for example. It is to be noted that description is given hereinbelow of an example in which only the pad section 120 is formed, as the contact section 120X, using polysilicon (Poly Si) in which an n-type impurity is diffused.

First, the opening 117H1 having a predetermined depth is formed in a manner similar to that described above, and the light-shielding film 117A and the insulating film 117B (both not illustrated) included in the pixel separation section 117 are embedded in the opening 117H1, and thereafter, as illustrated in FIG. 99A, the resist film 232 having a predetermined pattern is formed, and the opening 117H2 having a predetermined depth (e.g., about 150 nm) is formed by etching-back in a region where the contact section 120X is to be formed.

Next, as illustrated in FIG. 99B, after the polysilicon film 132 is embedded in the opening 117H2, the polysilicon film 132 is etched back to cause the height of the front surface of the polysilicon film 132 to become substantially the same as the height of the front surface of the semiconductor layer 100S. Next, after the opening 117H2 is filled with the insulating film 125, as illustrated in FIG. 99C, the light-shielding film 117A and the insulating film 117B included in the unnecessary pixel separation section 117 are removed, and an opening 117H4 is formed. Next, as illustrated in FIG. 99D, the insulating film 125 is formed, with use of high-density plasma (HDP) CVD, in the opening 117H4 formed by removal of polysilicon (Poly Si), and thereafter the front surface of the semiconductor layer 100S in which the polysilicon film 132 and the insulating film 125 are embedded is planarized by CMP.

Thereafter, the transfer gates TG are formed at predetermined positions, and then p-type or n-type ion implantation and annealing treatment are selectively performed on the polysilicon film 132 formed in a region where the contact section 120X is to be formed. Thus, it is possible to separately form the contact section 120X and the pad section 121.

It is to be noted that in general, the pad section 121 is formed in a rectangular shape having sides parallel to the H direction and the V direction where a plurality of pixels 541 are arranged in a matrix; however, for example, as illustrated in FIG. 97, the pad section 121 may be formed by being rotated by about 45° with respect to the H direction and the V direction. This makes it possible to suppress occurrence of a malfunction caused by contact between the pad section 121 and another element formed in each pixel 541, and improve area efficiency.

In addition, FIG. 93 illustrates an example in which each of electrical coupling between the through electrode 120E and the floating diffusion FD and electrical coupling between the through electrode 121E and the VSS contact region 118 is performed through polysilicon (Poly Si) (the contact section 120X or 121X), in which an n-type or p-type impurity is diffused, formed to be embedded in the front surface of the semiconductor layer 100S; however, the floating diffusion FD and the VSS contact region 118 may be respectively directly coupled to the through electrodes 120E and 121E.

FIG. 100 illustrates a modification example of a cross-sectional configuration of main parts of the first substrate 100 and the second substrate 200 in a case where the floating diffusion FD and the through electrode 120E are directly coupled to each other and the VSS contact region 118 and the through electrode 121E are directly coupled to each other. FIG. 101 illustrates a planar configuration of the main part of the first substrate 100 illustrated in FIG. 100.

In the present modification example, each of the through electrodes 120E and 121E has a diameter larger than the area of an intersection of the pixel separation section 117 extending in the H direction and the V direction, and a portion thereof is embedded in the semiconductor layer 100S. Accordingly, electrical coupling between the through electrode 120E and a plurality of floating diffusions FD and electrical coupling between the through electrode 121E and a plurality of VSS contact regions 118 are made on side walls.

It is possible to manufacture the through electrodes 120E and 121E that are respectively electrically coupled to the floating diffusions FD and the VSS contact regions 118 on respective side walls as follows, for example.

First, after the opening 117H2 having a predetermined depth (e.g., about 150 nm) is formed above the pixel separation section 117 on the front surface of the semiconductor layer 100S by etching-back in a manner similar to that described above, as illustrated in FIG. 102A, the insulating film 125 is formed with use of high-density plasma (HDP) CVD to be embedded in the opening 17H2. Next, as illustrated in FIG. 102B, the front surface of the semiconductor layer 100S in which the insulating film 125 is embedded is planarized by CMP.

Next, as illustrated in FIG. 102C, after the transfer gates TG are formed at predetermined positions, the passivation film 122 is formed to cover the front surfaces of the semiconductor layer 100S and the transfer gates TG. Thereafter, the first substrate 100 and the second substrate 200 are bonded together in a manner similar to that described in the above embodiment, and thereafter the coupling holes 120H and 121H that reach the insulating film 125 embedded in the semiconductor layer 100S are formed. On this occasion, the depths of the coupling holes 120H and 121H are respectively formed to cause portions of the side walls of the floating diffusions FD and VSS contact regions 118 to be exposed. Thus, the side walls of the through electrodes 120E and 121E are respectively in contact with the side walls of the floating diffusions FD and the VSS contact regions 118.

As described above, in the present modification example, indirect or direct electrical coupling between the through electrode 120E and the floating diffusions FD and indirect or direct electrical coupling between the through electrode 121E and the VSS contact regions 118 are made in the semiconductor layer 100S. Accordingly, a distance to the transfer gate TG of the transfer transistor TR is secured, as compared with the embodiment described above, which makes it possible to reduce a parasitic capacitance.

18. Modification Example 17

FIG. 103 illustrates a modification example of a cross-sectional configuration of main parts of the first substrate 100 and the second substrate 200 of the imaging device 1 according to the embodiment described above.

In the imaging device 1, the respective transistors formed in the first substrate 100 and the second substrate 200 may each have the same gate structure. However, the first substrate 100 and the second substrate 200 have different thermal budgets, and the transistor (e.g., the transfer transistor TR) of the first substrate 100 has passed through more heating processes, which may cause impurity diffusion. Accordingly, it is conceivable that in order to maintain off characteristics of the transfer transistor TR, for example, a high concentration of a p-type impurity is ion-implanted below the transfer gate TG, which may consequently increase leakage of a current and electric field concentration in proximity to the floating diffusion FD, thereby generating a white spot.

In contrast, in the present modification example, for example, as illustrated in FIG. 103, the width of the sidewall SW of the transistor (e.g., the transfer transistor TR) on side of the first substrate 100 is larger than the width of the sidewall SW of the transistor on the side of the second substrate 200. This makes it possible to reduce impurity diffusion caused by passing through a heat process. In addition, decreasing the width of the sidewall SW of the transistor on the side of the second substrate 200 makes it possible to increase a gate area of the transistor in the second substrate 200, thereby making it possible to reduce noise.

FIG. 104 illustrates a modification example of a cross-sectional configuration of main parts of the first substrate 100 and the second substrate 200 of the imaging device 1 according to the embodiment described above.

In order to improve yields of through wiring lines such as the through electrodes 120E and 121E, it is necessary to decrease an aspect ratio. However, in a case where the gate height of the transistor on the side of the first substrate 100 is decreased, an impurity to be implanted in forming a potential of a photoelectric converter (the photodiode PD) may penetrate to below the gate, which may not allow for potential formation with self-alignment with respect to the gate. As a result, variations in characteristics caused by misalignment may be increased.

In contrast, in the present modification example, as illustrated in FIG. 104, the gate height of the transistor on the side of the second substrate 200 is decreased. This makes it possible to decrease the aspect ratio of the through wiring line, thereby making it possible to improve yields. In addition, it is possible to achieve a decrease in resistance of the through wiring line. Furthermore, it is possible to suppress gate penetration in ion implantation in the transistor (e.g., the transfer transistor TR) on the side of the first substrate 100, and perform patterning with self-alignment. This makes it possible to reduce variations in characteristics.

It is to be noted that in the present modification example, the planar transfer transistor TR has been described as an example; however, the transfer transistor TR may have, for example, a vertical transistor configuration as illustrated in FIG. 21F. In addition, in the present modification example, description has been given of an example in which the transistor on the side of the second substrate 200 is a planar transistor; however, the transistor on the side of the second substrate 200 may have a three-dimensional structure such as a fin type.

19. Modification Example 18

FIG. 105 illustrates a modification example of a cross-sectional configuration of main parts of the first substrates 100 and the second substrate 200 of the imaging device 1 according to the embodiment described above. The present modification example differs from the imaging device 1 described in the above embodiment in that the through electrodes 120E and 121E and a coupling section 219V are coupled to the first wiring layer W1 at different heights.

It is possible to manufacture a structure illustrated in FIG. 105 as follows, for example.

First, after components to the interlayer insulating film 222 are formed in a manner similar to that in the embodiment described above, as illustrated in FIG. 106A, the coupling holes 120H and 121H that penetrate through the interlayer insulating film 222, the passivation film 221, the bonding film 124, and the interlayer insulating film 123 are formed by dry etching. Next, as illustrated in FIG. 106B, an electrically conductive material is embedded in the coupling holes 120H and 121H to form the through electrodes 120E and 121E.

Next, as illustrated in FIG. 106C, an electrically conductive film provided on the interlayer insulating film 222 is removed by CMP, and the front surface of the interlayer insulating film 222 is planarized. Next, as illustrated in FIG. 106D, the insulating film 223 including, for example, silicon oxide (SiO) or silicon nitride (SiN) is formed on the interlayer insulating film 222, and thereafter, as illustrated in FIG. 106E, coupling holes 218H and 219H that penetrate through the insulating film 223 and the interlayer insulating film 222 are formed. Next, as illustrated in FIG. 106F, an electrically conductive material is embedded in the coupling holes 218H and 219H to form the coupling sections 218V and 219V.

Next, as illustrated in FIG. 106G, an electrically conductive film provided on the insulating film 223 is removed by CMP, and the front surface of the insulating film 223 is planarized. Next, as illustrated in FIG. 106H, openings 223H are formed at positions corresponding to the through electrodes 120E and 121E to expose the through electrodes 120E and 121E. Thereafter, the first wiring layer W1 is formed in a manner similar to that in the embodiment described above. Thus, the imaging device 1 illustrated in FIG. 105 is completed.

FIG. 107 illustrates a modification example of a cross-sectional configuration of main parts of the first substrate 100 and the second substrate 200 of the imaging device 1 according to the embodiment described above. FIG. 105 illustrates an example in which top surfaces of the through electrodes 120E and 121E are formed at positions lower than a top surface of the coupling section 219V; however, it is possible to form the top surface of the coupling section 219V at a position lower than the top surfaces of the through electrodes 120E and 121E.

For example, after components to the interlayer insulating film 222 are formed in a manner similar to that in the embodiment described above, as illustrated in FIG. 108A, the coupling holes 218H and 219H that penetrate through the interlayer insulating film 222 are formed by dry etching. Next, as illustrated in FIG. 108B, an electrically conductive material is embedded in the coupling holes 218H and 219H to form the coupling sections 218V and 219V.

Next, as illustrated in FIG. 108C, an electrically conductive film provided on the interlayer insulating film 222 is removed by CMP, and the front surface of the interlayer insulating film 222 is planarized. Next, as illustrated in FIG. 108D, the insulating film 223 is formed on the interlayer insulating film 222, and thereafter, as illustrated in FIG. 108E, the coupling holes 120H an 121H that penetrate through the interlayer insulating film 222, the passivation film 221, the bonding film 124, and the interlayer insulating film 123 are formed. Next, as illustrated in FIG. 108F, an electrically conductive material is embedded in the coupling holes 120H and 121H to form the through electrodes 120E and 121E.

Next, as illustrated in FIG. 108G, an electrically conductive film provided on the insulating film 223 is removed by CMP, and the front surface of the insulating film 223 is planarized. Next, as illustrated in FIG. 108H, openings 223H are formed at positions corresponding to the coupling sections 218V and 219V to expose the coupling sections 218V and 219V. Thereafter, the first wiring layer W1 is formed in a manner similar to that in the embodiment described above. Thus, the imaging device 1 illustrated in FIG. 107 is completed.

An example has been described above in which the heights of the top surfaces of the through electrodes 120E and 121E and the coupling section 219V are different from each other; however, for example, as illustrated in FIG. 109A, after an electrically conductive material is embedded in the coupling holes 218H and 219H as illustrated in FIG. 108F, an electrically conductive film and the insulating film 223 provided on the interlayer insulating film 222 are removed by CMP, which makes it possible to form the imaging device 1 in which the top surfaces of the through electrodes 120E and 121E and the coupling section 219V are in the same plane as illustrated in FIG. 109B.

In the embodiment described above, a through wiring line (e.g., the through electrodes 120E and 121E) that electrically couples the first substrate 100 and the second substrate 200 to each other, and a wiring line (e.g., the coupling section 219V) coupled to a gate in the second substrate 200 are formed in the same process. However, the aspect ratios of the through electrodes 120E and 121E and the aspect ratio of the coupling section 219V are greatly different; therefore, in a case where barrier metal is simultaneously deposited in respective coupling holes (e.g., the coupling holes 120H, 121H, and 219H) with use of a physical vapor deposition (PVD) method, the barrier metal in bottom portions of the coupling holes 120H and 121H having a large aspect ratio becomes thin, and the barrier metal in a bottom portion of the coupling hole 219H having a small aspect ratio becomes thick. This may easily cause a contact failure and a volcano of a metal film.

In contrast, in the present modification example, the through electrodes 120E and 121E, and the coupling section 219V that have greatly different aspect ratios are formed in different processes. This makes it possible to deposit barrier metal under respective optimum conditions. Specifically, it is possible to reduce the thickness of the barrier metal formed in the bottom portion of the coupling section 219V to 30 nm or less. In addition, it is possible to deposit the barrier metal, formed in the bottom portions of the through electrodes 120E and 121E, with a thickness of 10 nm or more. Thus, it is possible to improve manufacturing yields and reliability.

20. Modification Example 19

In the present modification example, description is given of a specific layout example of the pixel transistors (the amplification transistor AMP, the selection transistor SEL, the reset transistor RST, and the FD conversion gain switching transistor FDG) in the second substrate 200.

For example, in the pixel transistors, as illustrated in FIG. 110, the amplification transistor AMP may have a three-dimensional structure such as a fin type, and the selection transistor SEL, the reset transistor RST, and the FD conversion gain switching transistor FDG may have a planar structure.

For example, in the pixel transistors, as illustrated in FIG. 111, the amplification transistor AMP and the selection transistor may have a three-dimensional structure such as a fin type, and the reset transistor RST and the FD conversion gain switching transistor FDG may have a planar structure.

In addition, a fin structure may be a double-fin structure, other than a single-fin structure illustrated in FIG. 110.

For example, in the pixel transistors, as illustrated in FIG. 112, all the amplification transistor AMP, the selection transistor, the reset transistor RST, and the FD conversion gain switching transistor FDG may have a three-dimensional structure such as a fin type.

For example, in the pixel transistors, as illustrated in FIG. 113, the amplification transistor AMP, the selection transistor, the reset transistor RST, and the FD conversion gain switching transistor FDG may be provided in the semiconductor layers 200S independent of each other.

FIG. 114 schematically illustrates a planar configuration (A) and a cross-sectional configuration (B), which is taken along a line A-A' illustrated in (A) of FIG. 114, of the amplification transistor AMP and the selection transistor SEL coupled in series to each other illustrated in FIG. 1.

The pixel transistors provided in the second substrate 200 have a three-dimensional structure in such a manner, which makes it possible to improve characteristics per footprint. For example, as illustrated in FIG. 111, in a case where the selection transistor SEL has a three-dimensional structure, it is possible to expand a dynamic range of the selection transistor SEL.

Furthermore, ions are implanted as a dopant in a silicon channel of the selection transistor SEL to form an ion implanted region, which makes it possible to control the threshold voltage Vth of the selection transistor SEL. For example, boron (B) is implanted as a dopant in a portion of the selection transistor SEL of the silicon channel having a fin shape, which makes it possible to form the ion implanted region as a p-type semiconductor. That is, it is possible to make the threshold voltage Vth of the selection transistor SEL higher, as compared with a case the dopant is not implanted. In addition, for example, phosphorus (P) is implemented as a dopant in the portion of the selection transistor SEL of the silicon channel having a fin shape, which makes it possible to form the ion implanted region as an n-type semiconductor. That is, it is possible to make the threshold voltage Vth of the selection transistor SEL lower, as compared with the dopant is not implanted.

It is to be noted that depths of diffusion layers of a fin type transistor (e.g., the amplification transistor AMP) and a transistor having a planar structure (e.g., the selection transistor SEL) may be different from each other. In this case, the diffusion layer of the fin type transistor is formed deeper than that of the transistor having the planar structure.

It is to be noted that boron (B) and phosphorus (P) have a relatively large thermal diffusion coefficient, and are relatively easily diffused. In a case where such a dopant that is easily diffused is used, the dopant is diffused from a region of the selection transistor SEL to a region of the amplification transistor AMP by subsequent heat treatment, which may deteriorate controllability of the threshold voltage Vth of the amplification transistor AMP and may increase 1/f noise caused by an increase in MOS interface electron density. This may decrease image quality of a captured image.

Accordingly, for example, it is preferable that ions having a smaller thermal diffusion coefficient than boron (B) be implanted in the silicon channel of the selection transistor SEL. This makes it possible to suppress expansion of the ion implanted region formed in the silicon channel of the selection transistor SEL, as compared with a case where boron (B) is used as a dopant. That is, it is possible to suppress a decrease in image quality of a captured image.

In addition, for example, it is preferable that ions having a smaller thermal diffusion coefficient than phosphorus (P) be implanted in the silicon channel of the selection transistor SEL. For example, arsenic (As) or antimony (Sb) may be implanted as a dopant. This makes it possible to suppress expansion of the ion implanted region formed in the silicon channel of the selection transistor SEL, as compared with a case where phosphorus (P) is used as a dopant. This makes it possible to suppress deterioration in controllability of the threshold voltage Vth of the amplification transistor AMP and an increase in 1/f noise caused by an increase in MOS interface electron density. In addition, it is possible to improve a modulation degree and a saturated electric charge amount of the selection transistor SEL. That is, it is possible to suppress a decrease in image quality of a captured image.

Furthermore, for example, ions having a smaller thermal diffusion coefficient than boron (B) and phosphorus (P) is implanted in the silicon channel of the selection transistor SEL, which makes it possible to decrease a necessary distance between the amplification transistor AMP and the selection transistor SEL. This makes it possible to suppress an increase in pixel size.

It is to be noted that the work function of a gate may be controlled in place of implanting a dopant in the silicon channel of the selection transistor SEL. That is, selecting a material to be applied as the gate of the selection transistor SEL and the gate of the amplification transistor AMP makes it possible to control the threshold voltages Vth of the selection transistor SEL and the amplification transistor AMP.

For example, the gates of the selection transistor SEL and the amplification transistor AMP are formed with use of a material having a smaller work function, which makes it possible to increase the threshold voltage Vth of the selection transistor SEL and the amplification transistor AMP. This makes it possible to improve off characteristics of the selection transistor SEL and the amplification transistor AMP. That is, it is possible to suppress a decrease in image quality of a captured image.

For example, forming the gates of the selection transistor SEL and the amplification transistor AMP with use of a material having a larger work function, which makes it possible to decrease the threshold voltages Vth of the selection transistor SEL and the amplification transistor AMP. This makes it possible to improve the modulation degrees and the saturated electric charge amounts of the selection transistor SEL and the amplification transistor AMP. That is, it is possible to suppress a decrease in image quality of a captured image.

As described above, dopant implantation is unnecessary for the selection transistor SEL and the amplification transistor AMP each having a gate that uses a material having a predetermined work function. Accordingly, it is possible to reduce a necessary distance between the amplification transistor AMP and the selection transistor SEL. This makes it possible to suppress an increase in pixel size.

It is to be noted that materials having work functions different from each other may be used for the gates of the selection transistor SEL and the amplification transistor AMP. For example, tungsten (W), ruthenium (Ru), or rhodium (Rh) is used as a gate material of the selection transistor SEL and an n-type semiconductor is used as a gate material of the amplification transistor AMP, which makes it possible to make the threshold voltage Vth of the selection transistor SEL higher than the threshold voltage Vth of the amplification transistor AMP. In addition, for example, a compound (silicide) of a master group and silicon may be used for the gates of the selection transistor SEL and the amplification transistor AMP.

Furthermore, it is preferable that the semiconductor layer 200S use, for example, a 45° notch substrate. This causes a FinFET sidewall of the amplification transistor AMP to be a (100) plane, which makes it possible to reduce an interface state and reduce generation of noise.

21. Modification Example 20

FIGS. 115, 123, 125, 127, and 129 illustrate other examples of the transistor Tr1 and the protection element PE described in the above modification example 5. In the modification example 5, an example in which a diode having a pn junction is used as the protection element PE has been described, but this is not limitative. For the protection element PE, it is possible to use, for example, a Gated Diode type protection element (FIG. 115), a transistor type protection element using a dummy antenna (FIG. 123), a PMOS type protection element (FIG. 125), a PMOS type protection element including a reverse diode (FIG. 127), and a PMOS type protection element further including an NMOS type transistor (FIG. 129).

FIG. 116 illustrates an example of a planar configuration of the transistor Tr1 and the Gated Diode type protection element PE illustrated in FIG. 115. FIG. 117 is a circuit diagram illustrating an example of a relationship between the transistor Tr1 and the protection element PE illustrated in FIG. 115. The drain of the protection element PE is coupled to the antenna wiring line WH, and the gate and the source thereof are coupled to the well region 211.

The Gated Diode type protection element PE is provided in the semiconductor layer 200S in such a manner, which suppresses a potential in an overlapping portion between the gate and the drain of the protection element PE during a plasma process. Accordingly, a large leakage current to the semiconductor layer 200S by an inter-band tunnel current flows, which becomes a protection current. This makes it possible to obtain a higher protection function, as compared with a case where a reverse diode is used as the protection element PE. Furthermore, the source of the protection element PE is grounded, which makes it possible to protect Ioff.

FIGS. 118 to 122 illustrate other examples of the transistor Tr1 and the Gated Diode type protection element PE illustrated in FIG. 115.

The p-type semiconductor region 207 of the semiconductor layer 200S may be electrically coupled to the p-type semiconductor region 107 (e.g., the VSS contact region 118 in FIG. 6) of the semiconductor layer 100S through the coupling section 207V, the coupling wiring line WL1, and a through electrode 107E, for example (FIG. 118). Accordingly, when the protection element PE is brought into conduction, the potential of the gate electrode 208 of the transistor Tr1 becomes substantially the same as the potential of the semiconductor layer 200S and the potential of the semiconductor layer 100S. Accordingly, PID to the transistor Tr1 is suppressed.

The semiconductor layer 200S provided with the transistor Tr1 and the semiconductor layer 200S provided with the protection element PE may be divided by the insulating region 212 (FIG. 119). For example, on this occasion, the p-type semiconductor region 207 of the semiconductor layer 200S provided with the transistor Tr1 is coupled to the p-type semiconductor region 107 of the semiconductor layer 100S through the coupling wiring line WL1, and the p-type semiconductor region 207 of the semiconductor layer 200S provided with the protection element PE is coupled to the p-type semiconductor region 107 of the semiconductor layer 100S through the coupling wiring line WL2. Accordingly, when the protection element PE is brought into conduction, the potential of the gate electrode 208 of the transistor Tr1 becomes substantially the same as the potential of the semiconductor layer 200S provided with the transistor Tr1, the potential of the semiconductor layer 200S provided with the protection element PE, and the potential of the semiconductor layer 100S. Accordingly, PID to the transistor Tr1 is suppressed.

The p-type semiconductor region 207 of the semiconductor layer 200S provided with the transistor Tr1 and the p-type semiconductor region 207 of the semiconductor layer 200S provided with the protection element PE may be electrically coupled to each other through the coupling wiring line WL (FIG. 120). Even on this occasion, PID to the transistor Tr1 is suppressed in a manner similar to that described in FIG. 118.

The transistor Tr1 protected by the protection element PE may be provided in the first substrate 100 (FIG. 121). The n-type semiconductor region 214 of the protection element PE and the gate electrode 208 of the transistor Tr1 are electrically coupled to each other through the coupling section 214V, the antenna wiring line WH, and the through electrode 208E, for example. Accordingly, when the protection element PE is brought into conduction, a potential difference between a well region (the p-well layer 115) and the gate electrode 208 of the transistor Tr1 is decreased, and PID to the transistor Tr1 is suppressed. Alternatively, the protection element PE may be provided in the first substrate 100 (FIG. 122). The n-type semiconductor region 214 of the protection element PE and the gate electrode 208 of the transistor Tr1 are electrically coupled to each other through the through electrode 214E, the antenna wiring line WH, and the through electrode 208V, for example. Accordingly, when the protection element PE is brought into conduction, the potential of the gate electrode 208 of the transistor Tr1 the potential of a well region (the p-well layer 115) of the semiconductor layer 200S become common, and PID to the transistor Tr1 is suppressed.

FIG. 124 is a circuit diagram illustrating an example of a relationship between a transistor T1 and the transistor type protection element PE using a dummy antenna illustrated in FIG. 123. The protection element PE has a drain coupled to the gate electrode 208 of the transistor Tr1, and a source grounded. In addition, an antenna wiring line WH1 is coupled to the drain of the protection element PE, and an antenna wiring line WH2 serving as a dummy antenna is coupled to the gate of the protection element PE.

Using the transistor type protection element PE using a dummy antenna in such a manner makes it possible to turn on the protection element PE before a charge is accumulated in the gate electrode 208 of the transistor Tr1 due to a PID charge. Accordingly, a current of the PID charge flows via the dummy antenna (the antenna wiring line WH2) flows in the gate of the protection element PE, which turns on the protection element PE, and it is possible to release the PID charge flowing via the antenna wiring line WH2 by its ON current.

It is to be noted that the transistor Tr1 and the transistor type protection element PE using a dummy antenna (the antenna wiring line WH2) may have any of the structures illustrated in FIGS. 118 to 122 described above.

FIG. 126 is a circuit diagram illustrating an example of a relationship between the transistor T1 and the PMOS type protection element PE illustrated in FIG. 125. The protection element PE includes at least one PMOS type transistor Tr2. A p-type semiconductor region 245 of the transistor Tr2 is electrically coupled to the gate electrode 208 of the transistor Tr1, and a p-type semiconductor region 246 of the transistor Tr2 is coupled to a ground potential. Power source lines are separately provided in the gate and a well 248 of the transistor Tr2.

The PMOS type protection element PE is used in such a manner, which relatively decreases the voltages of the p-type semiconductor region 246, the gate, and the well 248 of the transistor Tr2 upon suffering damage resulting from plasma. Accordingly, the transistor Tr2 operates in a forward bias mode.

It is to be noted that the transistor Tr1 and the PMOS type protection element PE may have any of the structures illustrated in FIGS. 118 to 122 described above.

In addition, a reverse diode may be added to the PMOS type protection element PE, as illustrated in FIGS. 127 and 128. Adding the reverse diode makes it possible to fix the potential of the gate of the transistor Tr2, thereby making it possible to further stabilize an operation as the protection element PE.

Furthermore, an NMOS type transistor Tr3 may be further added to the PMOS type protection element PE, as illustrated in FIGS. 129 and 130. One (e.g., an n-type semiconductor region 219) of a source and a drain of the transistor Tr3 is electrically coupled to the gate electrode 208 of the transistor Tr1. In addition, power source lines are separately provided in the gate and a well of the transistor Tr3.

The NMOS type transistor Tr3 is further added as the protection element PE in such a manner, which makes it possible to perform protection by a GID (Gate-Induced-Drain Leakage current) of the NMOS type transistor upon receiving a positive electric charge as damage resulting from plasma in a stage of processing the semiconductor layer 200S. In addition, upon receiving a negative electric charge as damage resulting from plasma, the NMOS type transistor Tr3 operates in the forward bias mode, which makes it possible to release an electric charge.

Furthermore, the transistor T1 and the PMOS type protection element to which the reverse diode and the NMOS type transistor are added, illustrated in FIGS. 129 and 130, may have a structure illustrated in FIGS. 131 and 132. Specifically, the transistor Tr1 and the protection element PE may be provided in the mutually independent semiconductor layers 200S divided by the insulating region 212. It is preferable that a circuit that adjusts each potential be provided in the transistor Tr2 included in the protection element PE and each well of the transistor Tr2. This makes it possible to further stabilize an operation as the protection element PE.

22. Modification Example 21

In the embodiment described above, a structure has been described in which one wiring line (that is, a floating diffusion contact) electrically coupled to the floating diffusion FD, and one wiring line (that is, a well contact) electrically coupled to a well layer WE are disposed in each of a plurality of sensor pixels. However, an embodiment of the present disclosure is not limited thereto. In the embodiment of the present disclosure, one floating diffusion contact may be disposed for every plurality of sensor pixels. One floating diffusion contact may be shared by four sensor pixels adjacent to each other, for example. Similarly, one well contact may be disposed for every plurality of sensor pixels. One well contact may be shared by four sensor pixels adjacent to each other, for example.

FIGS. 133 to 135 are cross-sectional views in the thickness direction of a configuration example of an imaging device 1A according to a modification example 21 of the present disclosure. FIGS. 136 to 138 are cross-sectional views in a horizontal direction of a layout example of a plurality of pixel units PU according to the modification example 21 of the present disclosure. It is to be noted that the cross-sectional views illustrated in FIGS. 133 to 135 are merely schematic views, and are not diagrams for strictly accurately illustrating an actual structure. In the cross-sectional views illustrated in FIGS. 133 to 135, for easily describing the configuration of the imaging device 1A on a paper surface, positions in the horizontal direction of a transistor and an impurity diffusion layer are intentionally changed at positions sec1 to sec3.

Specifically, in the pixel unit PU of the imaging device 1A illustrated in FIG. 133, a cross section at the position sec1 is a cross section taken along a line A1-A1' of FIG. 136, a cross section at the position sec2 is a cross section taken along a line B1-B1' of FIG. 137, and a cross section at the position sec3 is a cross section taken along a line C1-C1' of FIG. 138. Likewise, in the imaging device 1A illustrated in FIG. 134, a cross section at the position sec1 is a cross section taken along a line A2-A2' of FIG. 136, a cross section at the position sec2 is a cross section taken along a line B2-B2' of FIG. 137, and a cross section at the position sec3 is a cross section taken along a line C2-C2' of FIG. 138. In the imaging device 1A illustrated in FIG. 135, a cross section at the position sec1 is a cross section taken along a line A3-A3' of FIG. 136, a cross section at the position sec2 is a cross section taken along a line B3-B3' of FIG. 137, and a cross section at the position sec3 is a cross section taken along a line C3-C3' of FIG. 138.

As illustrated in FIGS. 134 and 138, in the imaging device 1A, a common pad electrode 1102 disposed over a plurality of sensor pixels 1012, and one wiring line L1002 provided on the common pad electrode 1102 are shared. For example, in the imaging device 1A, a region is present in which the floating diffusions FD1 to FD4 of four sensor pixels 1012 are adjacent to each other with an element separation layer 1016 interposed therebetween in plan view. The common pad electrode 1102 is provided in this region. The common pad electrode 1102 is disposed over the four floating diffusions FD1 to FD4, and is electrically coupled to each of the four floating diffusions FD1 to FD4. The common pad electrode 1102 includes, for example, a polysilicon film doped with an n-type impurity or a p-type impurity.

One wiring line L1002 (that is, the floating diffusion contact) is provided on a central portion of the common pad electrode 1102. As illustrated in FIGS. 134, and 136 to 138, the wiring line L1002 provided on the central portion of the common pad electrode 1102 extends from a first substrate section 1010 to an upper substrate 1220 of a second substrate section 1020 through the lower substrate 1210 of the second substrate section 1020, and is coupled to a gate electrode AG of the amplification transistor AMP through a wiring line and the like provided in the upper substrate 1220.

In addition, as illustrated in FIGS. 133 and 138, in the imaging device 1A, a common pad electrode 1110 disposed over a plurality of sensor pixels 1012, and one wiring line L1010 provided on the common pad electrode 1110 are shared. For example, in the imaging device 1A, a region is present in which the well layers WE of four sensor pixels 1012 are adjacent to each other with the element separation layer 1016 interposed therebetween in plan view. The common pad electrode 1110 is provided in this region. The common pad electrode 1110 is disposed over the well layers WE of the four sensor pixels 1012, and is electrically coupled to each of the well layers WE of the four sensor pixels 1012. As an example, the common pad electrode 1110 is disposed between one common pad electrode 1102 and another common pad electrode 1102 arranged side by side in a Y-axis direction. In the Y-axis direction, the common pad electrodes 1102 and 1110 are alternately arranged side by side. The common pad electrode 1110 includes, for example, a polysilicon film doped with an n-type impurity or a p-type impurity.

One wiring line L1010 (that is, the well contact) is provided on a central portion of the common pad electrode 1110. As illustrated in FIGS. 133, and 135 to 138, the wiring line L1010 provided on the central portion of the common pad electrode 1110 extends from the first substrate section 1010 to the upper substrate 1220 of the second substrate section 1020 through the lower substrate 1210 of the second substrate section 1020, and is coupled to a reference potential line that supplies a reference potential (e.g., a ground potential: 0 V) through a wiring line and the like provided in the upper substrate 1220.

The wiring line L110 provided on the central portion of the common pad electrode 1110 is electrically coupled to each of a top surface of the common pad electrode 1110, an inner surface of a through hole provided in the lower substrate 1210, and an inner surface of a through hole provided in the upper substrate 1220. Accordingly, the well layer WE of the semiconductor substrate 1011 of the first substrate section 1010, and well layers of the lower substrate 1210 and the upper substrate 1220 of the second substrate section 1020 are coupled to a reference potential (e.g., a ground potential: 0 V).

The imaging device 1A according to the modification example 21 of the present disclosure has effects similar to those of the imaging device 1 according to the embodiment. In addition, the imaging device 1A further includes the common pad electrodes 1102 and 1110 that are provided on side of a front surface 11*a* of the semiconductor substrate 1011 included in the first substrate section 1010 and are disposed over a plurality of (e.g., four) sensor pixels 1012 adjacent to each other. The common pad electrode 1102 is electrically coupled to the floating diffusions FD of the four sensor pixels 1012. The common pad electrode 1110 is electrically coupled to the well layers WE of the four sensor pixels 1012. This makes it possible to provide the wiring line L1002, which is coupled to the floating diffusions FD, common to every four sensor pixels 1012. It is possible to provide the wiring line L1010, which is coupled to the well layers WE, common to every four sensor pixels 1012. This makes it possible to reduce the number of wiring lines L1002 and the number of wiring lines L1010, which makes it possible to reduce the areas of the sensor pixels 1012 and downsize the imaging device 1A.

23. Application Example

FIG. 140 illustrates an example of a schematic configuration of an imaging system 7 including the imaging device 1 according to any of the embodiment described above and the modification examples thereof.

The imaging system 7 is an electronic apparatus. Examples of the electronic apparatus include an imaging device such as a digital still camera or a video camera, and a portable terminal device such as a smartphone or a tablet-type terminal. The imaging system 7 includes, for example, the imaging device 1 according to any of the embodiment described above and the modification examples thereof, a DSP circuit 1243, a frame memory 1244, a display section 1245, a storage section 1246, an operation section 1247, and a power source section 1248. In the imaging system 7, the imaging device 1 according to any of the embodiment described above and the modification examples thereof, the DSP circuit 1243, the frame memory 1244, the display section 1245, the storage section 1246, the operation section 1247, and the power source section 1248 are coupled to one another via a bus line 1249.

The imaging device 1 according to any of the embodiment described above and the modification examples thereof outputs image data corresponding to incident light. The DSP circuit 1243 is a signal processing circuit that processes a signal (image data) outputted from the imaging device 1 according to any of the embodiment described above and the modification examples thereof. The frame memory 1244 temporarily holds the image data processed by the DSP circuit 1243 in a frame unit. The display section 1245 includes, for example, a panel-type display device such as a liquid crystal panel or an organic EL (Electro Luminescence) panel, and displays a moving image or a still image captured by the imaging device 1 according to any of the embodiment described above and the modification examples thereof. The storage section 1246 records image data of a moving image or a still image captured by the imaging device 1 according to any of the embodiment described above and the modification examples thereof in a recording medium such as a semiconductor memory or a hard disk. The operation section 1247 issues an operation command for various functions of the imaging system 7 in accordance with an operation by a user. The power source section 1248 appropriately supplies various types of power for operation to the imaging device 1 according to any of the embodiment described above and the modification examples thereof, the DSP circuit 1243, the frame memory 1244, the display section 1245, the storage section 1246, and the operation section 1247 which are supply targets.

Next, description is given of an imaging procedure in the imaging system 7.

FIG. 141 illustrates an example of a flowchart of an imaging operation in the imaging system 7. A user instructs start of imaging by operating the operation section 1247 (step S101). Then, the operation section 1247 transmits an imaging command to the imaging device 1 (step S102). The imaging device 1 (specifically, a system control circuit 36) executes imaging in a predetermined imaging method upon receiving the imaging command (step S103).

The imaging device 1 outputs image data obtained by imaging to the DSP circuit 1243. Herein, the image data refers to data for all pixels of pixel signals generated on the basis of electric charges temporarily held in the floating diffusions FD. The DSP circuit 1243 performs predetermined signal processing (e.g., noise reduction processing, etc.) on the basis of the image data inputted from the imaging device 1 (step S104). The DSP circuit 1243 causes the frame memory 1244 to hold the image data having been subjected to the predetermined signal processing, and the frame memory 1244 causes the storage section 1246 to store the image data (step S105). In this manner, the imaging in the imaging system 7 is performed.

In the present application example, the imaging device 1 according to any of the embodiment described above and the modification examples thereof is applied to the imaging system 7. This enables smaller size or higher definition of the imaging device 1, which makes it possible to provide a small or high-definition imaging system 7.

24. Practical Application Examples

Practical Application Example 1

The technology (the present technology) according to the present disclosure is applicable to various products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, an airplane, a drone, a vessel, and a robot.

FIG. 142 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 142, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 142, an audio speaker 12061, a display section 12062, and an instrument panel 12063 are illustrated as the output device. The display section 12062 may, for example, include at least one of an on-board display and a head-up display.

FIG. 143 is a diagram depicting an example of the installation position of the imaging section 12031.

In FIG. 143, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 143 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given hereinabove of one example of the mobile body control system, to which the technology according to the present disclosure may be applied. The technology according to the present disclosure may be applied to the imaging section 12031 among the configurations described above. Specifically, the imaging device 1 according to any of the embodiment described above and modification examples thereof is applicable to the imaging section 12031. Applying the technology according to the present disclosure to the imaging section 12031 makes it possible to obtain a high-definition captured image with less noise, which makes it possible to perform highly accurate control using the captured image in the mobile body control system.

Practical Application Example 2

FIG. 144 is a view depicting an example of a schematic configuration of an endoscopic surgery system to which the technology according to an embodiment of the present disclosure (present technology) can be applied.

In FIG. 144, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 145 is a block diagram depicting an example of a functional configuration of the camera head 11102 and the CCU 11201 depicted in FIG. 144.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given hereinabove of one example of the endoscopic surgery system, to which the technology according to the present disclosure may be applied. The technology according to the present disclosure may be suitably applied to the image pickup unit 11402 provided in the camera head 11102 of the endoscope 11100, among the configurations described above. Applying the technology according to the present disclosure to the image pickup unit 11402 enables smaller size or higher definition of the image pickup unit 11402, which makes it possible to provide the endoscope 11100 having a small size or high definition.

Although the present disclosure has been described with reference to the embodiment and the modification examples thereof, the application example, and the practical application examples, the present disclosure is not limited to the embodiment and the like described above, and may be modified in a variety of ways. It is to be noted that the effects described herein are merely illustrative. The effects of the present disclosure are not limited to those described herein. The present disclosure may have effects other than those described herein.

In addition, for example, the present disclosure may also have the following configurations. In a solid-state imaging device having any of the following configurations, a first semiconductor layer provided with a photoelectric converter and a second semiconductor layer provided with a pixel transistor are provided to be stacked, which makes it possible to design each of the photoelectric converter and the pixel transistor more freely. This makes it possible to further enhance flexibility in design.

(1)

A solid-state imaging device including:

- a first semiconductor layer including a photoelectric converter and an electric charge accumulation section for each pixel, the electric charge accumulation section in which a signal electric charge generated in the photoelectric converter is accumulated;
- a pixel separation section that is provided in the first semiconductor layer, and partitions a plurality of the pixels from each other;
- a second semiconductor layer that is provided with a pixel transistor and is stacked on the first semiconductor layer, the pixel transistor that reads the signal electric charge of the electric charge accumulation section; and
- a first shared coupling section that is provided between the second semiconductor layer and the first semiconductor layer, and is provided to straddle the pixel separation section and is electrically coupled to a plurality of the electric charge accumulation sections.

(2)

The solid-state imaging device according to (1), further including:

- a first substrate including the first semiconductor layer and a first wiring layer provided with the first shared coupling section;
- a second substrate including the second semiconductor layer and a second wiring layer that is opposed to the first substrate with the second semiconductor layer interposed therebetween; and
- a third substrate that is opposed to the first substrate with the second substrate interposed therebetween, and includes a circuit that is electrically coupled to the second semiconductor layer.

(3)

The solid-state imaging device according to (2), further including a first through electrode that electrically couples the first shared coupling section and the pixel transistor to each other, and is provided in the first substrate and the second substrate.

(4)

The solid-state imaging device according to (2) or (3), further including:

- an impurity diffusion region that is provided in the first semiconductor layer for each of the pixels, and is disposed apart from the electric charge accumulation section;
- a second shared coupling section that is provided in the first wiring layer, and is provided to straddle the pixel separation section and is electrically coupled to a plurality of the impurity diffusion regions; and
- a second through electrode that electrically couples the second shared coupling section and a predetermined region of the second semiconductor layer to each other, and is provided in the first substrate and the second substrate.

(5)

The solid-state imaging device according to any one of (1) to (4), in which the first shared coupling section includes polysilicon.

(6)

The solid-state imaging device according to any one of (1) to (5), in which the electric charge accumulation section includes arsenic.

(7)

The solid-state imaging device according to any one of (1) to (6), further including:

a transfer transistor that includes a gate electrode opposed to the first semiconductor layer, and transfers the signal electric charge of the photoelectric converter to the electric charge accumulation section; and a third through electrode that is electrically coupled to a gate of the transfer transistor, the third through electrode provided for each of the plurality of pixels each including a corresponding one of a plurality of the electric charge accumulation sections that is electrically coupled to each other by the first shared coupling section, and the third through electrodes being disposed asymmetrical to each other in plan view.

(8)

The solid-state imaging device according to any one of (4) to (7), in which an impurity region that is electrically coupled to the pixel transistor is further provided in the second semiconductor layer.

(9)

The solid-state imaging device according to any one of (3) to (8), in which the first shared coupling section includes polysilicon and has an alloy region that is partially alloyed, and the first through electrode is coupled to the alloy region.

(10)

The solid-state imaging device according to any one of (1) to (9), in which the first shared coupling section is formed to be embedded in the first semiconductor layer.

(11)

The solid-state imaging device according to any one of (1) to (10), in which the first semiconductor layer further includes a transfer transistor that includes a gate electrode opposed to the first semiconductor layer, and transfers the signal electric charge of the photoelectric converter to the electric charge accumulation section, and the transfer transistor and the pixel transistor have shapes different from each other.

(12)

The solid-state imaging device according to (11), in which gate electrodes of the transfer transistor and the pixel transistor are covered with respective sidewalls having widths different from each other.

(13)

The solid-state imaging device according to (11) or (12), in which gate electrodes of the transfer transistor and the pixel transistor have heights different from each other.

(14)

The solid-state imaging device according to any one of (1) to (13), in which the second semiconductor layer includes, as the pixel transistor, an amplification transistor, a selection transistor, a reset transistor, and an FD conversion gain switching transistor, and the amplification transistor, the selection transistor, the reset transistor, and the FD conversion gain switching transistor each have a planar structure or a three-dimensional structure.

(15)

A solid-state imaging device including:

a first semiconductor layer including a photoelectric converter and an electric charge accumulation section for each pixel, the electric charge accumulation section in which a signal electric charge generated in the photoelectric converter is accumulated;

a second semiconductor layer that is provided with a pixel transistor and is stacked on the first semiconductor layer, the pixel transistor that reads the signal electric charge of the electric charge accumulation section;

an insulating region that divides the second semiconductor layer; and a through electrode that penetrates through the insulating region in a thickness direction and is electrically coupled to the first semiconductor layer, and includes a first portion and a second portion from side of the first semiconductor layer in the thickness direction, the second portion being bonded to the first portion.

(16)

The solid-state imaging device according to (15), in which a material of the second portion is different from a material of the first portion.

(17)

The solid-state imaging device according to (15) or (16), in which the first portion includes polysilicon, and the second portion includes metal.

(18)

A solid-state imaging device including:

a first semiconductor layer including a photoelectric converter and an electric charge accumulation section for each pixel, the electric charge accumulation section in which a signal electric charge generated in the photoelectric converter is accumulated;

a second semiconductor layer that is provided with a pixel transistor and is stacked on the first semiconductor layer, the pixel transistor that reads the signal electric charge of the electric charge accumulation section;

an insulating region that divides the second semiconductor layer; and an element separation region provided in a portion in a thickness direction from a front surface of the second semiconductor layer.

(19)

The solid-state imaging device according to (18), further including a through electrode that is provided to penetrate through the insulating region in the thickness direction, and electrically couples a predetermined region of the first semiconductor layer and a predetermined region of the second semiconductor layer to each other.

(20)

A solid-state imaging device including:

a first substrate including a photoelectric converter and an electric charge accumulation section for each pixel, the electric charge accumulation section in which a signal electric charge generated in the photoelectric converter is accumulated;

a second substrate that is provided with a pixel transistor and includes a second semiconductor layer and an insulating region, the pixel transistor that reads the signal electric charge of the electric charge accumulation section, the second semiconductor layer being stacked on the first substrate, and the insulating region that divides the second semiconductor layer;

a through electrode that penetrates through the insulating region in a thickness direction to reach the first substrate; and a coupling section that is provided in the second substrate and disposed at a position opposed to the second semiconductor layer, and has a hole diameter different from a hole diameter of the through electrode.

(21)

The solid-state imaging device according to (20), in which the hole diameter of the coupling section is smaller than the hole diameter of the through electrode.

(22)

A solid-state imaging device including:

a first substrate including a photoelectric converter and an electric charge accumulation section for each pixel, the electric charge accumulation section in which a signal electric charge generated in the photoelectric converter is accumulated;

a second substrate that is provided with a pixel transistor and is stacked on the first substrate, the pixel transistor that reads the signal electric charge of the electric charge accumulation section;

a bonding film that is provided at a bonding surface between the second substrate and the first substrate, and is provided in a selective region between the second substrate and the first substrate; and a through electrode that is disposed in a gap of the bonding film, and electrically couples the second substrate and the first substrate to each other.

(23)

The solid-state imaging device according to (22), in which the gap of the bonding film further includes a region where the bonding film is removed.

(24)

The solid-state imaging device according to (22) or (23), in which the second substrate includes a second semiconductor layer and an insulating region that divides the second semiconductor layer, and the insulating region is selectively disposed in the gap of the bonding film.

(25)

The solid-state imaging device according to any one of (22) to (24), in which the bonding film includes a first nitride film.

(26)

The solid-state imaging device according to any one of (22) to (25), in which the second substrate includes a second nitride film that covers the pixel transistor, and the through electrode is coupled to the first substrate through an opening or a gap of the second nitride film.

(27)

A solid-state imaging device including:

a first semiconductor layer including a photoelectric converter and an electric charge accumulation section for each pixel, the electric charge accumulation section in which a signal electric charge generated in the photoelectric converter is accumulated; and a second semiconductor layer that is provided with a pixel transistor and is stacked on the first semiconductor layer, the pixel transistor that has a three-dimensional structure and reads the signal electric charge of the electric charge accumulation section.

(28)

The solid-state imaging device according to (27), in which the pixel transistor has a fin (Fin) structure.

(29)

A solid-state imaging device including:

a first semiconductor layer including a photoelectric converter and an electric charge accumulation section for each pixel, the electric charge accumulation section in which a signal electric charge generated in the photoelectric converter is accumulated;

a transfer transistor that includes a gate electrode opposed to the first semiconductor layer, and transfers the signal electric charge of the photoelectric converter to the electric charge accumulation section;

a second semiconductor layer that is provided with a pixel transistor and is stacked on the first semiconductor layer, the pixel transistor that reads the signal electric charge of the electric charge accumulation section;

a third semiconductor layer including a third region electrically coupled to a potential of a first region of the first semiconductor layer or a second region of the second semiconductor layer;

a protection element having a pn junction in the third semiconductor layer; and an antenna wiring line that is opposed to the first semiconductor layer with the second semiconductor layer interposed therebetween, and is electrically coupled to the protection element, and the pixel transistor or the transfer transistor.

(30)

The solid-state imaging device according to (29), in which the third semiconductor layer is provided integrally with the first semiconductor layer or the second semiconductor layer.

(31)

The solid-state imaging device according to (29) or (30), further including a wiring layer that is provided at a position closer to the second semiconductor layer than the antenna wiring line, and electrically couples the third region of the third semiconductor layer and the first region of the first semiconductor layer or the second region of the second semiconductor layer to each other.

(32)

The solid-state imaging device according to any one of (29) to (31), in which the protection element has a plurality of pn junctions.

This application claims the benefit of Japanese Priority Patent Application JP2019-118222 filed with Japan Patent Office on Jun. 26, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state imaging device, comprising:

a first semiconductor layer including a photoelectric converter and an electric charge accumulation section for each pixel, wherein the electric charge accumulation section accumulates a signal electric charge generated in the photoelectric converter;

a pixel separation section that is provided in the first semiconductor layer, wherein the pixel separation section partitions a plurality of the pixels from each other;

a second semiconductor layer that is provided with a pixel transistor and is stacked on the first semiconductor layer, wherein the pixel transistor reads the signal electric charge of the electric charge accumulation section; and a first shared coupling section that is provided between the second semiconductor layer and the first semiconductor layer, wherein the first shared coupling section straddles the pixel separation section and is electrically coupled to a plurality of the electric charge accumulation sections;

a first substrate including the first semiconductor layer and a first wiring layer provided with the first shared coupling section;

a second substrate including the second semiconductor layer and a second wiring layer that is opposed to the first substrate with the second semiconductor layer interposed therebetween;

a third substrate that is opposed to the first substrate with the second substrate interposed therebetween, and includes a circuit that is electrically coupled to the second semiconductor layer; and a first through electrode that electrically couples the first shared coupling section and the pixel transistor to each other, and is provided in the first substrate and the second substrate.

2. The solid-state imaging device according to claim 1, wherein the first shared coupling section includes polysilicon.

3. The solid-state imaging device according to claim 1, wherein the electric charge accumulation section includes arsenic.

4. The solid-state imaging device according to claim 1, wherein the first shared coupling section includes polysilicon and has an alloy region that is partially alloyed, and the first through electrode is coupled to the alloy region.

5. The solid-state imaging device according to claim 1, wherein the first semiconductor layer further includes a transfer transistor that includes a gate electrode opposed to the first semiconductor layer, and transfers the signal electric charge of the photoelectric converter to the electric charge accumulation section, and the transfer transistor and the pixel transistor have shapes different from each other.

6. The solid-state imaging device according to claim 5, wherein gate electrodes of the transfer transistor and the pixel transistor are covered with respective sidewalls having widths different from each other.

7. The solid-state imaging device according to claim 5, wherein gate electrodes of the transfer transistor and the pixel transistor have heights different from each other.

8. The solid-state imaging device according to claim 1, wherein the second semiconductor layer includes, as the pixel transistor, an amplification transistor, a selection transistor, a reset transistor, and an FD conversion gain switching transistor, and the amplification transistor, the selection transistor, the reset transistor, and the FD conversion gain switching transistor each have a planar structure or a three-dimensional structure.

9. The solid-state imaging device according to claim 1, further comprising:

an impurity diffusion region that is provided in the first semiconductor layer for each of the pixels, and is disposed apart from the electric charge accumulation section;

a second shared coupling section that is provided in the first wiring layer, wherein the second shared coupling section straddles the pixel separation section and is electrically coupled to a plurality of the impurity diffusion regions; and a second through electrode that electrically couples the second shared coupling section and a predetermined region of the second semiconductor layer to each other, wherein the second through electrode is provided in the first substrate and the second substrate.

10. The solid-state imaging device according to claim 1, further comprising:

a transfer transistor that includes a gate electrode opposed to the first semiconductor layer, wherein the transfer transistor transfers the signal electric charge of the photoelectric converter to the electric charge accumulation section; and a third through electrode that is electrically coupled to a gate of the transfer transistor, wherein the third through electrode is provided for each of the plurality of pixels each including a corresponding one of a plurality of the electric charge accumulation sections that is electrically coupled to each other by the first shared coupling section, and wherein the third through electrodes are disposed asymmetrical to each other in plan view.

11. The solid-state imaging device according to claim 1, wherein the first shared coupling section is embedded in the first semiconductor layer.

12. A solid-state imaging device, comprising:

a first semiconductor layer including a photoelectric converter and an electric charge accumulation section for each pixel, wherein the electric charge accumulation section accumulates a signal electric charge generated in the photoelectric converter;

a pixel separation section that is provided in the first semiconductor layer, wherein the pixel separation section partitions a plurality of the pixels from each other;

a second semiconductor layer that is provided with a pixel transistor and is stacked on the first semiconductor layer, wherein the pixel transistor reads the signal electric charge of the electric charge accumulation section;

a first shared coupling section that is provided between the second semiconductor layer and the first semiconductor layer, wherein the first shared coupling section straddles the pixel separation section and is electrically coupled to a plurality of the electric charge accumulation sections;

a first substrate including the first semiconductor layer and a first wiring layer provided with the first shared coupling section;

a second substrate including the second semiconductor layer and a second wiring layer that is opposed to the first substrate with the second semiconductor layer interposed therebetween;

a third substrate that is opposed to the first substrate with the second substrate interposed therebetween, and includes a circuit that is electrically coupled to the second semiconductor layer an impurity diffusion region that is provided in the first semiconductor layer for each of the pixels, and is disposed apart from the electric charge accumulation section;

a second shared coupling section that is provided in the first wiring layer, wherein the second shared coupling section straddles the pixel separation section and is electrically coupled to a plurality of the impurity diffusion regions; and a second through electrode that electrically couples the second shared coupling section and a predetermined region of the second semiconductor layer to each other, wherein the second through electrode is provided in the first substrate and the second substrate.

13. The solid-state imaging device according to claim 12, wherein an impurity region that is electrically coupled to the pixel transistor is further provided in the second semiconductor layer.

14. The solid-state imaging device according to claim 12, wherein the first shared coupling section includes polysilicon and has an alloy region that is partially alloyed, and the first through electrode is coupled to the alloy region.

15. The solid-state imaging device according to claim 12, wherein the first shared coupling section is embedded in the first semiconductor layer.

16. The solid-state imaging device according to claim 12, wherein the first semiconductor layer further includes a transfer transistor that includes a gate electrode opposed to the first semiconductor layer, and transfers the signal electric charge of the photoelectric converter to the electric charge accumulation section, and the transfer transistor and the pixel transistor have shapes different from each other.

17. The solid-state imaging device according to claim 16, wherein gate electrodes of the transfer transistor and the pixel transistor are covered with respective sidewalls having widths different from each other.

18. The solid-state imaging device according to claim 16, wherein gate electrodes of the transfer transistor and the pixel transistor have heights different from each other.

19. The solid-state imaging device according to claim 12, wherein the first shared coupling section includes polysilicon.

20. The solid-state imaging device according to claim 12, wherein the electric charge accumulation section includes arsenic.

21. The solid-state imaging device according to claim 12, further comprising:

a transfer transistor that includes a gate electrode opposed to the first semiconductor layer, wherein the transfer transistor transfers the signal electric charge of the photoelectric converter to the electric charge accumulation section; and a third through electrode that is electrically coupled to a gate of the transfer transistor, wherein the third through electrode is provided for each of the plurality of pixels each including a corresponding one of a plurality of the electric charge accumulation sections that is electrically coupled to each other by the first shared coupling section, and wherein the third through electrodes are disposed asymmetrical to each other in plan view.

22. A solid-state imaging device, comprising:

a first semiconductor layer including a photoelectric converter and an electric charge accumulation section for each pixel, wherein the electric charge accumulation section accumulates a signal electric charge generated in the photoelectric converter;

a pixel separation section that is provided in the first semiconductor layer, wherein the pixel separation section partitions a plurality of the pixels from each other;

a second semiconductor layer that is provided with a pixel transistor and is stacked on the first semiconductor layer, wherein the pixel transistor reads the signal electric charge of the electric charge accumulation section;

a first shared coupling section that is provided between the second semiconductor layer and the first semiconductor layer, wherein the first shared coupling section straddles the pixel separation section and is electrically coupled to a plurality of the electric charge accumulation sections;

a transfer transistor that includes a gate electrode opposed to the first semiconductor layer, wherein the transfer transistor transfers the signal electric charge of the photoelectric converter to the electric charge accumulation section; and a third through electrode that is electrically coupled to a gate of the transfer transistor, wherein the third through electrode is provided for each of the plurality of pixels each including a corresponding one of a plurality of the electric charge accumulation sections that is electrically coupled to each other by the first shared coupling section, and wherein the third through electrodes are disposed asymmetrical to each other in plan view.

23. The solid-state imaging device according to claim 22, further comprising:

a first substrate including the first semiconductor layer and a first wiring layer provided with the first shared coupling section;

a second substrate including the second semiconductor layer and a second wiring layer that is opposed to the first substrate with the second semiconductor layer interposed therebetween; and a third substrate that is opposed to the first substrate with the second substrate interposed therebetween, and includes a circuit that is electrically coupled to the second semiconductor layer.

24. The solid-state imaging device according to claim 23, further comprising a first through electrode that electrically couples the first shared coupling section and the pixel transistor to each other, and is provided in the first substrate and the second substrate.

25. The solid-state imaging device according to claim 22, wherein the first shared coupling section includes polysilicon.

26. The solid-state imaging device according to claim 22, wherein the electric charge accumulation section includes arsenic.

27. The solid-state imaging device according to claim 22, wherein an impurity region that is electrically coupled to the pixel transistor is further provided in the second semiconductor layer.

28. The solid-state imaging device according to claim 22, wherein the first shared coupling section includes polysilicon and has an alloy region that is partially alloyed, and the first through electrode is coupled to the alloy region.

29. The solid-state imaging device according to claim 22, wherein the first shared coupling section is embedded in the first semiconductor layer.

30. A solid-state imaging device, comprising:

a first semiconductor layer including a photoelectric converter and an electric charge accumulation section for each pixel, wherein the electric charge accumulation section accumulates a signal electric charge generated in the photoelectric converter;

a pixel separation section that is provided in the first semiconductor layer, wherein the pixel separation section partitions a plurality of the pixels from each other;

a second semiconductor layer that is provided with a pixel transistor and is stacked on the first semiconductor layer, wherein the pixel transistor reads the signal electric charge of the electric charge accumulation section; and a first shared coupling section that is provided between the second semiconductor layer and the first semiconductor layer, wherein the first shared coupling section straddles the pixel separation section and is electrically coupled to a plurality of the electric charge accumulation sections, wherein the first shared coupling section is embedded in the first semiconductor layer.

31. A solid-state imaging device, comprising:

a first semiconductor layer including a photoelectric converter and an electric charge accumulation section for each pixel, wherein the electric charge accumulation section accumulates a signal electric charge generated in the photoelectric converter;

a pixel separation section that is provided in the first semiconductor layer, wherein the pixel separation section partitions a plurality of the pixels from each other;

a second semiconductor layer that is provided with a pixel transistor and is stacked on the first semiconductor layer, wherein the pixel transistor reads the signal electric charge of the electric charge accumulation section; and a first shared coupling section that is provided between the second semiconductor layer and the first semiconductor layer, wherein the first shared coupling section straddles the pixel separation section and is electrically coupled to a plurality of the electric charge accumulation sections, wherein the first semiconductor layer further includes a transfer transistor that includes a gate electrode opposed to the first semiconductor layer, wherein the transfer transistor transfers the signal electric charge of the photoelectric converter to the electric charge accumulation section, wherein the transfer transistor and the pixel transistor have shapes different from each other, and wherein gate electrodes of the transfer transistor and the pixel transistor are covered with respective sidewalls having widths different from each other.

32. A solid-state imaging device, comprising:

a first semiconductor layer including a photoelectric converter and an electric charge accumulation section for each pixel, wherein the electric charge accumulation section accumulates a signal electric charge generated in the photoelectric converter;

a pixel separation section that is provided in the first semiconductor layer, wherein the pixel separation section partitions a plurality of the pixels from each other;

a second semiconductor layer that is provided with a pixel transistor and is stacked on the first semiconductor layer, wherein the pixel transistor reads the signal electric charge of the electric charge accumulation section; and a first shared coupling section that is provided between the second semiconductor layer and the first semiconductor layer, wherein the first shared coupling section straddles the pixel separation section and is electrically coupled to a plurality of the electric charge accumulation sections, wherein the first semiconductor layer further includes a transfer transistor that includes a gate electrode opposed to the first semiconductor layer, wherein the transfer transistor transfers the signal electric charge of the photoelectric converter to the electric charge accumulation section, wherein the transfer transistor and the pixel transistor have shapes different from each other, and wherein gate electrodes of the transfer transistor and the pixel transistor have heights different from each other.

* * * * *